(12) United States Patent
Asami

(10) Patent No.: US 11,276,782 B2
(45) Date of Patent: Mar. 15, 2022

(54) SEMICONDUCTOR DEVICE AND MANUFACTURING METHOD OF SEMICONDUCTOR DEVICE

(71) Applicant: Semiconductor Energy Laboratory Co., Ltd., Atsugi (JP)

(72) Inventor: Yoshinobu Asami, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 131 days.

(21) Appl. No.: 16/493,491

(22) PCT Filed: Mar. 15, 2018

(86) PCT No.: PCT/IB2018/051726
§ 371 (c)(1),
(2) Date: Sep. 12, 2019

(87) PCT Pub. No.: WO2018/178793
PCT Pub. Date: Oct. 4, 2018

(65) Prior Publication Data
US 2021/0159342 A1    May 27, 2021

(30) Foreign Application Priority Data

Mar. 29, 2017    (JP) .............................. JP2017-065704

(51) Int. Cl.
*H01L 29/786*    (2006.01)
*H01L 29/221*    (2006.01)
*H01L 29/66*    (2006.01)

(52) U.S. Cl.
CPC ...... *H01L 29/78603* (2013.01); *H01L 29/221* (2013.01); *H01L 29/66742* (2013.01)

(58) Field of Classification Search
CPC ............. H01L 29/78603; H01L 29/221; H01L 29/4908; H01L 29/66742–6678;
(Continued)

(56) References Cited

U.S. PATENT DOCUMENTS 8,860,108 B2    10/2014  Yamazaki et al.
9,660,100 B2     5/2017  Okazaki
(Continued)

FOREIGN PATENT DOCUMENTS

JP    2007-096055 A    4/2007
JP    2007-123861 A    5/2007
(Continued)

OTHER PUBLICATIONS

International Search Report (Application No. PCT/IB2018/051726) dated Jun. 26, 2018.
(Continued)

*Primary Examiner* — Shahed Ahmed
(74) *Attorney, Agent, or Firm* — Robinson Intellectual Property Law Office; Eric J. Robinson

(57) ABSTRACT

A semiconductor device capable of miniaturization or high integration and manufacture of a semiconductor device are provided. The semiconductor device includes a first insulator; an oxide over the first insulator; a second insulator and first and second conductors over the oxide; a third conductor over the second insulator; a fourth conductor over the first conductor; a fifth conductor over the second conductor; a third insulator over the first insulator and the first and second conductors; a fourth insulator over the second and third insulators and the third conductor; and a fifth insulator over the fourth insulator. The first and second conductors are provided to face each other with the second insulator therebetween. The second insulator is provided along an inner wall of an opening provided in the third insulator, facing side surfaces of the first and second conductors, and a top surface of the oxide. The level of a top surface of the third conductor is higher than the levels of top surfaces of the second and third insulators. The fourth insulator is provided along the
(Continued)

top surfaces of the second and third insulators and the top surface and a side surface of the third conductor.

10 Claims, 46 Drawing Sheets

(58) Field of Classification Search
CPC . H01L 29/786–78696; H01L 27/12–13; H01L 29/78666; H01L 29/78675; H01L 29/66757; H01L 29/78648; H01L 21/02172–02194
See application file for complete search history.

(56) References Cited

U.S. PATENT DOCUMENTS

| | | | |
|---|---|---|---|
| 9,882,061 B2 | 1/2018 | Yamazaki et al. | |
| 9,887,300 B2 | 2/2018 | Yamazaki | |
| 9,954,112 B2 | 4/2018 | Asami et al. | |
| 9,954,113 B2 | 4/2018 | Shimomura et al. | |
| 9,966,473 B2 | 5/2018 | Endo | |
| 10,304,962 B2 | 5/2019 | Akimoto et al. | |
| 2015/0309637 A1* | 10/2015 | Sakuishi | G06F 3/0445 345/174 |
| 2016/0111638 A1* | 4/2016 | Banno | H01L 45/146 257/4 |
| 2016/0260838 A1 | 9/2016 | Yamazaki | |
| 2016/0276487 A1 | 9/2016 | Yamazaki et al. | |
| 2016/0293232 A1* | 10/2016 | Ishizu | G11C 11/4091 |
| 2016/0300952 A1 | 10/2016 | Toriumi et al. | |
| 2016/0336454 A1 | 11/2016 | Endo | |
| 2018/0190826 A1 | 7/2018 | Endo | |
| 2020/0111874 A1* | 4/2020 | Meiser | H01L 21/0334 |
| 2020/0136061 A1* | 4/2020 | Onodera | H01L 51/0007 |

FOREIGN PATENT DOCUMENTS

| | | |
|---|---|---|
| JP | 2011-119674 A | 6/2011 |
| JP | 2016-167595 A | 9/2016 |
| JP | 2016-184635 A | 10/2016 |
| JP | 2016-201541 A | 12/2016 |
| JP | 2016-207759 A | 12/2016 |
| JP | 2016-213468 A | 12/2016 |
| JP | 2016-225602 A | 12/2016 |
| KR | 2017-0137125 A | 12/2017 |
| TW | 201642472 | 12/2016 |
| TW | 201705490 | 2/2017 |
| WO | WO-2016/166628 | 10/2016 |

OTHER PUBLICATIONS

Written Opinion (Application No. PCT/IB2018/051726) dated Jun. 26, 2018.
Asami.Y et al., "Properties of c-axis-aligned crystalline indium-gallium-zinc oxide field-effect transistors fabricated through a tapered-trench gate process", Jpn. J. Appl. Phys. (Japanese Journal of Applied Physics), Mar. 22, 2016, vol. 55, pp. 04EG09-1-04EG09-6.
Matsubayashi.D et al., "20-nm-node trench-gate-self-aligned crystalline In—Ga—Zn-Oxide FET with high frequency and low off-state current", IEDM 15: Technical Digest of International Electron Devices Meeting, Dec. 7, 2015, pp. 141-144.

* cited by examiner

244

SEMICONDUCTOR DEVICE AND MANUFACTURING METHOD OF SEMICONDUCTOR DEVICE

TECHNICAL FIELD

One embodiment of the present invention relates to a semiconductor device and a manufacturing method of the semiconductor device.

Note that in this specification and the like, a semiconductor device generally means a device that can function by utilizing semiconductor characteristics. A semiconductor element such as a transistor, a semiconductor circuit, an arithmetic device, and a memory device are each one embodiment of a semiconductor device. It can be sometimes said that a display device (a liquid crystal display device, a light-emitting display device, and the like), a projection device, a lighting device, an electro-optical device, a power storage device, a memory device, a semiconductor circuit, an imaging device, an electronic device, and the like each include a semiconductor device.

Note that one embodiment of the present invention is not limited to the above technical field. One embodiment of the invention disclosed in this specification and the like relates to an object, a method, or a manufacturing method. Alternatively, one embodiment of the present invention relates to a process, a machine, manufacture, or a composition of matter.

BACKGROUND ART

A technique in which a transistor is formed using a semiconductor thin film has attracted attention. The transistor is used in a wide range of electronic devices such as an integrated circuit (IC) and an image display device (also simply referred to as a display device). A silicon-based semiconductor material is widely known as a material for a semiconductor thin film that can be used in a transistor; an oxide semiconductor has attracted attention as another material.

For example, techniques have been disclosed by each of which a display device is manufactured using a transistor whose channel formation region includes zinc oxide or an In—Ga—Zn-based oxide as an oxide semiconductor (see Patent Document 1 and Patent Document 2).

Moreover, in recent years, a technique has been disclosed by which an integrated circuit of a memory device is manufactured using a transistor including an oxide semiconductor (see Patent Document 3). Furthermore, not only memory devices but also arithmetic devices and the like have been manufactured using transistors including oxide semiconductors.

PRIOR ART DOCUMENT

Patent Document

[Patent Document 1] Japanese Published Patent Application No. 2007-123861
[Patent Document 2] Japanese Published Patent Application No. 2007-96055
[Patent Document 3] Japanese Published Patent Application No. 2011-119674

SUMMARY OF THE INVENTION

Problems to be Solved by the Invention

Meanwhile, the integration of integrated circuits and miniaturization of transistors have progressed in accordance with an increase in performance and a reduction in the size and the weight of electronic devices. Thus, the process rule for fabricating a transistor has decreased year by year to 45 nm, 32 nm, and 22 nm. This requires transistors including oxide semiconductors to exhibit good electrical characteristics as designed even when they have minute structures.

An object of one embodiment of the present invention is to provide a semiconductor device that can be miniaturized or highly integrated and a manufacturing method of the semiconductor device. Alternatively, an object of one embodiment of the present invention is to provide a semiconductor device having good electrical characteristics and a manufacturing method of the semiconductor device. Alternatively, an object of one embodiment of the present invention is to provide a semiconductor device with a low off-state current and a manufacturing method of the semiconductor device. Alternatively, an object of one embodiment of the present invention is to provide a semiconductor device with a high on-state current and a manufacturing method of the semiconductor device. Alternatively, an object of one embodiment of the present invention is to provide a highly reliable semiconductor device and a manufacturing method of the semiconductor device. Alternatively, an object of one embodiment of the present invention is to provide a semiconductor device with reduced power consumption and a manufacturing method of the semiconductor device. Alternatively, an object of one embodiment of the present invention is to provide a semiconductor device with high design flexibility and a manufacturing method of the semiconductor device. Alternatively, an object of one embodiment of the present invention is to provide a semiconductor device with high productivity and a manufacturing method of the semiconductor device. Alternatively, an object of one embodiment of the present invention is to provide a novel semiconductor device and a manufacturing method of the semiconductor device.

Note that the descriptions of these objects do not disturb the existence of other objects. Note that in one embodiment of the present invention, there is no need to achieve all the objects. Objects other than these will be apparent from the descriptions of the specification, the drawings, the claims, and the like, and objects other than these can be derived from the descriptions of the specification, the drawings, the claims, and the like.

Means for Solving the Problems

One embodiment of the present invention is a semiconductor device that includes a first insulator, an oxide over the first insulator, a second insulator, a first conductor, and a second conductor over the oxide, a third conductor over the second insulator, a fourth conductor over the first conductor, a fifth conductor over the second conductor, a third insulator over the first insulator, the first conductor, and the second conductor, a fourth insulator over the second insulator, the third insulator, and the third conductor, and a fifth insulator over the fourth insulator; the first conductor and the second conductor are provided to face each other with the second insulator therebetween; the second insulator is provided along an inner wall of an opening provided in the third insulator, facing side surfaces of the first conductor and the second conductor, and a top surface of the oxide; the level of a top surface of the third conductor is higher than the levels of top surfaces of the second insulator and the third insulator; the fourth insulator is provided along the top surface of the second insulator, the top surface of the third insulator, the top surface of the third conductor, and a side surface of the third conductor; and the fourth conductor and the fifth conductor are provided to penetrate the third to fifth insulators and to face each other with the third conductor therebetween.

In the above embodiment, the fourth insulator may include a first region formed along the side surface of the third conductor, a second region formed along the top surface of the third conductor, and a third region other than the first and second regions, and the thickness of the first region with reference to a formation surface of the third region may be twice or more the thickness of the third region.

In the above embodiment, the fourth and fifth conductors may be provided to overlap with at least part of the first region and to penetrate the third region.

In the above embodiment, a distance between the third conductor and a region of the fourth conductor in contact with the first conductor, which face each other, may be substantially the same as a distance between the third conductor and a region of the fifth conductor in contact with the second conductor, which face each other.

In the above embodiment, the second insulator may be provided along the inner wall of the opening provided in the third insulator, the facing side surfaces of the first conductor and the second conductor, and the top surface of the oxide with a second oxide therebetween.

In the above embodiment, the fourth insulator may be provided along the top surface of the second insulator, the top surface of the third insulator, the top surface of the third conductor, and the side surface of the third conductor with a sixth insulator therebetween.

In the above embodiment, the first and second oxides may each contain a metal oxide.

One embodiment of the present invention is a manufacturing method of a semiconductor device, including a step of forming a first conductor, a second conductor, and a first insulator over an oxide; a step of forming a second insulator and a third conductor over top surfaces of the first insulator and the oxide; a step of making the levels of top surfaces of the third conductor, the first insulator, and the second insulator substantially the same; a step of etching the top surface of the first insulator to make the level of the top surface of the first insulator lower than the level of the top surface of the third conductor; a step of depositing a third insulator along the top surface of the first insulator, the top surface of the second insulator, the top surface of the third conductor, and a side surface of the third conductor; a step of forming a fourth insulator over the third insulator; and a step of processing the third insulator, the fourth insulator, and the first insulator to form a first opening reaching the first conductor and a second opening reaching the second conductor.

In the above embodiment, the first and second openings may be formed by processing at least part of a region of the third insulator along the side surface of the third conductor and part of a region of the third insulator along the top surface of the first insulator.

In the above embodiment, for the first and fourth insulators, silicon oxide or silicon oxynitride may be deposited, and for the third insulator, aluminum oxide, silicon nitride, or hafnium oxide may be deposited.

In the above embodiment, the first and second openings may be formed by a dry etching method.

In the above embodiment, the first and second openings may be formed in such a manner that the fourth insulator is subjected to a dry etching method using a mixed gas of Ar, $O_2$, and $C_4F_6$; the second insulator is subjected to a dry etching method using a mixed gas of Ar, $H_2$, and $C_4F_8$; and the first insulator is subjected to a dry etching method using a mixed gas of Ar, $O_2$, and $C_4F_6$.

Effect of the Invention

According to one embodiment of the present invention, a semiconductor device that can be miniaturized or highly integrated and a manufacturing method of the semiconductor device can be provided. Alternatively, according to one embodiment of the present invention, a semiconductor device having good electrical characteristics and a manufacturing method of the semiconductor device can be provided. Alternatively, according to one embodiment of the present invention, a semiconductor device with a low off-state current and a manufacturing method of the semiconductor device can be provided. Alternatively, according to one embodiment of the present invention, a semiconductor device with a high on-state current and a manufacturing method of the semiconductor device can be provided. Alternatively, according to one embodiment of the present invention, a highly reliable semiconductor device and a manufacturing method of the semiconductor device can be provided. Alternatively, according to one embodiment of the present invention, a semiconductor device with reduced power consumption and a manufacturing method of the semiconductor device can be provided. Alternatively, according to one embodiment of the present invention, a semiconductor device with high design flexibility and a manufacturing method of the semiconductor device can be provided. Alternatively, according to one embodiment of the present invention, a semiconductor device with high productivity and a manufacturing method of the semiconductor device can be provided. Alternatively, according to one embodiment of the present invention, a novel semiconductor device and a manufacturing method of the semiconductor device can be provided.

Note that the descriptions of these effects do not disturb the existence of other effects. Note that one embodiment of the present invention does not necessarily have all of these effects. Note that effects other than these will be apparent from the descriptions of the specification, the drawings, the claims, and the like and effects other than these can be derived from the descriptions of the specification, the drawings, the claims, and the like.

MODE FOR CARRYING OUT THE INVENTION

Figure 1A:
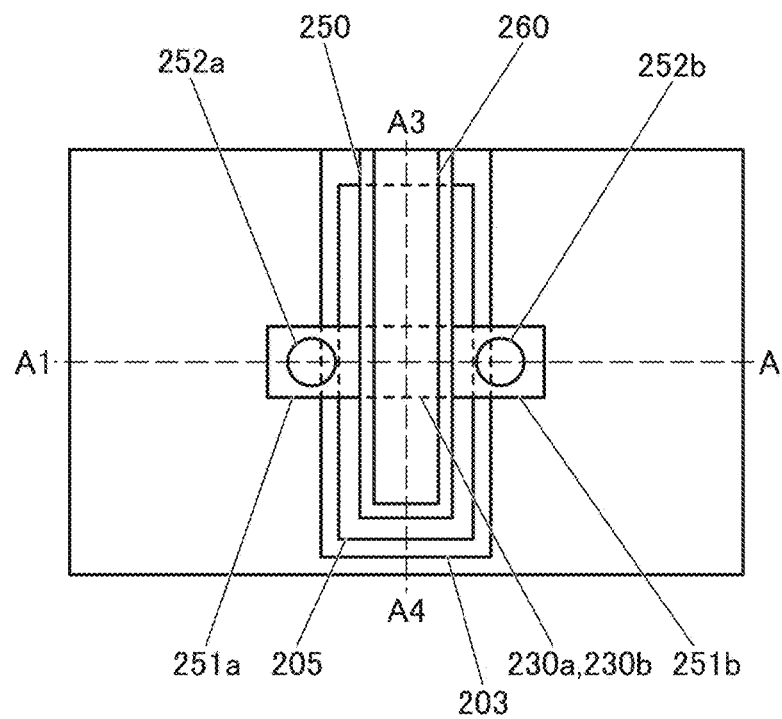
FIG. 1 A top view and cross-sectional views of a semiconductor device of one embodiment of the present invention.

Hereinafter, embodiments will be described with reference to drawings. However, the embodiments can be implemented in many different modes, and it will be readily appreciated by those skilled in the art that modes and details thereof can be changed in various ways without departing from the spirit and scope. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments are not limited to shapes, values, or the like shown in the drawings. For example, in the actual manufacturing process, a layer, a resist mask, or the like might be unintentionally reduced in size by treatment such as etching, which is not illustrated in some cases for easy understanding. Note that in the drawings, the same portions or portions having similar functions are denoted by the same reference numerals in different drawings, and repeated description is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, some components might not be shown for easy understanding of the invention. Furthermore, some hidden lines and the like might not be shown.

Note that in this specification and the like, the ordinal numbers such as first and second are used for convenience and do not denote the order of steps and the stacking order of layers. Therefore, for example, description can be made even when "first" is replaced with "second", "third", or the like, as appropriate. In addition, the ordinal numbers in this specification and the like do not correspond to the ordinal numbers which are used to specify one embodiment of the present invention in some cases.

In this specification, terms for describing arrangement, such as "over" and "under", are used for convenience in describing a positional relationship between components with reference to drawings. Furthermore, the positional relationship between components is changed as appropriate in accordance with a direction in which each component is described. Thus, terms for the description are not limited to those used in this specification, and the description can be changed appropriately depending on the situation.

In the case where there is an explicit description, X and Y are connected, in this specification and the like, for example, the case where X and Y are directly connected, the case where X and Y are electrically connected, and the case where X and Y are functionally connected are disclosed in this specification and the like. Accordingly, without being limited to a predetermined connection relationship, for example, a connection relationship shown in drawings or texts, a connection relationship other than one shown in drawings or texts is regarded as being included in the drawings or the texts.

Here, X and Y denote an object (e.g., a device, an element, a circuit, a wiring, an electrode, a terminal, a conductive film, or a layer).

An example of the case where X and Y are directly connected is the case where an element that allows electrical connection between X and Y (e.g., a switch, a transistor, a capacitor, an inductor, a resistor, a diode, a display element, a light-emitting element, or a load) is not connected between X and Y, and is the case where X and Y are connected without an element that allows electrical connection between X and Y (e.g., a switch, a transistor, a capacitor, an inductor, a resistor, a diode, a display element, a light-emitting element, or a load) placed therebetween.

In an example of the case where X and Y are electrically connected, at least one element that allows electrical connection between X and Y (e.g., a switch, a transistor, a capacitor, an inductor, a resistor, a diode, a display element, a light-emitting element, or a load) can be connected between X and Y. Note that a switch has a function of being controlled to be turned on or off. That is, a switch has a function of being in a conduction state (on state) or a non-conduction state (off state) to control whether or not current flows. Alternatively, a switch has a function of selecting and changing a path through which current flows. Note that the case where X and Y are electrically connected includes the case where X and Y are directly connected.

In an example of the case where X and Y are functionally connected, at least one circuit that allows functional connection between X and Y (e.g., a logic circuit (an inverter, a NAND circuit, a NOR circuit, or the like), a signal converter circuit (a DA converter circuit, an AD converter circuit, a gamma correction circuit, or the like), a potential level converter circuit (a power supply circuit (a step-up circuit, a step-down circuit, or the like), a level shifter circuit for changing the potential level of a signal, or the like), a voltage source, a current source, a switching circuit, an amplifier circuit (a circuit capable of increasing signal amplitude, the amount of current, or the like, an operational amplifier, a differential amplifier circuit, a source follower circuit, a buffer circuit, or the like), a signal generator circuit, a memory circuit, or a control circuit) can be connected between X and Y. Note that even if another circuit is provided between X and Y, for example, X and Y are regarded as being functionally connected when a signal output from X is transmitted to Y. Note that the case where X and Y are functionally connected includes the case where X and Y are directly connected and the case where X and Y are electrically connected.

In this specification and the like, a transistor is an element having at least three terminals of a gate, a drain, and a source. The transistor includes a channel formation region between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Functions of a source and a drain might be switched when transistors having different polarities are employed or a direction of current flow is changed in circuit operation. Therefore, in this specification and the like, the terms "source" and "drain" can be switched and used in some cases.

Note that a channel length refers to, for example, a distance between a source (a source region or a source electrode) and a drain (a drain region or a drain electrode) in a region where a semiconductor (or a portion where current flows in a semiconductor when a transistor is in an on state) and a gate electrode overlap with each other or a region where a channel is formed in a top view of the transistor. Note that in one transistor, channel lengths in all regions are not necessarily the same. In other words, the channel length of one transistor is not fixed to one value in some cases. Thus, in this specification, the channel length is any one of values, the maximum value, the minimum value, or the average value in a region where a channel is formed.

A channel width refers to, for example, the length of a portion where a source and a drain face each other in a region where a semiconductor (or a portion where current flows in a semiconductor when a transistor is in an on state) and a gate electrode overlap with each other, or a region where a channel is formed. Note that in one transistor, channel widths in all regions are not necessarily the same. In other words, the channel width of one transistor is not fixed to one value in some cases. Thus, in this specification, the channel width is any one of values, the maximum value, the minimum value, or the average value in a region where a channel is formed.

Note that depending on transistor structures, a channel width in a region where a channel is actually formed (hereinafter also referred to as an "effective channel width") is different from a channel width shown in a top view of a transistor (hereinafter also referred to as an "apparent channel width") in some cases. For example, when a gate electrode covers a side surface of a semiconductor, an effective channel width is greater than an apparent channel width, and its influence cannot be ignored in some cases. For example, in a miniaturized transistor having a gate electrode covering a side surface of a semiconductor, the proportion of a channel formation region formed in the side surface of the semiconductor is increased in some cases. In that case, an effective channel width is greater than an apparent channel width.

In such a case, an effective channel width is difficult to estimate by actual measurement in some cases. For example, estimation of an effective channel width from a design value requires an assumption that the shape of a semiconductor is known. Accordingly, in the case where the shape of a semiconductor is not known accurately, it is difficult to measure an effective channel width accurately.

Thus, in this specification, an apparent channel width is referred to as a "surrounded channel width (SCW)" in some cases. Furthermore, in this specification, the simple term "channel width" refers to a surrounded channel width or an apparent channel width in some cases. Alternatively, in this specification, the simple term "channel width" refers to an effective channel width in some cases. Note that values of a channel length, a channel width, an effective channel width, an apparent channel width, a surrounded channel width, and the like can be determined, for example, by analyzing a cross-sectional TEM image and the like.

In this specification and the like, an impurity in a semiconductor refers to an element other than a main component of a semiconductor. For example, an element with a concentration of lower than 0.1 atomic % can be regarded as an impurity. When an impurity is contained, for example, DOS (Density of States) in a semiconductor may be increased, or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also serves as an impurity in some cases. Also in the case of an oxide semiconductor, oxygen vacancies are formed by entry of impurities, for example. Furthermore, when the semiconductor is silicon, examples of an impurity which changes the characteristics of the semiconductor include oxygen, Group 1 elements except hydrogen, Group 2 elements, Group 13 elements, and Group 15 elements.

Note that in this specification and the like, a silicon oxynitride film refers to a film that has an oxygen content higher than a nitrogen content in its composition. For example, a silicon oxynitride film preferably refers to a film that contains oxygen in a concentration range of 55 atomic % to 65 atomic % inclusive, nitrogen in a concentration range of 1 atomic % to 20 atomic % inclusive, silicon in a concentration range of 25 atomic % to 35 atomic % inclusive, and hydrogen in a concentration range of 0.1 atomic % to 10 atomic % inclusive. A silicon nitride oxide film refers to a film that has a nitrogen content higher than an oxygen content in its the composition. For example, a silicon nitride oxide film preferably refers to a film that contains nitrogen in a concentration range of 55 atomic % to 65 atomic % inclusive, oxygen in a concentration range of 1 atomic % to 20 atomic % inclusive, silicon in a concentration range of 25 atomic % to 35 atomic % inclusive, and hydrogen in a concentration range of 0.1 atomic % to 10 atomic % inclusive.

Moreover, in this specification and the like, the term "film" and the term "layer" can be interchanged with each other. For example, the term "conductive layer" can be changed into the term "conductive film" in some cases. For another example, the term "insulating film" can be changed into the term "insulating layer" in some cases.

In addition, in this specification and the like, the term "insulator" can be replaced with "insulating film" or "insulating layer". Moreover, the term "conductor" can be replaced with "conductive film" or "conductive layer". Furthermore, the term "semiconductor" can be replaced with "semiconductor film" or "semiconductor layer".

Unless otherwise specified, transistors described in this specification and the like are field-effect transistors. Furthermore, unless otherwise specified, transistors described in this specification and the like are n-channel transistors. Thus, unless otherwise specified, the threshold voltage (also referred to as "Vth") is higher than 0 V.

In this specification and the like, "parallel" indicates a state where the angle formed between two straight lines is greater than or equal to −10° and less than or equal to 10°. Thus, the case where the angle is greater than or equal to −5° and less than or equal to 5° is also included. Furthermore, "substantially parallel" indicates a state where the angle formed between two straight lines is greater than or equal to −30° and less than or equal to 30°. Moreover, "perpendicular" indicates a state where the angle formed between two straight lines is greater than or equal to 80° and less than or equal to 100°. Thus, the case where the angle is greater than or equal to 85° and less than or equal to 95° is also included. Furthermore, "substantially perpendicular" indicates a state where the angle formed between two straight lines is greater than or equal to 60° and less than or equal to 120°.

In this specification and the like, a metal oxide means an oxide of metal in a broad expression. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is called an oxide semiconductor in some cases. That is, an OS FET or an OS transistor can also be called a transistor including a metal oxide or an oxide semiconductor.

Embodiment 1

An example of a semiconductor device including a transistor 200 of one embodiment of the present invention will be described below.

Structure Example 1 of Semiconductor Device

Figure 1C:
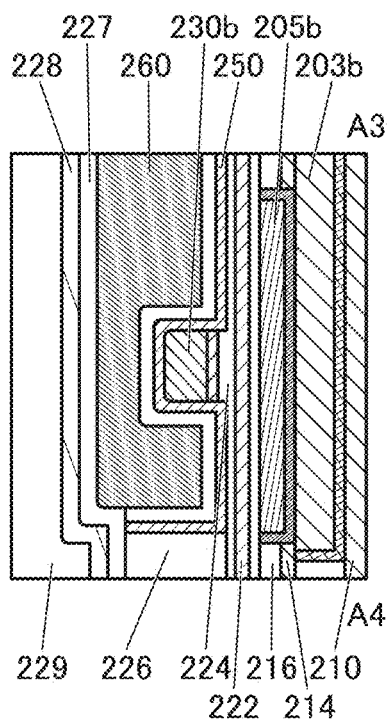
Figure 1B:
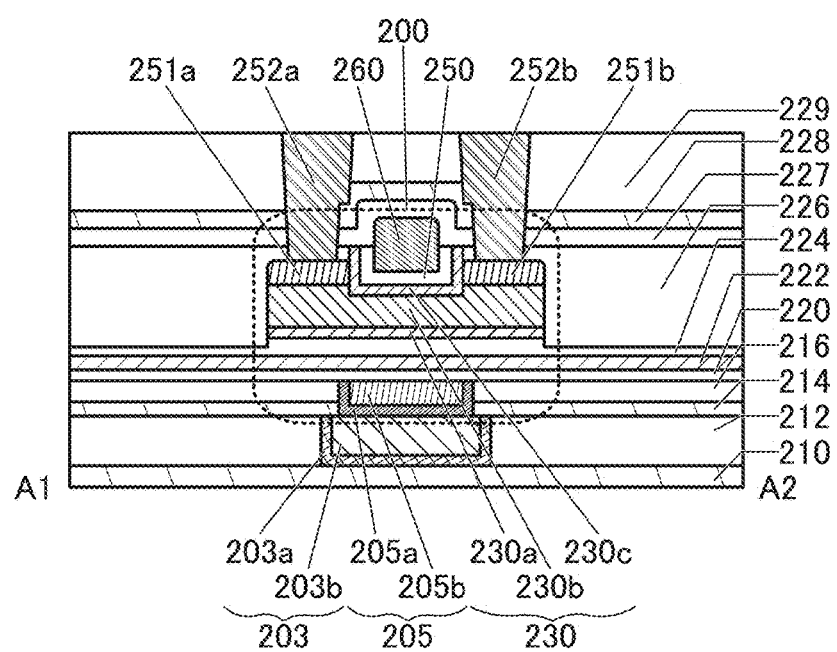

FIG. 1(A), FIG. 1(B), and FIG. 1(C) are a top view and cross-sectional views of the transistor 200 of one embodiment of the present invention and the periphery of the transistor 200.

FIG. 1(A) is a top view of the semiconductor device including the transistor 200. FIG. 1(B) and FIG. 1(C) are cross-sectional views of the semiconductor device. FIG. 1(B) is a cross-sectional view of a portion indicated by dashed-dotted line A1-A2 in FIG. 1(A), which is a cross-sectional view of the transistor 200 in the channel length direction. FIG. 1(C) is a cross-sectional view of a portion indicated by dashed-dotted line A3-A4 in FIG. 1(A), which is a cross-sectional view of the transistor 200 in the channel width direction. For simplification of the drawing, some components are not illustrated in the top view of FIG. 1(A).

The semiconductor device of one embodiment of the present invention includes the transistor 200, and an insulator 210, an insulator 212, an insulator 226, an insulator 227, an insulator 228, and an insulator 229 which function as interlayer films provided over a substrate (not illustrated). The semiconductor device further includes a conductor 203 (a conductor 203a and a conductor 203b) functioning as wirings and a conductor 252 (a conductor 252a and a conductor 252b) functioning as plugs, which are electrically connected to the transistor 200. Note that the semiconductor device of one embodiment of the present invention does not necessarily include the insulator 227.

Note that the conductor 203 has a stacked-layer structure in which the conductor 203a is formed in contact with an inner wall of an opening provided in the insulator 212 and the conductor 203b is formed on an inner side. Here, the level of a top surface of the conductor 203 is preferably substantially the same as the level of a top surface of the insulator 212. Although a structure in which the conductor 203a and the conductor 203b are stacked in the transistor 200 is described, one embodiment of the present invention is not limited thereto. For example, a structure in which only the conductor 203b is provided may be employed.

The conductor 252 is formed to fill openings provided in the insulator 226, the insulator 227, the insulator 228, and the insulator 229. Here, the level of a top surface of the conductor 252 can be substantially the same as the level of a top surface of the insulator 229. Although a structure in which the conductor 252 is a single layer in the transistor 200 is described, one embodiment of the present invention is not limited thereto. For example, the conductor 252 may have a stacked-layer structure of two or more layers.

[Transistor 200]

As illustrated in FIG. 1(B), the transistor 200 includes an insulator 214 provided over the insulator 212, an insulator 216 provided over the insulator 214, a conductor 205 (a conductor 205a and a conductor 205b) provided to be embedded in the insulator 214 and the insulator 216, an insulator 220 provided over the insulator 216 and the conductor 205, an insulator 222 provided over the insulator 220, an insulator 224 provided over the insulator 222, an oxide 230 (an oxide 230a, an oxide 230b, and an oxide 230c) provided over the insulator 224, an insulator 250 provided over the oxide 230, a conductor 251 (a conductor 251a and a conductor 251b) provided over the oxide 230b with the oxide 230c and the insulator 250 therebetween, and a conductor 260 provided over the conductor 250.

Although a structure in which the conductor 205a and the conductor 205b are stacked in the transistor 200 is described, one embodiment of the present invention is not limited thereto. For example, a structure in which only the conductor 205b is provided may be employed.

Although a structure in which three layers of the oxide 230a, the oxide 230b, and the oxide 230c are stacked in the transistor 200 is described, one embodiment of the present invention is not limited thereto. For example, a stacked-layer structure of four or more layers may be employed. Alternatively, for example, a two-layer structure of the oxide 230a and the oxide 230b may be employed. Further alternatively, for example, a single-layer structure of only the oxide 230b may be employed.

Although a structure in which the conductor 260 is a single layer in the transistor 200 is described, one embodiment of the present invention is not limited thereto. For example, the conductor 260 may have a stacked-layer structure of two or more layers.

In the transistor 200, the oxide 230 (the oxide 230a, the oxide 230b, and the oxide 230c) is preferably formed using a metal oxide functioning as an oxide semiconductor (hereinafter also referred to as an oxide semiconductor). A transistor using a metal oxide has an extremely low leakage current (off-state current) in a non-conduction state; thus, a semiconductor device with low power consumption can be provided. A metal oxide can be deposited by a sputtering method or the like, and thus can be used for a transistor included in a highly integrated semiconductor device.

Meanwhile, the transistor using a metal oxide is likely to have its electrical characteristics changed by impurities and oxygen vacancies in the metal oxide, and have reduced reliability in some cases. Furthermore, hydrogen contained in the metal oxide reacts with oxygen bonded to a metal atom to be water, and thus forms an oxygen vacancy in some cases. Entry of hydrogen into the oxygen vacancy generates an electron serving as a carrier in some cases. Thus, a transistor using the metal oxide that includes oxygen vacancies is likely to have normally-on characteristics. Accordingly, oxygen vacancies in the metal oxide are preferably reduced as much as possible.

In particular, when oxygen vacancies exist at an interface between a channel formation region of the oxide 230 and the insulator 250 functioning as a first gate insulator, a variation in the electrical characteristics of the transistor 200 is likely to occur and the reliability is reduced in some cases.

Thus, the insulator 250 in contact with the oxide 230 preferably contains more oxygen than oxygen in the stoichiometric composition (also referred to as excess oxygen). That is, excess oxygen contained in the insulator 250 is diffused into the channel formation region of the oxide 230, whereby oxygen vacancies in the channel formation region can be reduced.

Furthermore, the transistor 200 is preferably covered with an insulator having a barrier property for preventing entry of impurities such as water or hydrogen. The insulator having a barrier property is an insulator using an insulating material which has a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. It is preferable to use an insulating material which has a function of inhibiting diffusion of at least one of oxygen (e.g., oxygen atoms and oxygen molecules) (through which the above oxygen is less likely to pass).

For example, the transistor 200 is provided over the insulator 222 having a barrier property. In addition, the insulator 228 having a barrier property is provided over the transistor 200. When the insulator 222 and the insulator 228 are provided under and over the transistor 200, the transistor 200 can be sandwiched between the insulators having a barrier property. With this structure, impurities such as hydrogen or water can be prevented from entering the transistor 200 from a layer below the insulator 222 and/or a layer above the insulator 228. Alternatively, oxygen contained in the insulator 224 and the insulator 250 can be prevented from being diffused into a layer below the insulator 222 and/or a layer above the insulator 228. Thus, oxygen contained in the insulator 224 and the insulator 250 can be efficiently supplied to the channel formation region of the oxide 230.

The structure of the semiconductor device including the transistor 200 of one embodiment of the present invention will be described in detail below.

In the transistor 200, the conductor 260 functions as a first gate (also referred to as a top gate) electrode. The conductor 205 functions as a second gate (also referred to as a bottom gate) electrode. In this case, a potential applied to the conductor 205 and a potential applied to the conductor 260 are controlled independently, whereby Vth of the transistor 200 can be freely shifted in the positive direction or the negative direction. For example, Vth of the transistor 200 can be shifted in the positive direction more when drain current (Id) measurement is performed while a potential (Vg) applied to the conductor 260 is swept (what is called Vg-Id measurement) in the state where a negative potential is applied to the conductor 205 than when Vg-Id measurement is performed in the state where the conductor 205 is fixed to 0 V. As a result, drain current at a potential applied to the conductor 260 of 0 V can be smaller in the case where the conductor 205 is supplied with a negative potential than in the case where the conductor 205 is fixed to 0 V. Note that the above-described drain current when the potential of the gate electrode controlling the switching operation of the transistor 200 is 0 V is also referred to as "Icut" in this specification and the like.

As illustrated in FIG. 1(A), the conductor 205 is provided to overlap with the oxide 230 and the conductor 260. As illustrated in FIG. 1(B), the conductor 205 is preferably provided over and in contact with the conductor 203. As illustrated in FIG. 1(C), it is preferable that the conductor 205 be positioned to overlap with the conductor 260 in a region outside an end portion of the oxide 230 that intersects with the channel width direction. That is, the conductor 205 and the conductor 260 preferably overlap with each other with the insulator 220, the insulator 222, and the insulator 224 therebetween outside the side surface of the oxide 230.

In the case where the transistor 200 has the above structure, when potentials are applied to the conductor 260 and the conductor 205, an electric field generated between the conductor 260 and the conductor 205 can cover the channel formation region of the oxide 230.

In this specification and the like, a transistor structure in which a channel formation region is surrounded by gate electric fields of a first gate electrode and a second gate electrode is referred to as a surrounded channel (S-channel) structure.

The conductor 205 has a stacked-layer structure in which the conductor 205a is formed in contact with an inner wall of an opening provided in the insulator 214 and the insulator 216 and the conductor 205b is formed on an inner side. Here, the levels of top surfaces of the conductor 205a and the conductor 205b are preferably substantially the same as the level of a top surface of the insulator 216. Although a structure in which the conductor 205a and the conductor 205b are stacked in the transistor 200 is described, one embodiment of the present invention is not limited thereto. For example, a structure in which only the conductor 205b is provided may be employed.

As illustrated in FIG. 1(C), the conductor 203 extends in the channel width direction like the conductor 260 and functions as a wiring for applying a potential to the conductor 205 functioning as the second gate electrode. Here, the conductor 205 embedded in the opening provided in the insulator 214 and the insulator 216 is provided to be stacked over the conductor 203 functioning as the wiring for the second gate electrode. When the conductor 205 is provided over the conductor 203, a distance between the conductor 203 and the conductor 260 functioning as the first gate electrode can be designed as appropriate. That is, the insulator 214, the insulator 216, and the like are provided between the conductor 203 and the conductor 260, whereby the parasitic capacitance between the conductor 203 and the conductor 260 can be reduced, and the withstand voltage between the conductor 203 and the conductor 260 can be increased.

The reduction in the parasitic capacitance between the conductor 203 and the conductor 260 can improve the switching speed of the transistor 200, so that a transistor having frequency characteristics higher than those in the case where the parasitic capacitance is not reduced can be formed. The increase in the withstand voltage between the conductor 203 and the conductor 260 can improve the reliability of the transistor 200. Therefore, the insulator 214 and the insulator 216 preferably have a large thickness. Note that the extending direction of the conductor 203 is not limited to the channel width direction, and may extend in the channel length direction of the transistor 200, for example.

Here, the conductor 205a and the conductor 203a are preferably formed using a conductive material which has a function of inhibiting diffusion of impurities such as a hydrogen atom, a hydrogen molecule, a water molecule, a nitrogen atom, a nitrogen molecule, a nitrogen oxide molecule (e.g., $N_2O$, $NO$, and $NO_2$), and a copper atom (through which the above impurities are less likely to pass). Alternatively, it is preferable to use a conductive material which has a function of inhibiting diffusion of at least one of oxygen (e.g., oxygen atoms and oxygen molecules) (through which the above oxygen is less likely to pass). Note that in this specification, a function of inhibiting diffusion of impurities or oxygen is a function of inhibiting diffusion of any one or all of the above impurities and the above oxygen.

When the conductor 205a and the conductor 203a have a function of inhibiting diffusion of oxygen, the conductivity of the conductor 205b and the conductor 203b can be prevented from being lowered because of their oxidation. As a conductive material which has a function of inhibiting diffusion of oxygen, for example, tantalum, tantalum nitride, titanium nitride, ruthenium, ruthenium oxide, or the like is preferably used. Thus, a single layer or a stacked layer of the above conductive materials may be used for the conductor 205a and the conductor 203a. This can inhibit diffusion of impurities such as hydrogen or water from below the insulator 210 to the transistor 200 side through the conductor 203 and the conductor 205.

A conductive material containing tungsten, copper, or aluminum as its main component is preferably used for the conductor 205b. The conductor 205b is illustrated as a single layer in FIG. 1, but may have a stacked-layer structure; for example, a stack of any of the above conductive materials and titanium or titanium nitride may be used.

The conductor 203b functions as a wiring and thus is preferably formed using a material having higher conductivity than the conductor 205b. For example, a conductive material containing copper or aluminum as its main component can be used. The conductor 203b may have a stacked-layer structure; for example, a stack of any of the above conductive materials and titanium or titanium nitride may be used.

It is particularly preferable to use copper for the conductor 203b. Because of its low resistance, copper is a conductive material that is preferably used for a wiring and the like.

Meanwhile, copper is easily diffused and thus might deteriorate the electrical characteristics of the transistor 200 when diffused into the oxide 230. In view of the above, it is preferable to use a material having low copper-transmitting property, such as aluminum oxide or hafnium oxide, for the insulator 214. This can prevent diffusion of copper from the conductor 203*b* into the oxide 230.

Each of the insulator 210 and the insulator 214 preferably functions as a barrier film that prevents impurities such as water or hydrogen from entering the transistor 200 from below the insulators. Accordingly, each of the insulator 210 and the insulator 214 is preferably formed using an insulating material which has a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (through which the above impurities are less likely to pass). Alternatively, it is preferable to use an insulating material which has a function of inhibiting diffusion of at least one of oxygen (e.g., oxygen atoms and oxygen molecules) (through which the above oxygen is less likely to pass).

For example, it is preferable to use aluminum oxide or the like for the insulator 210 and to use silicon nitride or the like for the insulator 214. Accordingly, impurities such as water or hydrogen can be inhibited from being diffused into above the insulator 210 and the insulator 214 (into the transistor 200 side). Alternatively, oxygen contained in the insulator 224 and the like can be inhibited from being diffused into below the insulator 210 and the insulator 214.

Furthermore, with the structure in which the conductor 205 is stacked over the conductor 203, the insulator 214 can be provided between the insulator 212 and the insulator 216 as illustrated in FIG. 1(B) and FIG. 1(C). Therefore, for example, even in the case where a metal that is easily diffused, such as copper, is used for the conductor 203*b*, silicon nitride or the like used for the insulator 214 can inhibit diffusion of the metal into a layer above the insulator 214.

The dielectric constant of each of the insulator 212, the insulator 216, the insulator 226, the insulator 227, and the insulator 229 functioning as interlayer films is preferably lower than that of each of the insulator 210, the insulator 214, and the insulator 228. The use of an interlayer film formed using a material with a low dielectric constant can reduce the parasitic capacitance generated between wirings provided over and under the interlayer film, for example.

For example, for the insulator 212, the insulator 216, the insulator 226, the insulator 227, and the insulator 229, silicon oxide, silicon oxynitride, silicon nitride oxide, silicon nitride, or the like can be used.

The insulator 210, the insulator 214, and the insulator 228 can be formed using, for example, a single layer or a stacked layer of insulators such as aluminum oxide, hafnium oxide, and silicon nitride.

It is preferable to use, among the above materials that can be used for the insulator 226, the insulator 227, the insulator 228, and the insulator 229, the same material for the insulator 226, the insulator 227, and the insulator 229 and to use a different material from the material for the insulator 228. For example, it is preferable to use silicon oxide or silicon oxynitride for the insulator 226, the insulator 227, and the insulator 229, and to use aluminum oxide, silicon nitride, or hafnium oxide for the insulator 228. With such a structure, when opening treatment for forming the conductor 252 is performed on the insulator 226, the insulator 227, the insulator 228, and the insulator 229 by a dry etching method, the opening can be formed by a self-aligned manner by utilizing the difference in etching rate between the insulator 228 and the insulator 226, the insulator 227, and the insulator 229. This will be described in detail later.

In the transistor 200, the insulator 220, the insulator 222, and the insulator 224 function as a second gate insulator.

Here, for the insulator 224 in contact with the oxide 230, an oxide insulator that contains more oxygen than oxygen in the stoichiometric composition is preferably used. That is, an excess-oxygen region is preferably formed in the insulator 224. When such an insulator containing excess oxygen is provided in contact with the oxide 230, oxygen vacancies in the channel formation region of the oxide 230 can be reduced, leading to an improvement in reliability of the transistor 200.

As the insulator including an excess-oxygen region, specifically, an oxide material that releases part of oxygen by heating is preferably used. An oxide that releases oxygen by heating is an oxide film in which the amount of released oxygen converted into oxygen molecules is greater than or equal to $1.0 \times 10^{14}$ molecules/cm$^2$, preferably greater than or equal to $3.0 \times 10^{15}$ molecules/cm$^2$ in TDS (Thermal Desorption Spectroscopy) analysis. Note that the surface temperature of a film in the TDS analysis is preferably in a range of higher than or equal to 100° C. and lower than or equal to 700° C.

In the case where the insulator 224 includes an excess-oxygen region, it is preferable that the insulator 222 have a function of inhibiting diffusion of at least one of oxygen (e.g., oxygen atoms and oxygen molecules) (be less likely to transmit the above oxygen).

When the insulator 222 has a function of inhibiting diffusion of oxygen, oxygen in the excess-oxygen region of the insulator 224 is not diffused into the insulator 220 side and thus can be supplied to the oxide 230 efficiently. The conductor 205 can be inhibited from reacting with oxygen in the excess-oxygen region of the insulator 224.

For the insulator 222, it is preferable to use a single layer or a stacked layer of insulators containing what is called high-k materials such as aluminum oxide, hafnium oxide, tantalum oxide, zirconium oxide, lead zirconate titanate (PZT), strontium titanate ($SrTiO_3$), and $(Ba,Sr)TiO_3$ (BST), for example. It is particularly preferable to use an insulating material such as aluminum oxide and hafnium oxide which has a function of inhibiting diffusion of impurities, oxygen, and the like (through which oxygen is less likely to pass). The insulator 222 formed using the material can prevent release of oxygen from the oxide 230 and entry of impurities such as hydrogen from below the insulator 222 into the oxide 230.

Alternatively, aluminum oxide, bismuth oxide, germanium oxide, niobium oxide, silicon oxide, titanium oxide, tungsten oxide, yttrium oxide, or zirconium oxide may be added to the above insulating material, for example. Further alternatively, these insulators may be subjected to nitriding treatment. Silicon oxide, silicon oxynitride, or silicon nitride may be stacked over the insulator to be used.

It is preferable that the insulator 220 be thermally stable. For example, because silicon oxide and silicon oxynitride are thermally stable, combination with an insulator that is a high-k material can provide a thermally stable stacked-layer structure.

Note that the insulator 220, the insulator 222, and the insulator 224 may each have a stacked-layer structure of two or more layers. In that case, the stacked-layer structure is not necessarily formed of the same material and the stacked-layer structure may be formed of different materials.

In the transistor 200 illustrated in FIG. 1, the oxide 230 includes the oxide 230*a*, the oxide 230*b* over the oxide 230*a*, and the oxide 230*c* over the oxide 230*b*.

Here, it is preferable that the oxide 230*c* be provided in contact with an inner wall of an opening provided in the insulator 226, facing side surfaces of the conductor 251*a* and the conductor 251*b*, and a top surface of the oxide 230*b*, as illustrated in FIG. 1(B). As described later, the oxide 230*b* functions as the channel formation region of the transistor 200. Thus, when the oxide 230*c* is provided as described above, the transistor 200 has a structure in which the conductor 251 functioning as a source electrode or a drain electrode is in direct contact with the oxide 230*b*, and an on-state current and field-effect mobility higher than those in the case where they overlap with each other with the oxide 230*c* therebetween can be obtained.

In the transistor 200, part of the oxide 230 functions as the channel formation region. The channel formation region may be included in all the three layers of the oxide 230*a*, the oxide 230*b*, and the oxide 230*c*, but may be included in only two layers of the oxide 230*a* and the oxide 230*b*, and may be included in at least the oxide 230*b*.

Here, when the oxide 230*a* is provided under the oxide 230*b*, impurities can be inhibited from being diffused into the channel formation region of the oxide 230*b* from the structure bodies formed below the oxide 230*a*. When the oxide 230*c* is provided over the oxide 230*b*, impurities can be inhibited from being diffused into the channel formation region of the oxide 230*b* from the structure bodies formed above the oxide 230*c*.

For the oxide 230, it is preferable to use a metal oxide functioning as an oxide semiconductor (hereinafter also referred to as an oxide semiconductor). For example, the metal oxide used for the channel formation region preferably has a band gap greater than or equal to 2 eV, further preferably greater than or equal to 2.5 eV. With the use of a metal oxide having such a wide band gap, the off-state current of the transistor can be reduced.

The oxide 230 preferably has a stacked-layer structure of oxides which differ in the atomic ratio of metal atoms. Specifically, in the case where the oxide 230 has the stacked-layer structure of three layers of the oxide 230*a*, the oxide 230*b*, and the oxide 230*c* as illustrated in FIG. 1, the atomic ratio of an element M to constituent elements in the metal oxide used for the oxide 230*a* and the oxide 230*c* is preferably greater than the atomic ratio of the element M to constituent elements in the metal oxide used for the oxide 230*b*. Moreover, the atomic ratio of the element M to In in the metal oxide used for the oxide 230*a* and the oxide 230*c* is preferably greater than the atomic ratio of the element M to In in the metal oxide used for the oxide 230*b*. Moreover, the atomic ratio of In to the element M in the metal oxide used for the oxide 230*b* is preferably greater than the atomic ratio of In to the element M in the metal oxide used for the oxide 230*a* and the oxide 230*c*.

As described above, a transistor using a metal oxide has an extremely low leakage current in a non-conduction state; thus, a semiconductor device with low power consumption can be provided. A metal oxide can be deposited by a sputtering method or the like, and thus can be used for a transistor included in a highly integrated semiconductor device.

For example, a metal oxide such as In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used for the oxide 230. Furthermore, for the oxide 230, In—Ga oxide or In—Zn oxide may be used.

The conductor 251 (the conductor 251*a* and the conductor 251*b*) functions as a source electrode or a drain electrode. As illustrated in FIG. 1(B), the conductor 251*a* and the conductor 251*b* are provided to face each other with the oxide 230*c* and the insulator 250 sandwiched therebetween. For the conductor 251, a conductor such as tantalum nitride, tungsten, or titanium nitride can be used, for example. Note that although the conductor 251 is illustrated as a single-layer structure in FIG. 1, a stacked-layer structure of two or more layers may be employed.

For example, when the conductor 251 has a two-layer structure, a metal such as tungsten may be used for a first layer of the conductor 251 and a conductor which has a function of inhibiting passage of oxygen, such as titanium nitride or tantalum nitride, may be used for a second layer of the conductor 251. With this structure, entry of oxygen from above the second layer of the conductor 251 into the first layer of the conductor 251 can be reduced, and an increase in electric resistance value of the first layer of the conductor 251 can be suppressed.

Although not illustrated in FIG. 1, a structure may be employed in which an insulator which has a function of inhibiting the passage of oxygen, such as aluminum oxide, may be deposited over the conductor 251. For example, a structure may be employed in which a conductor such as tantalum nitride, tungsten, or titanium nitride is used for the conductor 251 and an insulator such as aluminum oxide is stacked over the conductor 251. Such a structure can reduce entry of oxygen into the conductor 251 from above the insulator such as aluminum oxide, and inhibit an increase in electric resistance value of the conductor 251. Furthermore, oxygen entering the conductor 251 is reduced, so that more oxygen can be supplied to the oxide 230.

The conductor 251 (the conductor 251*a* and the conductor 251*b*) reacts with the oxide 230*b* and/or the oxide 230*c* in some cases. As a result, although not illustrated in FIG. 1, a region that has become n-type and in which carriers have increased is formed at an interface between the conductor 251 and the oxide 230*b* and/or the oxide 230*c* in some cases. The region contributes to an increase in drain current of the transistor 200 in some cases.

The insulator 250 functions as the first gate insulator. The insulator 250 is preferably positioned in contact with a top surface of the oxide 230*c*. The insulator 250 is preferably formed using an insulator from which oxygen is released by heating. The insulator 250 is preferably an oxide film in which the amount of released oxygen converted into oxygen molecules is greater than or equal to $1.0 \times 10^{14}$ molecules/cm$^2$, preferably greater than or equal to $3.0 \times 10^{15}$ molecules/cm$^2$ in thermal desorption spectroscopy analysis (TDS analysis), for example. Note that the surface temperature of the film in the TDS analysis is preferably in a range of higher than or equal to 100° C. and lower than or equal to 700° C.

When an insulator from which oxygen is released by heating is provided in contact with the top surface of the oxide 230*c* for the insulator 250, oxygen can be efficiently supplied to the channel formation region of the oxide 230*b*. Furthermore, as in the insulator 224, the concentration of impurities such as water or hydrogen is preferably lowered in the insulator 250. The thickness of the insulator 250 is preferably greater than or equal to 1 nm and less than or equal to 20 nm. The insulator 250 has a single-layer structure in FIG. 1, but may have a stacked-layer structure of two or more layers.

Note that as illustrated in FIG. 1(B), the level of a top surface of the insulator 250 is preferably substantially the same as the level of a top surface of the insulator 226.

For the conductor 260 functioning as the first gate electrode, a metal such as tungsten can be used, for example. The conductor 260 has a single-layer structure in FIG. 1, but may have a stacked-layer structure of two or more layers.

For example, in the case where the conductor 260 has a three-layer structure, it is preferable to use a conductive oxide for the first layer of the conductor 260 and to use titanium nitride for the second layer of the conductor 260 and a metal such as tungsten for the third layer of the conductor 260. As the conductive oxide that can be used for the first layer of the conductor 260, the metal oxide that can be used for the oxide 230 is given, for example. It is particularly preferable to use, among In—Ga—Zn-based oxides, a highly conductive In—Ga—Zn-based oxide that has a metal atomic ratio of [In]:[Ga]:[Zn]=4:2:3 to 4.1 or in the vicinity thereof. By using such a metal oxide for the first layer of the conductor 260, entry of oxygen from below the first layer of the conductor 260 into the second layer and the third layer of the conductor 260 can be reduced, and an increase in electric resistance value of the second layer of the conductor 260 due to oxidation can be suppressed.

When the conductive oxide that can be used for the first layer of the conductor 260 is deposited by a sputtering method, oxygen can be added to the insulator 250 and oxygen can be supplied to the oxide 230. Thus, oxygen vacancies in the channel formation region of the oxide 230 can be reduced.

As described above, a metal such as titanium nitride can be used for the second layer of the conductor 260, for example. For the second layer of the conductor 260, an impurity such as nitrogen may be added to the first layer of the conductor 260 to improve conductivity. A metal such as tungsten can be used for the third layer of the conductor 260, for example. With the use of a low-resistivity material such as tungsten, the electric resistance value of the conductor 260 can be reduced.

For example, in the case where the conductor 260 has a two-layer structure, a structure may be employed in which a metal nitride such as titanium nitride and a metal such as tungsten are stacked for the first layer and for the second layer, respectively.

Although not illustrated in FIG. 1, a structure may be employed in which an insulator which has a function of inhibiting the passage of oxygen, such as aluminum oxide, is deposited over the conductor 260. For example, a structure may be employed in which a metal such as tungsten is used for the conductor 260 and an insulator such as aluminum oxide is stacked over the conductor 260. This structure can reduce entry of oxygen into the conductor 260 from above the insulator such as aluminum oxide, so that the conductor 260 can be prevented from being oxidized. Furthermore, oxygen entering the conductor 260 is reduced, so that more oxygen can be supplied to the oxide 230.

As in the insulator 224 and the like, the concentration of impurities such as hydrogen and water in a film is preferably reduced in the insulator 226, the insulator 227, the insulator 228, and the insulator 229 functioning as interlayer films. As described above, it is preferable that a material used for the insulator 226, the insulator 227, and the insulator 229 be different from a material used for the insulator 228. For example, it is preferable to use silicon oxide or silicon oxynitride for the insulator 226, the insulator 227, and the insulator 229 and to use aluminum oxide, silicon nitride, or hafnium oxide for the insulator 228. With such a structure, entry of impurities such as hydrogen and water into the transistor 200 from above the insulator 228 can be suppressed. In addition, oxygen in the transistor 200 can be prevented from being diffused into above the insulator 228.

Here, as illustrated in FIG. 1(B), the level of a top surface of the conductor 260 is preferably higher than the level of the top surfaces of the insulator 250, the oxide 230c, and the insulator 226. It is preferable that the insulator 227 and the insulator 228 be formed to cover the insulator 250, the oxide 230c, the top surface of the insulator 226, the top surface of the conductor 260, and a side surface of the conductor 260. The insulator 229 preferably has a thickness larger than at least the thickness of the insulator 227 and the thickness of the insulator 228. With the insulator 227, the insulator 228, and the insulator 229 having such structures, when opening treatment for forming the conductor 252 is performed on the insulator 226, the insulator 227, the insulator 228, and the insulator 229 by a dry etching method, the opening can be formed in a self-aligned manner so that the conductor 260 functioning as the first gate electrode is not penetrated. This will be described in detail later.

The conductor 252 (the conductor 252a and the conductor 252b) functioning as a plug for connecting the conductor 251 (the conductor 251a and the conductor 251b) functioning as the source electrode or the drain electrode to an upper wiring is formed in the opening provided in the insulator 226, the insulator 227, the insulator 228, and the insulator 229. As illustrated in FIG. 1(A) and FIG. 1(B), the conductor 252a and the conductor 252b are provided to face each other with the conductor 260 functioning as the first gate electrode sandwiched therebetween. Here, as illustrated in FIGS. 1(A) and 1(B), it is preferable that, when seen from above, the conductor 252a and the conductor 252b be provided to overlap with at least part of a region where the insulator 228 overlaps with the side surfaces of the conductor 260 with the insulator 227 therebetween. The above structure enables the space between the conductor 252a and the conductor 252b to be narrowed; thus, the transistor 200 can be miniaturized. Furthermore, even when the space between the conductor 252a and the conductor 252b is narrowed, the conductor 252a and the conductor 252b can be isolated from the conductor 260 functioning as the first gate electrode; thus, the transistor 200 can have favorable electrical characteristics. Note that the levels of the top surfaces of the conductor 252a, the conductor 252b, and the insulator 229 may be substantially the same as illustrated in FIG. 1(B).

The semiconductor device illustrated in FIG. 1 has the above-described structure; thus, the distance between the conductor 260 functioning as the first gate electrode and a region of the conductor 252a in contact with the conductor 251a, which face each other, can be substantially equal to the distance between the conductor 260 and a region of the conductor 252b in contact with the conductor 251b, which face each other. Thus, a miniaturized semiconductor device having favorable electrical characteristics can be manufactured with high accuracy and high yield. Note that a specific method for manufacturing the semiconductor device is described in detail later in <Manufacturing method 1 of semiconductor device>.

It is preferable to use a conductive material containing tungsten, copper, or aluminum as its main component for the conductor 252. The conductor 252 may have a stacked-layer structure; for example, a structure may be employed in which titanium, titanium nitride, or the like is deposited in contact with the inner wall of the opening provided in the insulator 226, the insulator 227, the insulator 228, and the insulator 229 and a top surface of the conductor 251, and the above conductive material is provided on the inner side.

In the case where the conductor 252 has a stacked-layer structure, a conductive material which has a function of inhibiting the passage of impurities such as hydrogen or water is preferably used for the conductor that is in contact with the inner wall of the opening provided in the insulator 226, the insulator 227, the insulator 228, and the insulator 229 and the top surface of the conductor 252, as in the conductor 205a and the like. For example, tantalum, tantalum nitride, titanium, titanium nitride, ruthenium, ruthenium oxide, or the like is preferably used. The conductive material which has a function of inhibiting the passage of impurities such as water or hydrogen may be a single layer or a stacked layer. With the use of the conductive material, impurities such as hydrogen or water can be prevented from entering the oxide 230 through the conductor 252a and the conductor 252b from a layer above the insulator 229.

Although not illustrated, conductors functioning as wirings may be provided in contact with the top surfaces of the conductor 252a and the conductor 252b. It is preferable to use a conductive material containing tungsten, copper, or aluminum as its main component for the conductor functioning as a wiring. The conductor may have a stacked-layer structure; for example, a stack of titanium or titanium nitride and the above conductive material may be employed. Note that like the conductor 203 or the like, the conductor may be formed to be embedded in an opening provided in an insulator.

The structure example of the semiconductor device including the transistor 200 of one embodiment of the present invention is described above. In order to achieve "manufacture of a semiconductor device that can be miniaturized", which is one of the problems to be solved by the present invention, not only miniaturization of the transistor (a reduction in the channel length, the channel width, or the like) included in the semiconductor device, but also a reduction in the space between plugs connecting a wiring and a source electrode or a drain electrode of the transistor, a reduction in the opening diameter of a contact hole for passing the plug, and the like are required, for example. The semiconductor device including the transistor 200 of one embodiment of the present invention has features such as no contact between the plug and the first gate electrode of the transistor even when the space between the plugs is narrowed, highly accurate formation of the plug, and a high degree of freedom in a manufacturing process. A specific manufacturing method of the semiconductor device is described in detail later in <Manufacturing method 1 of semiconductor device>; the semiconductor device including the transistor 200 of one embodiment of the present invention, which is a semiconductor device that can be miniaturized, can be manufactured with high yield.

Structure Example 2 of Semiconductor Device

An example of a semiconductor device including the transistor 200 of one embodiment of the present invention, which is different from the semiconductor device described in <Structure example 1 of semiconductor device>, will be described below.

Figure 2A:
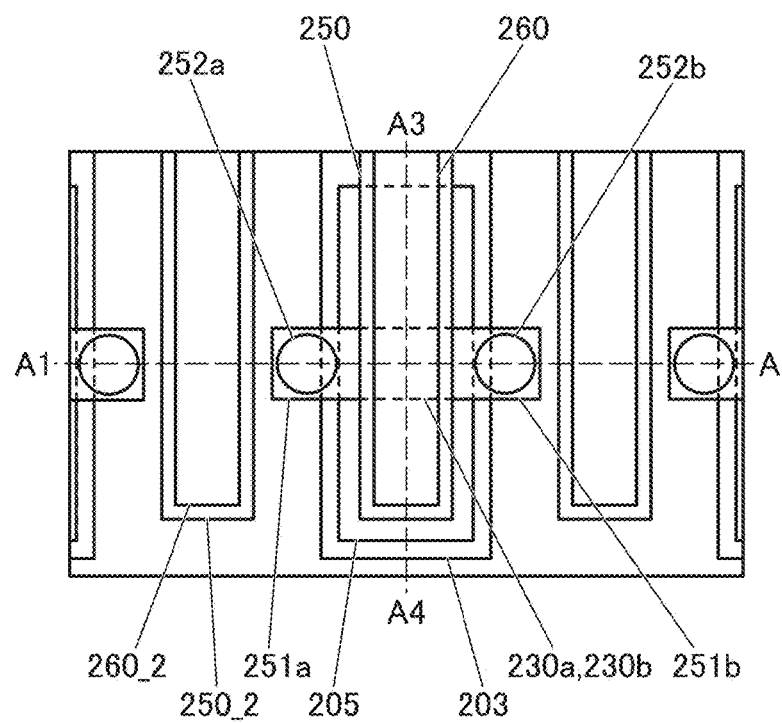
FIG. 2 A top view and cross-sectional views of a semiconductor device of one embodiment of the present invention.
Figure 2C:
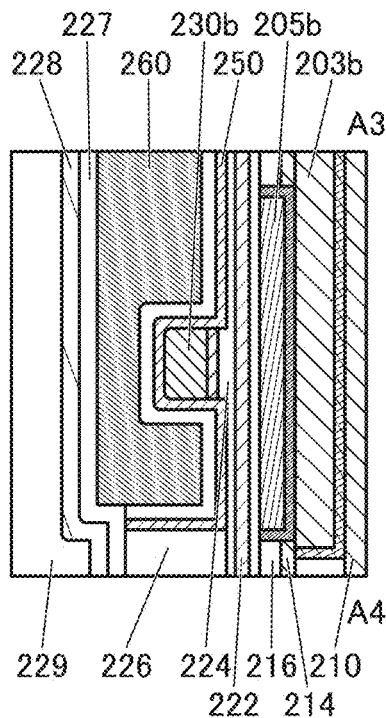
Figure 2B:
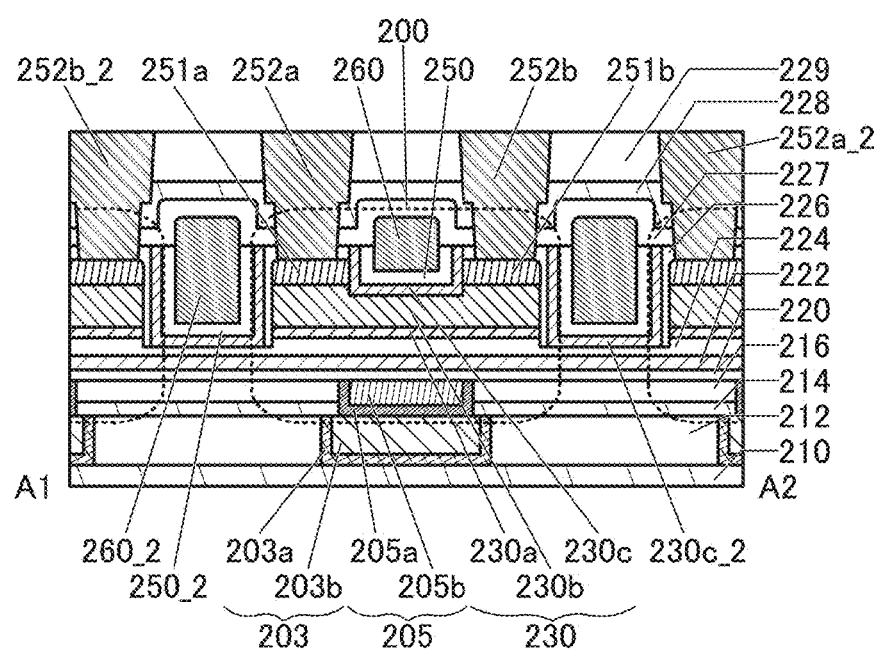

FIG. 2(A) is a top view of the semiconductor device including the transistor 200. FIG. 2(B) and FIG. 2(C) are cross-sectional views of the semiconductor device. FIG. 2(B) is a cross-sectional view of a portion indicated by dashed-dotted line A1-A2 in FIG. 2(A), which is a cross-sectional view of the transistor 200 in the channel length direction. FIG. 2(C) is a cross-sectional view of a portion indicated by dashed-dotted line A3-A4 in FIG. 2(A), which is a cross-sectional view of the transistor 200 in the channel width direction. For simplification of the drawing, some components are not illustrated in the top view of FIG. 2(A).

Note that in the semiconductor device illustrated in FIG. 2, components having the same functions as the components included in the semiconductor device described in <Structure example 1 of semiconductor device> are denoted by the same reference numerals. Portions different from those in the semiconductor device described in <Structure example 1 of semiconductor device> are described below, and description in <Structure example 1 of semiconductor device> can be referred to for the other portions.

The semiconductor device illustrated in FIG. 2 is different from the semiconductor device described in <Structure example 1 of semiconductor device> in that a plurality of transistors 200 are provided so as to be adjacent to each other in the channel length direction with an oxide 230c_2, an insulator 250_2, and a conductor 260_2 sandwiched therebetween, as illustrated in FIG. 2(A).

As illustrated in FIG. 2(B), the oxide 230c_2, the insulator 250_2, and the conductor 260_2 are formed in an opening provided in the insulator 226 and the insulator 224 and between the transistors 200 adjacent to each other in the channel length direction. Specifically, the oxide 230c_2 is formed in contact with an inner wall of the opening, the insulator 250_2 is formed inside thereof, and the conductor 260_2 is formed inside thereof. Here, it is preferable that the level of a top surface of the insulator 226, the level of a top surface of the oxide 230c_2, and the level of a top surface of the insulator 250_2 be substantially the same. It is preferable that the level of a top surface of the conductor 260_2 be higher than the levels of the top surfaces of the insulator 226, the oxide 230c_2, and the insulator 250_2, and substantially the same as the level of the top surface of the conductor 260.

The conductor 260 functions as the first gate electrode, while the conductor 260_2 has a function of isolating the transistors 200 adjacent to each other in the channel length direction to prevent contact therebetween. Note that the conductor 260_2 can be formed at the same time as and using the same material as the conductor 260 functioning as the first gate electrode, which is described later in <Manufacturing method 2 of semiconductor device>. Therefore, in this specification, the conductor 260_2 is referred to as a "dummy gate" in some cases.

The insulator 227 is provided over the insulator 226, the oxide 230c, the oxide 230c_2, the insulator 250, the insulator 250_2, the conductor 260, and the conductor 260_2, the insulator 228 is provided over the insulator 227, and the insulator 229 is provided over the insulator 228. Here, as illustrated in FIG. 2(B), the insulator 227 and the insulator 228 are preferably formed to cover the top surfaces of the oxide 230c, the oxide 230c_2, the insulator 250, the insulator 250_2, and the insulator 226, the top surfaces of the conductor 260 and the conductor 260_2, and side surfaces of the conductor 260 and the conductor 260_2. The insulator 229 preferably has a thickness larger than at least the thickness of the insulator 227 and the thickness of the insulator 228. With the insulator 227, the insulator 228, and the insulator 229 having such structures, when opening treatment for forming the conductor 252 is performed on the insulator 226, the insulator 227, the insulator 228, and the insulator 229 by a dry etching method, the opening can be formed in a self-aligned manner so that the conductor 260 functioning as the first gate electrode and the conductor 260_2 that is the dummy gate are not penetrated. This will be described in detail later.

As illustrated in FIG. 2(A) and FIG. 2(B), the conductor 252a and the conductor 252b are provided to face each other with the conductor 260 functioning as the first gate electrode sandwiched therebetween. The conductor 252a is provided to face a conductor 252b_2 functioning as a plug of the adjacent transistor with the conductor 260_2 that is the dummy gate sandwiched therebetween. The conductor 252b is provided to face a conductor 252a_2 functioning as a plug of the adjacent transistor with the conductor 260_2 that is the dummy gate sandwiched therebetween.

Here, as illustrated in FIGS. 2(A) and 2(B), it is preferable that, when seen from above, the conductor 252a and the conductor 252b be provided to overlap with at least part of a region where the insulator 228 overlaps with the side surfaces of the conductor 260 and the side surfaces of the conductor 260_2 with the insulator 227 therebetween. The above structure enables the space between the conductor 252a and the conductor 252b to be narrowed; thus, the transistor 200 can be miniaturized. In addition, the space between the transistors adjacent to each other in the channel length direction can be narrowed; thus, higher integration of the semiconductor device including the transistors 200 can be achieved. Furthermore, even when the space between the conductor 252a and the conductor 252b is narrowed, the conductor 252a and the conductor 252b can be isolated from the conductor 260 functioning as the first gate electrode; thus, the transistor 200 can have favorable electrical characteristics. In addition, the conductor 252a (the conductor 252b) and the conductor 252b_2 (the conductor 252a_2) can be isolated from the conductor 260_2 that is the dummy gate; thus, the transistors adjacent to each other in the channel length direction are not electrically short-circuited, and the semiconductor device including the transistors 200 can have favorable electrical characteristics. Note that the levels of top surfaces of the conductor 252a, the conductor 252b, the conductor 252a_2, the conductor 252b_2, and the insulator 229 may be substantially the same as illustrated in FIG. 2(B).

The semiconductor device illustrated in FIG. 2 has the above-described structure; thus, the distance between the conductor 260 functioning as the first gate electrode and a region of the conductor 252a in contact with the conductor 251a, which face each other, can be substantially equal to the distance between the conductor 260 and a region of the conductor 252b in contact with the conductor 251b, which face each other. Thus, a miniaturized and highly integrated semiconductor device having favorable electrical characteristics can be manufactured with high accuracy and high yield. Note that a specific method for manufacturing the semiconductor device is described in detail later in <Manufacturing method 2 of semiconductor device>.

The structure example of the semiconductor device including the transistors 200 of embodiments of the present invention, which is different from the semiconductor device described in <Structure example 1 of semiconductor device>, is described above. In order to achieve "manufacture of a semiconductor device that can be miniaturized", which is one of the problems to be solved by the present invention, not only miniaturization of the transistor (a reduction in the channel length, channel width, or the like) included in the semiconductor device, but also a reduction in the space between plugs connecting a wiring and a source electrode or a drain electrode of the transistor, a reduction in the opening diameter of a contact hole for passing the plug, and the like are required, for example. The semiconductor device including the transistors 200 of embodiments of the present invention has features such as no contact between the plug and the first gate electrode of the transistor even when the space between the plugs is narrowed, highly accurate formation of the plug, and a high degree of freedom in a manufacturing process.

In order to achieve "manufacture of a highly integrated semiconductor device", which is another one of the problems to be solved by the present invention, it is required to reduce, as much as possible, the space between adjacent transistors of a plurality of transistors included in the semiconductor device. The semiconductor device including the transistors 200 of embodiments of the present invention has features such as no contact between adjacent transistors owing to a dummy gate even when the space therebetween is narrowed, highly accurate formation of the dummy gate and the transistors adjacent to each other with the dummy gate sandwiched therebetween, and a high degree of freedom in a manufacturing process. A specific manufacturing method of the semiconductor device is described in detail later in <Manufacturing method 2 of semiconductor device>; the semiconductor device including the transistors 200 of embodiments of the present invention, which is a semiconductor device that can be miniaturized or highly integrated, can be manufactured with high yield.

Modification Example of Semiconductor Device

A semiconductor device including a transistor 200a and a transistor 200b of embodiments of the present invention is described below as a modification example of the semiconductor device described in <Structure example 2 of semiconductor device>.

Figure 31A:
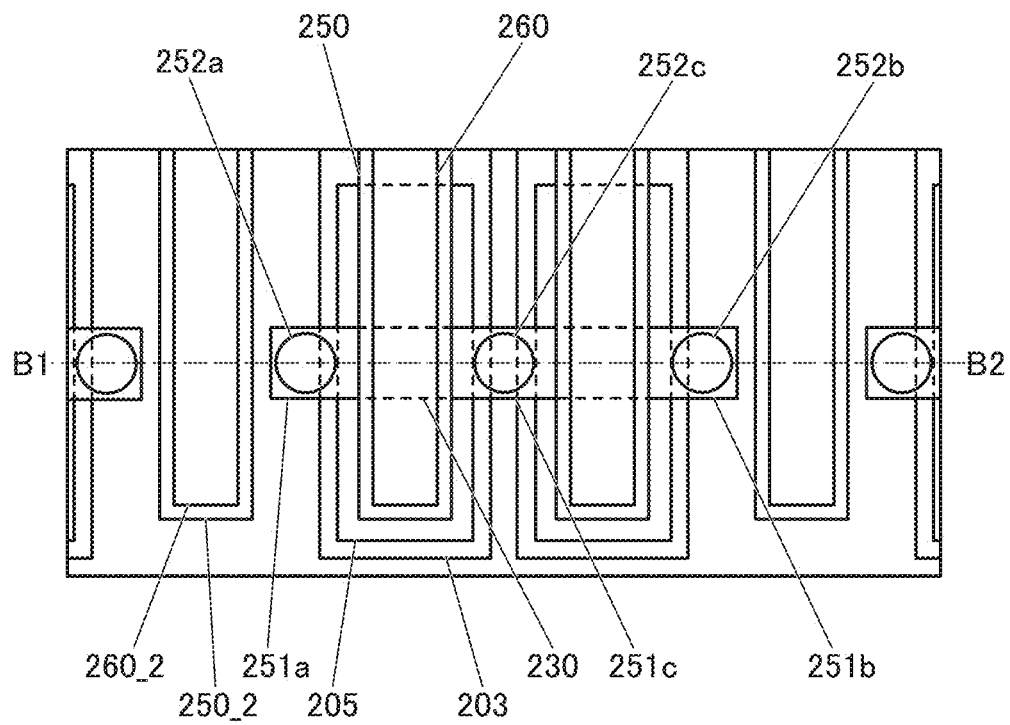
FIG. 31 A top view and a cross-sectional view of a semiconductor device of one embodiment of the present invention.
Figure 31B:
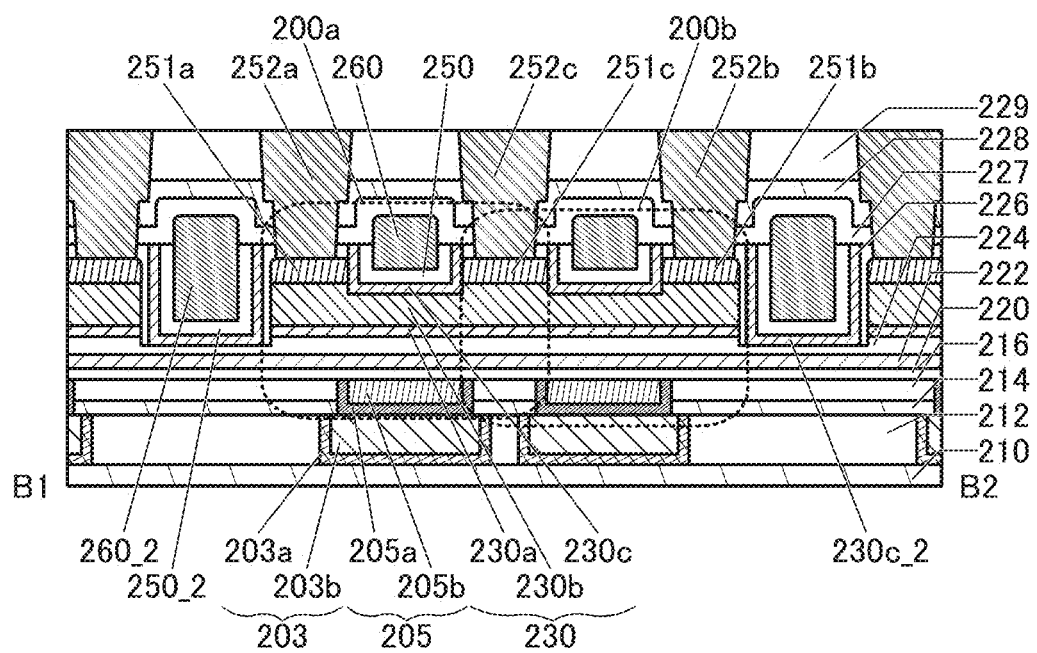

FIG. 31(A) is a top view of the semiconductor device including the transistor 200a and the transistor 200b. FIG. 31(B) is a cross-sectional view of a portion indicated by dashed-dotted line B1-B2 in FIG. 31(A), which is a cross-sectional view of the transistor 200a and the transistor 200b in the channel length direction. For simplification of the drawing, some components are not illustrated in the top view of FIG. 31(A).

Note that in the semiconductor device illustrated in FIG. 31, components having the same functions as the components included in the semiconductor device described in <Structure example 2 of semiconductor device> are denoted by the same reference numerals. Portions different from those in the semiconductor device described in <Structure example 2 of semiconductor device> are described below, and description in <Structure example 2 of semiconductor device> can be referred to for the other portions.

The semiconductor device illustrated in FIG. 31 is different from the semiconductor device including the transistors 200 described in <Structure example 2 of semiconductor device> in that the transistor 200a and the transistor 200b are included.

[Transistor 200a and Transistor 200b]

As illustrated in FIG. 31(B), the transistor 200a and the transistor 200b do not have independent structures, and share the conductor 251c as one of a source electrode and a drain electrode.

For example, when the conductor 251a functions as a source electrode of the transistor 200a and the conductor 251b functions as a source electrode of the transistor 200b, the conductor 251c can function as drain electrodes of both the transistor 200a and the transistor 200b. Similarly, for example, when the conductor 251a functions as the drain electrode of the transistor 200a and the conductor 251b functions as the drain electrode of the transistor 200b, the conductor 251c can function as the source electrodes of both the transistor 200a and the transistor 200b.

Note that whether the conductor 251c functions as the source electrodes or the drain electrodes of the transistor 200a and the transistor 200b can be freely changed depending on the relative relationship between the levels of potentials applied to the conductor 251a and the conductor 251b and the level of a potential applied to the conductor 251c. For example, when the transistor 200a and the transistor 200b are n-channel (p-channel) transistors, the potentials applied to the conductor 251a and the conductor 251b are higher than the potential applied to the conductor 251c, whereby the conductor 251c functions as the source electrodes (the drain electrodes) of the transistor 200a and the transistor 200b; the potentials applied to the conductor 251a and the conductor 251b are lower than the potential applied to the conductor 251c, whereby the conductor 251c functions as the drain electrodes (the source electrodes) of the transistor 200a and the transistor 200b.

As described above, the two different transistors of the transistor 200a and the transistor 200b share one source electrode or one drain electrode, whereby the transistor 200a and the transistor 200b can have reduced occupied areas than the transistor 200a and the transistor 200b having independent structures. In addition, owing to the reduced occupied areas of the transistor 200a and the transistor 200b, high integration of the semiconductor device including the transistor 200a and the transistor 200b can be achieved.

In FIG. 31, the conductor 252a and the conductor 252c each function as a plug for connecting the source electrode or the drain electrode (the conductor 251a or the conductor 251c) of the transistor 200a and an upper wiring (not illustrated), and the conductor 252b and the conductor 252c each function as a plug for connecting the source electrode or the drain electrode (the conductor 251b or the conductor 251c) of the transistor 200b and an upper wiring (not illustrated).

For example, in the case where the conductor 251c functions as the source electrodes of the transistor 200a and the transistor 200b, the conductor 252a and the conductor 252b electrically connected to the drain electrodes (the conductor 251a and the conductor 251b) of the transistor 200a and the transistor 200b are electrically connected to each other in an upper layer (not illustrated), for example, so that drain currents of the transistor 200a and the transistor 200b can be detected as a total value at a time. In contrast, for example, in the case where the conductor 251c functions as the drain electrodes of the transistor 200a and the transistor 200b, the conductor 252a and the conductor 252b electrically connected to the source electrodes (the conductor 251a and the conductor 251b) of the transistor 200a and the transistor 200b are electrically connected to each other in an upper layer (not illustrated), for example, so that a common potential can be applied to the source electrodes of the transistor 200a and the transistor 200b at a time and the total value of drain currents of the transistor 200a and the transistor 200b can be detected from only one conductor 252c. Since the semiconductor device has the above structure, a high degree of integration of the semiconductor device can be maintained even in the case where the number of transistors is increased to obtain large current. Note that the conductor 252a and the conductor 252b are not necessarily electrically connected to each other in an upper layer and may be controlled independently.

Note that the semiconductor device illustrated in FIG. 31 has a structure in which two transistors (the transistor 200a and the transistor 200b) are provided between two dummy gates (the conductors 260_2) in the channel length direction; however, the modification example of the semiconductor device of one embodiment of the present invention is not limited to this. The semiconductor device of one embodiment of the present invention may have a structure in which three or more transistors are provided between two dummy gates in the channel length direction.

For example, in the case where a plurality of transistors existing between two dummy gates (the conductors 260_2) in the channel length direction function as one "cell", the semiconductor device illustrated in FIG. 31 can be said to function as a "cell array" including a plurality of "cells" separated by a plurality of dummy gates. In that case, as the number of transistors included in the "cell" becomes larger, an output current per "cell" (i.e., the total value of drain currents of the plurality of transistors included in the "cell") can become larger.

Needless to say, as the number of transistors included in the "cell" becomes larger, the "cell size" becomes larger; however, as described above, the transistor 200 (or the transistor 200a and the transistor 200b) of one embodiment of the present invention can be miniaturized or highly integrated. Accordingly, although the number of transistors included in the "cell" becomes larger, a significant increase in the "cell size" can be suppressed, and the semiconductor device including the "cell" can be miniaturized or highly integrated.

As described above, the semiconductor device illustrated in FIG. 31, which can achieve miniaturization or high integration that is one of the problems to be solved by the present invention, can be provided with high yield.

An example of a semiconductor device of one embodiment of the present invention is not limited to the semiconductor devices described above (see FIG. 1, FIG. 2, and FIG. 31). In a semiconductor device of one embodiment of the present invention, the structures of the respective semiconductor devices described above can be used in combination as appropriate.

<Components of Semiconductor Device>

Components that can be used in the semiconductor devices (see FIG. 1, FIG. 2, and FIG. 31) including the transistor 200 (or the transistor 200a and the transistor 200b) of one embodiment of the present invention will be described in detail below.

[Substrate]

As a substrate over which the transistor 200 (or the transistor 200a and the transistor 200b) is formed, for example, an insulator substrate, a semiconductor substrate, or a conductor substrate may be used. Examples of the insulator substrate include a glass substrate, a quartz substrate, a sapphire substrate, a stabilized zirconia substrate (an yttria-stabilized zirconia substrate or the like), and a resin substrate. Examples of the semiconductor substrate include a semiconductor substrate of silicon, germanium, or the like, and a compound semiconductor substrate of silicon carbide, silicon germanium, gallium arsenide, indium phosphide, zinc oxide, or gallium oxide. Moreover, a semiconductor substrate in which an insulator region is provided in the above semiconductor substrate, for example, an SOI (Silicon On Insulator) substrate is given. Examples of the conductor substrate include a graphite substrate, a metal substrate, an alloy substrate, and a conductive resin substrate. Alternatively, a substrate including a metal nitride, a substrate including a metal oxide, or the like is given. Furthermore, a substrate which is an insulator substrate provided with a conductor or a semiconductor, a substrate which is a semiconductor substrate provided with a conductor or an insulator, a substrate which is a conductor substrate provided with a semiconductor or an insulator, or the like may be used. Alternatively, any of these substrates over which an element is provided may be used. Examples of the element provided over the substrate include a capacitor, a resistor, a switching element, a light-emitting element, and a memory element.

Alternatively, a flexible substrate may be used as the substrate. Note that as a method for providing a transistor over a flexible substrate, there is a method in which the transistor is formed over a non-flexible substrate and then the transistor is separated and transferred to the substrate which is a flexible substrate. In that case, a separation layer is preferably provided between the non-flexible substrate and the transistor. Note that as the substrate, a sheet, a film, a foil, or the like that contains a fiber may be used. The substrate may have elasticity. The substrate may have a property of returning to its original shape when bending or pulling is stopped. Alternatively, the substrate may have a property of not returning to its original shape. The substrate has a region with a thickness of, for example, greater than or equal to 5 μm and less than or equal to 700 μm, preferably greater than or equal to 10 μm and less than or equal to 500 μm, further preferably greater than or equal to 15 μm and less than or equal to 300 μm. When the substrate has a small thickness, the weight of the semiconductor device including the transistor can be reduced. When the substrate has a small thickness, even in the case of using glass or the like, the substrate may have elasticity or a property of returning to its original shape when bending or pulling is stopped. Therefore, an impact or the like applied to the semiconductor device over the substrate due to dropping or the like can be reduced. That is, a durable semiconductor device can be provided.

For the substrate which is a flexible substrate, metal, an alloy, resin, glass, or fiber thereof can be used, for example. The substrate which is a flexible substrate preferably has a lower coefficient of linear expansion because deformation due to an environment is inhibited. For the substrate which is a flexible substrate, for example, a material whose coefficient of linear expansion is lower than or equal to $1 \times 10^{-3}$/K, lower than or equal to $5 \times 10^{-5}$/K, or lower than or equal to $1 \times 10^{-5}$/K is used. Examples of the resin include polyester, polyolefin, polyamide (nylon, aramid, or the like), polyimide, polycarbonate, and acrylic. In particular, aramid is favorably used for the substrate which is a flexible substrate because of its low coefficient of linear expansion.

[Insulator]

Examples of an insulator include an oxide, a nitride, an oxynitride, a nitride oxide, a metal oxide, a metal oxynitride, and a metal nitride oxide, each of which has an insulating property.

Here, when a high-k material having a high relative permittivity is used for the insulator functioning as the gate insulator, for the insulator functioning as the gate insulator, miniaturization and high integration of the transistor can be achieved. In contrast, when a material having a low relative permittivity is used for the insulator functioning as an interlayer film, the parasitic capacitance generated between the wirings can be reduced. Therefore, a material is preferably selected depending on the function of the insulator.

Moreover, as the insulator having a high relative permittivity, gallium oxide, hafnium oxide, zirconium oxide, aluminum oxide, silicon nitride, an oxide containing aluminum and hafnium, an oxynitride containing aluminum and hafnium, an oxide containing silicon and hafnium, an oxynitride containing silicon and hafnium, a nitride containing silicon and hafnium, or the like can be given.

Furthermore, as the insulator having a low relative permittivity, silicon oxide, silicon oxynitride, silicon nitride oxide, silicon oxide to which fluorine is added, silicon oxide to which carbon is added, silicon oxide to which carbon and nitrogen are added, porous silicon oxide, a resin, or the like can be given.

In particular, silicon oxide and silicon oxynitride are thermally stable. Accordingly, a stacked-layer structure which is thermally stable and has a low relative permittivity can be obtained by combination with a resin, for example. Examples of the resin include polyester, polyolefin, polyamide (nylon, aramid, or the like), polyimide, polycarbonate, and acrylic. Furthermore, combination of silicon oxide or silicon oxynitride with an insulator with a high relative permittivity allows the stacked-layer structure to be thermally stable and have a high relative permittivity, for example.

In addition, when the transistor using a metal oxide is surrounded by an insulator which has a function of inhibiting the passage of oxygen and impurities such as hydrogen, the electrical characteristics of the transistor can be stabilized.

As the insulator which has a function of inhibiting the passage of oxygen and impurities such as hydrogen, for example, a single layer or a stacked layer of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator which has a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide, silicon nitride oxide, silicon nitride, or the like can be used.

For example, an insulator which has a function of inhibiting the passage of oxygen and impurities such as hydrogen is used for each of the insulator 228, the insulator 222, the insulator 214, and the insulator 210. Note that the insulator 228, the insulator 222, the insulator 214, and the insulator 210 preferably include aluminum oxide, silicon nitride, hafnium oxide, or the like.

As the insulator 212, the insulator 216, the insulator 220, the insulator 224, the insulator 226, the insulator 250 (and the insulator 250_2), the insulator 227, and the insulator 229, for example, a single layer or a stacked layer of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, silicon oxide, silicon oxynitride, or silicon nitride is preferably included.

For example, when aluminum oxide, gallium oxide, or hafnium oxide in each of the insulator 224 and the insulator 250 functioning as gate insulators is in contact with the oxide 230, entry of silicon contained in silicon oxide or silicon oxynitride into the oxide 230 can be inhibited. In contrast, when silicon oxide or silicon oxynitride in each of the insulator 224 and the insulator 250 (and the insulator 250_2) is in contact with the oxide 230, trap centers might be formed at an interface between aluminum oxide, gallium oxide, or hafnium oxide and silicon oxide or silicon oxynitride. The trap centers can shift Vth of the transistor in the positive direction by trapping electrons in some cases.

The insulator 212, the insulator 216, the insulator 226, the insulator 227, and the insulator 229 preferably include an insulator with a low relative permittivity. For example, the insulator 212, the insulator 216, the insulator 226, the insulator 227, and the insulator 229 preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or a resin. Alternatively, the insulator 212, the insulator 216, the insulator 226, the insulator 227, and the insulator 229 preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. Because silicon oxide and silicon oxynitride are thermally stable, combination with a resin allows the stacked-layer structure to be thermally stable and have a low relative permittivity. Examples of the resin include polyester, polyolefin, polyamide (nylon, aramid, or the like), polyimide, polycarbonate, and acrylic.

[Conductor]

For the conductor, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Alternatively, a semiconductor having a high electric conductivity, typified by polycrystalline silicon containing an impurity element such as phosphorus, or silicide such as nickel silicide may be used.

Furthermore, a stack of a plurality of conductive layers formed with the above materials may be used. For example, a stacked-layer structure in which a material containing the above-described metal element and a conductive material containing oxygen are combined may be used. Alternatively, a stacked-layer structure in which a material containing the above-described metal element and a conductive material containing nitrogen are combined may be used. Alternatively, a stacked-layer structure in which a material containing the above-described metal element, a conductive material containing oxygen, and a conductive material containing nitrogen are combined may be used.

Note that when a metal oxide is used for the channel formation region of the transistor, a stacked-layer structure in which a material containing the above-described metal element and a conductive material containing oxygen are combined is preferably used for the conductor functioning as the gate electrode. In this case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in the metal oxide in which a channel is formed. Moreover, a conductive material containing the above-described metal element and nitrogen may be used. For example, a conductive material containing nitrogen such as titanium nitride or tantalum nitride may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. By using such a material, hydrogen contained in the metal oxide in which a channel is formed can be trapped in some cases. Alternatively, hydrogen entering from an external insulator or the like can be trapped in some cases.

For the conductor 260 (and the conductor 260_2), the conductor 203a, the conductor 203b, the conductor 205a, the conductor 205b, the conductor 251a and the conductor 251b (and the conductor 251c), and the conductor 252a and the conductor 252b (and the conductor 252a2, the conductor 252b_2, and the conductor 252c), a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Alternatively, a semiconductor having a high electric conductivity, typified by polycrystalline silicon containing an impurity element such as phosphorus, or silicide such as nickel silicide may be used.

[Oxide]

For the oxide 230a, the oxide 230b, and the oxide 230c, a metal oxide functioning as an oxide semiconductor (hereinafter also referred to as an oxide semiconductor) is preferably used. A metal oxide that can be used for the oxide 230a, the oxide 230b, and the oxide 230c of one embodiment of the present invention will be described below.

A metal oxide preferably contains at least indium or zinc. In particular, indium and zinc are preferably contained. In addition, aluminum, gallium, yttrium, tin, or the like is preferably contained. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide that contains indium, the element M, and zinc is considered. Note that the element M is aluminum, gallium, yttrium, tin, or the like. Other elements that can be used as the element M include boron, titanium, iron, nickel, germanium, zirconium, molybdenum, lanthanum, cerium, neodymium, hafnium, tantalum, tungsten, and magnesium. Note that a plurality of elements described above may be combined as the element M.

Note that in this specification and the like, a metal oxide containing nitrogen is also called a metal oxide in some cases. Alternatively, a metal oxide containing nitrogen may be called a metal oxynitride.

[Composition of Metal Oxide]

Described below is the composition of a CAC (Cloud-Aligned Composite)-OS applicable to a transistor disclosed in one embodiment of the present invention.

Note that in this specification and the like, CAAC (c-axis aligned crystal) and CAC (Cloud-Aligned Composite) might be stated. Note that CAAC refers to an example of a crystal structure, and CAC refers to an example of a function or a material composition.

A CAC-OS or a CAC-metal oxide has a conducting function in a part of the material and an insulating function in another part of the material, and has a function of a semiconductor as the whole material. Note that in the case where the CAC-OS or the CAC-metal oxide is used for a channel formation region of a transistor, the conducting function is to allow electrons (or holes) serving as carriers to flow, and the insulating function is to not allow electrons serving as carriers to flow. By the complementary action of the conducting function and the insulating function, the CAC-OS or the CAC-metal oxide can have a switching function (On/Off function). In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC-metal oxide, the conductive regions and the insulating regions each have a size of greater than or equal to 0.5 nm and less than or equal to 10 nm, preferably greater than or equal to 0.5 nm and less than or equal to 3 nm and are dispersed in the material, in some cases.

Moreover, the CAC-OS or the CAC-metal oxide includes components having different bandgaps. For example, the CAC-OS or the CAC-metal oxide includes a component having a wide gap due to the insulating region and a component having a narrow gap due to the conductive region. When carriers flow in this composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or CAC-metal oxide is used for a channel formation region of a transistor, high current drive capability in the on state of the transistor, that is, a high on-state current and high field-effect mobility, can be obtained.

In other words, the CAC-OS or the CAC-metal oxide can also be called a matrix composite or a metal matrix composite.

[Structure of Metal Oxide]

Metal oxides (oxide semiconductors) are classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the plurality of nanocrystals are connected.

The nanocrystal is basically a hexagon but is not always a regular hexagon and is a non-regular hexagon in some cases. A pentagonal lattice arrangement, a heptagonal lattice arrangement, and the like are included in the distortion in some cases. Note that a clear crystal grain boundary (also referred to as a grain boundary) cannot be observed even in the vicinity of distortion in the CAAC-OS. That is, it can be seen that formation of a crystal grain boundary is inhibited due to the distortion of lattice arrangement. This is probably because the CAAC-OS can tolerate distortion owing to a low density of oxygen atom arrangement in the a-b plane direction, a change in interatomic bond distance by substitution of a metal element, and the like.

In addition, the CAAC-OS tends to have a layered crystal structure (also referred to as a layered structure) in which a layer containing indium and oxygen (hereinafter, In layer) and a layer containing the element M, zinc, and oxygen (hereinafter, (M, Zn) layer) are stacked. Note that indium and the element M can be replaced with each other, and when the element M of the (M, Zn) layer is replaced by indium, the layer can also be represented as an (In, M, Zn) layer. When indium of the In layer is replaced by the element M, the layer can also be represented as an (In, M) layer.

The CAAC-OS is a metal oxide having high crystallinity. In contrast, it can be said that in the CAAC-OS, a reduction in the electron mobility due to the crystal grain boundary is less likely to occur because a clear crystal grain boundary cannot be observed. Since the crystallinity of a metal oxide might be decreased due to entry of impurities, formation of defects, or the like, it can be said that the CAAC-OS is a metal oxide that has small amounts of impurities and defects (oxygen vacancies or the like). Thus, a metal oxide including a CAAC-OS is physically stable. Therefore, the metal oxide including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide semiconductor depending on an analysis method.

The a-like OS is a metal oxide that has a structure intermediate between those of the nc-OS and the amorphous oxide semiconductor. The a-like OS has a void or a low-density region. That is, the a-like OS has lower crystallinity than the nc-OS and the CAAC-OS.

Metal oxides have various structures with different properties. Two or more kinds of the amorphous oxide semiconductor, the polycrystalline oxide semiconductor, the a-like OS, the nc-OS, and the CAAC-OS may be included in the metal oxide of one embodiment of the present invention.

[Transistor Including Metal Oxide]

Next, the case where the metal oxide is used for a channel formation region of a transistor will be described.

Note that when the metal oxide is used for a channel formation region of a transistor, the transistor can have high field-effect mobility. In addition, the transistor can have high reliability.

Moreover, a metal oxide with low carrier density is preferably used for the transistor. In order to reduce the carrier density of a metal oxide film, the concentration of impurities in the metal oxide film is reduced so that the density of defect states is reduced. In this specification and the like, a state with a low impurity concentration and a low density of defect states is referred to as a highly purified intrinsic or substantially highly purified intrinsic state. The metal oxide has, for example, a carrier density lower than $8\times10^{11}/cm^3$, preferably lower than $1\times10^{11}/cm^3$, and further preferably lower than $1\times10^{10}/cm^3$, and higher than or equal to $1\times10^{-9}/cm^3$.

Furthermore, a highly purified intrinsic or substantially highly purified intrinsic metal oxide film has a low density of defect states and accordingly has a low density of trap states in some cases.

In addition, charges trapped by the trap states in the metal oxide take a long time to disappear and may behave like fixed charges. Thus, a transistor using the metal oxide having a high density of trap states for a channel formation region has unstable electrical characteristics in some cases.

Thus, in order to stabilize electrical characteristics of the transistor, it is effective to reduce the concentration of impurities in the metal oxide. In addition, in order to reduce the concentration of impurities in the metal oxide, the concentration of impurities in an adjacent film is also preferably reduced. Examples of the impurities include hydrogen, nitrogen, alkali metal, alkaline earth metal, iron, nickel, and silicon.

[Impurity]

Here, the influence of impurities in the metal oxide will be described.

When silicon or carbon that is one of Group 14 elements is contained in the metal oxide, defect states are formed in the metal oxide. Thus, the concentration of silicon or carbon in the metal oxide and the concentration of silicon or carbon in the vicinity of an interface with the metal oxide (the concentration obtained by secondary ion mass spectrometry (SIMS)) is set to be lower than or equal to $2\times10^{18}$ atoms/cm$^3$, preferably lower than or equal to $2\times10^{17}$ atoms/cm$^3$.

When the metal oxide contains an alkali metal or an alkaline earth metal, defect states are formed in the metal oxide and carriers are generated in some cases. Thus, a transistor using a metal oxide that contains an alkali metal or an alkaline earth metal for a channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide, which is measured by SIMS, is set to be lower than or equal to $1\times10^{18}$ atoms/cm$^3$, preferably lower than or equal to $2\times10^{16}$ atoms/cm$^3$.

Furthermore, when the metal oxide contains nitrogen, the metal oxide easily becomes n-type by generation of electrons serving as carriers and an increase in carrier density. As a result, a transistor using a metal oxide that contains nitrogen for a channel formation region is likely to have normally-on characteristics. For this reason, nitrogen in the metal oxide is preferably reduced as much as possible. For example, the nitrogen concentration of the metal oxide measured by SIMS is set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in a metal oxide reacts with oxygen bonded to a metal atom to be water, and thus forms an oxygen vacancy in the metal oxide in some cases. Entry of hydrogen into the vacancy generates an electron serving as a carrier in some cases. Furthermore, in some cases, bonding of part of hydrogen to oxygen bonded to a metal atom causes generation of an electron serving as a carrier. Accordingly, a transistor using a metal oxide that contains hydrogen for a channel formation region is likely to have normally-on characteristics. For this reason, hydrogen in the metal oxide is preferably reduced as much as possible. Specifically, the hydrogen concentration of the metal oxide measured by SIMS is set to be lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When a metal oxide with sufficiently reduced impurities is used for a channel formation region of a transistor, the transistor can have stable electrical characteristics.

<Manufacturing Method 1 of Semiconductor Device>

An example of a method for manufacturing the semiconductor device including the transistor 200 of one embodiment of the present invention, which is described in <Structure example 1 of semiconductor device>, will be described below with reference to FIG. 3 to FIG. 16. Note that figures (A) in FIG. 3 to FIG. 11 and FIG. 13 are each a top view of the semiconductor device including the transistor 200. Figures (B) and (C) are cross-sectional views of the semiconductor device. Here, the figure (B) is a cross-sectional view of a portion indicated by dashed-dotted line A1-A2 in the figure (A), which is a cross-sectional view of the transistor 200 in the channel length direction. The figure (C) is a cross-sectional view of a portion indicated by dashed-dotted line A3-A4 in the figure (A), which is a cross-sectional view of the transistor 200 in the channel width direction. Note that in the manufacturing method of a semiconductor device described below, the description in <Components of semiconductor device> can be referred to for specific materials of components (e.g., a substrate, an insulator, a conductor, and an oxide) that can be used for the semiconductor device.

First, a substrate (not illustrated) is prepared, and the insulator 210 is deposited over the substrate. The insulator 210 can be deposited by a sputtering method, a chemical vapor deposition (CVD) method, a molecular beam epitaxy (MBE) method, a pulsed laser deposition (PLD) method, an atomic layer deposition (ALD) method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas.

A plasma enhanced CVD method can provide a high-quality film at a relatively low temperature. Furthermore, a thermal CVD method is a deposition method that does not use plasma and thus enables less plasma damage to an object. For example, a wiring, an electrode, an element (e.g., transistor or capacitor), or the like included in a semiconductor device might be charged up by receiving electric charges from plasma. In that case, accumulated electric charges might break the wiring, electrode, element, or the like included in the semiconductor device. Such plasma damage is not caused in the case of a thermal CVD method that does not use plasma, and thus the yield of a semiconductor device can be increased. In addition, since plasma damage does not occur in the deposition by a thermal CVD method, a film with few defects can be obtained.

An ALD method is also a deposition method that causes less plasma damage to an object. Since plasma damage does not occur in the deposition by an ALD method as well as a thermal CVD method, a film with few defects can be obtained.

Unlike in a deposition method in which particles ejected from a target or the like are deposited, in a CVD method and an ALD method, a film is formed by reaction at a surface of an object. Thus, a CVD method and an ALD method are deposition methods which are less likely to be influenced by the shape of an object and enable favorable step coverage. In particular, an ALD method enables excellent step coverage and excellent thickness uniformity and can be favorably used for covering a surface of an opening portion with a high aspect ratio, for example. On the other hand, an ALD method has a relatively low deposition rate; thus, it is sometimes preferable to combine an ALD method with another deposition method with a high deposition rate such as a CVD method.

In a CVD method and an ALD method, composition of a film to be obtained can be controlled with a flow rate ratio of the source gases. For example, by a CVD method and an ALD method, a film with a certain composition can be deposited depending on a flow rate ratio of the source gases. Moreover, in a CVD method and an ALD method, by changing the flow rate ratio of the source gases while depositing a film, a film whose composition is continuously changed can be deposited, for example. In the case where deposition is performed while the flow rate ratio of the source gases is changed, time taken for the deposition can be shortened as compared to the case where the film is deposited using a plurality of deposition chambers, because time taken for transfer and pressure adjustment is not needed. Thus, the productivity of semiconductor devices can be improved in some cases.

In this embodiment, for the insulator 210, aluminum oxide is deposited by a sputtering method. The insulator 210 may have a multilayer structure. For example, a structure may be employed in which aluminum oxide is deposited by a sputtering method and another aluminum oxide is deposited by an ALD method over the aluminum oxide. Alternatively, a structure may be employed in which aluminum oxide is deposited by an ALD method and another aluminum oxide is deposited by a sputtering method over the aluminum oxide.

Next, the insulator 212 is deposited over the insulator 210. The insulator 212 can be deposited by a sputtering method, a CVD method, an MBE method, a PLD method, an ALD method, or the like. In this embodiment, as the insulator 212, silicon oxide is deposited by a CVD method. Note that other than silicon oxide, silicon oxynitride may be used for the insulator 212, for example.

Then, an opening reaching the insulator 210 is formed in the insulator 212. Here, examples of the opening include a groove and a slit. A region where an opening is formed may be referred to as an opening portion. A wet etching method may be used for forming the opening; however, a dry etching method is more suitable for microfabrication. An insulator that serves as an etching stopper film used in forming the opening by etching the insulator 212 is preferably selected for the insulator 210. For example, in the case where a silicon oxide film is used as the insulator 212 in which the opening is formed, a silicon nitride film, an aluminum oxide film, or a hafnium oxide film is preferably used as the insulator 210.

After the formation of the opening, a conductor to be the conductor 203a is deposited. The conductor preferably contains a conductor which has a function of inhibiting the passage of oxygen. For example, tantalum nitride, tungsten nitride, or titanium nitride can be used. Alternatively, a stacked-layer film with tantalum, tungsten, titanium, molybdenum, aluminum, copper, or a molybdenum-tungsten alloy can be used. The conductor to be the conductor 203a can be deposited by a sputtering method, a CVD method, an MBE method, a PLD method, an ALD method, or the like.

In this embodiment, for the conductor to be the conductor 203a, tantalum nitride or a stacked film of tantalum nitride and titanium nitride thereover is formed by a sputtering method. Even when a metal that is easily diffused, such as copper, is used for the conductor 203b described later, the use of such a metal nitride for the conductor 203a can prevent the metal from being diffused into the outside from the conductor 203a.

Next, a conductor to be the conductor 203b is deposited over the conductor to be the conductor 203a. The conductor can be deposited by a sputtering method, a CVD method, an MBE method, a PLD method, an ALD method, or the like. In this embodiment, for the conductor to be the conductor 203b, a low-resistance conductive material such as copper is deposited.

Next, CMP (Chemical Mechanical Polishing) treatment is performed, so that the conductor to be the conductor 203a and the conductor to be the conductor 203b are partly removed and the insulator 212 is exposed. As a result, the conductor to be the conductor 203a and the conductor to be the conductor 203b remain only in the opening portion. Thus, the conductor 203 including the conductor 203a and the conductor 203b, which has a flat top surface, can be formed (see FIG. 3). Note that the insulator 212 is partly removed by the CMP treatment in some cases.

Next, the insulator 214 is deposited over the insulator 212 and the conductor 203. The insulator 214 can be deposited by a sputtering method, a CVD method, an MBE method, a PLD method, an ALD method, or the like. In this embodiment, for the insulator 214, silicon nitride is deposited by a CVD method. In this manner, even when a metal that is easily diffused, such as copper, is used for the conductor 203b, the use of an insulator through which copper is less likely to pass, such as silicon nitride, for the insulator 214 can prevent the metal from being diffused into a layer above the insulator 214.

Next, the insulator 216 is deposited over the insulator 214. The insulator 216 can be deposited by a sputtering method, a CVD method, an MBE method, a PLD method, an ALD method, or the like. In this embodiment, for the insulator 216, silicon oxide is deposited by a CVD method. Note that other than silicon oxide, silicon oxynitride may be used for the insulator 216, for example.

Then, an opening reaching the conductor 203 is formed in the insulator 214 and the insulator 216. A wet etching method may be used for forming the opening; however, a dry etching method is more suitable for microfabrication.

After the formation of the opening, a conductor to be the conductor 205a is deposited. The conductor to be the conductor 205a preferably contains a conductive material which has a function of inhibiting the passage of oxygen. For example, tantalum nitride, tungsten nitride, or titanium nitride can be used. Alternatively, a stacked-layer film with tantalum, tungsten, titanium, molybdenum, aluminum, copper, or a molybdenum-tungsten alloy can be used. The conductor to be the conductor 205a can be deposited by a sputtering method, a CVD method, an MBE method, a PLD method, an ALD method, or the like.

In this embodiment, tantalum nitride is deposited by a sputtering method for the conductor to be the conductor 205a.

Next, a conductor to be the conductor 205b is deposited over the conductor to be the conductor 205a. The conductor can be deposited by a sputtering method, a CVD method, an MBE method, a PLD method, an ALD method, or the like In this embodiment, for the conductor to be the conductor 205b, titanium nitride is deposited by an ALD method and tungsten is deposited by a CVD method over titanium nitride.

Next, CMP treatment is performed, so that the conductor to be the conductor 205a and the conductor to be the conductor 205b are partly removed and the insulator 216 is exposed. As a result, the conductor to be the conductor 205a and the conductor to be the conductor 205b remain only in the opening portion. Thus, the conductor 205 including the conductor 205a and the conductor 205b, which has a flat top surface, can be formed (see FIG. 3). Note that the insulator 216 is partly removed by the CMP treatment in some cases.

Next, the insulator 220 is deposited over the insulator 216 and the conductor 205. The insulator 220 can be deposited by a sputtering method, a CVD method, an MBE method, a PLD method, an ALD method, or the like. In this embodiment, for the insulator 220, silicon oxide is deposited by a CVD method. Note that other than silicon oxide, silicon oxynitride may be used for the insulator 220, for example.

Next, the insulator 222 is deposited over the insulator 220. The insulator 222 can be deposited by a sputtering method, a CVD method, an MBE method, a PLD method, an ALD method, or the like.

It is particularly preferable that hafnium oxide be deposited for the insulator 222 by an ALD method. Hafnium oxide deposited by an ALD method has a barrier property against oxygen, hydrogen, and water. When the insulator 222 has a barrier property against hydrogen and water, hydrogen and water contained in structure bodies provided around the transistor 200 are not diffused into the transistor 200, and generation of oxygen vacancies in the oxide 230 can be inhibited.

Next, the insulator 224 is deposited over the insulator 222. The insulator 224 can be deposited by a sputtering method, a CVD method, an MBE method, a PLD method, an ALD method, or the like. In this embodiment, for the insulator 224, silicon oxide is deposited by a CVD method. Note that other than silicon oxide, silicon oxynitride may be used for the insulator 224, for example.

Next, first heat treatment is preferably performed. The first heat treatment may be performed at higher than or equal to 250° C. and lower than or equal to 650° C., preferably higher than or equal to 300° C. and lower than or equal to 500° C., further preferably higher than or equal to 320° C. and lower than or equal to 450° C. The first heat treatment is performed in a nitrogen or inert gas atmosphere, or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in a nitrogen or inert gas atmosphere first, and then heat treatment is successively performed in an atmosphere containing an oxidizing gas at 10 ppm or more, 1% or more, or 10% or more in order to compensate for released oxygen.

By the above heat treatment, impurities such as hydrogen and water contained in the insulator 224 can be removed, for example.

Alternatively, as the first heat treatment, plasma treatment using oxygen may be performed under a reduced pressure. The plasma treatment using oxygen is preferably performed using an apparatus including a power source for generating high-density plasma using microwaves, for example. Alternatively, a power source for applying an RF (Radio Frequency) to a substrate side may be included. The use of high-density plasma enables high-density oxygen radicals to be produced, and application of an RF to a substrate side allows the oxygen radicals produced by the high-density plasma to be efficiently introduced into the insulator 224. Alternatively, after plasma treatment using an inert gas is performed with this apparatus, plasma treatment using oxygen may be performed to compensate for released oxygen. Note that the first heat treatment is not necessarily performed in some cases.

This heat treatment can also be performed after the deposition of the insulator 220 and after the deposition of the insulator 222. Although the conditions for the above-described heat treatment can be used for the heat treatment, the heat treatment after the deposition of the insulator 220 is preferably performed in an atmosphere containing nitrogen.

In this embodiment, as the first heat treatment, treatment is performed in a nitrogen atmosphere at 400° C. for one hour after the deposition of the insulator 224.

Next, an oxide 230A to be the oxide 230a, and an oxide 230B to be the oxide 230b are sequentially deposited over the insulator 224. Note that the oxides are preferably deposited successively without exposure to the air. By the deposition without exposure to the air, impurities or moisture from the air can be prevented from being attached to the oxide 230A and the oxide 230B, so that the vicinity of an interface between the oxide 230A and the oxide 230B can be kept clean.

The oxide 230A and the oxide 230B can be deposited by a sputtering method, a CVD method, an MBE method, a PLD method, an ALD method, or the like.

In the case where the oxide 230A and the oxide 230B are deposited by a sputtering method, for example, oxygen or a mixed gas of oxygen and a rare gas is used as a sputtering gas. By increasing the proportion of oxygen in the sputtering gas, excess oxygen in the oxides to be deposited can be increased. In the case where the above oxides are deposited by a sputtering method, the above-described In-M-Zn oxide target can be used.

In particular, at the time of the deposition of the oxide 230A, part of oxygen contained in the sputtering gas is supplied to the insulator 224 in some cases. Note that the proportion of oxygen in the sputtering gas for the oxide 230A is 70% or higher, preferably 80% or higher, further preferably 100%.

In the case where the oxide 230B is deposited by a sputtering method, the proportion of oxygen in the sputtering gas is set to be higher than or equal to 1% and lower than or equal to 30%, preferably higher than or equal to 5% and lower than or equal to 20%, whereby an oxygen-deficient metal oxide is formed. A transistor using an oxygen-deficient metal oxide for a channel formation region can have relatively high field-effect mobility.

In this embodiment, the oxide 230A is deposited by a sputtering method using a target with In:Ga:Zn=1:3:4 [atomic ratio]. The oxide 230B is deposited by a sputtering method using a target with In:Ga:Zn=4:2:4.1 [atomic ratio]. Note that each of the oxides is preferably deposited to have characteristics required for the oxide 230 of the transistor 200 by appropriate selection of deposition conditions and an atomic ratio.

Then, second heat treatment may be performed. For the second heat treatment, the above-described conditions for the first heat treatment can be used. By the second heat treatment, impurities such as hydrogen and water in the oxide 230A and the oxide 230B can be removed, for example. Furthermore, excess oxygen contained in the oxide 230A can be supplied to the oxide 230B. The oxide 230B is an oxide to be the oxide 230b in which the channel formation region of the transistor 200 is formed later. Therefore, by the second heat treatment, oxygen is supplied to the oxide 230B and the oxygen vacancies in the oxide 230B are reduced; thus, the transistor 200 having favorable electrical characteristics and reliability can be provided. In this embodiment, treatment is performed at 400° C. in a nitrogen atmosphere for one hour, and then another treatment is successively performed at 400° C. in an oxygen atmosphere for one hour.

Figure 3A:
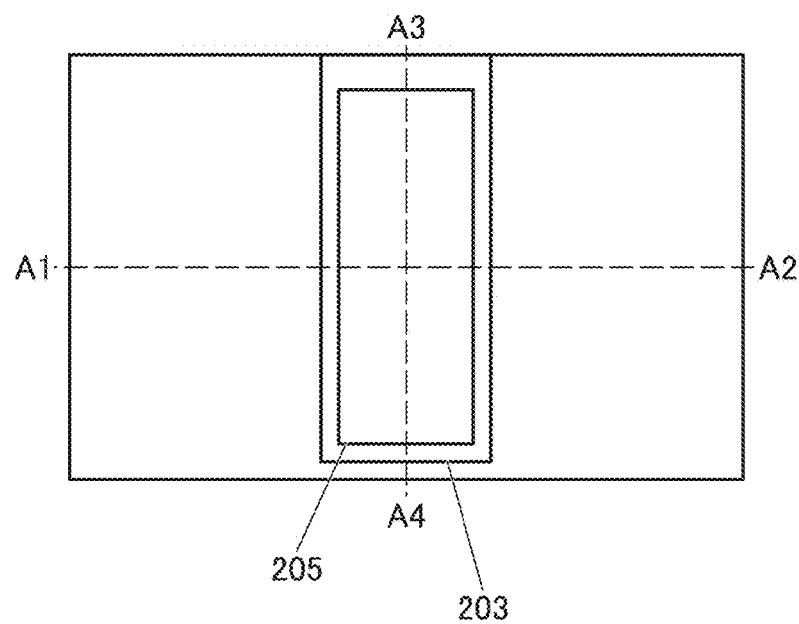
FIG. 3 A top view and cross-sectional views illustrating a manufacturing method of a semiconductor device of one embodiment of the present invention.
Figure 3C:
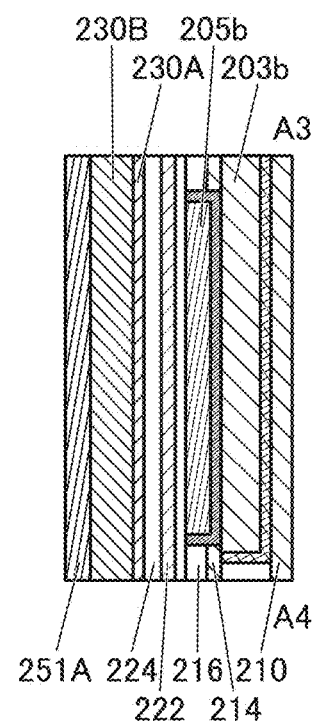
Figure 3B:
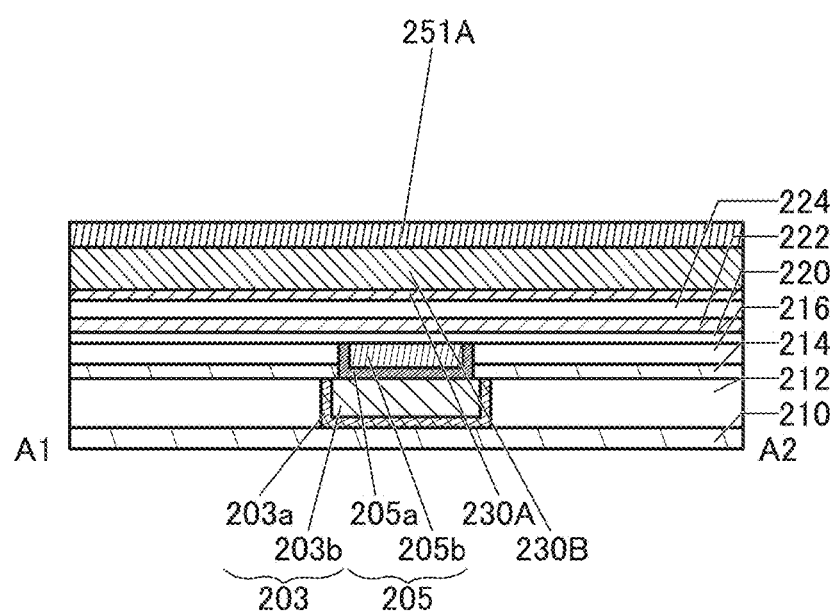

Next, a conductor 251A to be the conductor 251a and the conductor 251b is deposited (see FIG. 3). The conductor 251A can be deposited by a sputtering method, a CVD method, an MBE method, a PLD method, an ALD method, or the like. For the conductor 251A, for example, a conductor such as tantalum nitride, tungsten, or titanium nitride can be used. Alternatively, for example, a structure may be employed in which tungsten is deposited, and a conductor which has a function of inhibiting the passage of oxygen, such as titanium nitride or tantalum nitride, is deposited over tungsten. With such a structure, an increase in electric resistance value due to oxidation of tungsten by oxygen entering from above the conductor 251A can be inhibited.

Alternatively, for the conductor 251A, a structure may be employed in which a conductive oxide such as indium tin oxide (ITO), indium oxide containing tungsten oxide, indium zinc oxide containing tungsten oxide, indium oxide containing titanium oxide, indium tin oxide containing titanium oxide, indium zinc oxide, indium tin oxide to which silicon is added, or indium gallium zinc oxide containing nitrogen is deposited and a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like, a semiconductor with high electric conductivity, typified by polycrystalline silicon containing an impurity element such as phosphorus, or silicide such as nickel silicide is deposited over the oxide.

The oxide sometimes has a function of absorbing hydrogen in the oxide 230 and capturing hydrogen diffused from the outside; thus, the electrical characteristics and reliability of the transistor 200 are improved in some cases. Moreover, titanium used instead of the oxide may have a similar function.

In this embodiment, for the conductor 251A, tungsten is deposited by a sputtering method.

Figure 4A:
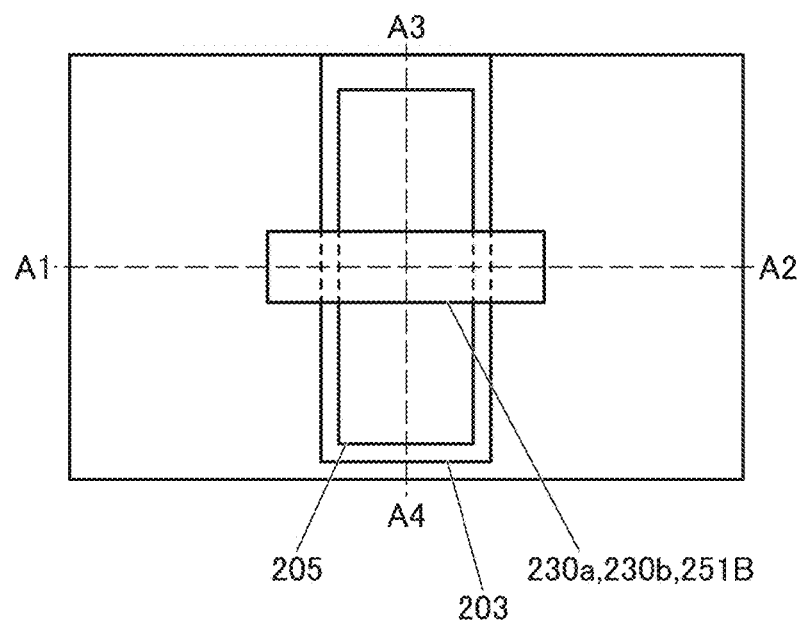
FIG. 4 A top view and cross-sectional views illustrating a manufacturing method of a semiconductor device of one embodiment of the present invention.
Figure 4C:
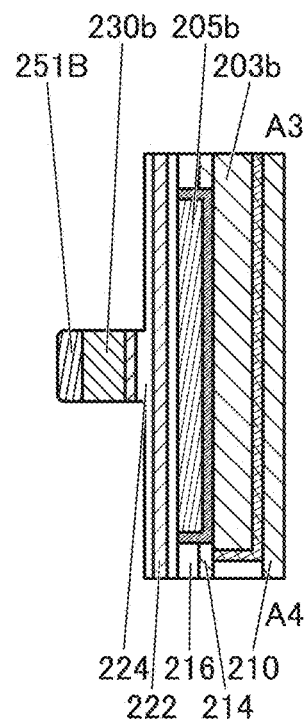
Figure 4B:
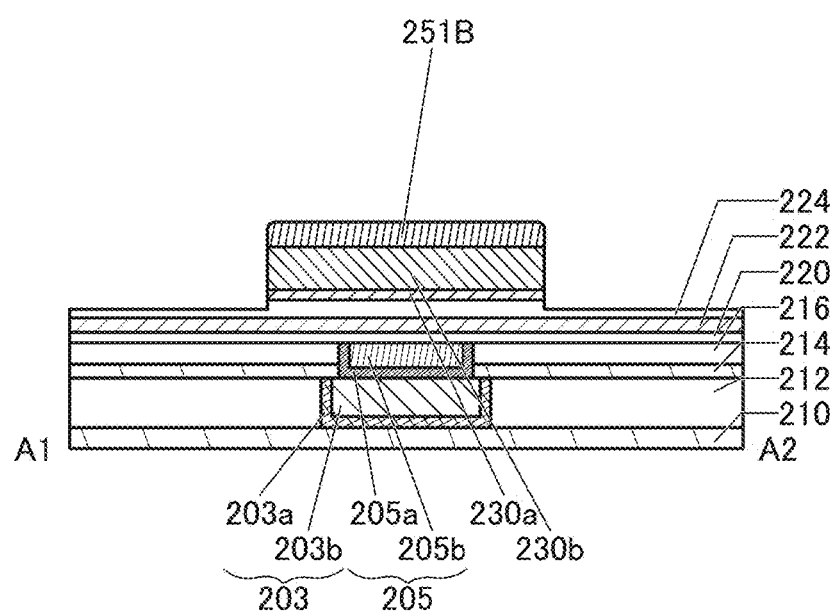

Next, the oxide 230A, the oxide 230B, and the conductor 251A are processed by a lithography method, whereby the oxide 230a, the oxide 230b, and a conductor 251B are formed over the insulator 224 (see FIG. 4). Note that the insulator 224 is partly removed by the processing in some cases.

Here, the oxide 230a and the oxide 230b are formed to at least partly overlap with the conductor 205. It is preferable that side surfaces of the oxide 230a and the oxide 230b be substantially perpendicular to a top surface of the insulator 224. When the side surfaces of the oxide 230a and the oxide 230b are substantially perpendicular to the top surface of the insulator 224, the plurality of transistors 200 can be provided in a smaller area and at a higher density.

In the lithography method, first, a resist is exposed to light through a mask. Next, a region exposed to light is removed or left using a developing solution, so that a resist mask is formed. Then, etching treatment through the resist mask is performed, whereby a conductor, a semiconductor, an insulator, or the like can be processed into a desired shape.

The resist mask is formed by, for example, exposure of the resist to light using KrF excimer laser light, ArF excimer laser light, EUV (Extreme Ultraviolet) light, or the like. Alternatively, a liquid immersion technique may be employed in which a portion between a substrate and a projection lens is filled with liquid (e.g., water) to perform light exposure. Furthermore, an electron beam or an ion beam may be used instead of the above-described light. A pattern is drawn directly on the resist in the case of using an electron beam or an ion beam, so that the above mask for the light exposure of the resist is unnecessary.

A dry etching method or a wet etching method can be used as the etching treatment in the lithography method. A dry etching method is particularly preferable because it is suitable for microfabrication. The resist mask remaining after the etching treatment can be removed by dry etching treatment such as ashing or wet etching treatment. Alternatively, the remaining resist mask can be removed by performing wet etching treatment after dry etching treatment or performing dry etching treatment after wet etching treatment, for example.

A hard mask formed of an insulator or a conductor may be used instead of the resist mask. In the case where a hard mask is used, an insulator or a conductor that is a hard mask material is formed over the conductor 251A, a resist mask is formed thereover, and then the hard mask material is etched, so that a hard mask with a desired shape can be formed. The etching of the oxide 230A, the oxide 230B, and the conductor 251A may be performed after removal of the resist mask or with the resist mask remaining. In the latter case, the resist mask disappears during the etching in some cases. The hard mask may be removed by etching after the etching of the oxide 230A, the oxide 230B, and the conductor 251A. In contrast, the hard mask is not necessarily removed in the case where the hard mask material does not affect the following process or can be utilized in the following process.

As a dry etching apparatus, a capacitively coupled plasma (CCP) etching apparatus including parallel plate type electrodes can be used. The capacitively coupled plasma etching apparatus including the parallel plate type electrodes may have a structure in which a high-frequency power is applied to one of the parallel plate type electrodes. Alternatively, a structure may be employed in which different high-frequency powers are applied to one of the parallel plate type electrodes. Alternatively, a structure may be employed in which high-frequency powers with the same frequency are applied to the parallel plate type electrodes. Alternatively, a structure may be employed in which high-frequency powers with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

In some cases, by performing the treatment such as dry etching, impurities due to an etching gas or the like are attached to or diffused into a surface or an inside of the oxide 230a, the oxide 230b, the conductor 251B, and the like. Examples of the impurities include fluorine and chlorine.

In order to remove the impurities and the like, cleaning is performed. As the cleaning method, wet cleaning using a cleaning solution or the like, plasma treatment using plasma, cleaning by heat treatment, and the like can be given, and any of these cleanings may be performed in appropriate combination.

As the wet cleaning, cleaning treatment may be performed using an aqueous solution obtained by diluting an oxalic acid, a phosphoric acid, a hydrofluoric acid, or the like with carbonated water or pure water. Alternatively, ultrasonic cleaning using pure water or carbonated water may be performed. In this embodiment, ultrasonic cleaning using pure water or carbonated water is performed.

Then, third heat treatment may be performed. For the third heat treatment, the above-described conditions for the heat treatment can be used.

Next, an insulator 226A is deposited over the insulator 224 and the conductor 251B. The insulator 226A can be deposited by a sputtering method, a CVD method, an MBE method, a PLD method, an ALD method, or the like. In this embodiment, for the insulator 226A, silicon oxide is deposited by a CVD method. Note that other than silicon oxide, silicon oxynitride may be used for the insulator 226A, for example.

Figure 5A:
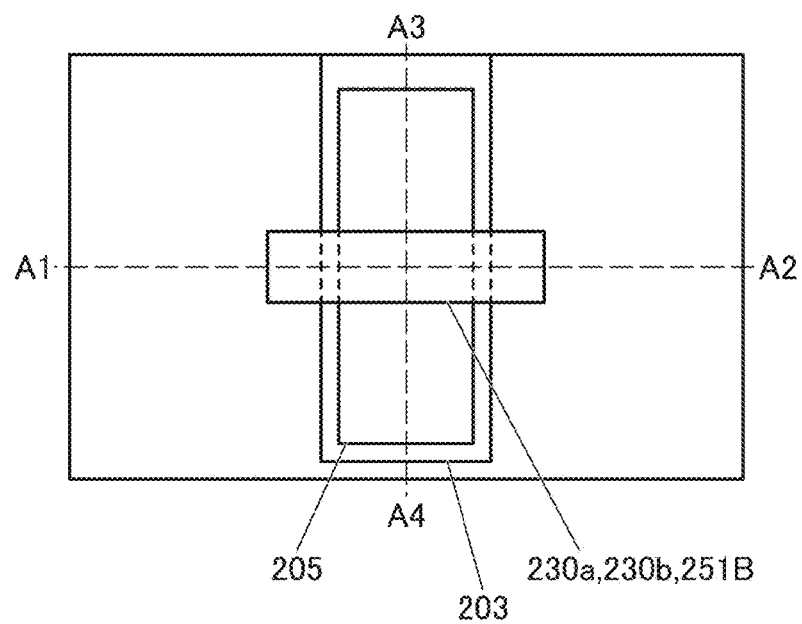
FIG. 5 A top view and cross-sectional views illustrating a manufacturing method of a semiconductor device of one embodiment of the present invention.
Figure 5C:
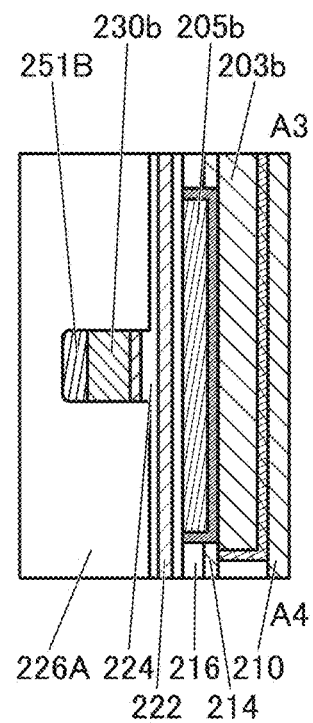
Figure 5B:
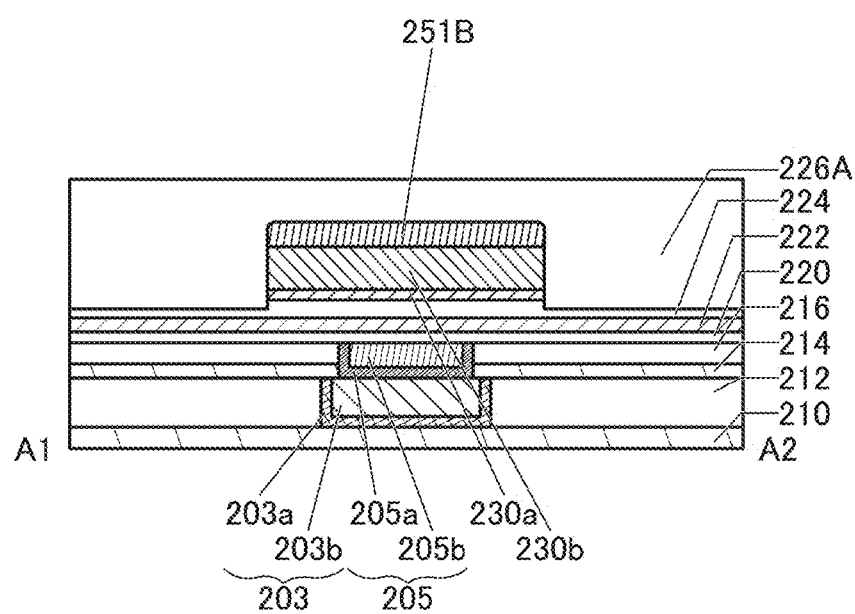

Then, part of the insulator 226A is removed, so that a top surface of the insulator 226A is planarized (see FIG. 5). The planarization can be performed by CMP treatment, dry etching treatment, or the like. In this embodiment, the top surface of the insulator 226A is planarized by CMP treatment. Note that in the case where the top surface of the insulator 226A has planarity after the deposition, the above-described planarization treatment is not necessarily performed in some cases.

Figure 6A:
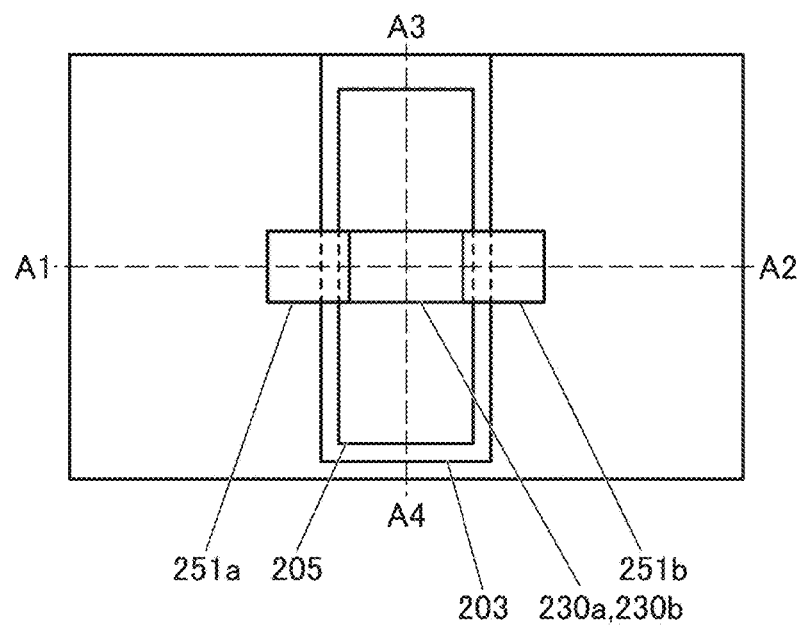
FIG. 6 A top view and cross-sectional views illustrating a manufacturing method of a semiconductor device of one embodiment of the present invention.
Figure 6C:
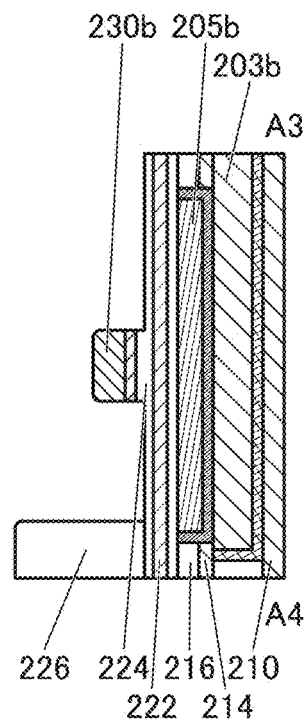
Figure 6B:
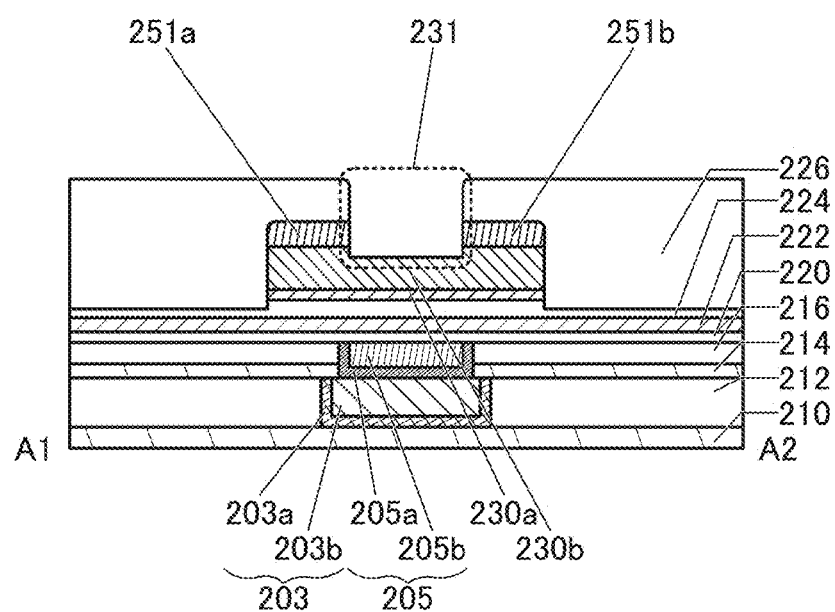

Next, the insulator 226A and the conductor 251B are processed by a lithography method, whereby an opening 231 reaching the top surface of the oxide 230b, the insulator 226, the conductor 251a, and the conductor 251b are formed (see FIG. 6). For example, light exposure of a resist in a lithography method may be performed, through a mask, using KrF excimer laser light, ArF excimer laser light, EUV light, or the like or using a liquid immersion technique. A method may be employed in which a pattern is drawn directly on a resist using an electron beam or an ion beam without a mask. Light exposure using an electron beam or an ion beam makes it possible to draw finer pattern on a resist than light exposure using the above-described light, and thus is suitable for microfabrication. In this embodiment, light exposure of a resist is performed using an electron beam.

A dry etching method or a wet etching method can be used as the etching treatment in the lithography method. In this embodiment, after the resist is subjected to the above-described light exposure using an electron beam and developing, the insulator 226A and the conductor 251B are etched by a dry etching method. Note that the insulator 226A and the conductor 251B are etched successively using different etching gases. In this embodiment, first, etching is performed on the insulator 226A using a mixed gas of Ar, $O_2$, and $C_4F_6$, and then etching is performed on the conductor 251B using a mixed gas of $CF_4$, $O_2$, and $Cl_2$. In some cases, part of the oxide 230b is removed by the etching treatment.

Next, an oxide 230C to be the oxide 230c is deposited on an inner wall of the opening 231 and over the insulator 226. The oxide 230C can be deposited by a sputtering method, a CVD method, an MBE method, a PLD method, an ALD method, or the like. In the case where the oxide 230C is deposited by a sputtering method, the proportion of oxygen contained in the sputtering gas is 70% or higher, preferably 80% or higher, and further preferably 100%. When the oxide 230C is deposited under the above conditions, part of oxygen contained in the sputtering gas is supplied to the oxide 230b at the time of the deposition of the oxide 230C in some cases. In this embodiment, the oxide 230C is deposited by a sputtering method using a target with In:Ga:Zn=4:2:4.1 [atomic ratio].

Figure 7A:
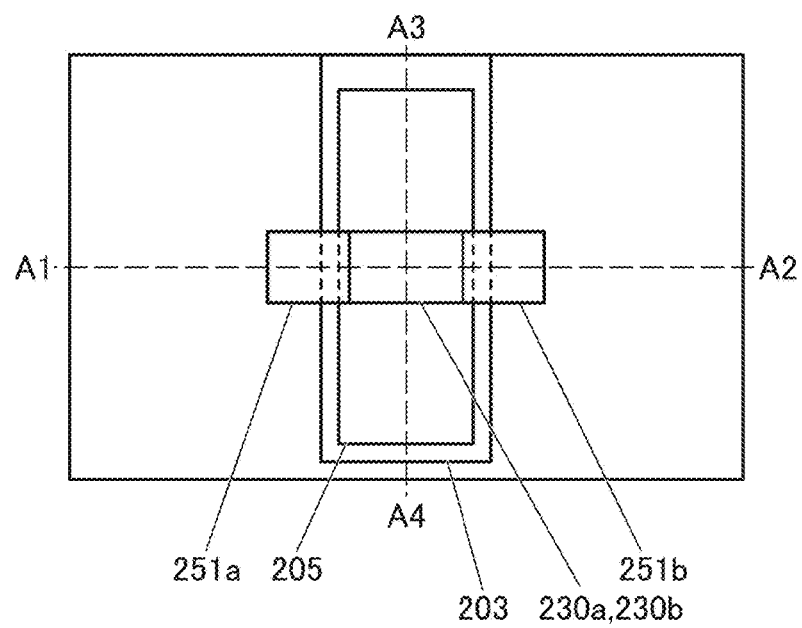
FIG. 7 A top view and cross-sectional views illustrating a manufacturing method of a semiconductor device of one embodiment of the present invention.
Figure 7C:
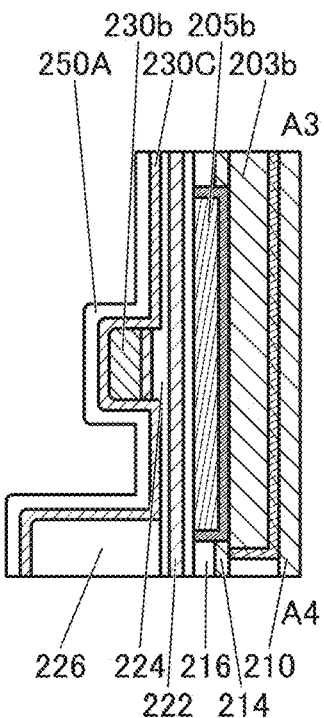
Figure 7B:
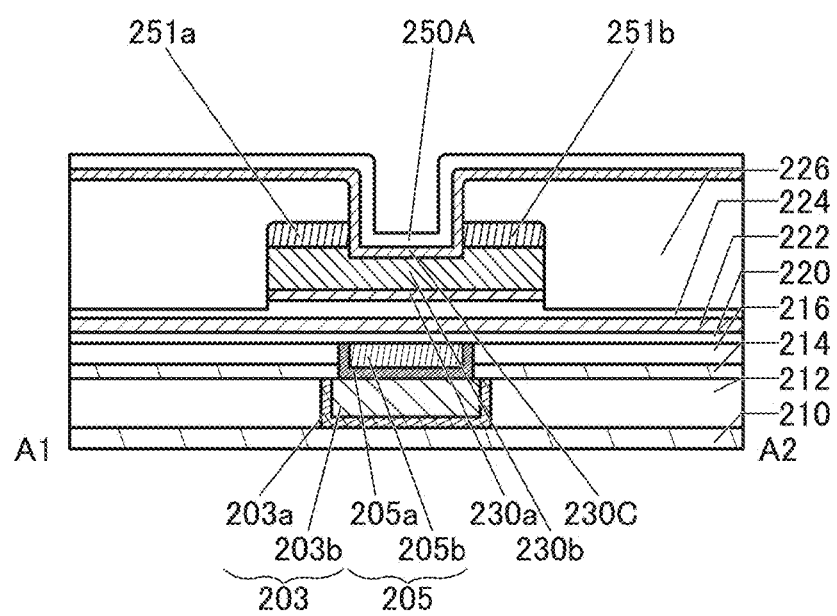

Next, an insulator 250A to be the insulator 250 is deposited over the oxide 230C (see FIG. 7). The insulator 250A can be deposited by a sputtering method, a CVD method, an MBE method, a PLD method, an ALD method, or the like. In this embodiment, for the insulator 250A, silicon oxide is deposited by a CVD method. Note that other than silicon oxide, silicon oxynitride may be used for the insulator 250A, for example.

Figure 8A:
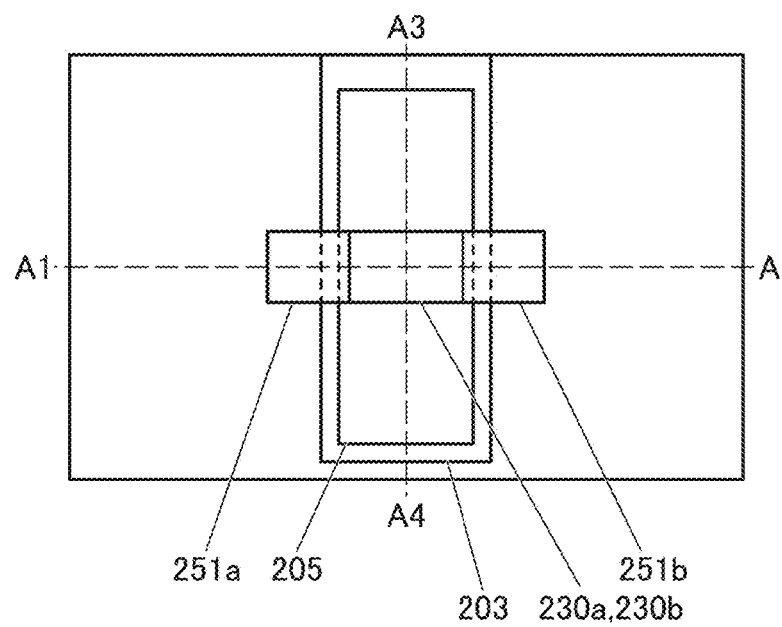
FIG. 8 A top view and cross-sectional views illustrating a manufacturing method of a semiconductor device of one embodiment of the present invention.
Figure 8C:
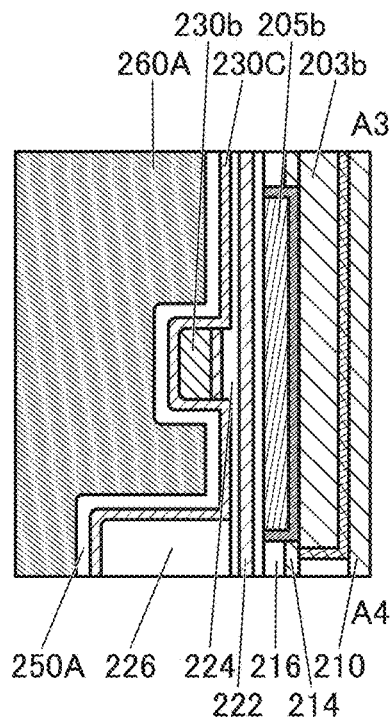
Figure 8B:
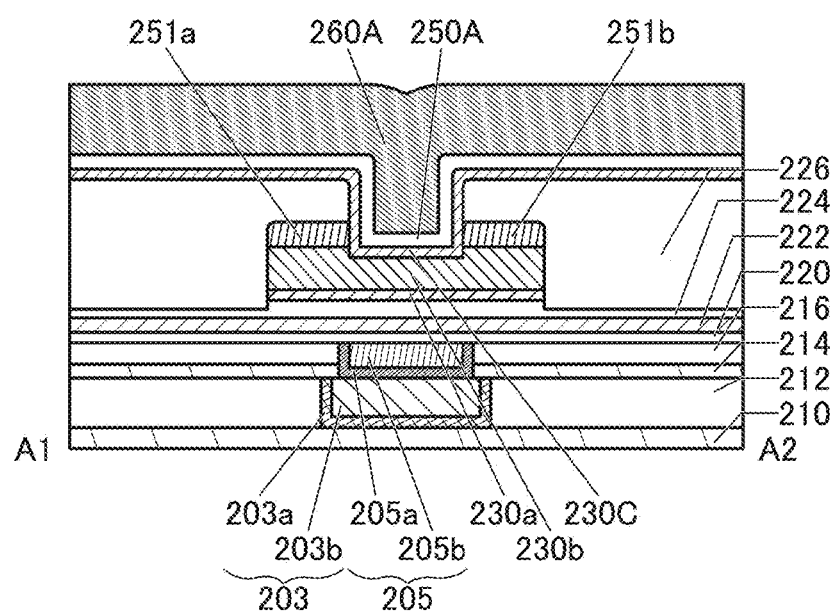

Next, a conductor 260A to be the conductor 260 is deposited over the insulator 250A (see FIG. 8). The conductor 260A can be deposited by a sputtering method, a CVD method, an MBE method, a PLD method, an ALD method, or the like. In this embodiment, for the conductor 260A, titanium nitride is deposited by an ALD method and then tungsten is deposited by a CVD method. Note that in the conductor 260A, the thickness of tungsten is preferably larger than the thickness of titanium nitride. It is preferable that titanium nitride be deposited along the inner wall of the opening 231 with the insulator 250A therebetween and a remaining space in the opening 231 be filled with tungsten. The conductor 260A is deposited in such a manner, whereby the conductor 260 having a stacked-layer structure of titanium nitride and tungsten can be formed later.

Figure 9A:
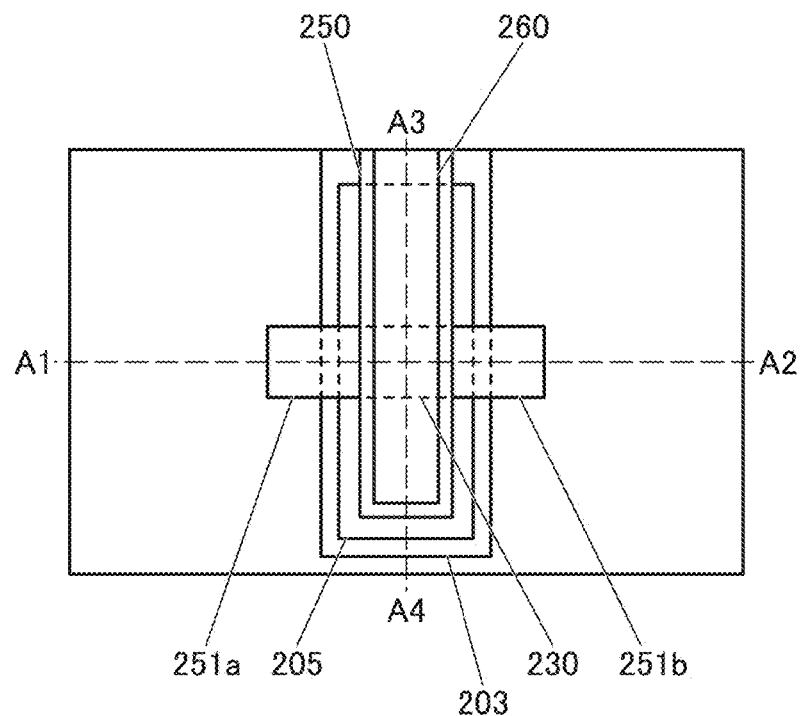
FIG. 9 A top view and cross-sectional views illustrating a manufacturing method of a semiconductor device of one embodiment of the present invention.
Figure 9C:
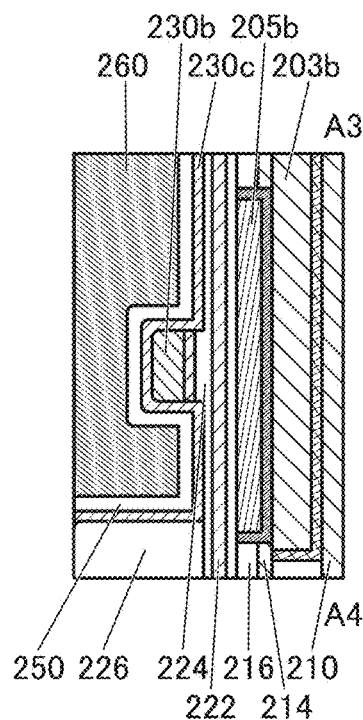
Figure 9B:
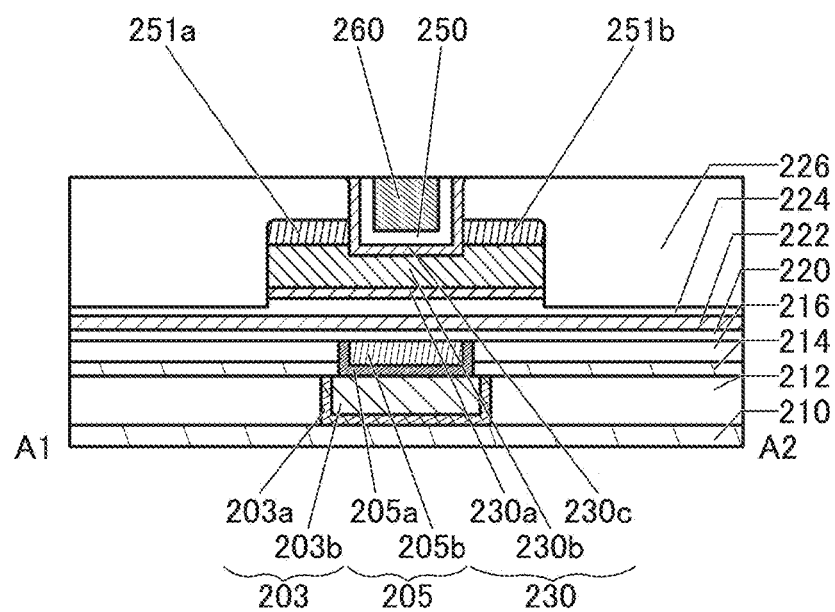

Next, top surfaces of the conductor 260A, the insulator 250A, and the oxide 230C are polished until the top surface of the insulator 226 is exposed, whereby the conductor 260, the insulator 250, and the oxide 230c are formed (see FIG. 9). The polishing can be performed by CMP treatment or the like. Alternatively, the conductor 260, the insulator 250, and the oxide 230c may be formed in such a manner that the top surfaces of the conductor 260A, the insulator 250A, and the oxide 230C are subjected to dry etching until the top surface of the insulator 226 is exposed. In this embodiment, the conductor 260, the insulator 250, and the oxide 230c are formed by CMP treatment. By this CMP treatment, the levels of the top surfaces of the insulator 226, the insulator 250, the oxide 230c, and the conductor 260 can be formed to be substantially the same (see FIG. 9). Note that the insulator 226 is partly removed by the CMP treatment in some cases.

Figure 10A:
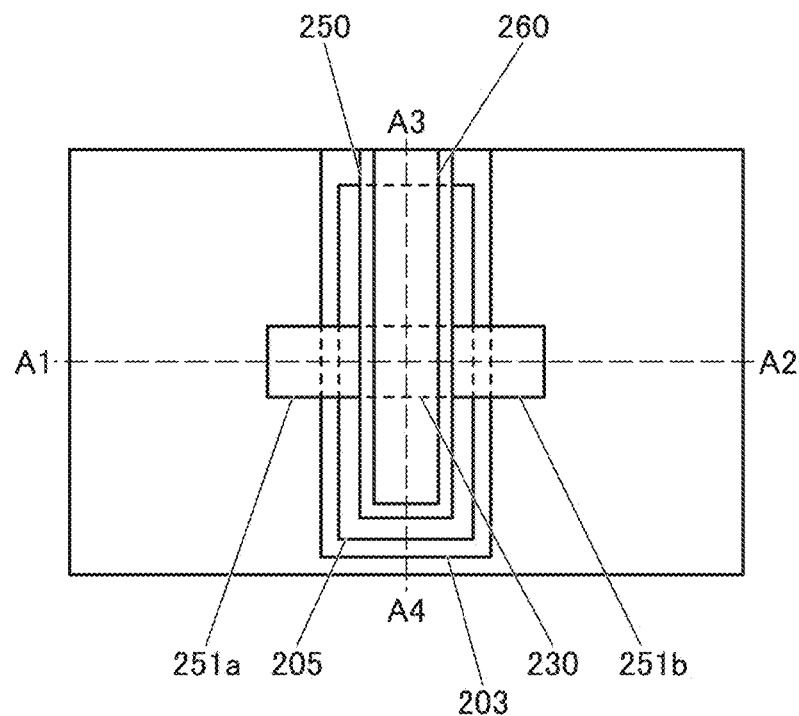
FIG. 10 A top view and cross-sectional views illustrating a manufacturing method of a semiconductor device of one embodiment of the present invention.
Figure 10C:
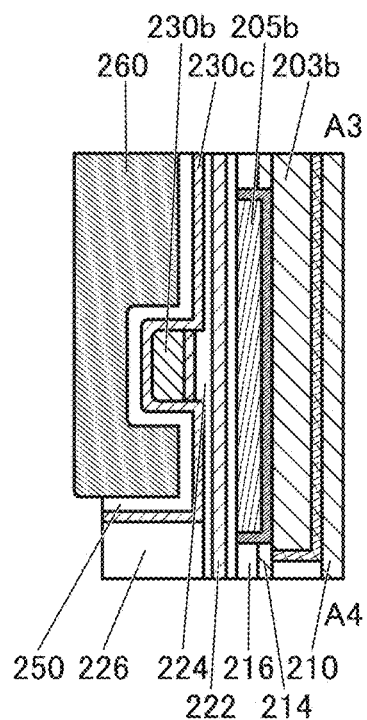
Figure 10B:
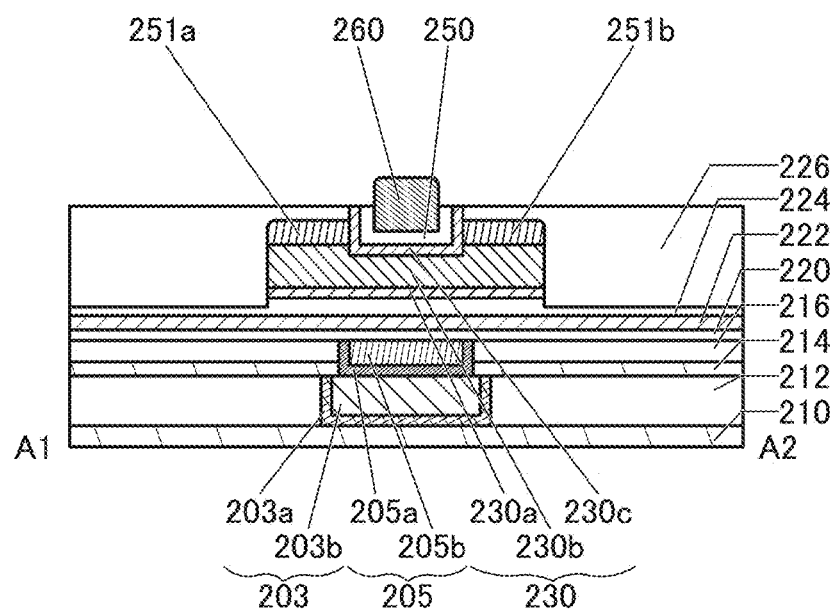

Next, the top surface of the insulator 226 is etched (half-etched back) and the level of the top surface of the insulator 226 is made lower than the level of the top surface of the conductor 260, whereby a step is formed (see FIG. 10). A dry etching method or a wet etching method can be used as the etching treatment. In this embodiment, the top surface of the insulator 226 is etched by a desired thickness amount by a dry etching method using a mixed gas of Ar, $CHF_3$, and $CF_4$. The top surfaces of the oxide 230c and the insulator 250 are also partly removed by the etching treatment in some cases. Note that the levels of the top surfaces of the insulator 226, the oxide 230c, and the insulator 250 after the etching treatment are preferably higher than the level of the top surface of the conductor 251 (the conductor 251a and the conductor 251b).

Figure 11A:
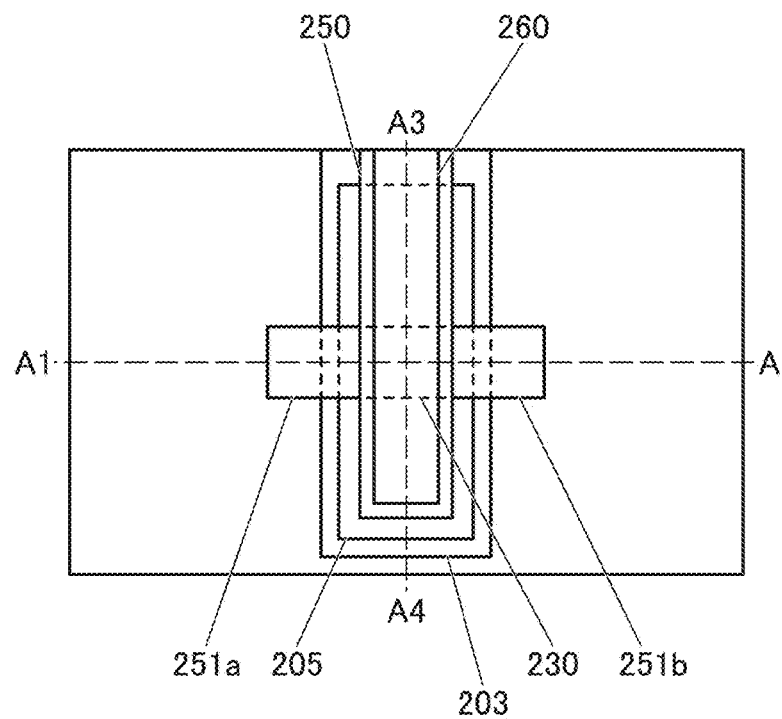
FIG. 11 A top view and cross-sectional views illustrating a manufacturing method of a semiconductor device of one embodiment of the present invention.
Figure 11C:
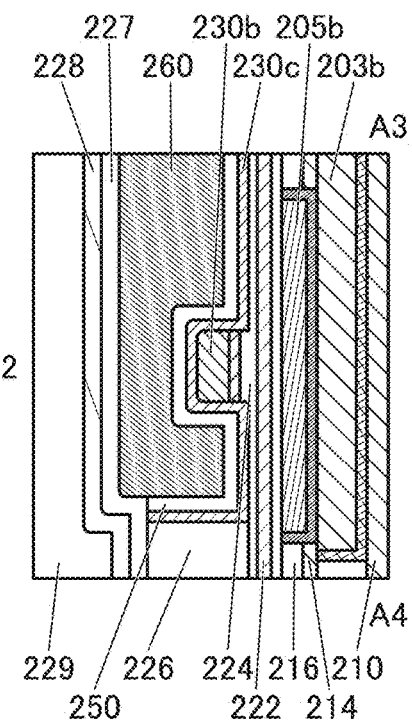

Next, the insulator 227 is deposited over the top surface of the insulator 226, the top surface of the insulator 250, the top surface of the oxide 230c, and the top surface of the conductor 260, and on the side surface of the conductor 260; the insulator 228 is deposited over the insulator 227; and the insulator 229 is deposited over the insulator 228 (see FIG. 11). The insulator 227, the insulator 228, and the insulator 229 can be deposited by a sputtering method, a CVD method, an MBE method, a PLD method, an ALD method, or the like. Note that the insulator 227 is not necessarily provided. In this embodiment, silicon oxide is deposited for the insulator 227 by a CVD method, aluminum oxide is deposited for the insulator 228 by a sputtering method, and silicon oxide is deposited for the insulator 229 by a CVD method. Note that the insulator 229 is preferably formed to be thicker than the insulator 227 and the insulator 228. Note that other than silicon oxide, silicon oxynitride may be used for the insulator 227 and/or the insulator 229, for example. As described later, for the insulator 228, any material may be used as long as it can have the etching "selectivity (to be described later)" with respect to the insulator 229, the insulator 227, and the insulator 226; other than aluminum oxide, silicon nitride or hafnium oxide may be used, for example.

Figure 11B:
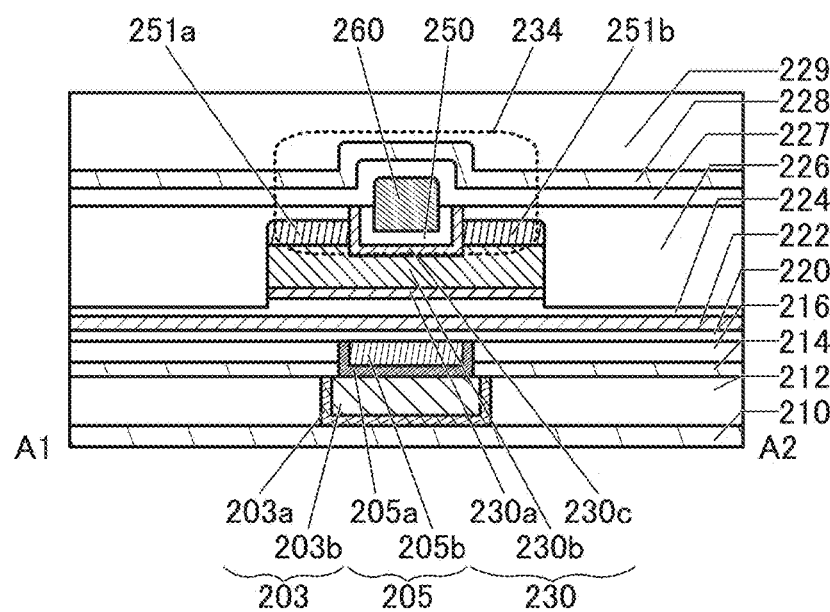
Figure 12:
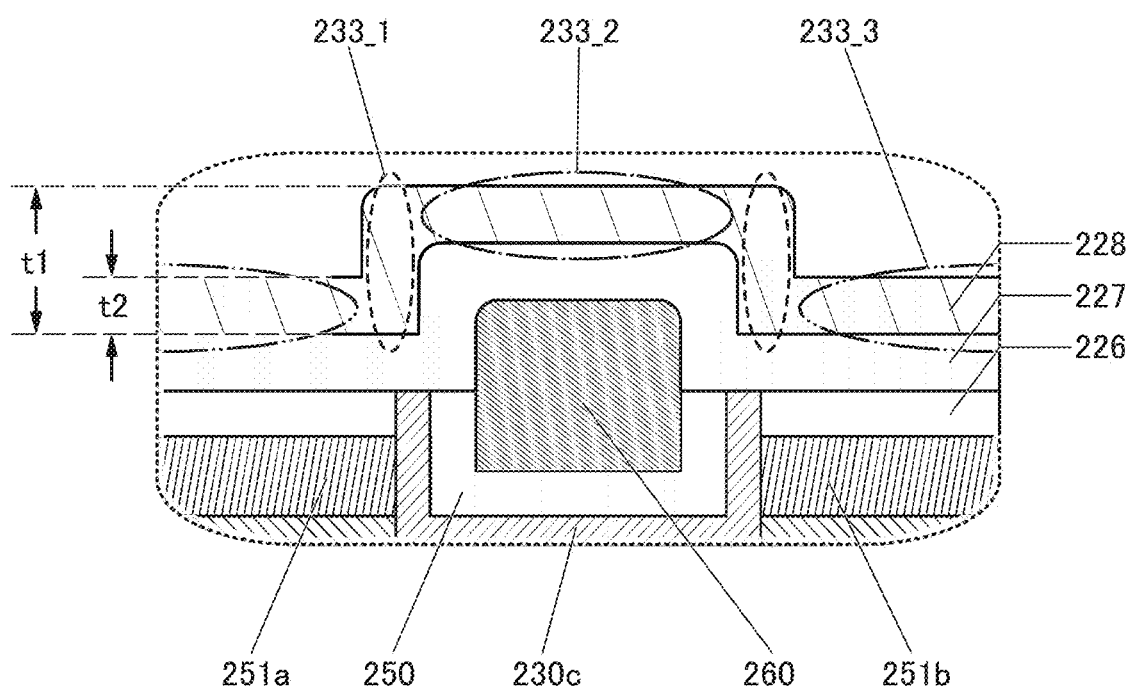
FIG. 12 An enlarged cross-sectional view of a semiconductor device of one embodiment of the present invention during manufacture.

FIG. 12 is an enlarged view of a region 234 in FIG. 11(B). As illustrated in FIG. 12, the insulator 228 includes a region 233_1 formed along the side surface of the conductor 260 with the insulator 227 therebetween; a region 233_2 formed along the top surface of the conductor 260 with the insulator 227 therebetween; and a region 233_3 other than the region 233_1 and the region 233_2. In the case where the semiconductor device does not include the insulator 227, a region of the insulator 228 in contact with the side surface of the conductor 260 is the region 233_1, a region of the insulator 228 in contact with the top surface of the conductor 260 is the region 233_2, and a region of the insulator 228 in contact with the top surface of the insulator 226 is the region 233_3. Furthermore, in the insulator 228, a thickness t1 of the region 233_1 with reference to a formation surface of the region 233_3 is preferably twice or more a thickness t2 of the region 233_3 (see FIG. 12). The insulator 228 has the above structure, whereby the opening for providing the conductor 252 (the conductor 252a and the conductor 252b) functioning as a plug of the transistor 200 can be formed in a desired portion in a self-aligned manner without contact with the conductor 260 functioning as the first gate electrode. This will be described later.

Then, part of the insulator 229 is removed, so that the top surface of the insulator 229 is planarized (see FIG. 11). The planarization can be performed by CMP treatment, dry etching treatment, or the like. In this embodiment, the top surface of the insulator 229 is planarized by CMP treatment. Note that in the case where the top surface of the insulator 229 has planarity after the deposition, the above-described planarization treatment is not necessarily performed in some cases.

Figure 13A:
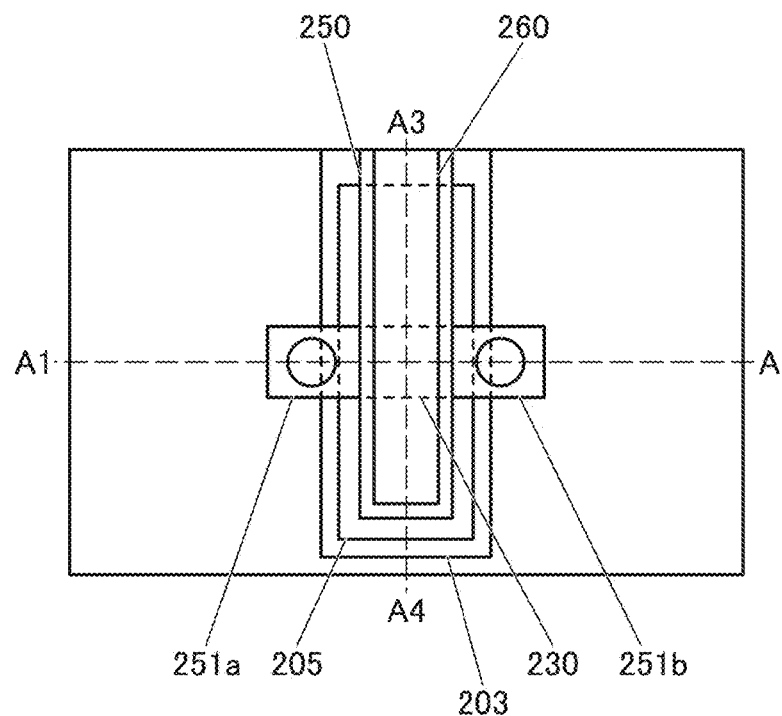
FIG. 13 A top view and cross-sectional views illustrating a manufacturing method of a semiconductor device of one embodiment of the present invention.
Figure 13C:
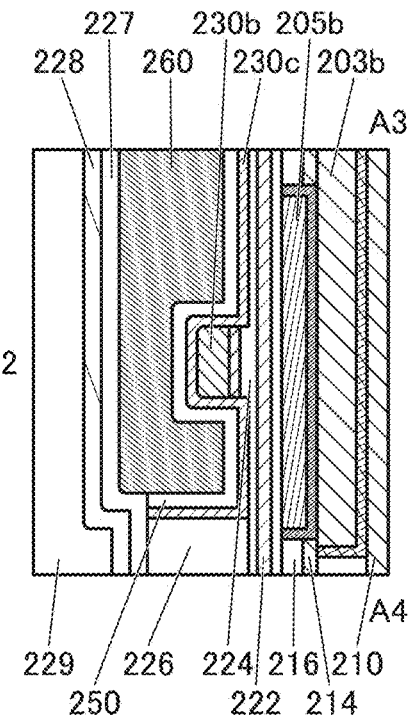

Next, the insulator 229, the insulator 228, the insulator 227, and the insulator 226 are processed by a lithography method, whereby an opening 232a reaching the top surface of the conductor 251a and an opening 232b reaching the top surface of the conductor 251b are formed (see FIG. 13). For example, light exposure of a resist in a lithography method may be performed, through a mask, using KrF excimer laser light, ArF excimer laser light, EUV light, or the like or using a liquid immersion technique. A method may be employed in which a pattern is drawn directly on a resist using an electron beam or an ion beam without a mask. Light exposure using an electron beam or an ion beam makes it possible to draw finer pattern on a resist than light exposure using the above-described light, and thus is suitable for microfabrication. In this embodiment, light exposure of a resist is performed using an electron beam.

A dry etching method or a wet etching method can be used as the etching treatment in the lithography method. In this embodiment, after the resist is subjected to the above-described light exposure using an electron beam and developing, the insulator 229, the insulator 228, the insulator 227, and the insulator 226 are etched by a dry etching method. Note that etching of the insulator 229, the insulator 227, and the insulator 226, and etching of the insulator 228 are performed using different etching gases. In this embodiment, etching is performed on the insulator 229, the insulator 227, and the insulator 226 using a mixed gas of Ar, $O_2$, and $C_4F_6$, and etching is performed on the insulator 228 using a mixed gas of Ar, $H_2$, and $C_4F_8$. In some cases, part of the conductor 251 (the conductor 251a and the conductor 251b) is removed by the etching treatment.

Figure 13B:
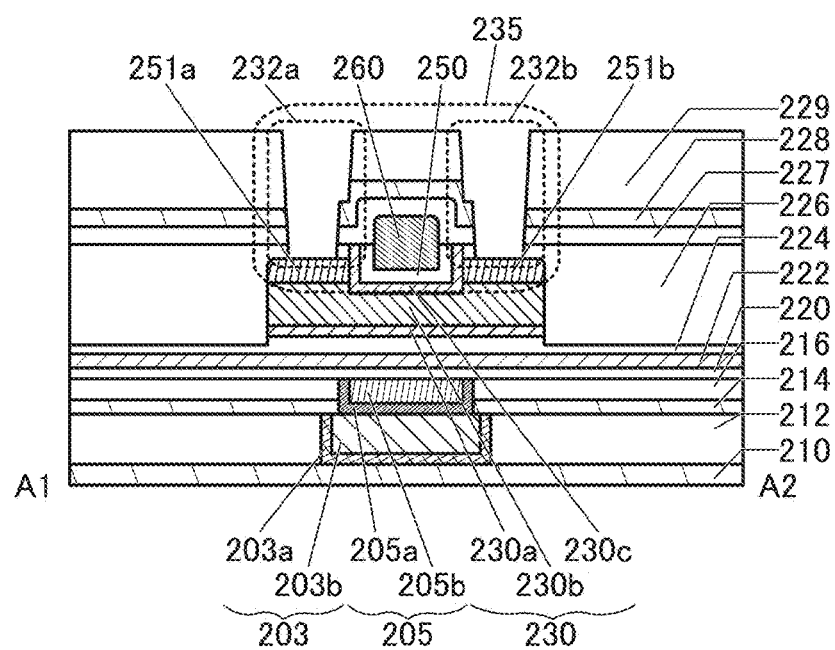
Figure 14A:
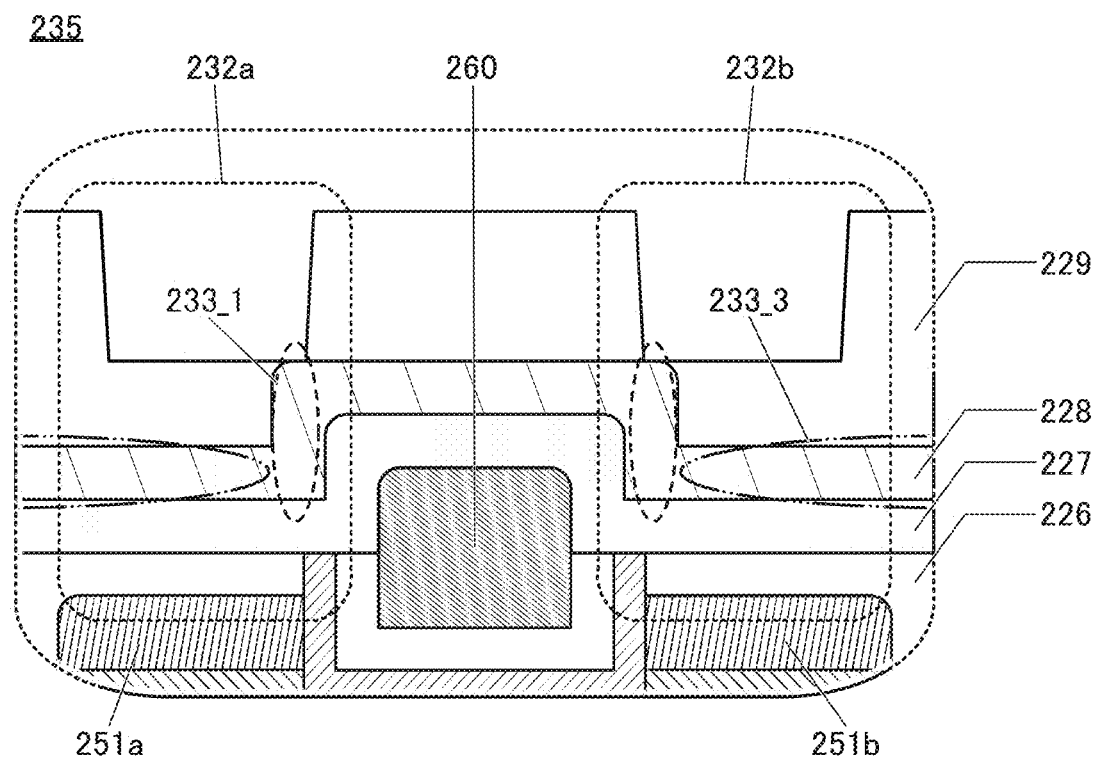
FIG. 14 Enlarged cross-sectional views illustrating a manufacturing method of a semiconductor device of one embodiment of the present invention.
Figure 14B:
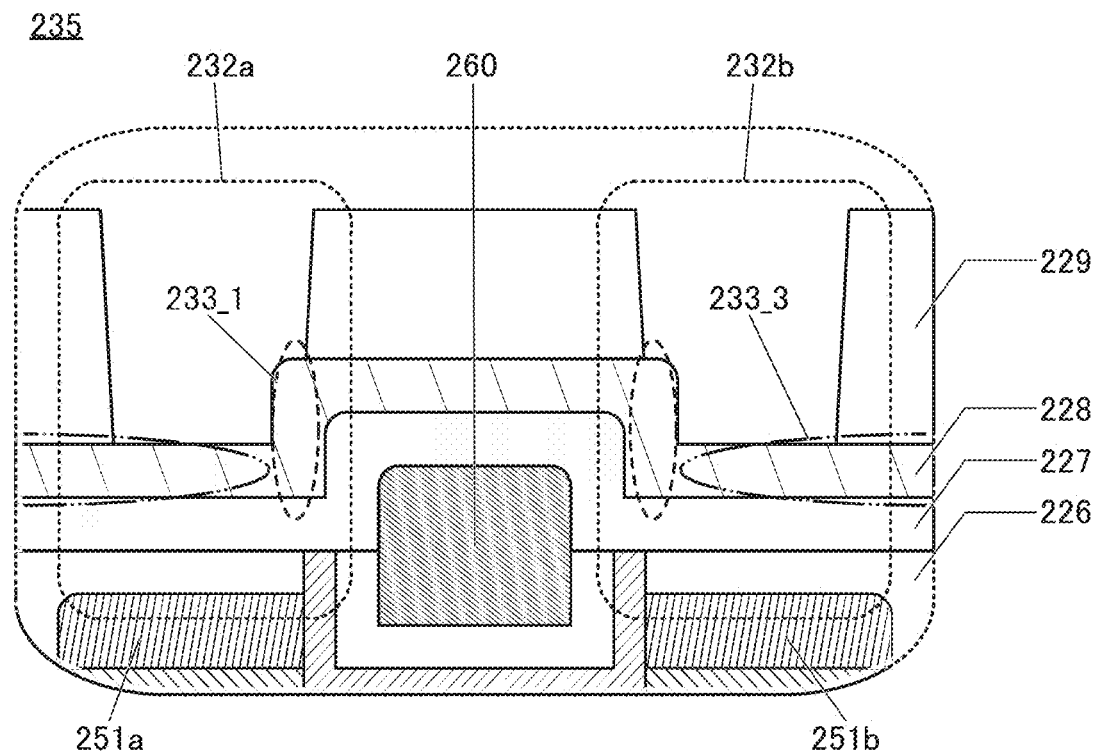
Figure 15A:
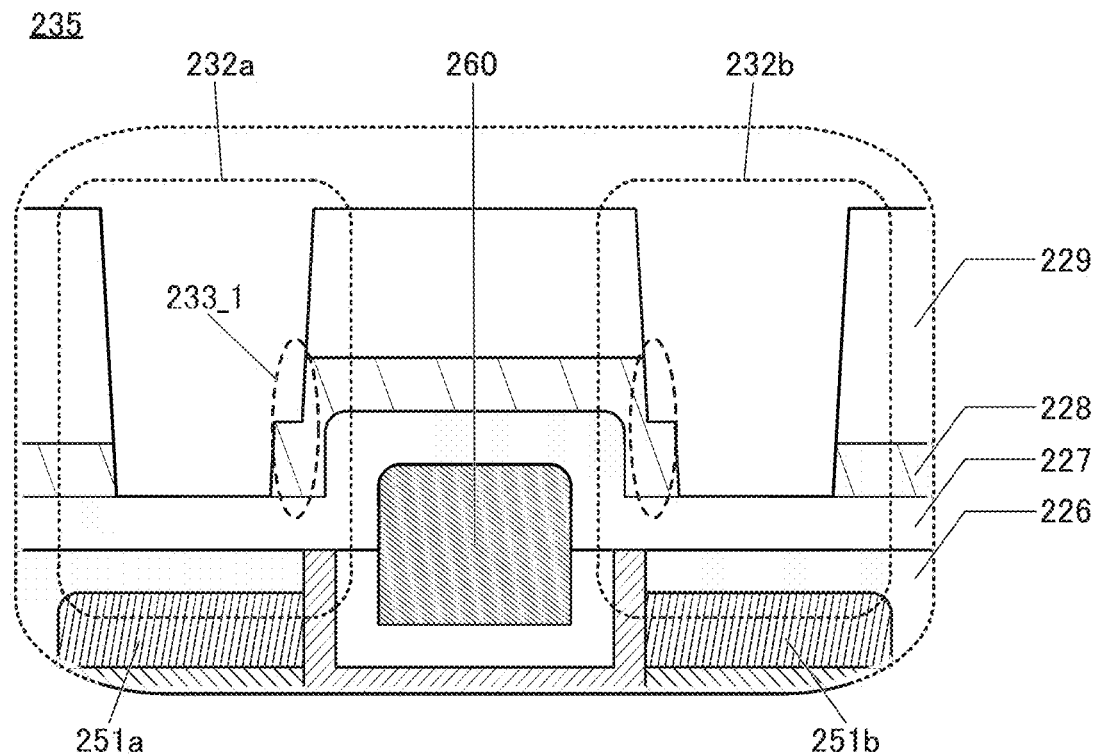
FIG. 15 Enlarged cross-sectional views illustrating a manufacturing method of a semiconductor device of one embodiment of the present invention.
Figure 15B:
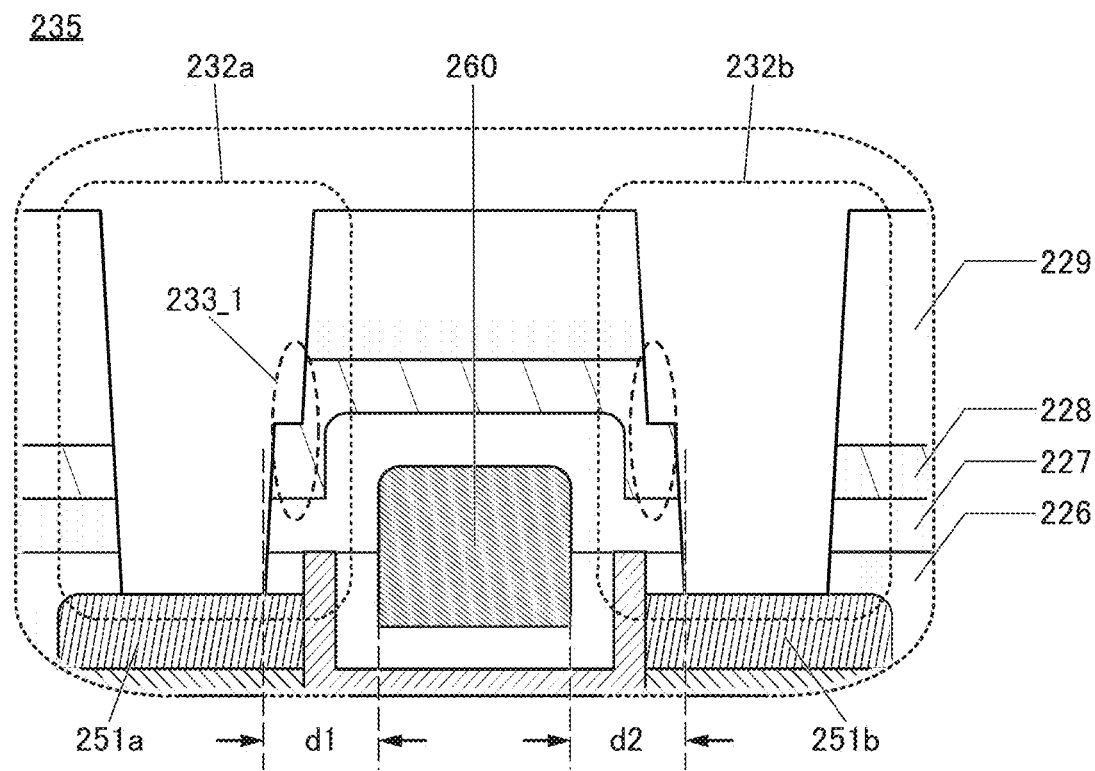

Here, a region 235 in FIG. 13(B) is focused on; FIG. 14 and FIG. 15 are enlarged views showing changes in a process shape of the transistor 200 in the formation of the opening 232a and the opening 232b.

As illustrated in FIG. 12, the insulator 228 is provided to cover the side surfaces and the top surface of the conductor 260 functioning as the first gate electrode with the insulator 227 therebetween. Thus, as described above, in the insulator 228, the thickness (t1) of the region 233_1 with reference to the formation surface of the region 233_3 is twice or more the thickness (t2) of the region 233_3. The insulator 228 includes two regions (the region 233_1 and the region 233_3) with different thicknesses, whereby, by utilizing the difference in thickness, the opening 232a and the opening 232b can be formed in a desired portion in a self-aligned manner without contact with the conductor 260 functioning as the first gate electrode.

For example, considered is the case where the opening 232a and the opening 232b are formed by processing at least part of the region 233_1 and part of the region 233_3 in the insulator 228. First, the opening treatment begins with the insulator 229 that is the uppermost layer; the distance from the uppermost surface of the insulator 229 to the uppermost surface of the insulator 228 thereunder on the region 233_1 differs from that on the region 233_3, and is shorter than that on the region 233_3. Thus, in the insulator 229, an opening is formed on the region 233_1 prior to on the region 233_3 (see FIG. 14(A)). However, the opening treatment of the insulator 229 needs to be continued because the opening on the region 233_3 needs to be completely formed.

Here, different materials are used for the insulator 229 and the insulator 228. For example, as described above, in this embodiment, silicon oxide is used for the insulator 229 and aluminum oxide is used for the insulator 228. Materials used for the insulators are different, so that gases used for etching the insulators are also different. For example, as described above, in this embodiment, the mixed gas of Ar, $O_2$, and $C_4F_6$ is used for etching of the insulator 229, and the mixed gas of Ar, $H_2$, and $C_4F_8$ is used for etching of the insulator 228. For this reason, depending on an etching gas for the target insulator 229 or the target insulator 228, the sufficient "selectivity" between the two can be obtained. Here, the "selectivity" refers to a ratio between etching rates of two etching objects, and a higher "selectivity" means a larger difference between the etching rates. That is, when etching is performed on the insulator 229 and the insulator 228 using an etching gas (the mixed gas of Ar, $O_2$, and $C_4F_6$) for the insulator 229, the etching rate of the insulator 228 is much lower than the etching rate of the insulator 229, so that the etching of the insulator 229 can proceed while the etching of the insulator 228 is suppressed. Thus, even after the opening treatment of the insulator 229 on the region 233_1 is finished, the opening treatment of the insulator 229 on the region 233_3 can be completed while the etching amount of the region 233_1 is suppressed (see FIG. 14(B)). Note that the etching amount of the insulator 228 with a lower etching rate is not zero; therefore, part of the top surface of the insulator 228 exposed by the etching treatment is removed in some cases.

The opening treatment of the insulator 229 is completed as described above, the etching gas is switched to the mixed gas of Ar, $H_2$, and $C_4F_8$, and opening treatment is performed on the insulator 228. By the opening treatment, both the region 233_1 and the region 233_3 are etched by the same thickness amount. Specifically, etching is performed by at least the thickness (t2) amount of the region 233_3. Here, as described above, in the insulator 228, the thickness (t1) of the region 233_1 with reference to the formation surface of the region 233_3 is twice or more the thickness (t2) of the region 233_3. Therefore, even when an opening is formed in the region 233_3 by the opening treatment, part of the region 233_1 (with at least the thickness amount t1-t2) remains. That is, by the opening treatment, the opening is selectively formed only in the region 233_3 in a self-aligned manner (FIG. 15(A)).

Note that in this embodiment, the etching gases to be used are changed in the case where the insulator 229 is intended to be etched and in the case where the insulator 228 is intended to be etched; however, one embodiment of the present invention is not limited to this. For example, the etching gas for the insulator 229 on which the opening treatment is performed first may be continuously used in the subsequent formation of the opening in the insulator 228. In this case, switch of the etching gas is not needed depending on the insulator that is the etching target, so that an etching gas species can be cut down and time for the opening treatment can be shortened. Note that in this case, the etching rate of the insulator 228 is lower than the etching rate of the insulator 229, so that it takes time to form the opening in the insulator 228. Therefore, in the case where the opening treatment is performed on the insulator 228 using this method, the ratio of the thickness (t1) of the region 233_1 to the thickness (t2) of the region 233_3 needs to be adjusted to an optimal ratio in advance. Specifically, a combination of the half-etching back amount of the insulator 226 illustrated in FIG. 10 and the thickness of the insulator 228 at the deposition in FIG. 11 is optimized, whereby the ratio of t1 to t2 can be adjusted to a desired ratio.

Next, the etching gas is switched to the mixed gas of Ar, $O_2$, and $C_4F_6$ again, and the opening treatment is performed on the insulator 227 and the insulator 226. As described above, in this embodiment, silicon oxide is used for both the insulator 227 and the insulator 226. Thus, the openings reaching the top surface of the conductor 251 (the conductor 251a and the conductor 251b) can be formed in the insulator 227 and the insulator 226 at a time by using the same etching gas (the mixed gas of Ar, $O_2$, and $C_4F_6$) (see FIG. 15(B)).

As described above, only the region 233_3 is selectively penetrated by utilizing the difference in "selectivity" between the insulator 229 and the insulator 228, t2 smaller than t1, and the like, whereby the opening 232a and the opening 232b can be formed in a self-aligned manner. For example, assuming that d1 is the distance between the conductor 260 functioning as the first gate electrode and the bottom surface of the opening 232a on the conductor 251a, which face each other, and d2 is the distance between the conductor 260 and the bottom surface of the opening 232b on the conductor 251b, which face each other, in FIG. 15(B), by using the manufacturing method described in this embodiment, the opening 232a and the opening 232b can be formed in desired portions without contact with the conductor 260 functioning as the first gate electrode with the distance d1 and the distance d2 kept, even when the space between the opening 232a and the opening 232b is narrowed.

In addition, by using the manufacturing method described in this embodiment, for example, even when etching treatment is performed with slight misalignment caused in light exposure of the resist used at the time of the formation of the opening 232a and the opening 232b, the opening 232a and the opening 232b can be formed without contact with the conductor 260 functioning as the first gate electrode with the distance d1 and the distance d2 kept.

Figure 16A:
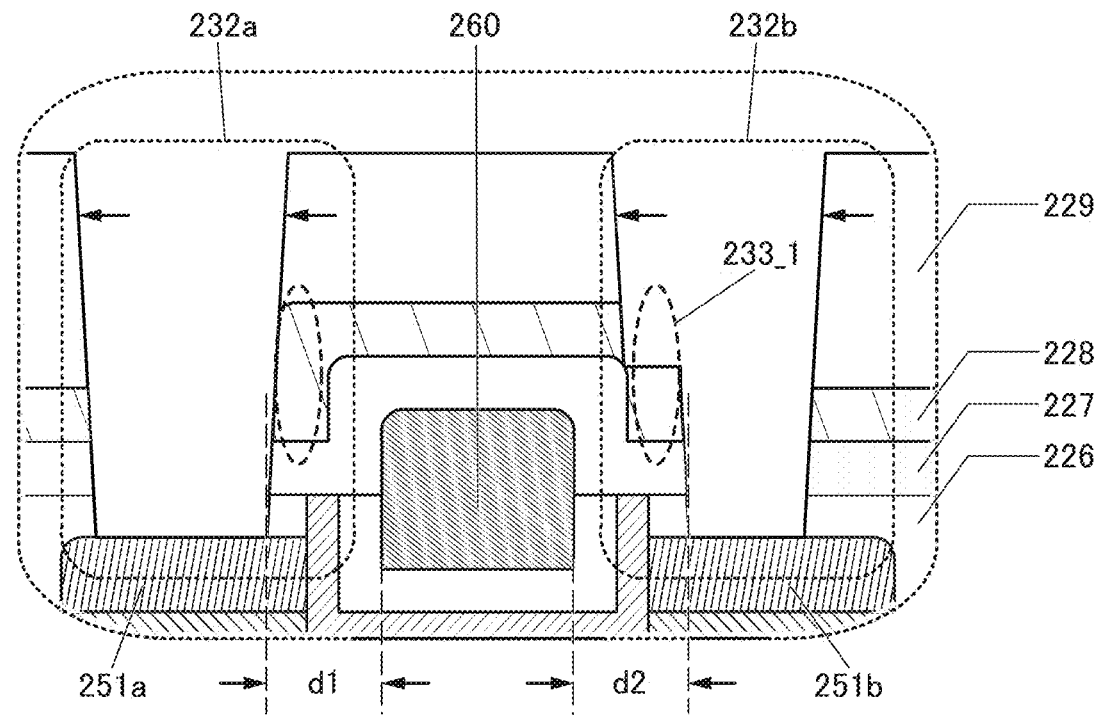
FIG. 16 Enlarged cross-sectional views of a semiconductor device of one embodiment of the present invention during manufacture.
Figure 16B:
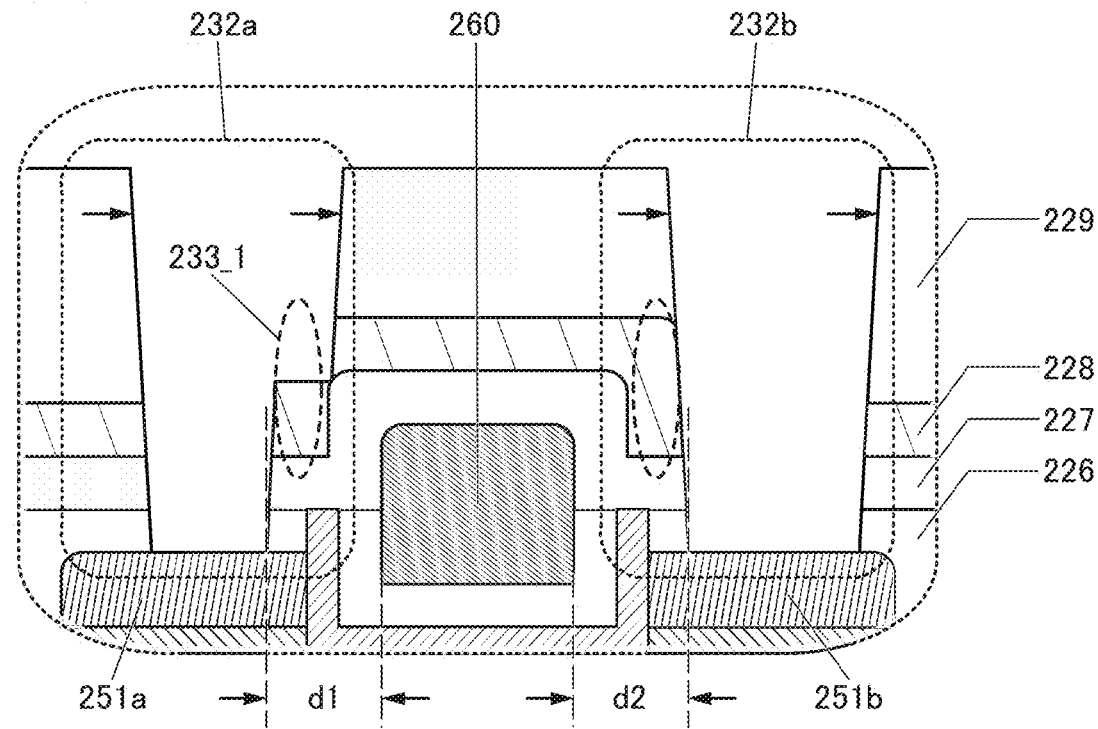

FIG. 16 shows enlarged views of the region 235 in the case where the opening 232a and the opening 232b are formed in the state where the above misalignment is caused. FIG. 16(A) is a cross-sectional view of the case where misalignment to the left of the target position is caused, and FIG. 16(B) is a cross-sectional view of the case where misalignment to the right of the target position is caused. It is found that the opening 232a and the opening 232b can be formed with the distance d1 and the distance d2 kept as long as the misalignment is within the width of the region 233_1.

As described above, in order to achieve "manufacture of a semiconductor device that can be miniaturized", which is one of the problems to be solved by the present invention, not only miniaturization of the transistor (a reduction in the channel length, the channel width, or the like) included in the semiconductor device, but also a reduction in the space between plugs connecting a wiring and a source electrode or a drain electrode of the transistor, a reduction in the opening diameter of a contact hole for passing the plug, and establishment of a manufacturing process that enables these are required, for example. The manufacturing method described in this embodiment has features such as no contact between the plug and the first gate electrode of the transistor even with a narrow space between the plugs, formation of the opening for the plug with high accuracy, and the constant distance between the first gate electrode of the transistor and the plug even when misalignment is caused to some degree at the time of the formation of the opening, i.e., a high degree of freedom in a manufacturing process, and thus can be said to be a manufacturing method having a possibility of satisfying the above requirements.

After the opening 232a and the opening 232b are formed, a conductor to be the conductor 252 (the conductor 252a and the conductor 252b) is deposited on the inner walls of the opening 232a and the opening 232b and over the insulator 229.

Next, a top surface of the conductor to be the conductor 252 is polished until the top surface of the insulator 229 is exposed, so that the conductor 252a and the conductor 252b are formed in the opening 232a and in the opening 232b, respectively. The polishing can be performed by CMP treatment or the like. Alternatively, the conductor 252a and the conductor 252b may be formed by performing dry etching on the top surface of the conductor to be the conductor 252 until the top surface of the insulator 229 is exposed. In this embodiment, the conductor 252a and the conductor 252b are formed by CMP treatment. By the CMP treatment, the levels of the top surfaces of the insulator 229, the conductor 252a, and the conductor 252b can be formed to be substantially the same. Note that the insulator 229 is partly removed by the CMP treatment in some cases. Note that the distance between the conductor 260 functioning as the first gate electrode and a region of the conductor 252a in contact with the conductor 251a, which face each other, is equal to d1 described above. Similarly, the distance between the conductor 260 and a region of the conductor 252b in contact with the conductor 251b, which face each other, is equal to d2 described above.

Thus, the semiconductor device including the transistor 200 of one embodiment of the present invention can be manufactured (see FIG. 1).

As described above, a method for manufacturing the semiconductor device including the transistor 200, which is described in this embodiment, is used, whereby a semiconductor device that can be miniaturized can be manufactured.

Furthermore, a semiconductor device can be manufactured with high yield. In addition, a semiconductor device with a high degree of freedom in a manufacturing process can be manufactured.

<Manufacturing Method 2 of Semiconductor Device>

An example of a method for manufacturing the semiconductor device including the transistor 200 of one embodiment of the present invention, which is described in <Structure example 2 of semiconductor device>, will be described below with reference to FIG. 17 to FIG. 30. Note that figures (A) in FIG. 17 to FIG. 25 and FIG. 27 are each a top view of the semiconductor device including the transistor 200. Figures (B) and (C) are cross-sectional views of the semiconductor device. Here, the figure (B) is a cross-sectional view of a portion indicated by dashed-dotted line A1-A2 in the figure (A), which is a cross-sectional view of the transistor 200 in the channel length direction. The figure (C) is a cross-sectional view of a portion indicated by dashed-dotted line A3-A4 in the figure (A), which is a cross-sectional view of the transistor 200 in the channel width direction. Note that in the manufacturing method of a semiconductor device described below, the description in <Components of semiconductor device> can be referred to for specific materials of components (e.g., a substrate, an insulator, a conductor, and an oxide) that can be used for the semiconductor device.

First, a substrate (not illustrated) is prepared, and the insulator 210 is deposited over the substrate. The insulator 210 can be deposited by a sputtering method, a CVD method, an MBE method, a PLD method, an ALD method, or the like.

In this embodiment, for the insulator 210, aluminum oxide is deposited by a sputtering method. The insulator 210 may have a multilayer structure. For example, a structure may be employed in which aluminum oxide is deposited by a sputtering method and another aluminum oxide is deposited by an ALD method over the aluminum oxide. Alternatively, a structure may be employed in which aluminum oxide is deposited by an ALD method and another aluminum oxide is deposited by a sputtering method over the aluminum oxide.

Next, the insulator 212 is deposited over the insulator 210. The insulator 212 can be deposited by a sputtering method, a CVD method, an MBE method, a PLD method, an ALD method, or the like. In this embodiment, for the insulator 212, silicon oxide is deposited by a CVD method. Note that other than silicon oxide, silicon oxynitride may be used for the insulator 212, for example.

Figure 17A:
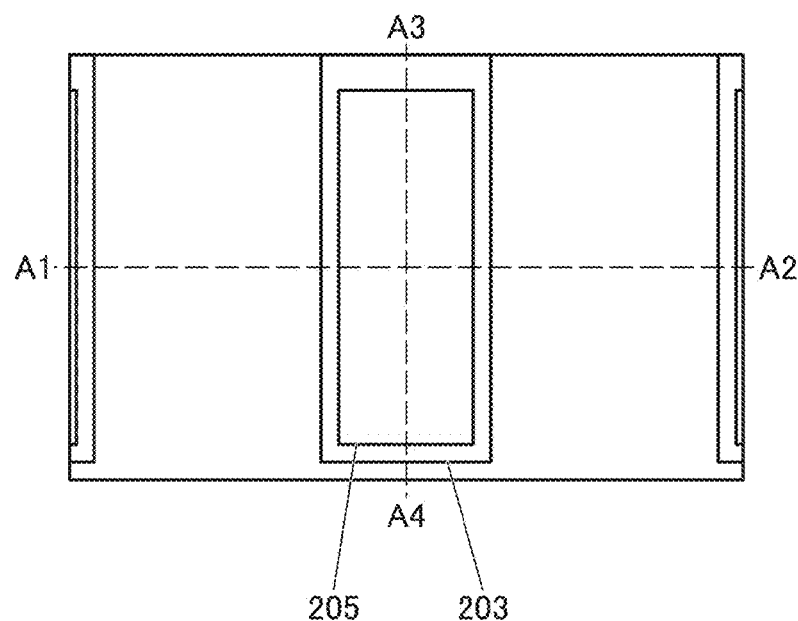
FIG. 17 A top view and cross-sectional views illustrating a manufacturing method of a semiconductor device of one embodiment of the present invention.

Then, an opening reaching the insulator 210 is formed in the insulator 212. Here, examples of the opening include a groove and a slit. A region where an opening is formed may be referred to as an opening portion. A wet etching method may be used for forming the opening; however, a dry etching method is more suitable for microfabrication. An insulator that serves as an etching stopper film used in forming the opening by etching the insulator 212 is preferably selected for the insulator 210. For example, in the case where a silicon oxide film is used as the insulator 212 in which the opening is formed, a silicon nitride film, an aluminum oxide film, or a hafnium oxide film is preferably used as the insulator 210. Note that as illustrated in FIG. 17(A) and FIG. 17(B), a plurality of openings are provided in the insulator 212 in the channel length direction with predetermined spaces, which is different from the semiconductor device described in the above <Manufacturing method 1 of semiconductor device>.

After the formation of the opening, a conductor to be the conductor 203a is deposited. The conductor preferably contains a conductor which has a function of inhibiting the passage of oxygen. For example, tantalum nitride, tungsten nitride, or titanium nitride can be used. Alternatively, a stacked-layer film with tantalum, tungsten, titanium, molybdenum, aluminum, copper, or a molybdenum-tungsten alloy can be used. The conductor to be the conductor 203a can be deposited by a sputtering method, a CVD method, an MBE method, a PLD method, an ALD method, or the like.

In this embodiment, for the conductor to be the conductor 203a, tantalum nitride or a stacked film of tantalum nitride and titanium nitride thereover is formed by a sputtering method. Even when a metal that is easily diffused, such as copper, is used for the conductor 203b described later, the use of such a metal nitride for the conductor 203a can prevent the metal from being diffused into the outside from the conductor 203a.

Next, a conductor to be the conductor 203b is deposited over the conductor to be the conductor 203a. The conductor can be deposited by a sputtering method, a CVD method, an MBE method, a PLD method, an ALD method, or the like. In this embodiment, for the conductor to be the conductor 203b, a low-resistance conductive material such as copper is deposited.

Next, CMP treatment is performed, so that the conductor to be the conductor 203a and the conductor to be the conductor 203b are partly removed and the insulator 212 is exposed. As a result, the conductor to be the conductor 203a and the conductor to be the conductor 203b remain only in the opening portion. Thus, the plurality of conductors 203 including the conductors 203a and the conductors 203b, which have flat top surfaces, can be formed in the channel length direction (see FIG. 17). Note that the insulator 212 is partly removed by the CMP treatment in some cases.

Next, the insulator 214 is deposited over the insulator 212 and the conductors 203. The insulator 214 can be deposited by a sputtering method, a CVD method, an MBE method, a PLD method, an ALD method, or the like. In this embodiment, for the insulator 214, silicon nitride is deposited by a CVD method. In this manner, even when a metal that is easily diffused, such as copper, is used for the conductor 203b, the use of an insulator through which copper is less likely to pass, such as silicon nitride, for the insulator 214 can prevent the metal from being diffused into a layer above the insulator 214.

Next, the insulator 216 is deposited over the insulator 214. The insulator 216 can be deposited by a sputtering method, a CVD method, an MBE method, a PLD method, an ALD method, or the like. In this embodiment, for the insulator 216, silicon oxide is deposited by a CVD method. Note that other than silicon oxide, silicon oxynitride may be used for the insulator 216, for example.

Then, an opening reaching the conductor 203 is formed in the insulator 214 and the insulator 216. A wet etching method may be used for forming the opening; however, a dry etching method is more suitable for microfabrication. Since the plurality of conductors 203 are provided in the channel length direction, the plurality of openings are provided in the channel length direction in accordance with positions of the conductors 203.

After the formation of the opening, a conductor to be the conductor 205a is deposited. The conductor to be the conductor 205a preferably contains a conductive material which has a function of inhibiting the passage of oxygen. For example, tantalum nitride, tungsten nitride, or titanium nitride can be used. Alternatively, a stacked-layer film with tantalum, tungsten, titanium, molybdenum, aluminum, copper, or a molybdenum-tungsten alloy can be used. The conductor to be the conductor 205a can be deposited by a sputtering method, a CVD method, an MBE method, a PLD method, an ALD method, or the like.

In this embodiment, tantalum nitride is deposited by a sputtering method for the conductor to be the conductor 205a.

Next, a conductor to be the conductor 205b is deposited over the conductor to be the conductor 205a. The conductor can be deposited by a sputtering method, a CVD method, an MBE method, a PLD method, an ALD method, or the like In this embodiment, for the conductor to be the conductor 205b, titanium nitride is deposited by an ALD method and tungsten is deposited by a CVD method over titanium nitride.

Next, CMP treatment is performed, so that the conductor to be the conductor 205a and the conductor to be the conductor 205b are partly removed and the insulator 216 is exposed. As a result, the conductor to be the conductor 205a and the conductor to be the conductor 205b remain only in the opening portion. Thus, the plurality of conductors 205 including the conductors 205a and the conductors 205b, which have flat top surfaces, can be formed in the channel length direction (see FIG. 17). Note that the insulator 216 is partly removed by the CMP treatment in some cases.

Next, the insulator 220 is deposited over the insulator 216 and the conductor 205. The insulator 220 can be deposited by a sputtering method, a CVD method, an MBE method, a PLD method, an ALD method, or the like. In this embodiment, for the insulator 220, silicon oxide is deposited by a CVD method. Note that other than silicon oxide, silicon oxynitride may be used for the insulator 220, for example.

Next, the insulator 222 is deposited over the insulator 220. The insulator 222 can be deposited by a sputtering method, a CVD method, an MBE method, a PLD method, an ALD method, or the like.

It is particularly preferable that hafnium oxide be deposited for the insulator 222 by an ALD method. Hafnium oxide deposited by an ALD method has a barrier property against oxygen, hydrogen, and water. When the insulator 222 has a barrier property against hydrogen and water, hydrogen and water contained in structure bodies provided around the transistor 200 are not diffused into the transistor 200, and generation of oxygen vacancies in the oxide 230 can be inhibited.

Next, the insulator 224 is deposited over the insulator 222. The insulator 224 can be deposited by a sputtering method, a CVD method, an MBE method, a PLD method, an ALD method, or the like. In this embodiment, for the insulator 224, silicon oxide is deposited by a CVD method. Note that other than silicon oxide, silicon oxynitride may be used for the insulator 224, for example.

Next, first heat treatment is preferably performed. The first heat treatment may be performed at higher than or equal to 250° C. and lower than or equal to 650° C., preferably higher than or equal to 300° C. and lower than or equal to 500° C., further preferably higher than or equal to 320° C. and lower than or equal to 450° C. The first heat treatment is performed in a nitrogen or inert gas atmosphere, or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in a nitrogen or inert gas atmosphere first, and then heat treatment is successively performed in an atmosphere containing an oxidizing gas at 10 ppm or more, 1% or more, or 10% or more in order to compensate for released oxygen.

By the above heat treatment, impurities such as hydrogen and water contained in the insulator 224 can be removed, for example.

Alternatively, as the first heat treatment, plasma treatment using oxygen may be performed under a reduced pressure. The plasma treatment using oxygen is preferably performed using an apparatus including a power source for generating high-density plasma using microwaves, for example. Alternatively, a power source for applying an RF to a substrate side may be included. The use of high-density plasma enables high-density oxygen radicals to be generated, and application of an RF to a substrate side allows the oxygen radicals generated by the high-density plasma to be efficiently introduced into the insulator 224. Alternatively, after plasma treatment using an inert gas is performed with this apparatus, plasma treatment using oxygen may be performed to compensate for released oxygen. Note that the first heat treatment is not necessarily performed in some cases.

This heat treatment can also be performed after the deposition of the insulator 220 and after the deposition of the insulator 222. Although the conditions for the above-described heat treatment can be used for the heat treatment, the heat treatment after the deposition of the insulator 220 is preferably performed in an atmosphere containing nitrogen.

In this embodiment, as the first heat treatment, treatment is performed in a nitrogen atmosphere at 400° C. for one hour after the deposition of the insulator 224.

Next, an oxide 230A to be the oxide 230a, and an oxide 230B to be the oxide 230b are sequentially deposited over the insulator 224. Note that the oxides are preferably deposited successively without exposure to the air. By the deposition without exposure to the air, impurities or moisture from the air can be prevented from being attached to the oxide 230A and the oxide 230B, so that the vicinity of an interface between the oxide 230A and the oxide 230B can be kept clean.

The oxide 230A and the oxide 230B can be deposited by a sputtering method, a CVD method, an MBE method, a PLD method, an ALD method, or the like.

In the case where the oxide 230A and the oxide 230B are deposited by a sputtering method, for example, oxygen or a mixed gas of oxygen and a rare gas is used as a sputtering gas. By increasing the proportion of oxygen in the sputtering gas, excess oxygen in the oxides to be deposited can be increased. In the case where the above oxides are deposited by a sputtering method, the above-described In-M-Zn oxide target can be used.

In particular, at the time of the deposition of the oxide 230A, part of oxygen contained in the sputtering gas is supplied to the insulator 224 in some cases. Note that the proportion of oxygen in the sputtering gas for the oxide 230A is 70% or higher, preferably 80% or higher, further preferably 100%.

In the case where the oxide 230B is deposited by a sputtering method, the proportion of oxygen in the sputtering gas is set to be higher than or equal to 1% and lower than or equal to 30%, preferably higher than or equal to 5% and lower than or equal to 20%, whereby an oxygen-deficient metal oxide is formed. A transistor using an oxygen-deficient metal oxide for a channel formation region can have relatively high field-effect mobility.

In this embodiment, the oxide 230A is deposited by a sputtering method using a target with In:Ga:Zn=1:3:4 [atomic ratio]. The oxide 230B is deposited by a sputtering method using a target with In:Ga:Zn=4:2:4.1 [atomic ratio]. An oxide 230C is deposited by a sputtering method using a target with In:Ga:Zn=4:2:4.1 [atomic ratio]. Note that each of the oxides is preferably deposited to have characteristics required for the oxide 230 of the transistor 200 by appropriate selection of deposition conditions and an atomic ratio.

Then, second heat treatment may be performed. For the second heat treatment, the above-described conditions for the first heat treatment can be used. By the second heat treatment, impurities such as hydrogen and water in the oxide 230A and the oxide 230B can be removed, for example. Furthermore, excess oxygen contained in the oxide 230A can be supplied to the oxide 230B. The oxide 230B is an oxide to be the oxide 230b in which the channel formation region of the transistor 200 is formed later. Therefore, by the second heat treatment, oxygen is supplied to the oxide 230B and the oxygen vacancies in the oxide 230B are reduced; thus, the transistor 200 having favorable electrical characteristics and reliability can be provided. In this embodiment, treatment is performed at 400° C. in a nitrogen atmosphere for one hour, and another treatment is successively performed at 400° C. in an oxygen atmosphere for one hour.

Figure 17C:
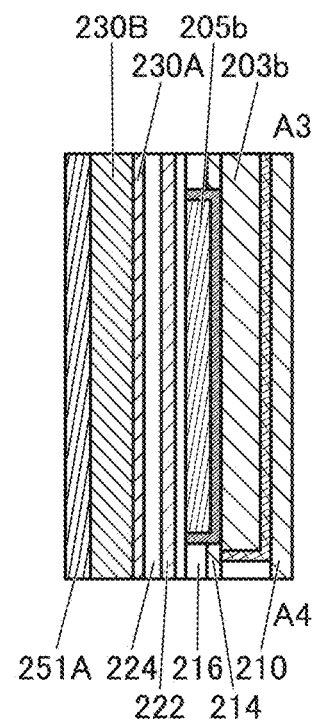
Figure 17B:
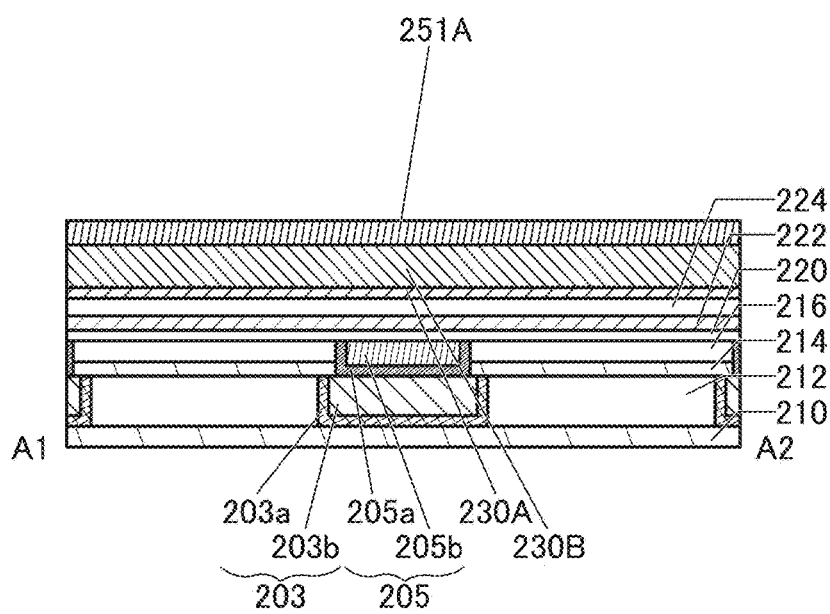

Next, a conductor 251A to be the conductor 251a and the conductor 251b is deposited (see FIG. 17). The conductor 251A can be deposited by a sputtering method, a CVD method, an MBE method, a PLD method, an ALD method, or the like. For the conductor 251A, for example, a conductor such as tantalum nitride, tungsten, or titanium nitride can be used. Alternatively, for example, a structure may be employed in which tungsten is deposited, and a conductor which has a function of inhibiting the passage of oxygen, such as titanium nitride or tantalum nitride, is deposited over tungsten. With such a structure, an increase in electric resistance value due to oxidation of tungsten by oxygen entering from above the conductor 251A can be inhibited.

Alternatively, for the conductor 251A, a structure may be employed in which a conductive oxide such as indium tin oxide, indium oxide containing tungsten oxide, indium zinc oxide containing tungsten oxide, indium oxide containing titanium oxide, indium tin oxide containing titanium oxide, indium zinc oxide, indium tin oxide to which silicon is added, or indium gallium zinc oxide containing nitrogen is deposited and a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like, a semiconductor with high electric conductivity typified by polycrystalline silicon containing an impurity element such as phosphorus, or silicide such as nickel silicide is deposited over the oxide.

The oxide sometimes has a function of absorbing hydrogen in the oxide 230 and capturing hydrogen diffused from the outside; thus, the electrical characteristics and reliability of the transistor 200 are improved in some cases. Moreover, titanium used instead of the oxide may have a similar function.

In this embodiment, for the conductor 251A, tantalum nitride is deposited by a sputtering method.

Figure 18A:
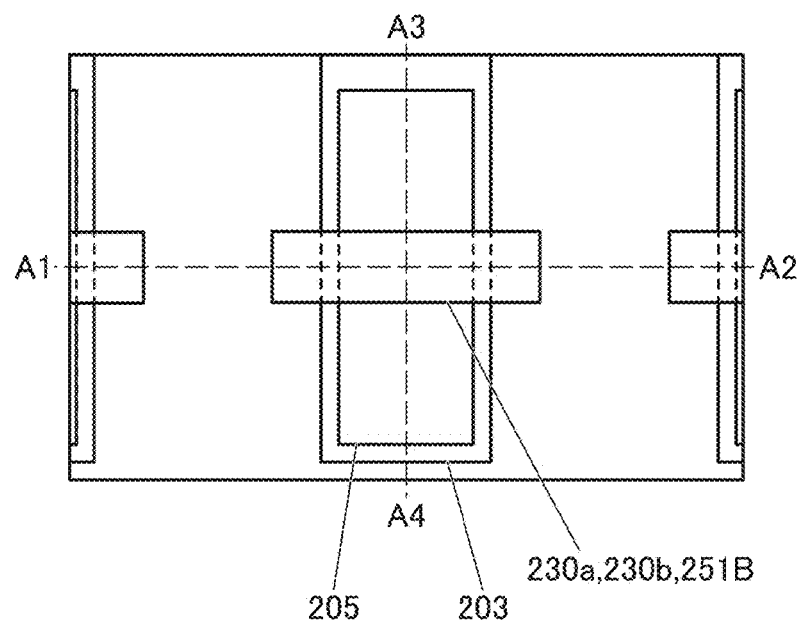
FIG. 18 A top view and cross-sectional views illustrating a manufacturing method of a semiconductor device of one embodiment of the present invention.
Figure 18C:
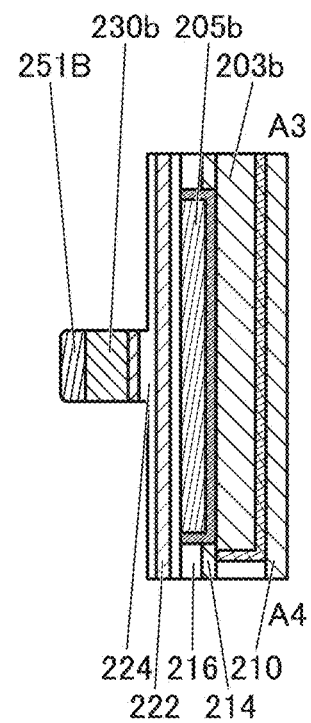
Figure 18B:
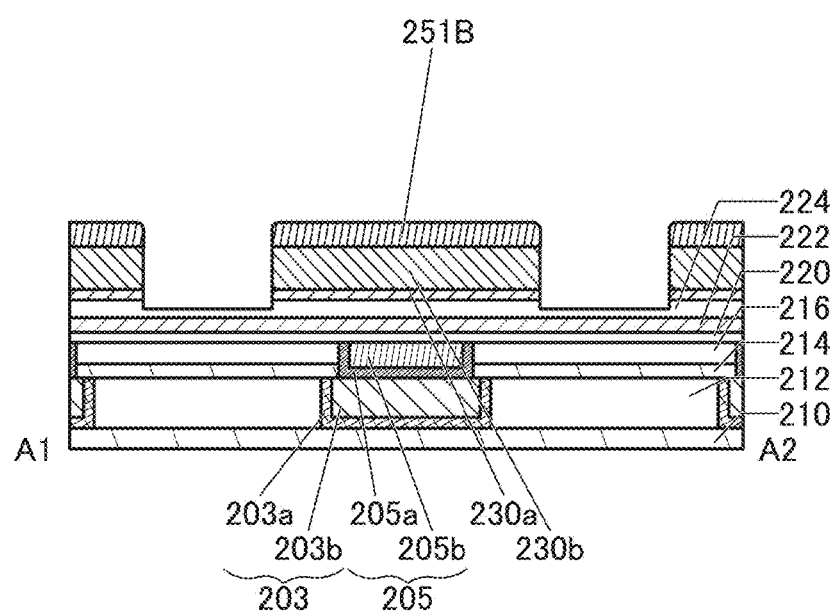

Next, the oxide 230A, the oxide 230B, and the conductor 251A are processed by a lithography method, whereby the oxide 230a, the oxide 230b, and the conductor 251B are formed over the insulator 224 (see FIG. 18). Note that the insulator 224 is partly removed by the processing in some cases.

Here, the oxide 230a and the oxide 230b are formed to at least partly overlap with the conductor 205. Thus, the plurality of oxides 230a and the plurality of oxides 230b are formed in the channel length direction in accordance with positions of the conductors 205. It is preferable that side surfaces of the oxide 230a and the oxide 230b be substantially perpendicular to a top surface of the insulator 224. When the side surfaces of the oxide 230a and the oxide 230b are substantially perpendicular to the top surface of the insulator 224, the plurality of transistors 200 can be provided in a smaller area and at a higher density.

In the lithography method, first, a resist is exposed to light through a mask. Next, a region exposed to light is removed or left using a developing solution, so that a resist mask is formed. Then, etching treatment through the resist mask is performed, whereby a conductor, a semiconductor, an insulator, or the like can be processed into a desired shape.

The resist mask is formed by, for example, exposure of the resist to light using KrF excimer laser light, ArF excimer laser light, EUV light, or the like. Alternatively, a liquid immersion technique may be employed in which a portion between a substrate and a projection lens is filled with liquid (e.g., water) to perform light exposure. Furthermore, an electron beam or an ion beam may be used instead of the above-described light. A pattern is drawn directly on the resist in the case of using an electron beam or an ion beam, so that the above mask for the light exposure of the resist is unnecessary.

A dry etching method or a wet etching method can be used as the etching treatment in the lithography method. A dry etching method is particularly preferable because it is suitable for microfabrication. The resist mask remaining after the etching treatment can be removed by dry etching treatment such as ashing or wet etching treatment. Alternatively, the remaining resist mask can be removed by performing wet etching treatment after dry etching treatment or performing dry etching treatment after wet etching treatment, for example.

A hard mask formed of an insulator or a conductor may be used instead of the resist mask. In the case where a hard mask is used, an insulator or a conductor that is a hard mask material is formed over the conductor 251A, a resist mask is formed thereover, and then the hard mask material is etched, so that a hard mask with a desired shape can be formed. The etching of the oxide 230A, the oxide 230B, and the conductor 251A may be performed after removal of the resist mask or with the resist mask remaining. In the latter case, the resist mask disappears during the etching in some cases. The hard mask may be removed by etching after the etching of the oxide 230A, the oxide 230B, and the conductor 251A. In contrast, the hard mask is not necessarily removed in the case where the hard mask material does not affect the following process or can be utilized in the following process.

As a dry etching apparatus, a capacitively coupled plasma etching apparatus including parallel plate type electrodes can be used. The capacitively coupled plasma etching apparatus including the parallel plate type electrodes may have a structure in which a high-frequency power is applied to one of the parallel plate type electrodes. Alternatively, a structure may be employed in which different high-frequency powers are applied to one of the parallel plate type electrodes. Alternatively, a structure may be employed in which high-frequency powers with the same frequency are applied to the parallel plate type electrodes. Alternatively, a structure may be employed in which high-frequency powers with different frequencies are applied to the parallel plate type electrodes. Alternatively, a dry etching apparatus including a high-density plasma source can be used. As the dry etching apparatus including a high-density plasma source, an inductively coupled plasma etching apparatus can be used, for example.

In some cases, by performing the treatment such as dry etching, impurities due to an etching gas or the like are attached to or diffused into a surface or an inside of the oxide 230, the conductor 251B, and the like. Examples of the impurities include fluorine and chlorine.

In order to remove the impurities and the like, cleaning is performed. As the cleaning method, wet cleaning using a cleaning solution or the like, plasma treatment using plasma, cleaning by heat treatment, and the like can be given, and any of these cleanings may be performed in appropriate combination.

As the wet cleaning, cleaning treatment may be performed using an aqueous solution obtained by diluting an oxalic acid, a phosphoric acid, a hydrofluoric acid, or the like with carbonated water or pure water. Alternatively, ultrasonic cleaning using pure water or carbonated water may be performed. In this embodiment, ultrasonic cleaning using pure water or carbonated water is performed.

Then, third heat treatment may be performed. For the third heat treatment, the above-described conditions for the heat treatment can be used.

Next, an insulator 226A is deposited over the insulator 224 and the conductor 251B. The insulator 226A can be deposited by a sputtering method, a CVD method, an MBE method, a PLD method, an ALD method, or the like. In this embodiment, for the insulator 226A, silicon oxide is deposited by a CVD method. Note that other than silicon oxide, silicon oxynitride may be used for the insulator 226A, for example.

Figure 19A:
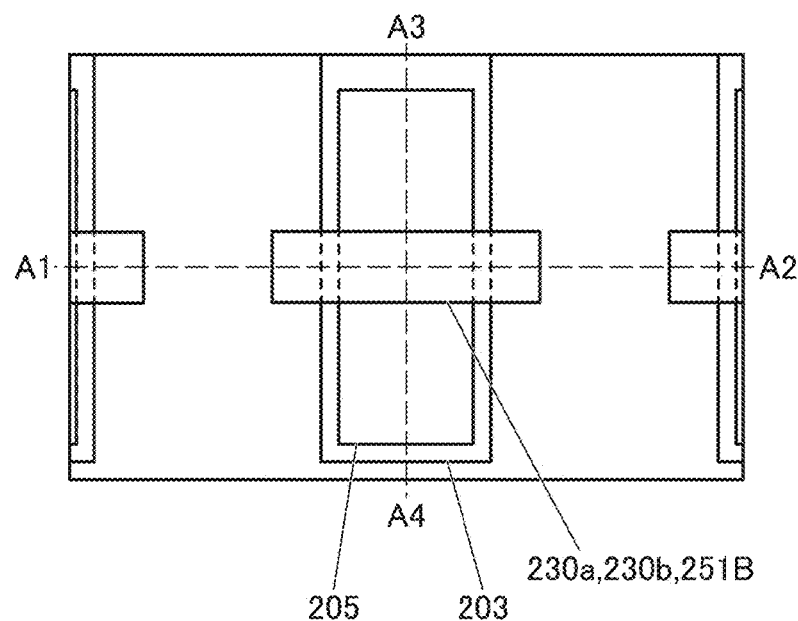
FIG. 19 A top view and cross-sectional views illustrating a manufacturing method of a semiconductor device of one embodiment of the present invention.
Figure 19C:
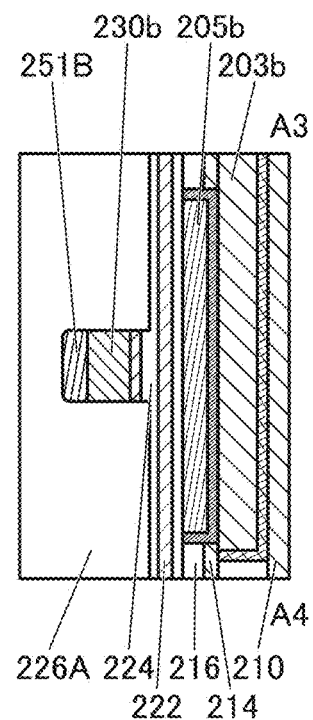
Figure 19B:
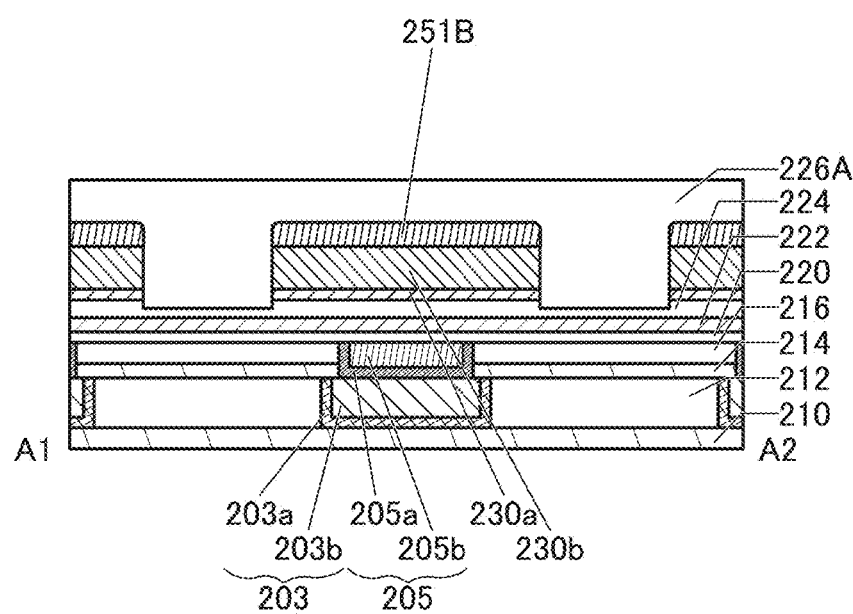

Then, part of the insulator 226A is removed, so that a top surface of the insulator 226A is planarized (see FIG. 19). The planarization can be performed by CMP treatment, dry etching treatment, or the like. In this embodiment, the top surface of the insulator 226A is planarized by CMP treatment. Note that in the case where the top surface of the insulator 226A has planarity after the deposition, the above-described planarization treatment is not necessarily performed in some cases.

Figure 20A:
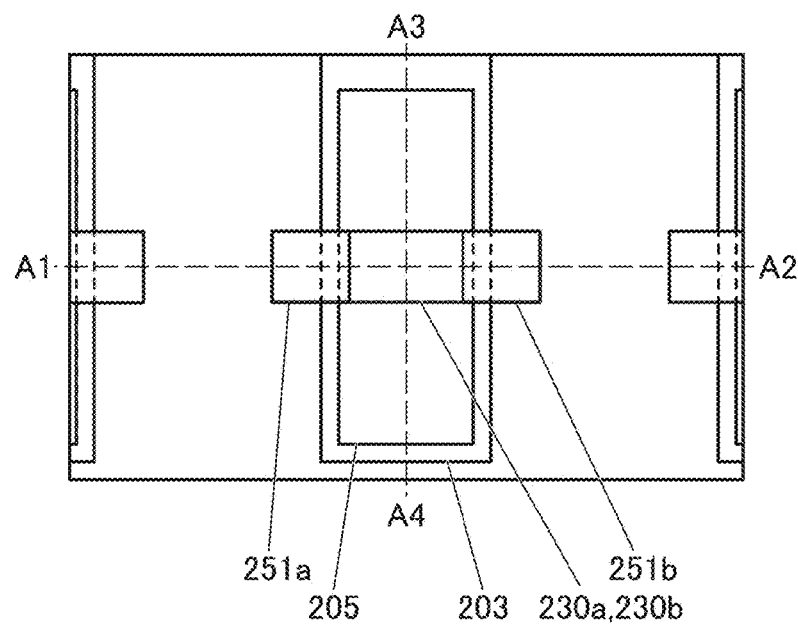
FIG. 20 A top view and cross-sectional views illustrating a manufacturing method of a semiconductor device of one embodiment of the present invention.
Figure 20C:
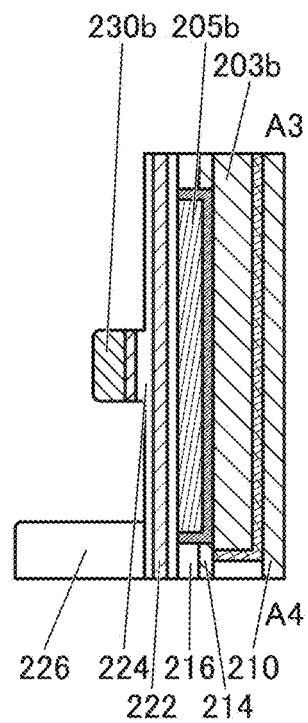

Next, the insulator 226A and the conductor 251B are processed by a lithography method, whereby an opening 241_1 reaching the top surface of the oxide 230$b$, an opening 241_2 and an opening 241_3 reaching the top surface of the insulator 224, the insulator 226, the conductor 251$a$, and the conductor 251$b$ are formed (see FIG. 20). For example, light exposure of a resist in a lithography method may be performed, through a mask, using KrF excimer laser light, ArF excimer laser light, EUV light, or the like or using a liquid immersion technique. A method may be employed in which a pattern is drawn directly on a resist using an electron beam or an ion beam without a mask. Light exposure using an electron beam or an ion beam makes it possible to draw finer pattern on a resist than light exposure using the above-described light, and thus is suitable for microfabrication. In this embodiment, light exposure of a resist is performed using an electron beam.

A dry etching method or a wet etching method can be used as the etching treatment in the lithography method. In this embodiment, after the resist is subjected to the above-described light exposure using an electron beam and developing, the insulator 226A and the conductor 251B are etched by a dry etching method. Note that the insulator 226A and the conductor 251 are etched successively using different etching gases.

Figure 20B:
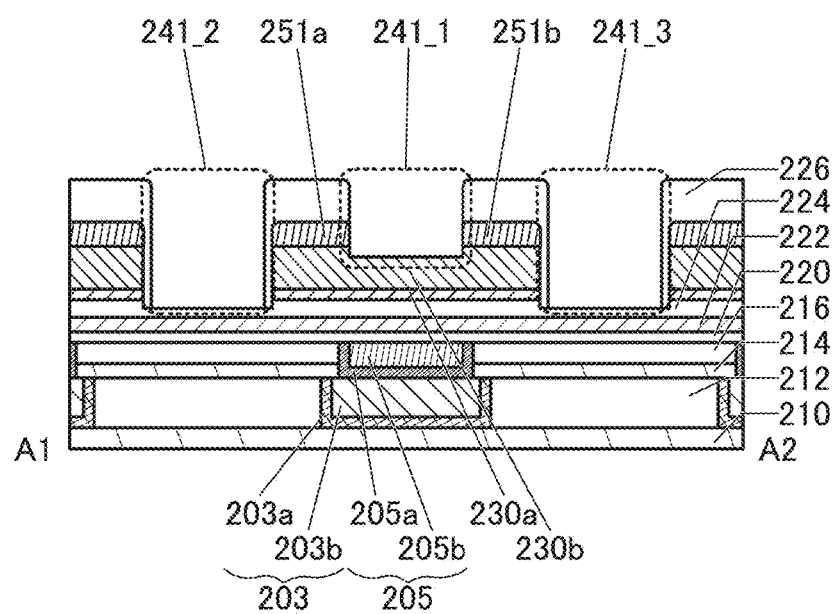

In this embodiment, first, etching is performed on the insulator 226A using a mixed gas of Ar, $O_2$, and $C_4F_6$. Here, as illustrated in FIG. 20(B), the etched thickness of the insulator 226A in a region to be the opening 241_1 is smaller than the etched thickness of the insulator 226A in regions to be the opening 241_2 and the opening 241_3. Thus, removal of the insulator 226A in the region to be the opening 241_1 is finished faster than removal of the insulator 226A in the regions to be the opening 241_2 and the opening 241_3. That is, from the finish of the removal of the insulator 226A in the region to be the opening 241_1 to the finish of the formation of the opening 241_2 and the opening 241_3, the conductor 251B in the region to be the opening 241_1 is exposed to the etching gas (the mixed gas of Ar, $O_2$, and $C_4F_6$) of the insulator 226A. However, in this embodiment, tantalum nitride is used for the conductor 251B and silicon oxide is used for the insulator 226A; thus, the sufficient selectivity between the two for the etching gas can be obtained (i.e., the etching rate of the conductor 251B is much smaller than the etching rate of the insulator 226A). Therefore, the insulator 226A can be removed in the regions to be the opening 241_1, the opening 241_2, and the opening 241_3 by the etching treatment without eliminating the conductor 251B. By the etching treatment, the opening 241_2, the opening 241_3, and the insulator 226 are formed.

Next, etching is performed on the conductor 251B in the region to be the opening 241_1 using a mixed gas of $Cl_2$ and $CF_4$. At this time, the insulator 224 in the regions to be the opening 241_2 and the opening 241_3 is also exposed to the etching gas. However, in this embodiment, silicon oxide is used for the insulator 224 and tantalum nitride is used for the conductor 251B; thus, the sufficient selectivity between the insulator 224 and the conductor 251B for the etching gas can be obtained (i.e., the etching rate of the insulator 224 is much smaller than the etching rate of the conductor 251B). Therefore, although partly removed by the etching treatment in some cases, the insulator 224 in the regions to be the opening 241_2 and the opening 241_3 is not completely eliminated. By the etching treatment, the opening 241_1, the conductor 251$a$, and the conductor 251$b$ are formed.

Next, the oxide 230C to be the oxide 230$c$ is deposited on inner walls of the opening 241_1, the opening 241_2, and the opening 241_3 and over the insulator 226. The oxide 230C can be deposited by a sputtering method, a CVD method, an MBE method, a PLD method, an ALD method, or the like. In the case where the oxide 230C is deposited by a sputtering method, the proportion of oxygen contained in the sputtering gas is 70% or higher, preferably 80% or higher, further preferably 100%. When the oxide 230C is deposited under the above conditions, part of oxygen contained in the sputtering gas is supplied to the oxide 230$b$ at the time of the deposition of the oxide 230C in some cases. In this embodiment, the oxide 230C is deposited by a sputtering method using a target with In:Ga:Zn=4:2:4.1 [atomic ratio].

Figure 21A:
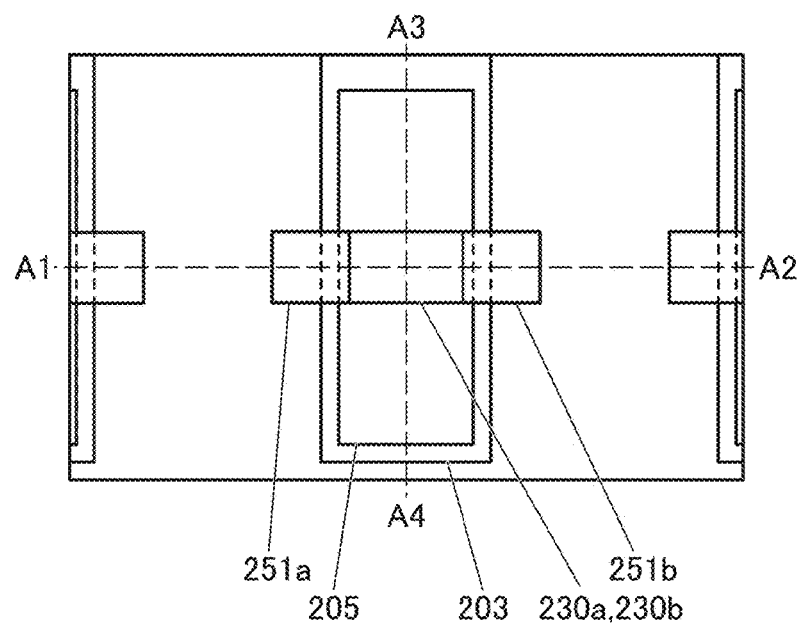
FIG. 21 A top view and cross-sectional views illustrating a manufacturing method of a semiconductor device of one embodiment of the present invention.
Figure 21C:
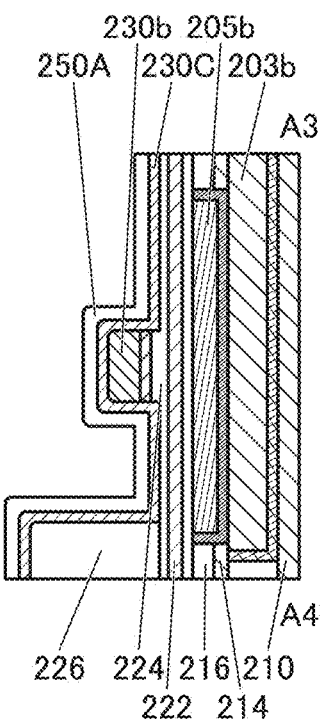
Figure 21B:
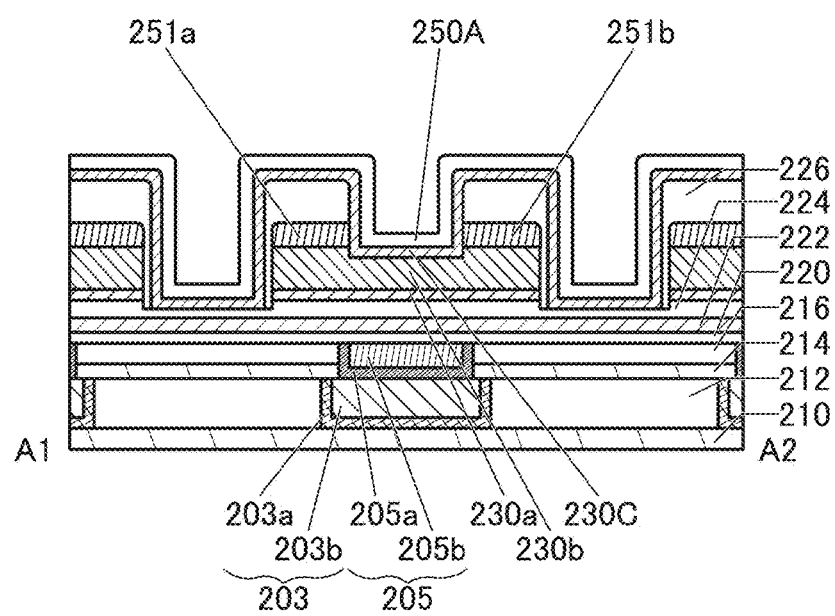

Next, an insulator 250A to be the insulator 250 is deposited over the oxide 230C (see FIG. 21). The insulator 250A can be deposited by a sputtering method, a CVD method, an MBE method, a PLD method, an ALD method, or the like. In this embodiment, for the insulator 250A, silicon oxide is deposited by a CVD method. Note that other than silicon oxide, silicon oxynitride may be used for the insulator 250A, for example.

Figure 22A:
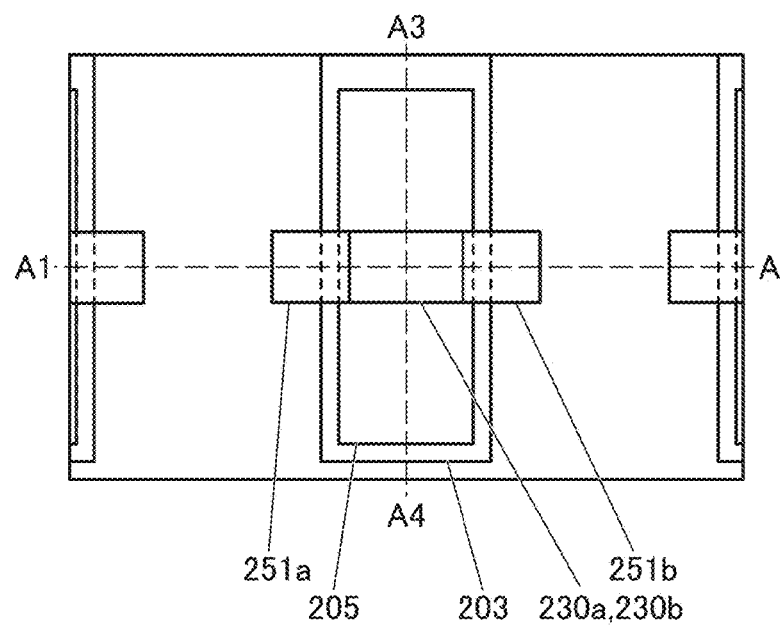
FIG. 22 A top view and cross-sectional views illustrating a manufacturing method of a semiconductor device of one embodiment of the present invention.
Figure 22C:
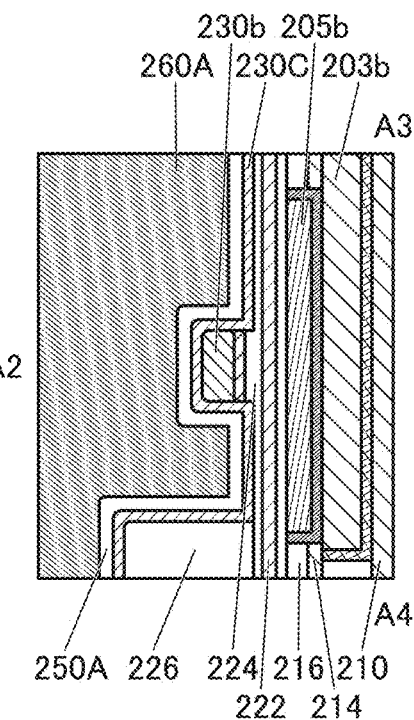
Figure 22B:
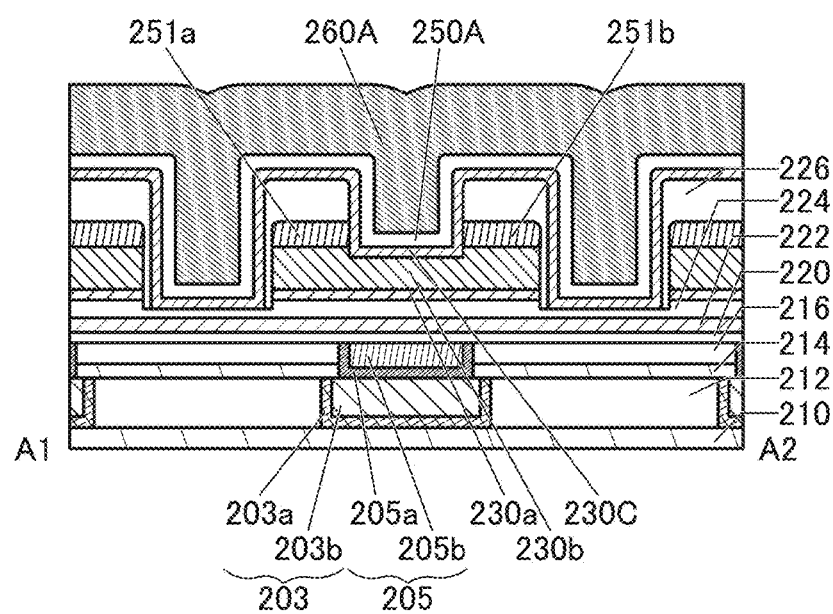

Next, a conductor 260A to be the conductor 260 is deposited over the insulator 250A (see FIG. 22). The conductor 260A can be deposited by a sputtering method, a CVD method, an MBE method, a PLD method, an ALD method, or the like. In this embodiment, for the conductor 260A, titanium nitride is deposited by an ALD method and then tungsten is deposited by a CVD method. Note that in the conductor 260A, the thickness of tungsten is preferably larger than the thickness of titanium nitride. It is preferable that titanium nitride be deposited along the inner walls of the opening 241_1, the opening 241_2, and the opening 241_3 with the insulator 250A therebetween and remaining spaces in the opening 241_1, the opening 241_2, and the opening 241_3 be filled with tungsten. The conductor 260A is deposited in such a manner, whereby the conductor 260 having a stacked-layer structure of titanium nitride and tungsten can be formed later.

Figure 23A:
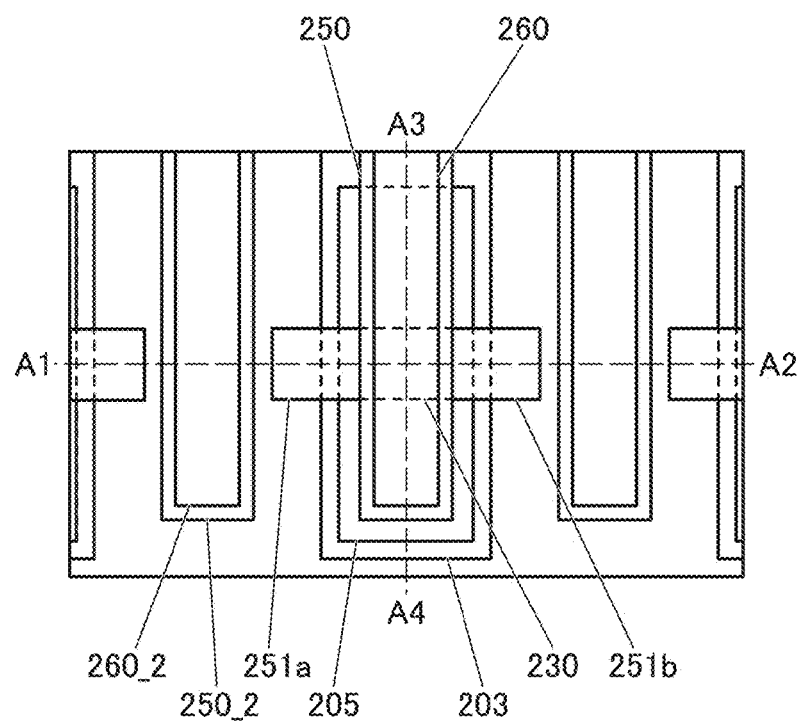
FIG. 23 A top view and cross-sectional views illustrating a manufacturing method of a semiconductor device of one embodiment of the present invention.
Figure 23C:
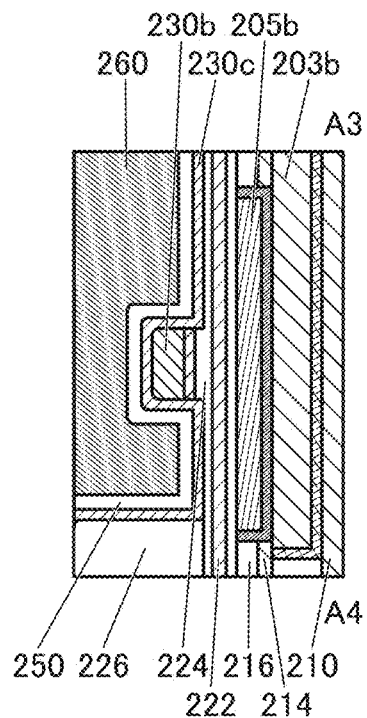
Figure 23B:
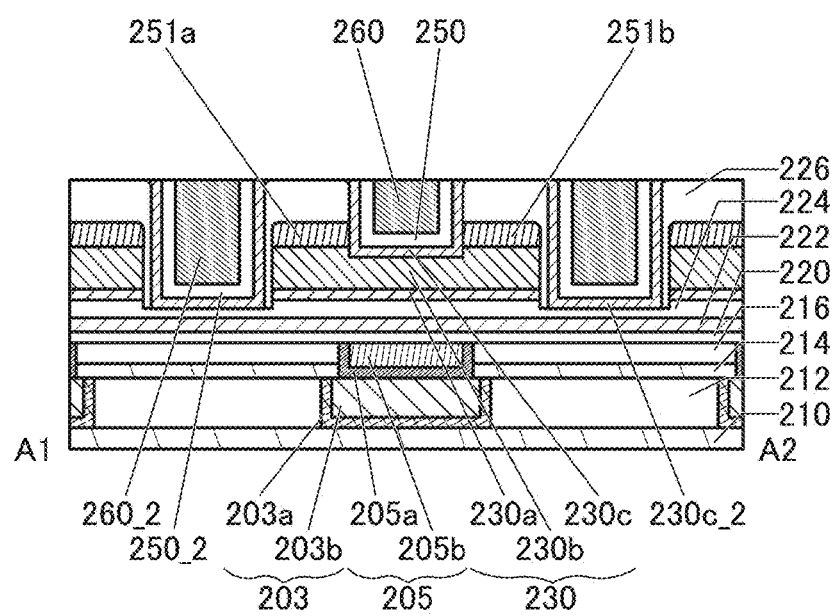

Next, top surfaces of the conductor 260A, the insulator 250A, and the oxide 230C are polished until the top surface of the insulator 226 is exposed, whereby the conductor 260, the conductor 2602, the insulator 250, the insulator 2502, the oxide 230c, and the oxide 230c2 are formed (see FIG. 23). The polishing can be performed by CMP treatment or the like. Alternatively, the conductor 260, the conductor 260_2, the insulator 250, the insulator 250_2, the oxide 230c, and the oxide 230c_2 may be formed in such a manner that the top surfaces of the conductor 260A, the insulator 250A, and the oxide 230C are subjected to dry etching until the top surface of the insulator 226 is exposed. In this embodiment, the conductor 260, the conductor 2602, the insulator 250, the insulator 2502, the oxide 230c, and the oxide 230c2 are formed by CMP treatment. By this CMP treatment, the levels of the top surfaces of the insulator 226, the insulator 250, the insulator 2502, the conductor 260, the conductor 2602, the oxide 230c, and the oxide 230c_2 can be formed to be substantially the same (see FIG. 23). Note that the insulator 226 is partly removed by the CMP treatment in some cases.

Figure 24A:
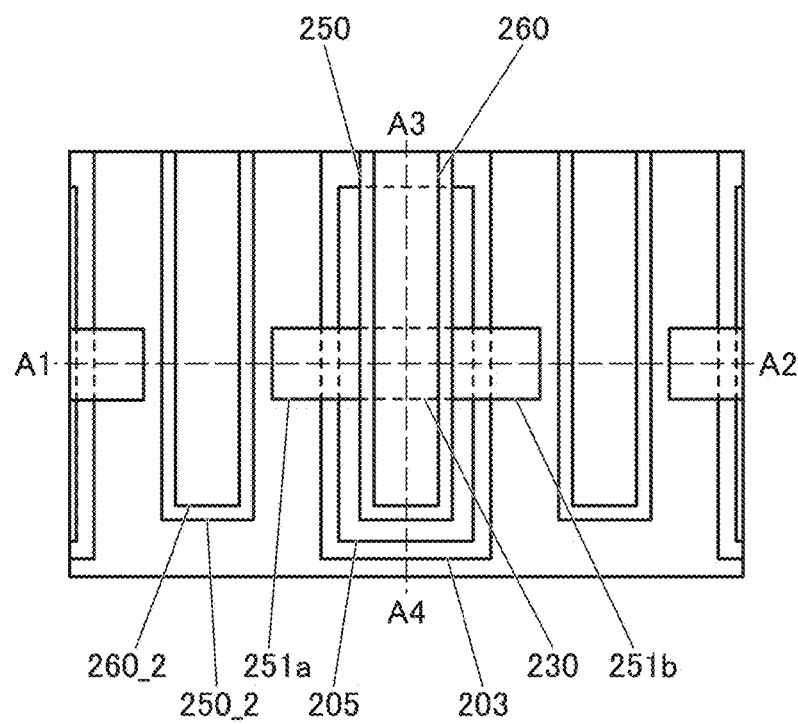
FIG. 24 A top view and cross-sectional views illustrating a manufacturing method of a semiconductor device of one embodiment of the present invention.
Figure 24C:
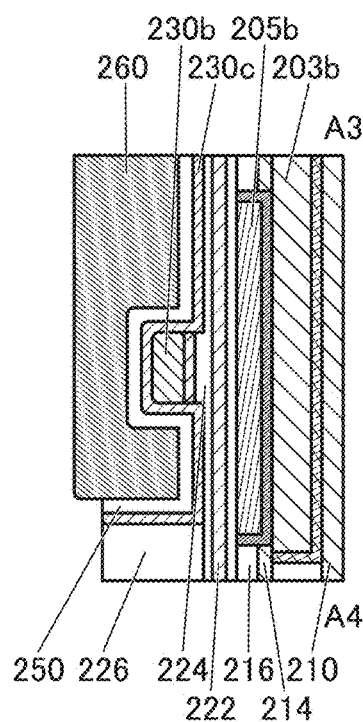
Figure 24B:
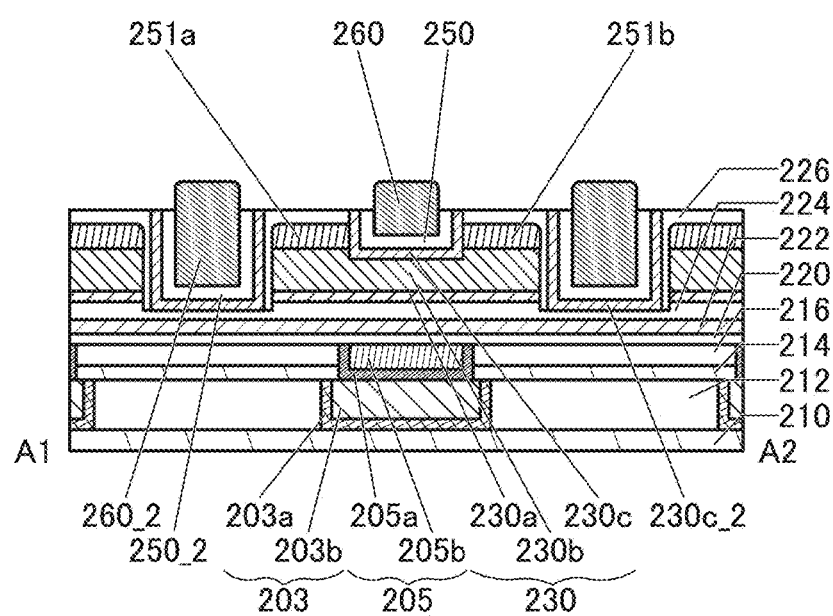

Next, the top surface of the insulator 226 is etched (half-etched back) and the level of the top surface of the insulator 226 is made lower than the levels of the top surfaces of the conductor 260 and the conductors 260_2, whereby steps are formed (see FIG. 24). A dry etching method or a wet etching method can be used for the etching treatment. In this embodiment, the top surface of the insulator 226 is etched by a desired thickness amount by a dry etching method using a mixed gas of Ar, $CHF_3$, and $CF_4$. The top surfaces of the oxide 230c, the oxide 230c_2, the insulator 250, and the insulator 250_2 are also partly removed by the etching treatment in some cases. Note that the levels of the top surfaces of the insulator 226, the oxide 230c, the oxide 230c_2, the insulator 250, and the insulator 250_2 after the etching treatment are preferably higher than the level of the top surface of the conductor 251 (the conductor 251a and the conductor 251b).

Figure 25A:
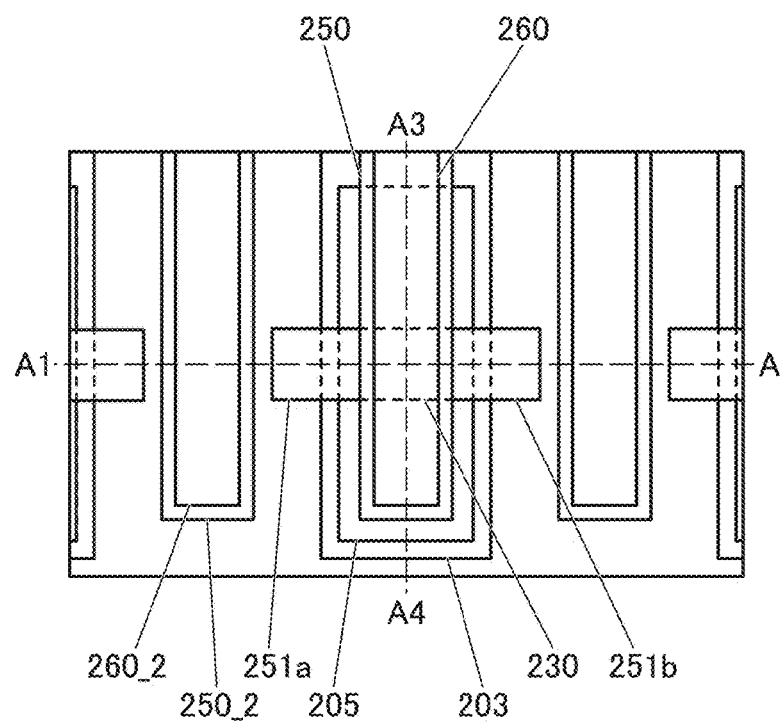
FIG. 25 A top view and cross-sectional views illustrating a manufacturing method of a semiconductor device of one embodiment of the present invention.
Figure 25C:
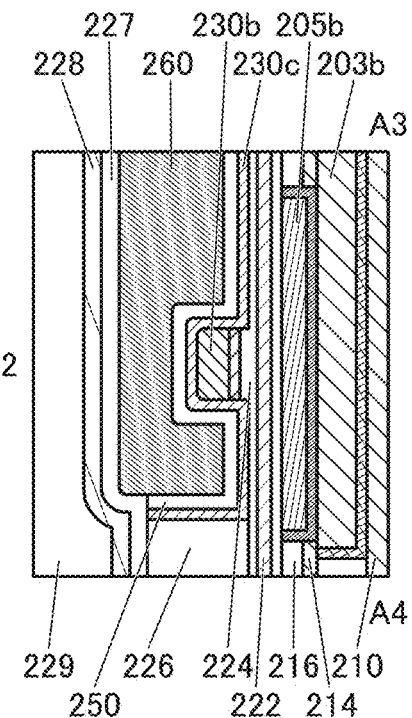

Next, the insulator 227 is deposited on the top surface of the insulator 226, the top surface of the insulator 250, the top surface of the insulator 250_2, the top surface of the oxide 230c, the top surface of the oxide 230c_2, the top surface of the conductor 260, the side surface of the conductor 260, the top surface of the conductor 260_2, and the side surface of the conductor 260_2; the insulator 228 is deposited over the insulator 227; and the insulator 229 is deposited over the insulator 228 (see FIG. 25). Note that the insulator 227 is not necessarily provided. The insulator 227, the insulator 228, and the insulator 229 can be deposited by a sputtering method, a CVD method, an MBE method, a PLD method, an ALD method, or the like. In this embodiment, silicon oxide is deposited for the insulator 227 by a CVD method, aluminum oxide is deposited for the insulator 228 by a sputtering method, and silicon oxide is deposited for the insulator 229 by a CVD method. Note that the insulator 229 is preferably formed thicker than the insulator 227 and the insulator 228. Note that other than silicon oxide, silicon oxynitride may be used for the insulator 227 and/or the insulator 229, for example. As described later, for the insulator 228, any material may be used as long as it can have the etching selectivity with respect to the insulator 229, the insulator 227, and the insulator 226; other than aluminum oxide, silicon nitride or hafnium oxide may be used, for example.

Figure 25B:
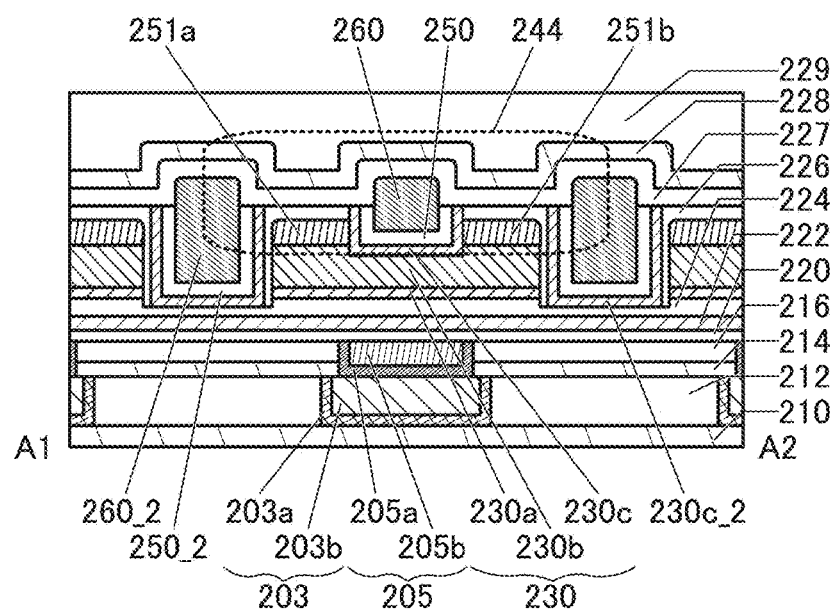
Figure 26:
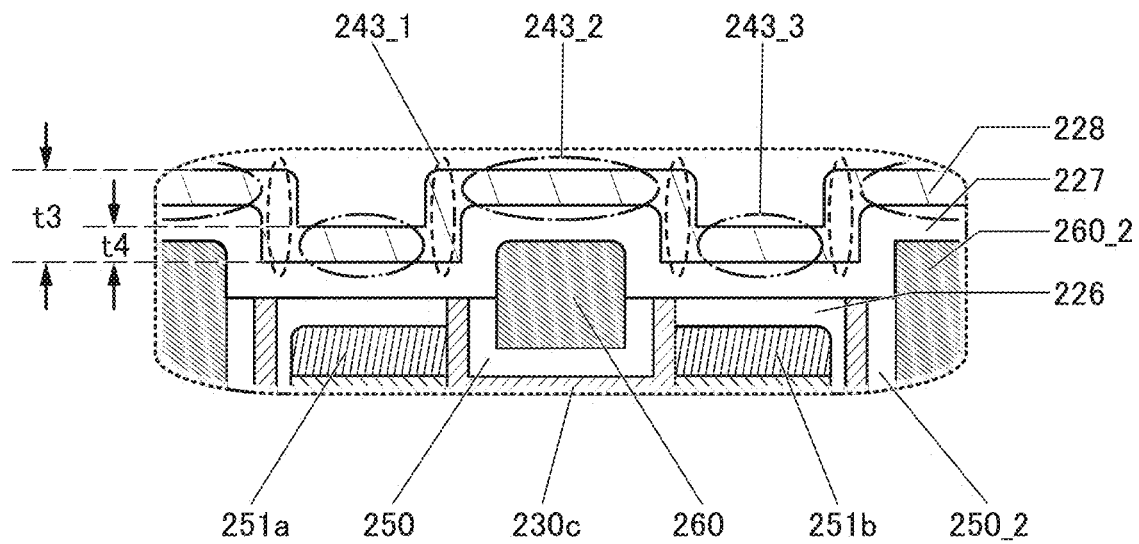
FIG. 26 An enlarged cross-sectional view of a semiconductor device of one embodiment of the present invention during manufacture.

FIG. 26 is an enlarged view of a region 244 in FIG. 25(B). As illustrated in FIG. 26, the insulator 228 includes region 243_1 formed along the side surface of the conductor 260 or the conductor 260_2 with the insulator 227 therebetween, a region 243_2 formed along the top surface of the conductor 260 or the conductor 260_2 with the insulator 227 therebetween, and a region 243_3 other than the region 243_1 and the region 243_2. Furthermore, in the insulator 228, a thickness t3 of the region 243_1 with reference to a formation surface of the region 243_3 is preferably twice or more a thickness t4 of the region 243_3 (see FIG. 26). The insulator 228 has the above structure, whereby the opening for providing the conductor 252 (the conductor 252a and the conductor 252b) functioning as a plug of the transistor 200 can be formed in a desired portion in a self-aligned manner without contact with the conductor 260 functioning as the first gate electrode. This will be described later.

Then, part of the insulator 229 is removed, so that the top surface of the insulator 229 is planarized (see FIG. 25). The planarization can be performed by CMP treatment, dry etching treatment, or the like. In this embodiment, the top surface of the insulator 229 is planarized by CMP treatment. Note that in the case where the top surface of the insulator 229 has planarity after the deposition, the above-described planarization treatment is not necessarily performed in some cases.

Figure 27A:
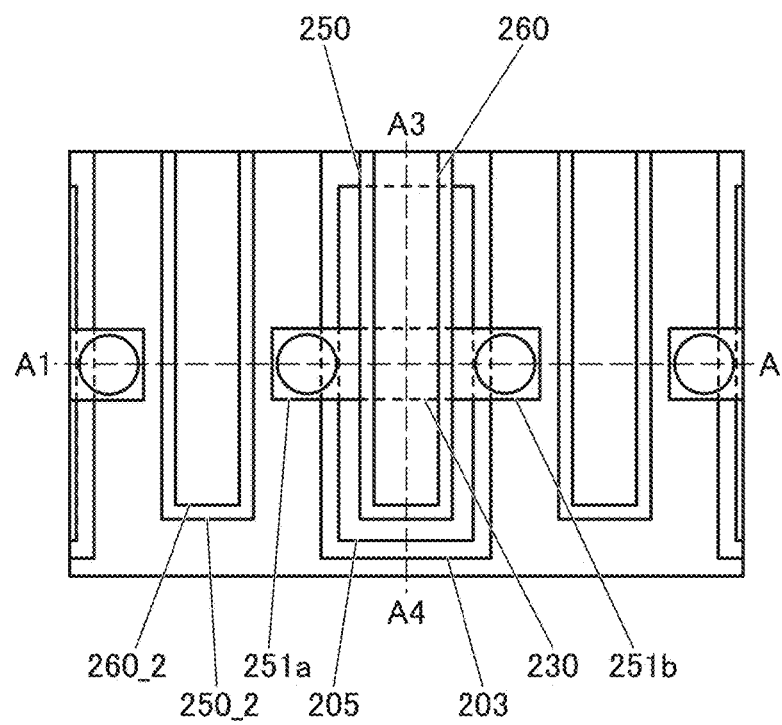
FIG. 27 A top view and cross-sectional views illustrating a manufacturing method of a semiconductor device of one embodiment of the present invention.
Figure 27C:
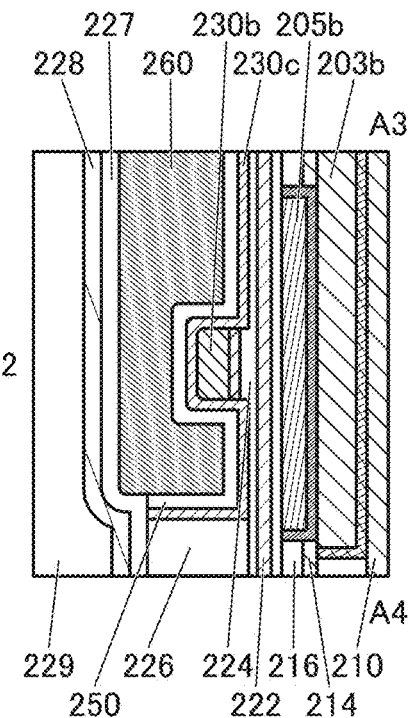

Next, the insulator 229, the insulator 228, the insulator 227, and the insulator 226 are processed by a lithography method, whereby an opening 242a reaching the top surface of the conductor 251a and an opening 242b reaching the top surface of the conductor 251b are formed (see FIG. 27). For example, light exposure of a resist in a lithography method may be performed, through a mask, using KrF excimer laser light, ArF excimer laser light, EUV light, or the like or using a liquid immersion technique. A method may be employed in which a pattern is drawn directly on a resist using an electron beam or an ion beam without a mask. Light exposure using an electron beam or an ion beam makes it possible to draw finer pattern on a resist than light exposure using the above-described light, and thus is suitable for microfabrication. In this embodiment, light exposure of a resist is performed using an electron beam.

A dry etching method or a wet etching method can be used as the etching treatment in the lithography method. In this embodiment, after the resist is subjected to the above-described light exposure using an electron beam and developing, the insulator 229, the insulator 228, the insulator 227, and the insulator 226 are etched by a dry etching method. Note that etching of the insulator 229, the insulator 227, and the insulator 226, and etching of the insulator 228 are performed using different etching gases. In this embodiment, etching is performed on the insulator 229, the insulator 227, and the insulator 226 using a mixed gas of Ar, $O_2$, and $C_4F_6$, and etching is performed on the insulator 228 using a mixed gas of Ar, $H_2$, and $C_4F_8$. In some cases, part of the conductor 251 (the conductor 251a and the conductor 251b) is removed by the etching treatment.

Figure 27B:
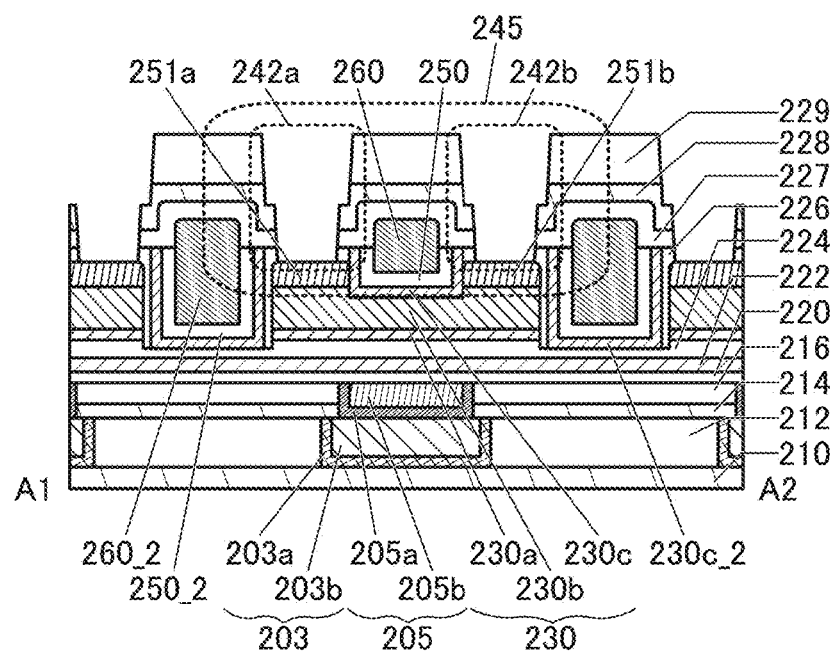
Figure 28A:
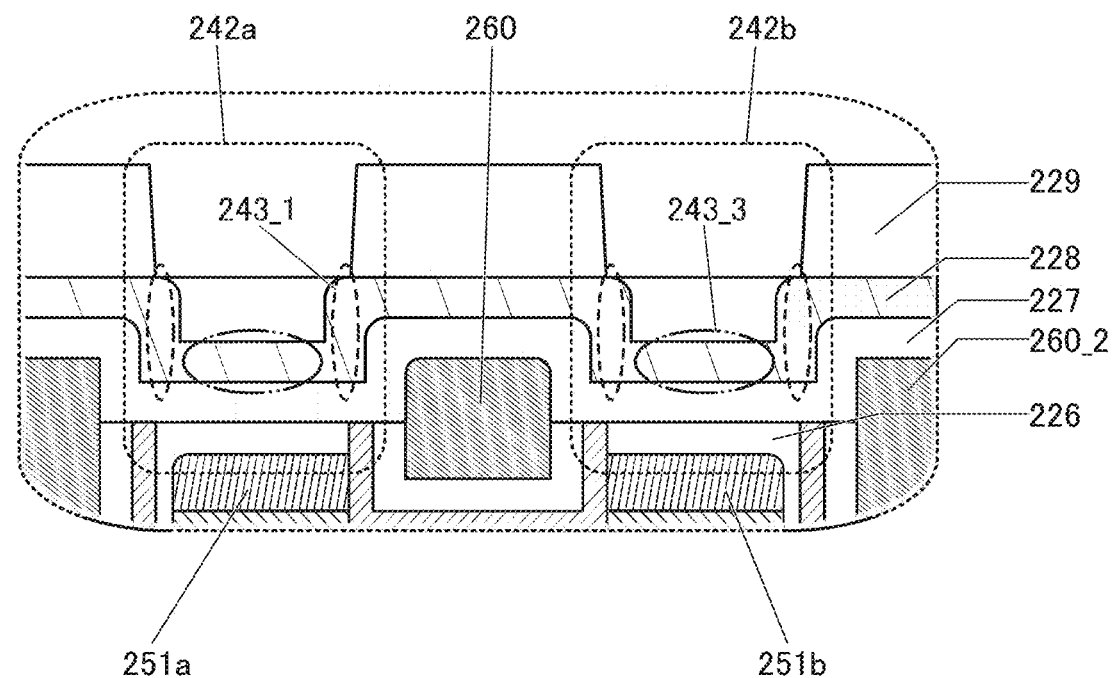
FIG. 28 Enlarged cross-sectional views illustrating a manufacturing method of a semiconductor device of one embodiment of the present invention.
Figure 28B:
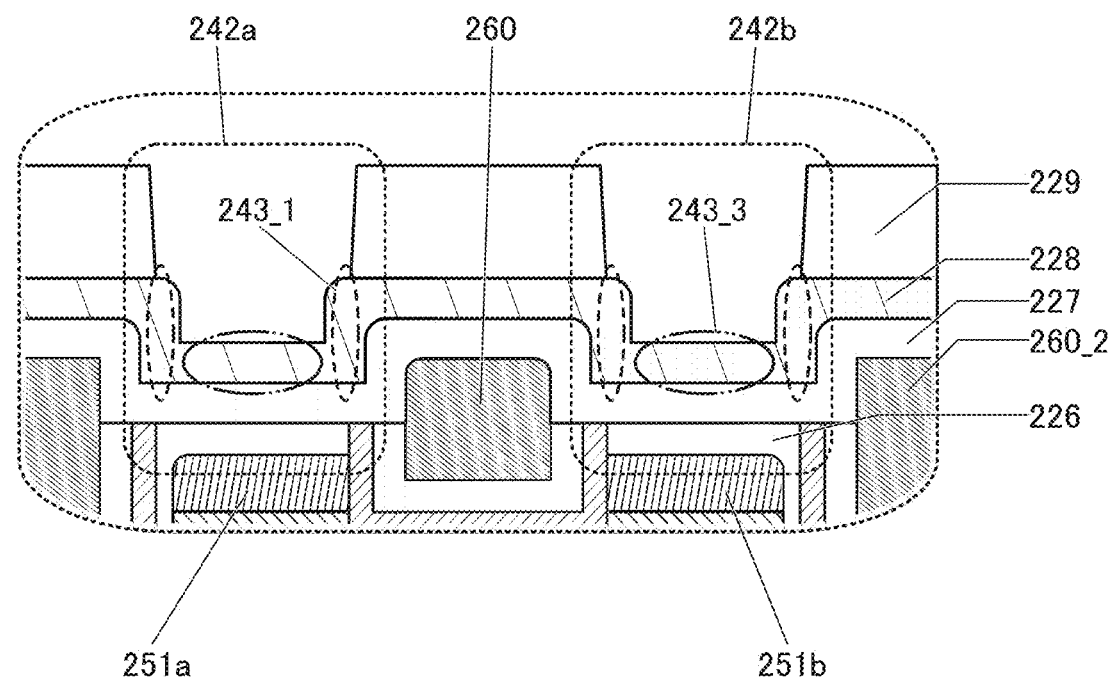
Figure 29A:
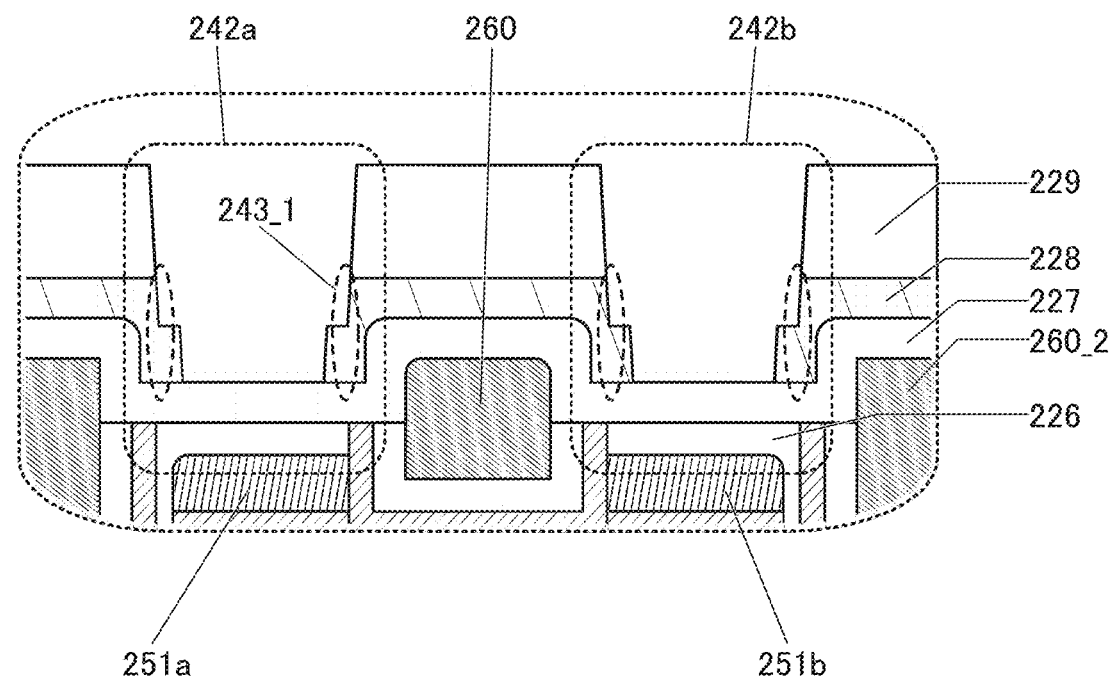
FIG. 29 Enlarged cross-sectional views illustrating a manufacturing method of a semiconductor device of one embodiment of the present invention.
Figure 29B:
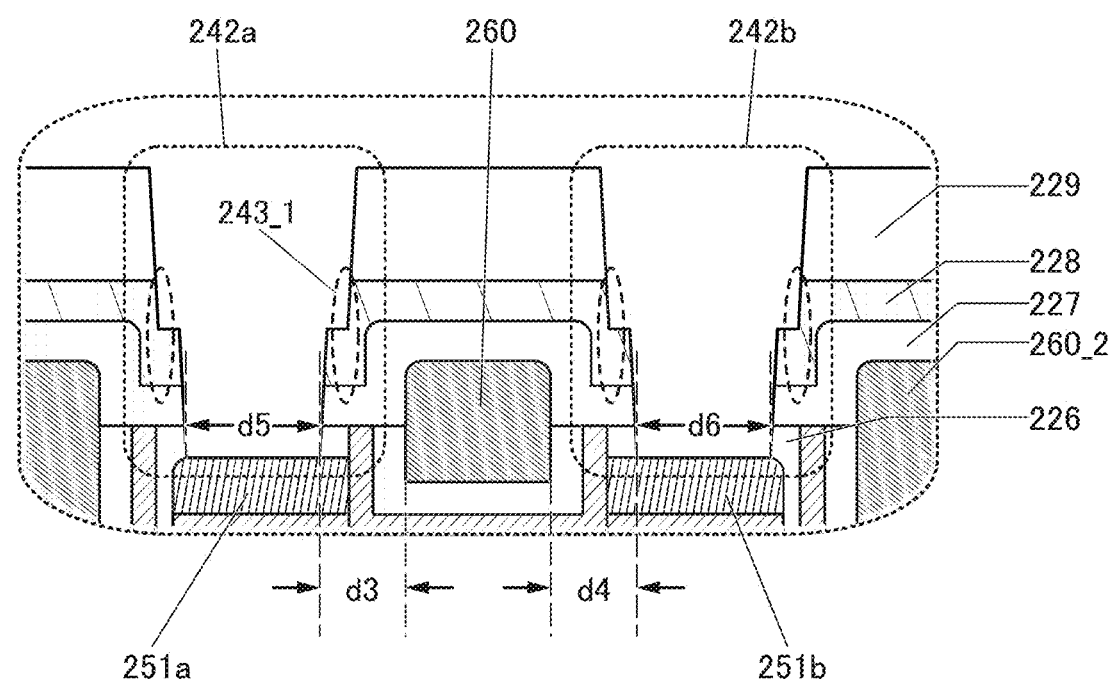

Here, a region 245 in FIG. 27(B) is focused on; FIG. 28 and FIG. 29 are enlarged views showing changes in a process shape of the transistor 200 in the formation of the opening 242*a* and the opening 242*b*.

As illustrated in FIG. 26, the insulator 228 is provided to cover the side surfaces and the top surfaces of the conductor 260 functioning as the first gate electrode and the conductor 260_2 that is a dummy gate with the insulator 227 therebetween. Thus, as described above, in the insulator 228, the thickness (t3) of the region 243_1 with reference to the formation surface of the region 243_3 is twice or more the thickness (t4) of the region 243_3. The insulator 228 includes two regions (the region 243_1 and the region 243_3) with different thicknesses, whereby, by utilizing the difference in thickness, the opening 242*a* and the opening 242*b* can be formed in a desired portion in a self-aligned manner without contact with the conductor 260 functioning as the first gate electrode.

For example, considered is the case where the opening 242*a* and the opening 242*b* are formed by processing at least part of the region 243_1 and part of the region 243_3 in the insulator 228. First, the opening treatment begins with the insulator 229 that is the uppermost layer; the distance from the uppermost surface of the insulator 229 to the uppermost surface of the insulator 228 thereunder on the region 243_1 differs from that on the region 243_3, and is shorter than that on the region 243_3. Thus, in the insulator 229, an opening is formed on the region 243_1 prior to on the region 243_3 (see FIG. 28(A)). However, the opening treatment needs to be continued in the insulator 229 because the opening on the region 243_3 needs to be completely formed.

Here, different materials are used for the insulator 229 and the insulator 228. For example, as described above, in this embodiment, silicon oxide is used for the insulator 229 and aluminum oxide is used for the insulator 228. Materials used for the insulators are different, so that gases used for etching the insulators are also different. For example, as described above, in this embodiment, the mixed gas of Ar, $O_2$, and $C_4F_6$ is used for etching of the insulator 229, and the mixed gas of Ar, $H_2$, and $C_4F_8$ is used for etching of the insulator 228. For this reason, depending on an etching gas for the target insulator 229 or the target insulator 228, the sufficient selectivity between the two can be obtained. That is, when etching is performed on the insulator 229 and the insulator 228 using an etching gas (the mixed gas of Ar, $O_2$, and $C_4F_6$) for the insulator 229, the etching rate of the insulator 228 is much lower than the etching rate of the insulator 229, so that the etching of the insulator 229 can proceed while the etching of the insulator 228 is suppressed. Thus, even after the opening treatment of the insulator 229 on the region 243_1 is finished, the opening treatment of the insulator 229 on the region 243_3 can be completed while the etching amount of the region 243_1 is suppressed (see FIG. 28(B)).

The opening treatment of the insulator 229 is completed as described above, and then the etching gas is switched to the mixed gas of Ar, $H_2$, and $C_4F_8$ and opening treatment is performed on the insulator 228. By the opening treatment, both the region 243_1 and the region 243_3 are etched by the same thickness amount. Specifically, etching is performed by at least the thickness (t4) amount of the region 243_3. Here, as described above, in the insulator 228, the thickness (t3) of the region 243_1 with reference to the formation surface of the region 243_3 is twice or more as large as the thickness (t4) of the region 243_3. Therefore, even when an opening is formed in the region 243_3 by the opening treatment, part of the region 243_1 (with at least the thickness amount t3-t4) remains. That is, by the opening treatment, the opening is selectively formed only in the region 243_3 in a self-aligned manner (FIG. 29(A)).

Next, the etching gas is switched to the mixed gas of Ar, $O_2$, and $C_4F_6$ again, and the opening treatment is performed on the insulator 227 and the insulator 226. As described above, in this embodiment, silicon oxide is used for both the insulator 227 and the insulator 226. Thus, the openings reaching the top surface of the conductor 251 (the conductor 251*a* and the conductor 251*b*) can be formed in the insulator 227 and the insulator 226 at a time by using the same etching gas (the mixed gas of Ar, $O_2$, and $C_4F_6$) (see FIG. 29(B)).

As described above, only the region 243_3 is selectively penetrated by utilizing the difference in selectivity between the insulator 229 and the insulator 228, t4 smaller than t3, and the like, whereby the opening 242*a* and the opening 242*b* can be formed in a self-aligned manner. For example, assuming that d3 is the distance between the conductor 260 functioning as the first gate electrode and the bottom surface of the opening 242*a* on the conductor 251*a*, which face each other, d4 is the distance between the conductor 260 and the bottom surface of the opening 242*b* on the conductor 251*b*, which face each other, d5 is the width of the bottom surface of the opening 242*a* on the conductor 251*a*, and d6 is the width of the bottom surface of the opening 242*b* on the conductor 251*b*, in FIG. 29(B), by using the manufacturing method described in this embodiment, the opening 242*a* and the opening 242*b* can be formed in desired portions without contact with the conductor 260 functioning as the first gate electrode with the distance d3, the distance d4, the distance d5, and the distance d6 kept, even when the space between the opening 242*a* and the opening 242*b* is narrowed.

In addition, by using the manufacturing method described in this embodiment, for example, even when etching treatment is performed with slight misalignment caused in light exposure of the resist at the time of the formation of the opening 242*a* and the opening 242*b*, the opening 242*a* and the opening 242*b* can be formed without contact with the conductor 260 functioning as the first gate electrode with the distance d3, the distance d4, the distance d5, and the distance d6 kept.

Figure 30A:
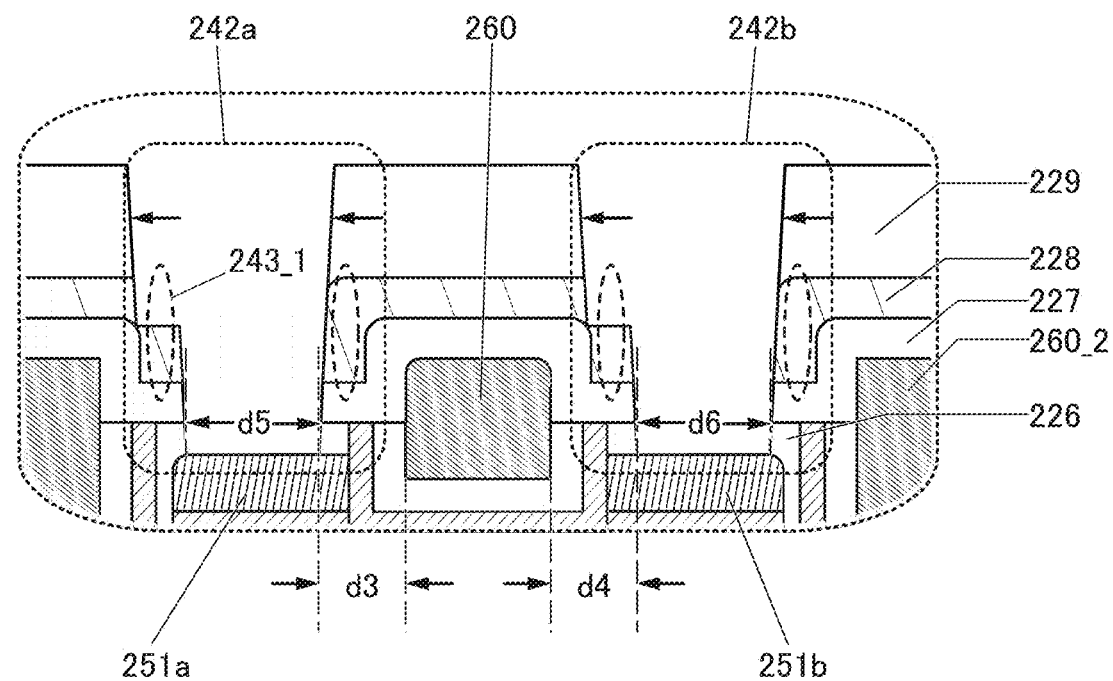
FIG. 30 Enlarged cross-sectional views of a semiconductor device of one embodiment of the present invention during manufacture.
Figure 30B:
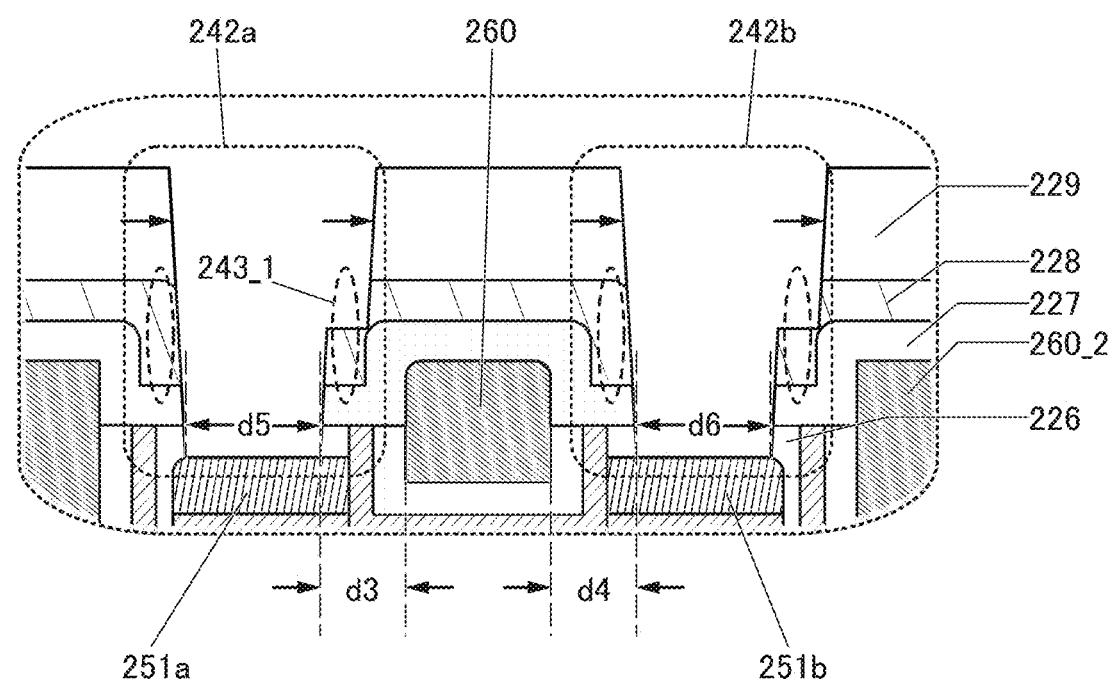

For example, FIG. 30 shows enlarged views of the region 245 in the case where the opening 242*a* and the opening 242*b* are formed in the state where the above misalignment is caused. FIG. 30(A) is a cross-sectional view of the case where misalignment to the left of the target position is caused, and FIG. 30(B) is a cross-sectional view of the case where misalignment to the right of the target position is caused. It is found that the opening 242*a* and the opening 242*b* can be formed with the distance d3, the distance d4, the distance d5, and the distance d6 kept without contact with the conductor 260 functioning as the first gate electrode as long as the misalignment is at least within the width of the region 243_1. In addition, owing to the constant distance d5 and the constant distance d6, it is possible to keep a contact area between the conductor 251*a* and the conductor 252*a* to be formed later in the opening 242*a* and a contact area between the conductor 251*b* and the conductor 252*b* to be formed later in the opening 242*b* constant, leading to a reduction in the variation in contact resistance.

As described above, in order to achieve "manufacture of a semiconductor device that can be miniaturized", which is one of the problems to be solved by the present invention, not only miniaturization of the transistor (a reduction in the channel length, the channel width, or the like) included in the semiconductor device, but also a reduction in the space between plugs connecting a wiring and a source electrode or a drain electrode of the transistor, a reduction in the opening diameter of a contact hole for passing the plug, and establishment of a manufacturing process that enables these are required, for example. The manufacturing method described in this embodiment has features such as no contact between the plug and the first gate electrode of the transistor even with a narrow space between the plugs, formation of the opening for the plug with high accuracy, and the constant distance between the first gate electrode of the transistor and the plug even when the misalignment is caused to some degree at the time of the formation of the opening, i.e., a high degree of freedom in a manufacturing process, and thus can be said to be a manufacturing method having a possibility of satisfying the above requirements.

In order to achieve "manufacture of a highly integrated semiconductor device", which is another one of the problems to be solved by the present invention, it is necessary to reduce, as much as possible, the space between adjacent transistors of a plurality of transistors included in the semiconductor device. The manufacturing method described in this embodiment has features such as no contact between adjacent transistors owing to a dummy gate even with a narrow space between the adjacent transistors, formation of the dummy gate and adjacent transistors with the dummy gate therebetween with high accuracy, and a high degree of freedom in a manufacturing process, and thus can be said to be a manufacturing method having a possibility of satisfying the above requirements.

After the opening 242a and the opening 242b are formed, a conductor to be the conductor 252 (the conductor 252a and the conductor 252b) is deposited on the inner walls of the opening 242a and the opening 242b and over the insulator 229.

Next, a top surface of the conductor to be the conductor 252 is polished until the top surface of the insulator 229 is exposed, so that the conductor 252a and the conductor 252b are formed in the opening 242a and in the opening 242b, respectively. The polishing can be performed by CMP treatment or the like. Alternatively, the conductor 252a and the conductor 252b may be formed by performing dry etching on the top surface of the conductor to be the conductor 252 until the top surface of the insulator 229 is exposed. In this embodiment, the conductor 252a and the conductor 252b are formed by CMP treatment. By the CMP treatment, the levels of the top surfaces of the insulator 229, the conductor 252a, and the conductor 252b can be formed to be substantially the same. Note that the insulator 229 is partly removed by the CMP treatment in some cases. Note that the distance between the conductor 260 functioning as the first gate electrode and a region of the conductor 252a in contact with the conductor 251a, which face each other, is equal to d3 described above. Similarly, the distance between the conductor 260 and a region of the conductor 252b in contact with the conductor 251b, which face each other, is equal to d4 described above.

Thus, the semiconductor device including the transistor 200 of one embodiment of the present invention can be manufactured (see FIG. 2).

As described above, a method for manufacturing the semiconductor device including the transistor 200, which is described in this embodiment, is used, whereby a semiconductor device that can be miniaturized can be manufactured. Furthermore, a semiconductor device can be manufactured with high yield. In addition, a semiconductor device with a high degree of freedom in a manufacturing process can be manufactured.

As described above, according to one embodiment of the present invention, a semiconductor device that can be miniaturized or highly integrated can be provided. Alternatively, according to one embodiment of the present invention, a semiconductor device having good electrical characteristics can be provided. Alternatively, according to one embodiment of the present invention, a semiconductor device with a low off-state current can be provided. Alternatively, according to one embodiment of the present invention, a semiconductor device with a high on-state current can be provided. Alternatively, according to one embodiment of the present invention, a highly reliable semiconductor device can be provided. Alternatively, according to one embodiment of the present invention, a semiconductor device with reduced power consumption can be provided. Alternatively, according to one embodiment of the present invention, a semiconductor device with high productivity can be provided.

The structure, the method, and the like described above in this embodiment can be implemented in combination with the structures, the methods, and the like described in the other embodiments as appropriate.

Embodiment 2

In this embodiment, one mode of a semiconductor device of one embodiment of the present invention will be described with reference to FIG. 32.

[Memory Device]

Figure 32:
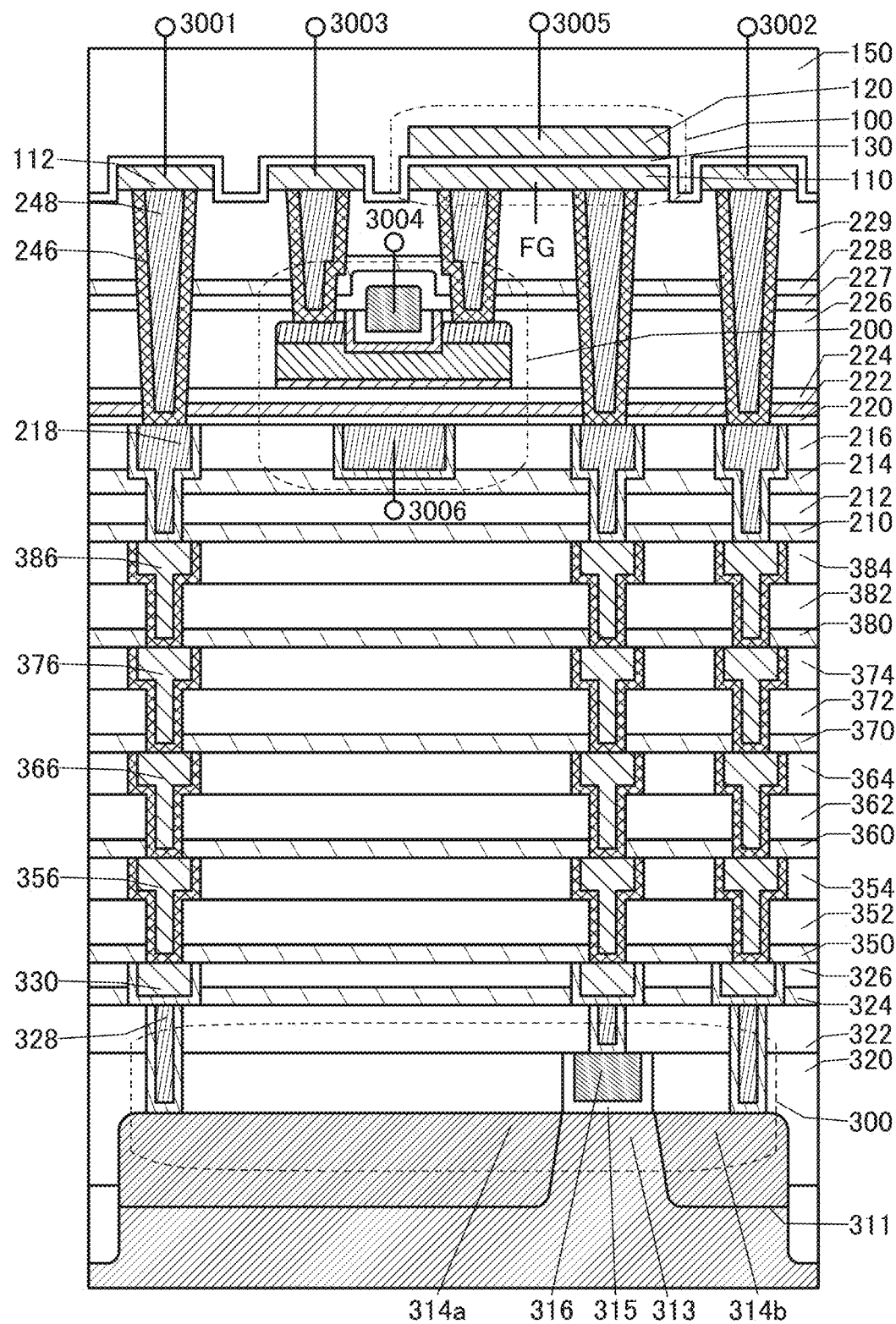
FIG. 32 A cross-sectional view illustrating a structure example of a memory device of one embodiment of the present invention.

A memory device illustrated in FIG. 32 includes a transistor 300, the transistor 200, and a capacitor 100.

The transistor 200 is a transistor whose channel is formed in a semiconductor layer including a metal oxide. Since the off-state current of the transistor 200 is low, a memory device using it can retain stored contents for a long time. In other words, since refresh operation is not required or frequency of refresh operation is extremely low, the power consumption of the memory device can be sufficiently reduced.

In FIG. 32, a first wiring 3001 is electrically connected to a source of the transistor 300, and a second wiring 3002 is electrically connected to a drain of the transistor 300. A third wiring 3003 is electrically connected to one of the source and the drain of the transistor 200, and a fourth wiring 3004 is electrically connected to the first gate of the transistor 200. In addition, a gate of the transistor 300 and the other of the source and the drain of the transistor 200 are electrically connected to one electrode of the capacitor 100, and a fifth wiring 3005 is electrically connected to the other electrode of the capacitor 100. Note that a sixth wiring 3006 is electrically connected to a second gate of the transistor 200.

The memory device illustrated in FIG. 32 has a feature that the potential of the gate of the transistor 300 can be retained and thus enables writing, retaining, and reading of data as follows.

Writing and retaining of data are described. First, the potential of the fourth wiring 3004 is set to a potential at which the transistor 200 is brought into a conduction state, so that the transistor 200 is brought into a conduction state. Accordingly, the potential of the third wiring 3003 is supplied to a node FG where the gate of the transistor 300 and one electrode of the capacitor 100 are electrically connected to each other. That is, a predetermined charge is supplied to the gate of the transistor 300 (writing). Here, one of charges providing two different potential levels (hereinafter referred to as a Low-level charge and a High-level charge) is supplied. After that, the potential of the fourth wiring 3004 is set to a potential at which the transistor 200 is brought into a non-conduction state so that the transistor 200 is brought into a non-conduction state; thus, the charge is retained in the node FG (retaining).

In the case where the off-state current of the transistor 200 is low, the charge of the node FG is retained for a long time.

Next, reading of data is described. An appropriate potential (reading potential) is supplied to the fifth wiring 3005 in a state where a predetermined potential (constant potential) is supplied to the first wiring 3001, whereby the second wiring 3002 has a potential corresponding to the amount of charge retained in the node FG. This is because when the transistor 300 is of an n-channel type, an apparent threshold voltage $V_{th\_H}$ at the time when a High-level charge is supplied to the gate of the transistor 300 is lower than an apparent threshold voltage $V_{th\_L}$ at the time when a Low-level charge is supplied to the gate of the transistor 300. Here, an apparent threshold voltage refers to the potential of the fifth wiring 3005 which is needed to bring the transistor 300 into a conduction state. Thus, the potential of the fifth wiring 3005 is set to a potential $V_0$ which is between $V_{th\_H}$ and $V_{th\_L}$, whereby the charge supplied to the node FG can be determined. For example, in the case where a High-level charge is supplied to the node FG in writing, when the potential of the fifth wiring 3005 is $V_0$ ($>V_{th\_H}$), the transistor 300 is brought into a conduction state. Meanwhile, in the case where a Low-level charge is supplied to the node FG, the transistor 300 remains in a non-conduction state even when the potential of the fifth wiring 3005 is $V_0$ ($<V_{th\_L}$). Thus, the data retained in the node FG can be read by determining the potential of the second wiring 3002.

<Structure of Memory Device>

The memory device of one embodiment of the present invention includes the transistor 300, the transistor 200, and the capacitor 100 as illustrated in FIG. 32. The transistor 200 is provided over the transistor 300, and the capacitor 100 is provided over the transistor 300 and the transistor 200.

The transistor 300 is provided on a substrate 311 and includes a conductor 316, an insulator 315, a semiconductor region 313 that is part of the substrate 311, and a low-resistance region 314a and a low-resistance region 314b functioning as a source region and a drain region.

The transistor 300 is of either a p-channel type or an n-channel type.

A region of the semiconductor region 313 where a channel is formed, a region in the vicinity thereof, the low-resistance region 314a and the low-resistance region 314b functioning as the source region and the drain region, and the like preferably contain a semiconductor such as a silicon-based semiconductor, further preferably contain single crystal silicon. Alternatively, the regions may be formed using a material containing Ge (germanium), SiGe (silicon germanium), GaAs (gallium arsenide), GaAlAs (gallium aluminum arsenide), or the like. Silicon whose effective mass is adjusted by applying stress to the crystal lattice and thereby changing the lattice spacing may be used. Alternatively, the transistor 300 may be a HEMT (High Electron Mobility Transistor) with GaAs and GaAlAs, or the like.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

For the conductor 316 functioning as the gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used.

Note that since the work function depends on a material of a conductor, Vth of a transistor can be adjusted by changing the material of the conductor. Specifically, it is preferable to use a material such as titanium nitride or tantalum nitride as the conductor. Furthermore, in order to ensure both conductivity and embeddability, it is preferable to use stacked layers of metal materials such as tungsten and aluminum as the conductor, and it is particularly preferable to use tungsten in terms of heat resistance.

Note that the transistor 300 illustrated in FIG. 32 is only an example and the structure is not limited thereto; a transistor appropriate for a circuit configuration or a driving method is used.

An insulator 320, an insulator 322, an insulator 324, and an insulator 326 are stacked sequentially and provided to cover the transistor 300.

For the insulator 320, the insulator 322, the insulator 324, and the insulator 326, for example, silicon oxide, silicon oxynitride, silicon nitride oxide, silicon nitride, aluminum oxide, aluminum oxynitride, aluminum nitride oxide, or aluminum nitride is used.

The insulator 322 may function as a planarization film for eliminating a level difference caused by the transistor 300 or the like provided below the insulator 322. For example, a top surface of the insulator 322 may be planarized by CMP treatment or the like to improve planarity.

As the insulator 324, a film having a barrier property that prevents hydrogen and impurities from being diffused from the substrate 311, the transistor 300, or the like into the region where the transistor 200 is provided is preferably used.

For the film having a barrier property against hydrogen, silicon nitride formed by a CVD method can be used, for example. Here, diffusion of hydrogen to a semiconductor element including a metal oxide, such as the transistor 200, degrades the electrical characteristics of the semiconductor element in some cases. Therefore, a film that inhibits hydrogen diffusion is preferably provided between the transistor 200 and the transistor 300. The film that inhibits hydrogen diffusion is specifically a film from which a small amount of hydrogen is released.

The amount of released hydrogen can be measured by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the insulator 326 preferably has a lower permittivity than the insulator 324. For example, the relative permittivity of the insulator 326 is preferably lower than 4, further preferably lower than 3. The relative permittivity of the insulator 326 is, for example, preferably 0.7 times or less, further preferably 0.6 times or less the relative permittivity of the insulator 324. In the case where a material with a low permittivity is used for an interlayer film, the parasitic capacitance generated between wirings can be reduced.

A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 each function as a plug or a wiring. A plurality of conductors functioning as plugs or wirings are collectively denoted by the same reference numeral in some cases. Furthermore, in this specification and the like, a wiring and a plug electrically connected to the wiring may be a single component. That is, part of a conductor functions as a wiring in some cases, and part of the conductor functions as a plug in some cases.

As a material for each of the plugs and wirings (the conductor 328, the conductor 330, and the like), a single layer or stacked layers of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 32, an insulator 350, an insulator 352, and an insulator 354 are stacked sequentially. Furthermore, a conductor 356 is formed in the insulator 350, the insulator 352, and the insulator 354. The conductor 356 functions as a plug or a wiring. Note that the conductor 356 can be provided using a material similar to those for the conductor 328 and the conductor 330.

Note that for example, for the insulator 350, an insulator having a barrier property against hydrogen is preferably used, as with the insulator 324. Furthermore, the conductor 356 preferably includes a conductor having a barrier property against hydrogen. In particular, the conductor 356 having a barrier property against hydrogen is preferably formed in an opening portion of the insulator 350 having a barrier property against hydrogen. With such a structure, the transistor 300 and the transistor 200 can be separated by a barrier layer, so that diffusion of hydrogen from the transistor 300 to the transistor 200 can be inhibited.

Note that as the conductor having a barrier property against hydrogen, tantalum nitride is preferably used, for example. By stacking tantalum nitride and tungsten having high conductivity, diffusion of hydrogen from the transistor 300 can be inhibited while the conductivity of a wiring is kept. In that case, a structure is preferable in which a tantalum nitride layer having a barrier property against hydrogen is in contact with the insulator 350 having a barrier property against hydrogen.

A wiring layer may be provided over the insulator 350 and the conductor 356. For example, in FIG. 32, an insulator 360, an insulator 362, and an insulator 364 are stacked sequentially. Furthermore, a conductor 366 is formed in the insulator 360, the insulator 362, and the insulator 364. The conductor 366 functions as a plug or a wiring. Note that the conductor 366 can be provided using a material similar to those for the conductor 328 and the conductor 330.

Note that for example, for the insulator 360, an insulator having a barrier property against hydrogen is preferably used, as with the insulator 324. Furthermore, the conductor 366 preferably includes a conductor having a barrier property against hydrogen. In particular, the conductor 366 having a barrier property against hydrogen is preferably formed in an opening portion of the insulator 360 having a barrier property against hydrogen. With such a structure, the transistor 300 and the transistor 200 can be separated by a barrier layer, so that diffusion of hydrogen from the transistor 300 to the transistor 200 can be inhibited.

A wiring layer may be provided over the insulator 364 and the conductor 366. For example, in FIG. 32, an insulator 370, an insulator 372, and an insulator 374 are stacked sequentially. Furthermore, a conductor 376 is formed in the insulator 370, the insulator 372, and the insulator 374. The conductor 376 functions as a plug or a wiring. Note that the conductor 376 can be provided using a material similar to those for the conductor 328 and the conductor 330.

Note that for example, for the insulator 370, an insulator having a barrier property against hydrogen is preferably used, as with the insulator 324. Furthermore, the conductor 376 preferably includes a conductor having a barrier property against hydrogen. In particular, the conductor 376 having a barrier property against hydrogen is preferably formed in an opening portion of the insulator 370 having a barrier property against hydrogen. With such a structure, the transistor 300 and the transistor 200 can be separated by a barrier layer, so that diffusion of hydrogen from the transistor 300 to the transistor 200 can be inhibited.

A wiring layer may be provided over the insulator 374 and the conductor 376. For example, in FIG. 32, an insulator 380, an insulator 382, and an insulator 384 are stacked sequentially. Furthermore, a conductor 386 is formed in the insulator 380, the insulator 382, and the insulator 384. The conductor 386 functions as a plug or a wiring. Note that the conductor 386 can be provided using a material similar to those for the conductor 328 and the conductor 330.

Note that for example, for the insulator 380, an insulator having a barrier property against hydrogen is preferably used, as with the insulator 324. Furthermore, the conductor 386 preferably includes a conductor having a barrier property against hydrogen. In particular, the conductor 386 having a barrier property against hydrogen is preferably formed in an opening portion of the insulator 380 having a barrier property against hydrogen. With such a structure, the transistor 300 and the transistor 200 can be separated by a barrier layer, so that diffusion of hydrogen from the transistor 300 to the transistor 200 can be inhibited.

The insulator 210, the insulator 212, the insulator 214, and the insulator 216 are stacked sequentially over the insulator 384. A substance having a barrier property against oxygen and hydrogen is preferably used for any of the insulator 210, the insulator 212, the insulator 214, and the insulator 216.

For example, it is preferable to use, as the insulator 210 and the insulator 214, a film having a barrier property that prevents hydrogen and impurities from being diffused from the substrate 311 or a region where the transistor 300 is provided into the region where the transistor 200 is provided. Therefore, a material similar to that of the insulator 324 can be used.

For the film having a barrier property against hydrogen, silicon nitride formed by a CVD method can be used, for example. Here, diffusion of hydrogen to a semiconductor element including a metal oxide, such as the transistor 200, degrades the electrical characteristics of the semiconductor element in some cases. Therefore, a film that inhibits hydrogen diffusion is preferably provided between the transistor 200 and the transistor 300. The film that inhibits hydrogen diffusion is specifically a film from which a small amount of hydrogen is released.

For the film having a barrier property against hydrogen used for the insulator 210 and the insulator 214, for example, a metal oxide such as aluminum oxide, hafnium oxide, or tantalum oxide is preferably used.

In particular, aluminum oxide has an excellent blocking effect that prevents passage of oxygen and impurities such as hydrogen and moisture which cause a change in electrical characteristics of the transistor. Accordingly, aluminum oxide can prevent entry of impurities such as hydrogen and moisture into the transistor 200 during a manufacturing process of the transistor and after the manufacturing. In addition, release of oxygen from the oxide included in the transistor 200 can be inhibited. Therefore, aluminum oxide is suitably used for a protective film of the transistor 200.

Furthermore, for example, a material similar to that of the insulator 320 can be used for the insulator 212 and the insulator 216. The use of a material with a relatively low permittivity for the insulators can reduce the parasitic capacitance between wirings. For example, silicon oxide, silicon oxynitride, or the like can be used for the insulator 212 and the insulator 216.

A conductor 218, a conductor (the conductor 205) included in the transistor 200, and the like are embedded in the insulator 210, the insulator 212, the insulator 214, and the insulator 216. Note that the conductor 218 functions as a plug or a wiring that is electrically connected to the capacitor 100 or the transistor 300. The conductor 218 can be provided using a material similar to those of the conductor 328 and the conductor 330.

In particular, the conductor 218 in regions in contact with the insulator 210 and the insulator 214 is preferably a conductor having a barrier property against oxygen, hydrogen, and water. With such a structure, the transistor 300 and the transistor 200 can be separated by the layer having a barrier property against oxygen, hydrogen, and water, so that the diffusion of hydrogen from the transistor 300 to the transistor 200 can be inhibited.

The transistor 200 is provided over the insulator 216. Note that the structure of the transistor included in the semiconductor device described in the above embodiment can be used as the structure of the transistor 200. The transistor 200 illustrated in FIG. 32 is an example and the structure is not limited thereto; a transistor appropriate for a circuit configuration or a driving method is used.

The insulator 226, the insulator 227, and the insulator 228 are provided over the transistor 200.

A substance having a barrier property against oxygen and hydrogen is preferably used for the insulator 228. Thus, a material similar to that of the insulator 214 can be used for the insulator 228. For the insulator 228, a metal oxide such as aluminum oxide, hafnium oxide, or tantalum oxide is preferably used, for example.

In particular, aluminum oxide has an excellent blocking effect that prevents passage of oxygen and impurities such as hydrogen and moisture which cause a change in electrical characteristics of the transistor. Accordingly, aluminum oxide can prevent entry of impurities such as hydrogen and moisture into the transistor 200 during a manufacturing process of the transistor and after the manufacturing. In addition, release of oxygen from the oxide included in the transistor 200 can be inhibited. Therefore, aluminum oxide is suitably used for a protective film of the transistor 200.

The insulator 229 is provided over the insulator 228. A material similar to that of the insulator 320 can be used for the insulator 229. The use of a material with a relatively low permittivity for the insulator can reduce the parasitic capacitance between wirings. For example, silicon oxide, silicon oxynitride, or the like can be used for the insulator 229.

A conductor 246, a conductor 248, and the like are embedded in the insulator 220, the insulator 222, the insulator 224, the insulator 226, the insulator 227, the insulator 228, and the insulator 229.

The conductor 246 and the conductor 248 each function as a plug or a wiring that is electrically connected to the capacitor 100, the transistor 200, or the transistor 300. The conductor 246 and the conductor 248 can be provided using materials similar to those of the conductor 328 and the conductor 330.

The capacitor 100 is provided over the transistor 200. The capacitor 100 includes a conductor 110, a conductor 120, and an insulator 130.

A conductor 112 may be provided over the conductor 246 and the conductor 248. The conductor 112 functions as a plug or a wiring that is electrically connected to the capacitor 100, the transistor 200, or the transistor 300. The conductor 110 functions as an electrode of the capacitor 100. Note that the conductor 112 and the conductor 110 can be formed at the same time.

For the conductor 112 and the conductor 110, a metal containing an element selected from molybdenum, titanium, tantalum, tungsten, aluminum, copper, chromium, neodymium, and scandium; a metal nitride containing any of the above elements as its component (tantalum nitride, titanium nitride, molybdenum nitride, or tungsten nitride); or the like can be used. Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used.

FIG. 32 shows a structure in which the conductor 112 and the conductor 110 each have a single-layer structure; however, without limitation to the structure, a stacked-layer structure of two or more layers may be used. For example, between a conductor having a barrier property and a conductor having high conductivity, a conductor which is highly adhesive to the conductor having a barrier property and the conductor having high conductivity may be formed.

As a dielectric of the capacitor 100, the insulator 130 is provided over the conductor 112 and the conductor 110. The insulator 130 can be provided as a stacked layer or a single layer using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, or hafnium nitride.

A material with high withstand voltage, such as silicon oxynitride, is preferably used for the insulator 130, for example. In the capacitor 100 having such a structure, resistance to dielectric breakdown of the capacitor 100 can be increased and the electrostatic breakdown of the capacitor 100 can be prevented.

Over the insulator 130, the conductor 120 is provided so as to overlap with the conductor 110. Note that for the conductor 120, a conductive material such as a metal material, an alloy material, or a metal oxide material can be used. It is preferable to use a high-melting-point material that has both heat resistance and conductivity, such as tungsten or molybdenum, and it is particularly preferable to use tungsten. Furthermore, in the case of forming concurrently with another component such as a conductor, Cu (copper), Al (aluminum), or the like, which is a low-resistance metal material, is used.

An insulator 150 is provided over the conductor 120 and the insulator 130. The insulator 150 can be provided using a material similar to that for the insulator 320. Furthermore, the insulator 150 may function as a planarization film that covers uneven shapes thereunder.

The above is the description of the structure example of the memory device including the semiconductor device of one embodiment of the present invention. With the use of this structure, a change in electrical characteristics can be suppressed and reliability can be improved in a semiconductor device using a transistor including a metal oxide. Alternatively, a transistor including a metal oxide with a high on-state current can be provided. Alternatively, a transistor including a metal oxide with a low off-state current can be provided. Alternatively, a semiconductor device with reduced power consumption can be provided.

The structure, the method, and the like described above in this embodiment can be implemented in combination with the structures, the methods, and the like described in the other embodiments as appropriate.

Embodiment 3

In this embodiment, a NOSRAM will be described as an example of a memory device, which is one embodiment of the present invention, including a transistor in which a metal oxide is used in a channel formation region (hereinafter referred to as an OS transistor) and a capacitor, with reference to FIG. 33 and FIG. 34. A NOSRAM (registered trademark) is an abbreviation of "Nonvolatile Oxide Semiconductor RAM", which indicates a RAM including a gain cell (2T or 3T) memory cell. Note that hereinafter, a memory device using an OS transistor, such as a NOSRAM, is referred to as an OS memory in some cases.

A memory device in which OS transistors are used in memory cells (hereinafter referred to as an "OS memory") is used in a NOSRAM. The OS memory is a memory including at least a capacitor and an OS transistor that controls charge and discharge of the capacitor. The OS memory has excellent retention characteristics because the OS transistor has an extremely low off-state current and thus can function as a nonvolatile memory.

<<NOSRAM>>

Figure 33:
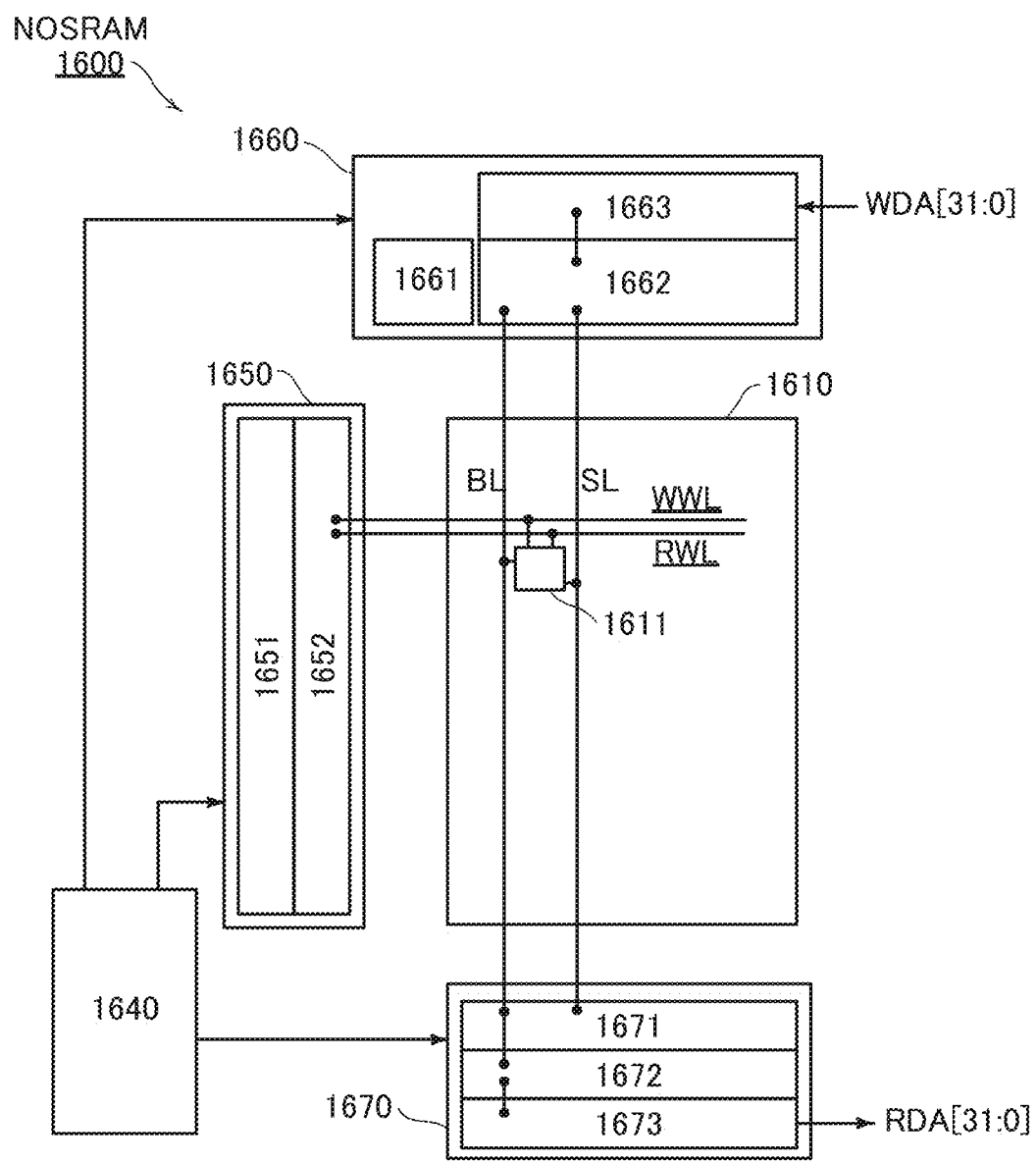
FIG. 33 A block diagram illustrating a configuration example of a memory device of one embodiment of the present invention.

FIG. 33 illustrates a configuration example of a NOSRAM. A NOSRAM 1600 illustrated in FIG. 33 includes a memory cell array 1610, a controller 1640, a row driver 1650, a column driver 1660, and an output driver 1670. Note that the NOSRAM 1600 is a multilevel NOSRAM in which one memory cell stores multilevel data.

The memory cell array 1610 includes a plurality of memory cells 1611, a plurality of word lines WWL, a plurality of word lines RWL, a plurality of bit lines BL, and a plurality of source lines SL. The word lines WWL are write word lines and the word lines RWL are read word lines. In the NOSRAM 1600, one memory cell 1611 stores 3-bit (8-level) data.

The controller 1640 controls the NOSRAM 1600 as a whole, writes data WDA[31:0], and reads out data RDA[31:0]. The controller 1640 processes command signals from the outside (for example, a chip enable signal and a write enable signal) to generate control signals of the row driver 1650, the column driver 1660, and the output driver 1670.

The row driver 1650 has a function of selecting a row to be accessed. The row driver 1650 includes a row decoder 1651 and a word line driver 1652.

The column driver 1660 drives the source lines SL and the bit lines BL. The column driver 1660 includes a column decoder 1661, a write driver 1662, and a DAC (digital-analog converter circuit) 1663.

The DAC 1663 converts 3-bit digital data into an analog voltage. The DAC 1663 converts 32-bit data WDA[31:01] into an analog voltage per 3 bits.

The write driver 1662 has a function of precharging the source lines SL, a function of bringing the source lines SL into an electrically floating state, a function of selecting a source line SL, a function of inputting a writing voltage generated in the DAC 1663 to the selected source line SL, a function of precharging the bit lines BL, a function of bringing the bit lines BL into an electrically floating state, and the like.

The output driver 1670 includes a selector 1671, an ADC (analog-digital converter circuit) 1672, and an output buffer 1673. The selector 1671 selects a source line SL to be accessed and transmits the voltage of the selected source line SL to the ADC 1672. The ADC 1672 has a function of converting an analog voltage into 3-bit digital data. The voltage of the source line SL is converted into 3-bit data in the ADC 1672, and the output buffer 1673 retains the data output from the ADC 1672.

<Memory Cell>

Figure 34A:
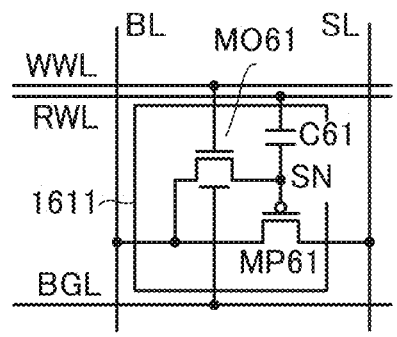
FIG. 34 Circuit diagrams illustrating configuration examples of memory devices of embodiments of the present invention.

FIG. 34(A) is a circuit diagram showing a configuration example of the memory cell 1611. The memory cell 1611 is a 2T gain cell and the memory cell 1611 is electrically connected to the word line WWL, the word line RWL, the bit line BL, the source line SL, and a wiring BGL. The memory cell 1611 includes a node SN, an OS transistor MO61, a transistor MP61, and a capacitor C61. The OS transistor MO61 is a write transistor. The transistor MP61 is a read transistor and is formed using a p-channel Si transistor, for example. The capacitor C61 is a storage capacitor for retaining the voltage of the node SN. The node SN is a data retaining node and corresponds to a gate of the transistor MP61 here.

The write transistor of the memory cell 1611 is formed using the OS transistor MO61; thus, the NOSRAM 1600 can retain data for a long time.

Figure 34B:
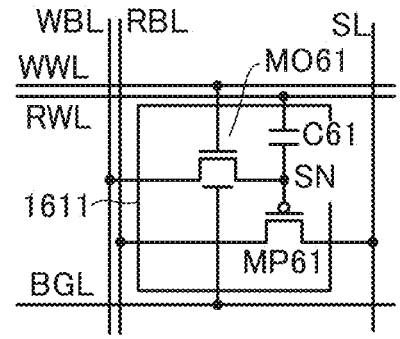

In the example of FIG. 34(A), the bit line is a common bit line for writing and reading; however, as illustrated in FIG. 34(B), a write bit line WBL and a read bit line RBL may be provided.

Figure 34C:
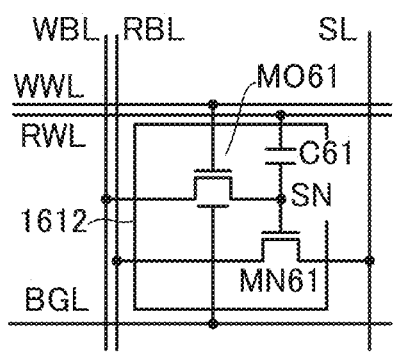
Figure 34D:
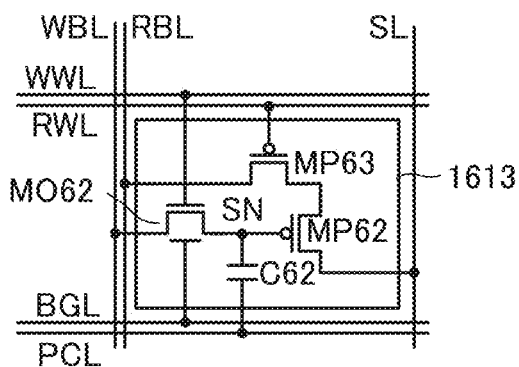
Figure 34E:
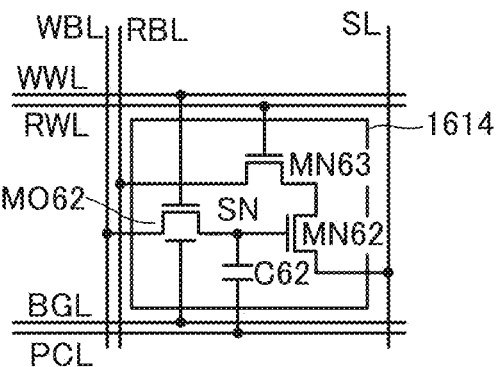

FIG. 34(C) to FIG. 34(E) show other configuration examples of the memory cell. FIG. 34(C) to FIG. 34(E) show examples where the write bit line and the read bit line are provided; however, as in FIG. 34(A), a bit line shared in writing and reading may be provided.

A memory cell 1612 illustrated in FIG. 34(C) is a modification example of the memory cell 1611 where the read transistor is changed into an n-channel transistor (MN61). The transistor MN61 may be an OS transistor or a Si transistor.

In the memory cell 1611 and the memory cell 1612, the OS transistor MO61 may be an OS transistor without a bottom gate.

A memory cell 1613 illustrated in FIG. 34(D) is a 3T gain cell and is electrically connected to the word line WWL, the word line RWL, the bit line WBL, the bit line RBL, the source line SL, the wiring BGL, and a wiring PCL. The memory cell 1613 includes the node SN, an OS transistor MO62, a transistor MP62, a transistor MP63, and a capacitor C62. The OS transistor MO62 is a write transistor. The transistor MP62 is a read transistor and the transistor MP63 is a selection transistor.

A memory cell 1614 illustrated in FIG. 34(E) is a modification example of the memory cell 1613 where the read transistor and the selection transistor are changed into n-channel transistors (MN62 and MN63). The transistor MN62 and the transistor MN63 may be OS transistors or Si transistors.

The OS transistors provided in the memory cell 1611 to the memory cell 1614 may each be a transistor without a bottom gate or a transistor with a bottom gate.

There is theoretically no limitation on the number of rewriting operations of the NOSRAM 1600 because data is rewritten by charging and discharging the capacitor C61; and writing and reading of data can be performed with low energy. Furthermore, since data can be retained for a long time, the refresh frequency can be reduced.

In the case where the semiconductor device described in any of the above embodiments is used for the memory cell 1611, the memory cell 1612, the memory cell 1613, and the memory cell 1614, the transistors 200 can be used as the OS transistor MO61 and the OS transistor MO62, and the transistors 300 can be used as the transistor MP61 and the transistor MN62. Thus, the occupied area of the transistor when seen from the above can be reduced, so that the memory device of this embodiment can be more highly integrated. As a result, storage capacity per unit area of the memory device of this embodiment can be increased.

The structure described in this embodiment can be used in appropriate combination with the structure described in the other embodiments.

Embodiment 4

Figure 35:
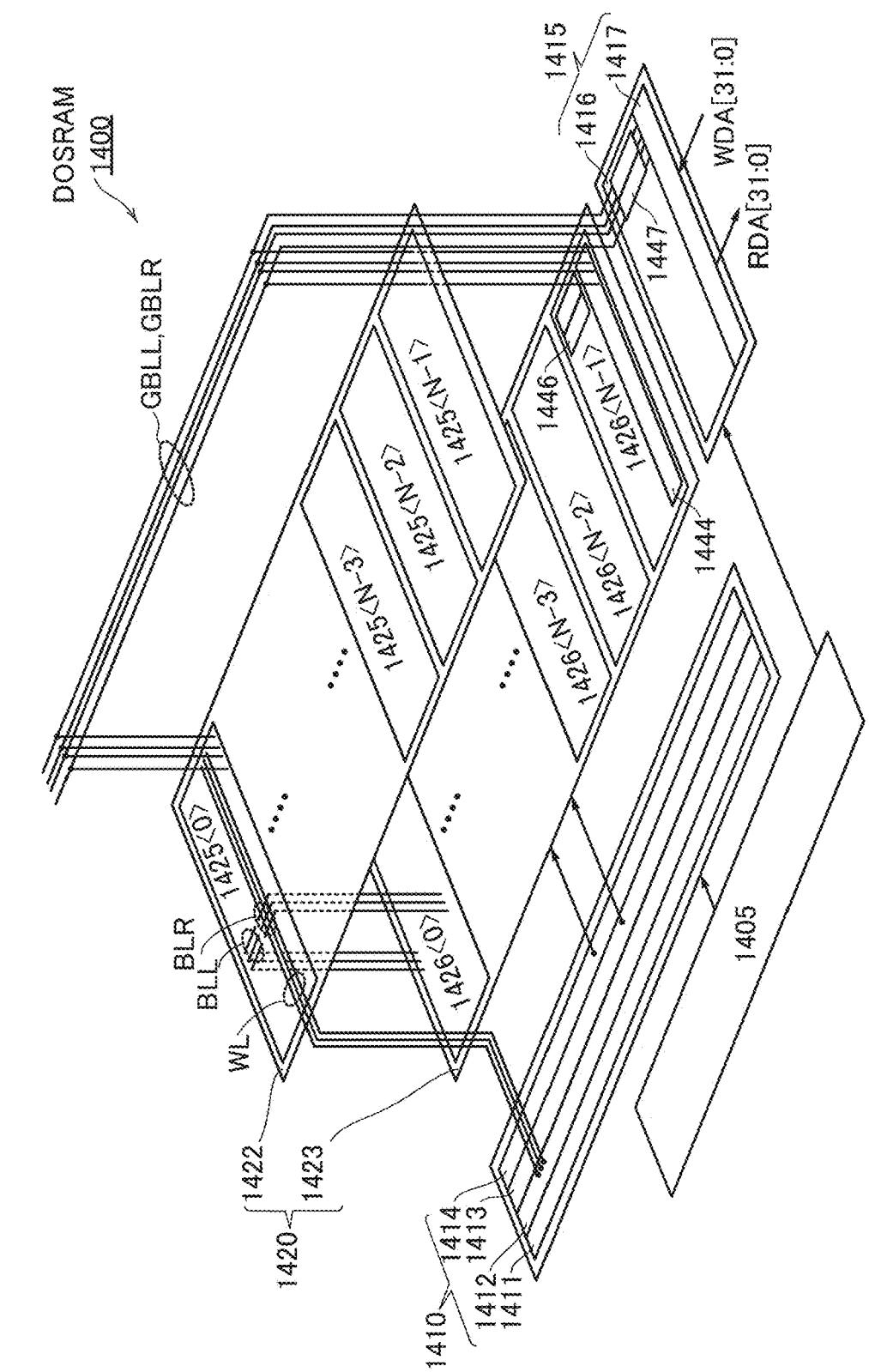
FIG. 35 A block diagram illustrating a configuration example of a memory device of one embodiment of the present invention.

In this embodiment, a DOSRAM is described as an example of the memory device of one embodiment of the present invention, which includes an OS transistor, with reference to FIG. 35 and FIG. 36. A DOSRAM (registered trademark) is an abbreviation of "Dynamic Oxide Semiconductor RAM", which indicates a RAM including a 1T (transistor) 1C (capacitor) memory cell. As in the NOSRAM, an OS memory is used in the DOSRAM.
<<DOSRAM 1400>>

A DOSRAM 1400 includes a controller 1405, a row circuit 1410, a column circuit 1415, and a memory cell and sense amplifier array 1420 (hereinafter referred to as an "MC-SA array 1420").

The row circuit 1410 includes a decoder 1411, a word line driver circuit 1412, a column selector 1413, and a sense amplifier driver circuit 1414. The column circuit 1415 includes a global sense amplifier array 1416 and an input/output circuit 1417. The global sense amplifier array 1416 includes a plurality of global sense amplifiers 1447. The MC-SA array 1420 includes a memory cell array 1422, a sense amplifier array 1423, a global bit line GBLL, and a global bit line GBLR.
(MC-SA Array 1420)

The MC-SA array 1420 has a stacked-layer structure in which the memory cell array 1422 is stacked over the sense amplifier array 1423. The global bit line GBLL and the global bit line GBLR are stacked over the memory cell array 1422. The DOSRAM 1400 adopts, as the bit-line structure, a hierarchical bit line structure hierarchized with local bit lines and global bit lines.

Figure 36A:
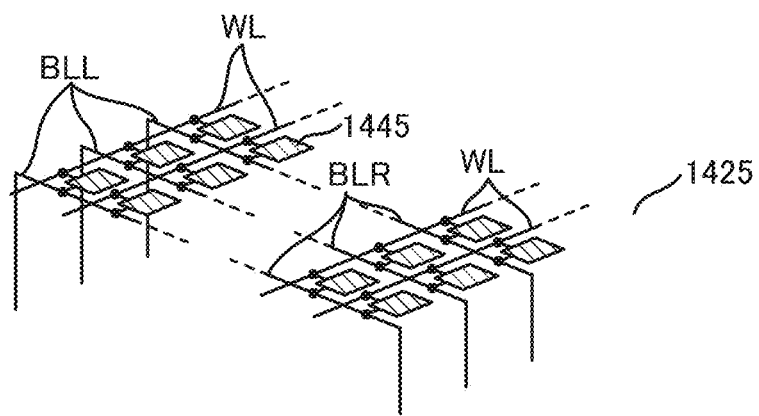
FIG. 36 A block diagram and a circuit diagram illustrating a configuration example of a memory device of one embodiment of the present invention.

The memory cell array 1422 includes N local memory cell arrays 1425<0> to 1425<N−1> (N is an integer greater than or equal to 2). FIG. 36(A) illustrates a configuration example of the local memory cell array 1425. The local memory cell array 1425 includes a plurality of memory cells 1445, a plurality of word lines WL, and a plurality of bit lines BLL, and a plurality of bit lines BLR. In the example of FIG. 36(A), the local memory cell array 1425 has an open bit-line architecture but may have a folded bit-line architecture.

Figure 36B:
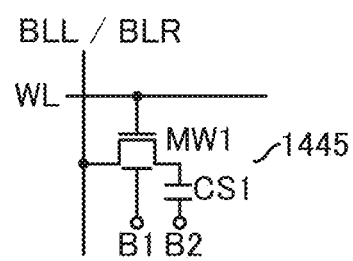

FIG. 36(B) illustrates a circuit configuration example of the memory cell 1445. The memory cell 1445 includes a transistor MW1, a capacitor CS1, a terminal B1, and a terminal B2. The transistor MW1 has a function of controlling charging and discharging of the capacitor CS1. A gate of the transistor MW1 is electrically connected to the word line, a first terminal of the transistor MW1 is electrically connected to the bit line, and a second terminal of the transistor MW1 is electrically connected to a first terminal of the capacitor CS1. A second terminal of the capacitor CS1 is electrically connected to the terminal B2. A constant potential (for example, a low power supply potential) is input to the terminal B2.

The transistor MW1 includes a bottom gate, and the bottom gate is electrically connected to the terminal B1. This makes it possible to change Vth of the transistor MW1 with a potential of the terminal B1. For example, the potential of the terminal B1 may be a fixed potential (for example, a negative constant potential), or the potential of the terminal B1 may be changed in response to the operation of the DOSRAM 1400.

The bottom gate of the transistor MW1 may be electrically connected to the gate, a source, or a drain of the transistor MW1. Alternatively, the bottom gate is not necessarily provided in the transistor MW1.

The sense amplifier array 1423 includes N local sense amplifier arrays 1426<0> to 1426<N−1>. The local sense amplifier array 1426 includes one switch array 1444 and a plurality of sense amplifiers 1446. A bit line pair is electrically connected to the sense amplifier 1446. The sense amplifier 1446 has a function of precharging the bit line pair, a function of amplifying a potential difference between the bit line pair, and a function of retaining the potential difference. The switch array 1444 has a function of selecting a bit line pair and bringing the selected bit line pair and a global bit line pair into a conduction state.

Here, the bit line pair refers to two bit lines which are compared by the sense amplifier at the same time. The global bit line pair refers to two global bit lines which are compared by the global sense amplifier at the same time. The bit line pair can be referred to as a pair of bit lines, and the global bit line pair can be referred to as a pair of global bit lines. Here, the bit line BLL and the bit line BLR form one bit line pair. The global bit line GBLL and the global bit line GBLR form one global bit line pair. In the following description, the expressions bit line pair (BLL, BLR) and global bit line pair (GBLL, GBLR) are also used.
(Controller 1405)

The controller 1405 has a function of controlling the overall operation of the DOSRAM 1400. The controller 1405 has a function of performing logic operation on a command signal input from the outside and determining an operation mode, a function of generating control signals for the row circuit 1410 and the column circuit 1415 so that the determined operation mode is executed, a function of retaining an address signal input from the outside, and a function of generating an internal address signal.
(Row Circuit 1410)

The row circuit 1410 has a function of driving the MC-SA array 1420. The decoder 1411 has a function of decoding an address signal. The word line driver circuit 1412 generates a selection signal for selecting a word line WL of a target row to be accessed.

The column selector 1413 and the sense amplifier driver circuit 1414 are circuits for driving the sense amplifier array 1423. The column selector 1413 has a function of generating a selection signal for selecting a bit line of a target column to be accessed. With the selection signal from the column selector 1413, the switch array 1444 of each local sense amplifier array 1426 is controlled. With the control signal from the sense amplifier driver circuit 1414, the plurality of local sense amplifier arrays 1426 are independently driven.
(Column Circuit 1415)

The column circuit 1415 has a function of controlling the input of data signals WDA[31:0], and a function of controlling the output of data signals RDA[31:0]. The data signals WDA[31:0] are write data signals, and the data signals RDA[31:01] are read data signals.

The global sense amplifier 1447 is electrically connected to the global bit line pair (GBLL, GBLR). The global sense amplifier 1447 has a function of amplifying a potential difference between the global bit line pair (GBLL, GBLR), and a function of retaining the potential difference. Data is written to and read from the global bit line pair (GBLL, GBLR) by the input/output circuit 1417.

The writing operation of the DOSRAM 1400 is briefly described. Data is written to the global bit line pair by the input/output circuit 1417. The data of the global bit line pair is retained by the global sense amplifier array 1416. By the switch array 1444 of the local sense amplifier array 1426 specified by an address, the data of the global bit line pair is written to the bit line pair of a target column. The local sense amplifier array 1426 amplifies and retains the written data. In the specified local memory cell array 1425, the word line WL of a target row is selected by the row circuit 1410, and the data retained in the local sense amplifier array 1426 is written to the memory cell 1445 of the selected row.

The reading operation of the DOSRAM 1400 is briefly described. One row of the local memory cell array 1425 is specified by an address signal. In the specified local memory cell array 1425, the word line WL of a target row is in a selected state, and the data of the memory cell 1445 is written to the bit line. The local sense amplifier array 1426 detects and retains a potential difference between the bit line pair of each column as data. Among the data retained in the local sense amplifier array 1426, the data of a column specified by the address is written to the global bit line pair by the switch array 1444. The global sense amplifier array 1416 detects and retains the data of the global bit line pair. The data retained in the global sense amplifier array 1416 is output to the input/output circuit 1417. Thus, the reading operation is completed.

There is theoretically no limitation on the number of rewriting operations of the DOSRAM 1400 because data is rewritten by charging and discharging the capacitor CS1; and writing and reading of data can be performed with low energy. In addition, the memory cell 1445 has a simple circuit configuration, and thus the capacity can be easily increased.

The transistor MW1 is an OS transistor. The extremely low off-state current of the OS transistor can inhibit charge leakage from the capacitor CS1. Therefore, the retention time of the DOSRAM 1400 is much longer than that of a DRAM using a Si transistor. This allows less frequent refresh, which can reduce power needed for refresh operations. For this reason, the DOSRAM 1400 used as a frame memory can reduce power consumption of a display controller IC and a source driver IC.

Since the MC-SA array 1420 has a stacked-layer structure, the bit line can be shortened to a length that is close to the length of the local sense amplifier array 1426. A shorter bit line results in smaller bit line capacitance, which can reduce the storage capacitance of the memory cell 1445. In addition, providing the switch array 1444 in the local sense amplifier array 1426 can reduce the number of long bit lines. For the reasons described above, a driving load during access to the DOSRAM 1400 is reduced, enabling a reduction in the energy consumption of a display controller IC and a source driver IC.

The structure described in this embodiment can be used in appropriate combination with the structure described in the other embodiments.

Embodiment 5

In this embodiment, an FPGA (field-programmable gate array) is described as an example of a semiconductor device of one embodiment of the present invention in which a transistor in which a metal oxide is used in a channel formation region (OS transistor) is used. In the FPGA of this embodiment, an OS memory is used in a configuration memory and a register. Here, such an FPGA is referred to as an "OS-FPGA".

The OS memory is a memory including at least a capacitor and an OS transistor that controls charge and discharge of the capacitor. The OS memory has excellent retention characteristics because the OS transistor has an extremely low off-state current and thus can function as a nonvolatile memory.

Figure 37A:
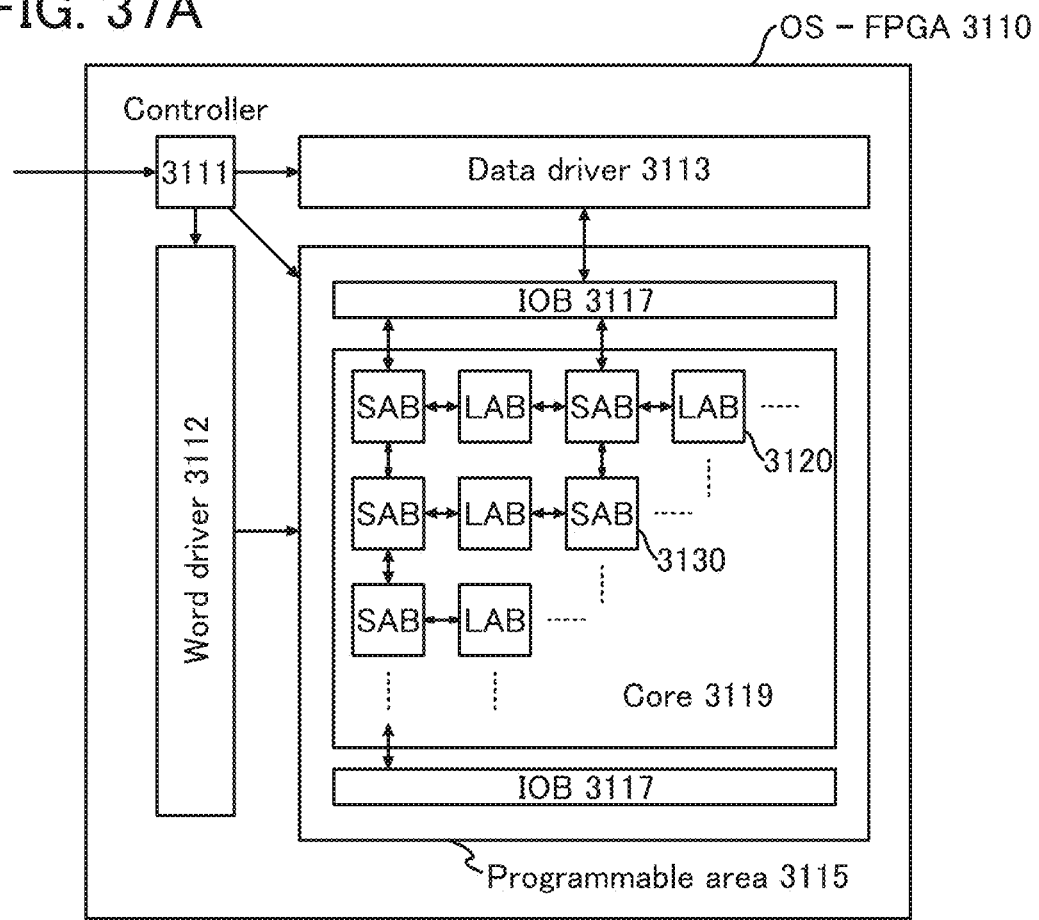
FIG. 37 Block diagrams illustrating configuration examples of semiconductor devices of embodiments of the present invention.

FIG. 37(A) illustrates a configuration example of an OS-FPGA. An OS-FPGA 3110 illustrated in FIG. 37(A) is capable of NOFF (normally-off) computing that executes context switching by a multi-context configuration and fine-grained power gating in each PLE. The OS-FPGA 3110 includes a controller 3111, a word driver 3112, a data driver 3113, and a programmable area 3115.

Figure 37B:
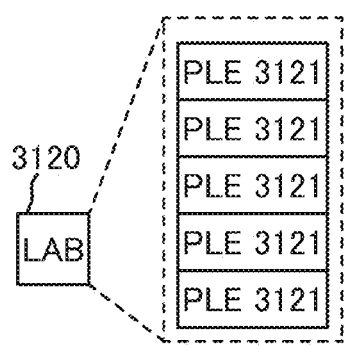
Figure 37C:
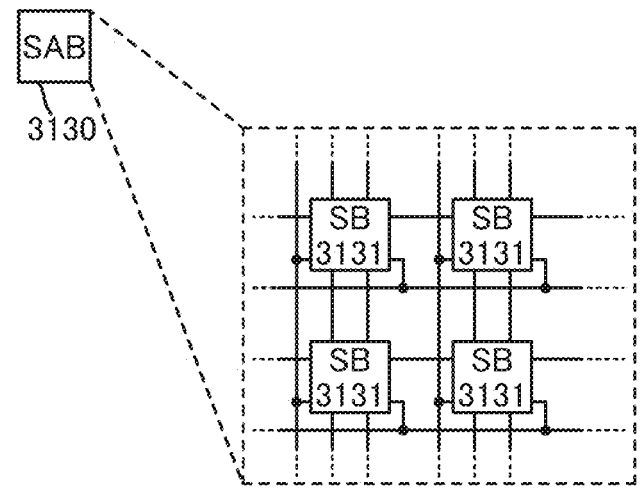

The programmable area 3115 includes two input/output blocks (IOBs) 3117 and a core 3119. The IOB 3117 includes a plurality of programmable input/output circuits. The core 3119 includes a plurality of logic array blocks (LABs) 3120 and a plurality of switch array blocks (SABs) 3130. The LAB 3120 includes a plurality of PLEs 3121. FIG. 37(B) illustrates an example in which the LAB 3120 includes five PLEs 3121. As illustrated in FIG. 37(C), the SAB 3130 includes a plurality of switch blocks (SBs) 3131 arranged in an array. The LAB 3120 is connected to the LABs 3120 in four directions (on the left, right, top, and bottom sides) through its input terminals and the SABs 3130.

Figure 38A:
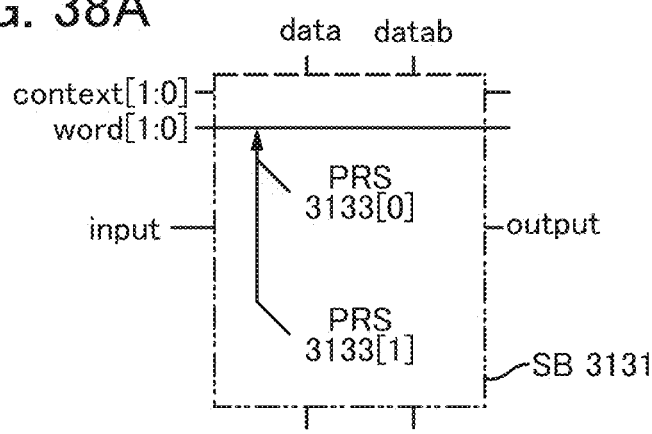
FIG. 38 A block diagram and a circuit diagram illustrating a configuration example of a semiconductor device of one embodiment of the present invention and a timing chart showing an operation example of the semiconductor device.

The SB 3131 is described with reference to FIG. 38(A) to FIG. 38(C). To the SB 3131 illustrated in FIG. 38(A), data, datab, and signals context[1:0] and word[1:0] are input. The data and the datab are configuration data, and the logics of the data and the datab have a complementary relationship. The number of contexts in the OS-FPGA 3110 is two, and the signals context[1:0] are context selection signals. The signals word[1:0] are word line selection signals, and wirings to which the signals word[1:0] are input are each a word line.

The SB 3131 includes a PRS (programmable routing switches) 3133[0] and a PRS 3133[1]. The PRS 3133[0] and the PRS 3133[1] each include a configuration memory (CM) that can store complementary data. Note that in the case where the PRS 3133[0] and the PRS 3133[1] are not distinguished from each other, they are each referred to as a PRS 3133. The same applies to other elements.

Figure 38B:
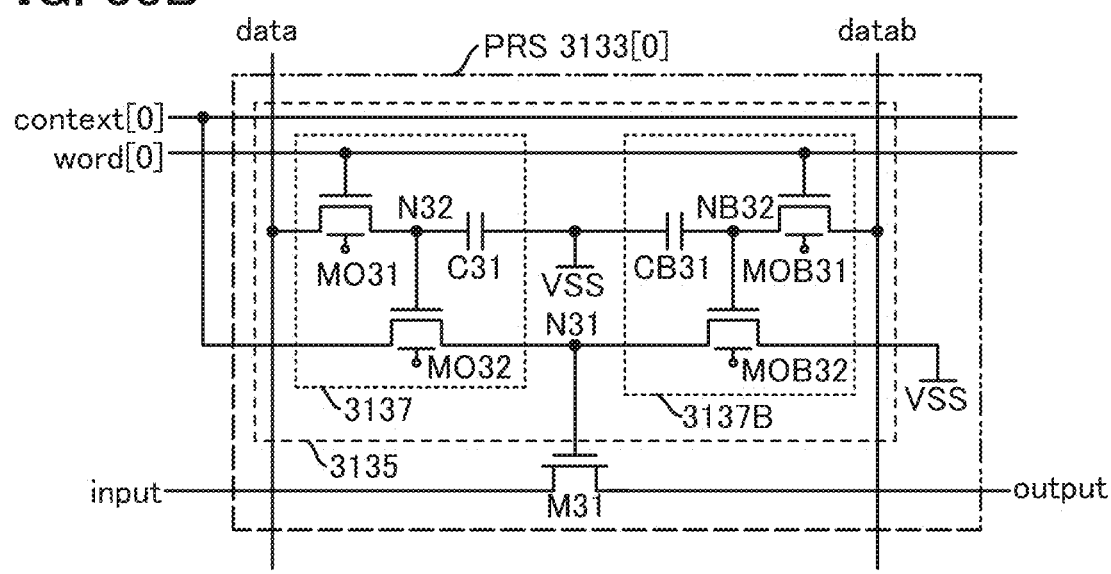
Figure 38C:
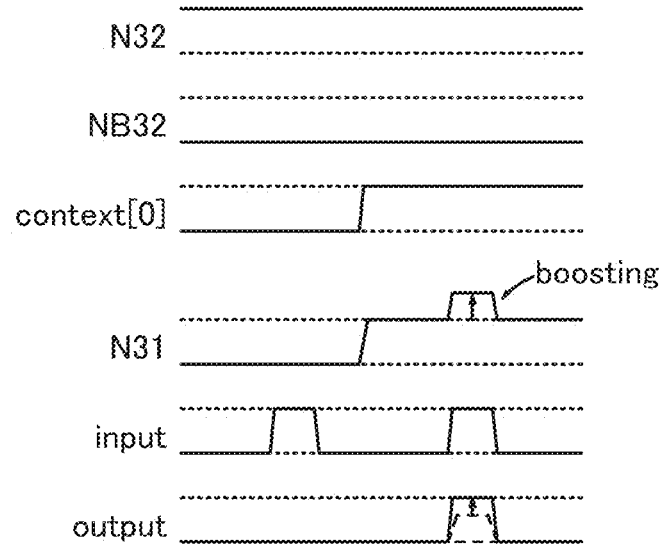

FIG. 38(B) illustrates a circuit configuration example of the PRS 3133[0]. The PRS 3133[0] and the PRS 3133[1] have the same circuit configuration. The PRS 3133[0] and the PRS 3133[1] are different from each other in a context selection signal and a word line selection signal that are input. The signal context[0] and the signal word[0] are input to the PRS 3133[0], and the signal context[1] and the signal word[1] are input to the PRS 3133[1]. For example, in the SB 3131, when the signal context[0] is set to "H", the PRS 3133[0] is activated.

The PRS 3133[0] includes a CM 3135 and a Si transistor M31. The Si transistor M31 is a pass transistor that is controlled by the CM 3135. The CM 3135 includes a memory circuit 3137 and a memory circuit 3137B. The memory circuit 3137 and the memory circuit 3137B have the same circuit configuration. The memory circuit 3137 includes a capacitor C31, an OS transistor MO31, and an OS transistor MO32. The memory circuit 3137B includes a capacitor CB31, an OS transistor MOB31, and an OS transistor MOB32.

The OS transistor MO31, the OS transistor MO32, the OS transistor MOB31, and the OS transistor MOB32 each include a bottom gate, and each of these bottom gates is electrically connected to a power supply line that supplies a fixed potential.

A gate of the Si transistor M31 corresponds to a node N31, a gate of the OS transistor MO32 corresponds to a node N32, and a gate of the OS transistor MOB32 corresponds to a node NB32. The node N32 and the node NB32 are each a charge retention node of the CM 3135. The OS transistor MO32 controls the conduction state between the node N31 and a signal line for the signal context[0]. The OS transistor MOB32 controls the conduction state between the node N31 and a low-potential power supply line VSS.

Logics of data retained in the memory circuit 3137 and the memory circuit 3137B have a complementary relationship. Thus, either the OS transistor MO32 or the OS transistor MOB32 is turned on.

The operation example of the PRS 3133[0] is described with reference to FIG. 38(C). In the PRS 3133[0], to which configuration data has already been written, the node N32 is at "H" and the node NB32 is at "L".

The PRS 3133[0] is inactive while the signal context[0] is at "L". During this period, even when an input terminal of the PRS 3133[0] is transferred to "H", the gate of the Si transistor M31 is kept at "L" and an output terminal of the PRS 3133[0] is also kept at "L".

The PRS 3133[0] is active while the signal context[0] is at "H". When the signal context[0] is transferred to "H", the gate of the Si transistor M31 is transferred to "H" by the configuration data stored in the CM 3135.

When the input terminal is transferred to "H" during the period when the PRS 3133[0] is active, the gate potential of the Si transistor M31 is increased by boosting because the OS transistor MO32 of the memory circuit 3137 is a source follower. As a result, the OS transistor MO32 of the memory circuit 3137 loses the driving capability, and the gate of the Si transistor M31 is brought into a floating state.

In the PRS 3133 with a multi-context function, the CM 3135 also functions as a multiplexer.

Figure 39:
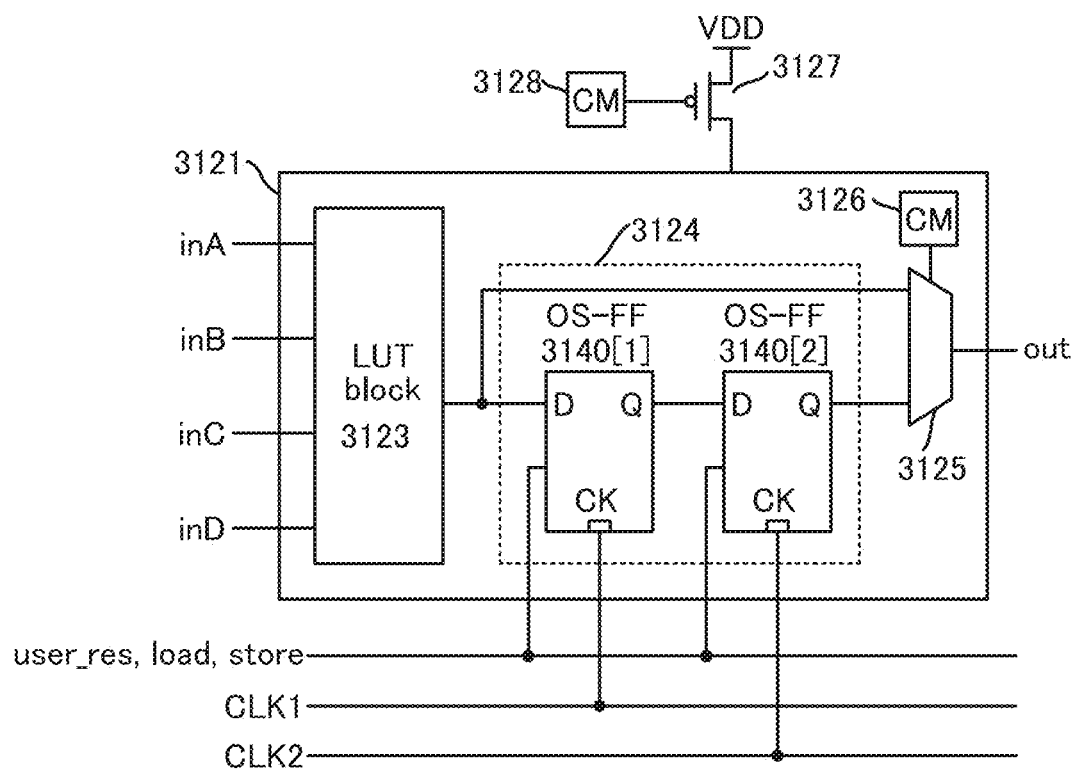
FIG. 39 A block diagram illustrating a configuration example of a semiconductor device of one embodiment of the present invention.

FIG. 39 illustrates a configuration example of the PLE 3121. The PLE 3121 includes an LUT (lookup table) block 3123, a register block 3124, a selector 3125, and a CM 3126. The LUT block 3123 is configured to select and output data in accordance with inputs inA to inD. The selector 3125 selects an output of the LUT block 3123 or an output of the register block 3124 in accordance with the configuration data stored in the CM 3126.

The PLE 3121 is electrically connected to a power supply line for a potential VDD through a power switch 3127. Whether the power switch 3127 is turned on or off is determined in accordance with the configuration data stored in a CM 3128. Providing the power switch 3127 for each PLE 3121 enables fine-grained power gating. The PLE 3121 that is not used after context switching can be power gated owing to the fine-grained power gating function; thus, standby power can be effectively reduced.

The register block 3124 is formed by nonvolatile registers to achieve NOFF computing. The nonvolatile registers in the PLE 3121 are each a flip-flop provided with an OS memory (hereinafter referred to as an "OS-FF").

Figure 40A:
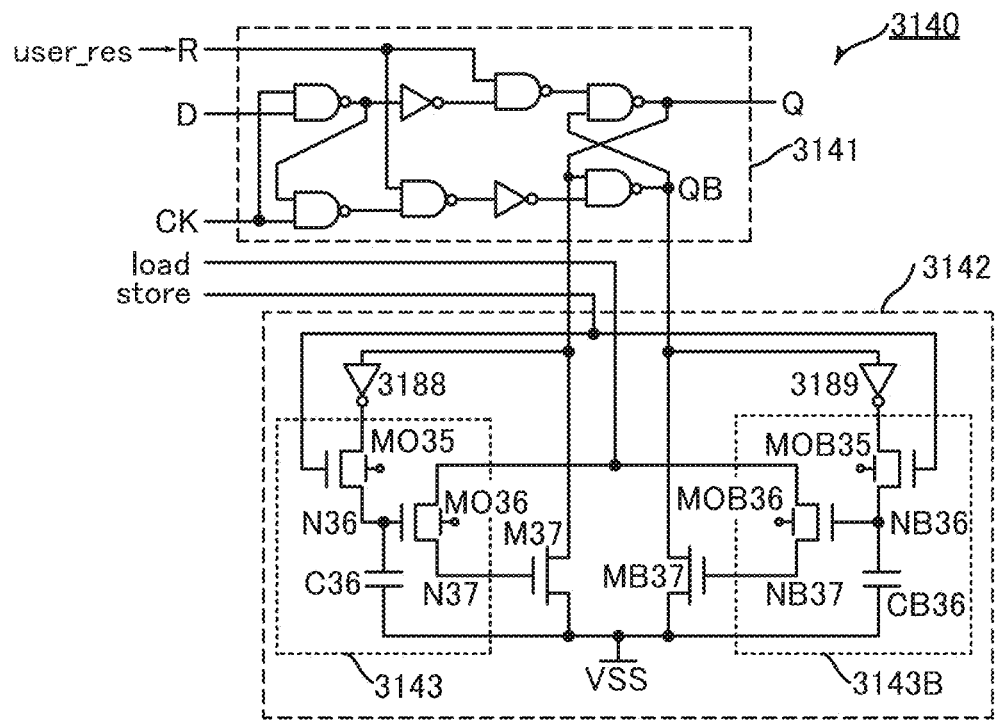
FIG. 40 A circuit diagram illustrating a configuration example of a semiconductor device of one embodiment of the present invention and a timing chart showing an operation example of the semiconductor device.

The register block 3124 includes an OS-FF 3140[1] and an OS-FF 3140[2]. A signal user_res, a signal load, and a signal store are input to the OS-FF 3140[1] and the OS-FF 3140[2]. A clock signal CLK1 is input to the OS-FF 3140[1] and a clock signal CLK2 is input to the OS-FF 3140[2]. FIG. 40(A) illustrates a configuration example of the OS-FF 3140.

The OS-FF 3140 includes an FF 3141 and a shadow register 3142. The FF 3141 includes a node CK, a node R, a node D, a node Q, and a node QB. A clock signal is input to the node CK. The signal user_res is input to the node R. The signal user_res is a reset signal. The node D is a data input node, and the node Q is a data output node. Logics of the node Q and the node QB have a complementary relationship.

The shadow register 3142 functions as a backup circuit of the FF 3141. The shadow register 3142 backs up data of the node Q and the node QB in accordance with the signal store and writes back the backed up data to the node Q and the node QB in accordance with the signal load.

The shadow register 3142 includes an inverter circuit 3188, an inverter circuit 3189, a Si transistor M37, a Si transistor MB37, a memory circuit 3143, and a memory circuit 3143B. The memory circuit 3143 and the memory circuit 3143B have the same circuit configuration as the memory circuit 3137 of the PRS 3133. The memory circuit 3143 includes a capacitor C36, an OS transistor MO35, and an OS transistor MO36. The memory circuit 3143B includes a capacitor CB36, an OS transistor MOB35, and an OS transistor MOB36. A node N36 and a node NB36 correspond to a gate of the OS transistor MO36 and a gate of the OS transistor MOB36, respectively, and are each a charge retention node. A node N37 and a node NB37 correspond to a gate of the Si transistor M37 and a gate of the Si transistor MB37, respectively.

The OS transistor MO35, the OS transistor MO36, the OS transistor MOB35, and the OS transistor MOB36 each include a bottom gate, and each of these bottom gates is electrically connected to a power supply line that supplies a fixed potential.

Figure 40B:
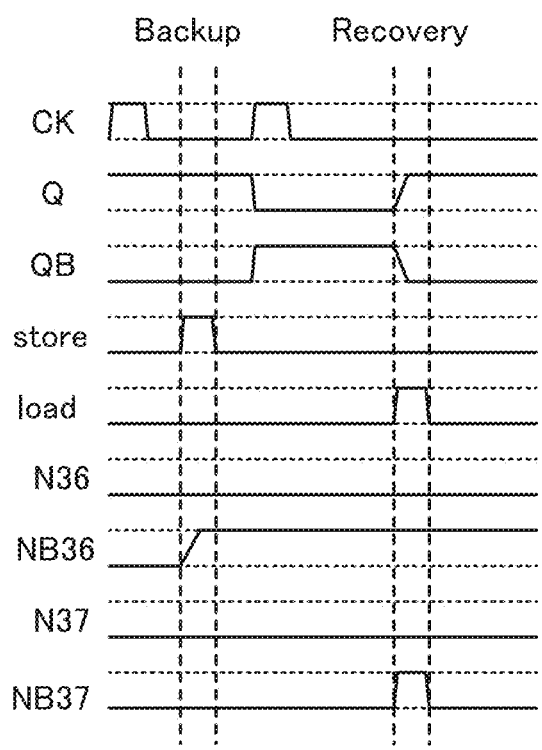

An example of an operation method of the OS-FF 3140 is described with reference to FIG. 40(B).

(Backup)

When the signal store at "H" is input to the OS-FF 3140, the shadow register 3142 backs up the data of the FF 3141. The node N36 becomes "L" when the data of the node Q is written, and the node NB36 becomes "H" when the data of the node QB is written. After that, power gating is performed and the power switch 3127 is turned off. Although the data of the node Q and the node QB of the FF 3141 are lost, the shadow register 3142 retains the backed up data even when power supply is stopped.

(Recovery)

The power switch 3127 is turned on to supply power to the PLE 3121. After that, when the signal load at "H" is input to the OS-FF 3140, the shadow register 3142 writes back the backed up data to the FF 3141. The node N37 is kept at "L" because the node N36 is at "L", and the node NB37 becomes "H" because the node NB36 is at "H". Thus, the node Q becomes "H" and the node QB becomes "L". That is, the OS-FF 3140 is recovered to a state at the backup operation.

A combination of the fine-grained power gating and backup/recovery operation of the OS-FF 3140 allows power consumption of the OS-FPGA 3110 to be effectively reduced.

As an error that might occur in a memory circuit, a soft error due to entry of radiation is given. The soft error is a phenomenon in which a malfunction such as inversion of data stored in a memory is caused by electron-hole pair generation when a transistor is irradiated with a rays emitted from a material of a memory or a package or the like, secondary cosmic ray neutrons generated by nuclear reaction of primary cosmic rays entering the Earth's atmosphere from outer space with nuclei of atoms existing in the atmosphere, or the like. An OS memory using an OS transistor has a high soft-error tolerance. Therefore, the OS-FPGA 3110 with high reliability can be provided when an OS memory is included therein.

The structure described in this embodiment can be used in appropriate combination with the structure described in the other embodiments.

Embodiment 6

In this embodiment, an example of a CPU including a semiconductor device of one embodiment of the present invention, such as the above-described memory device, is described.

<Configuration of CPU>

Figure 41:
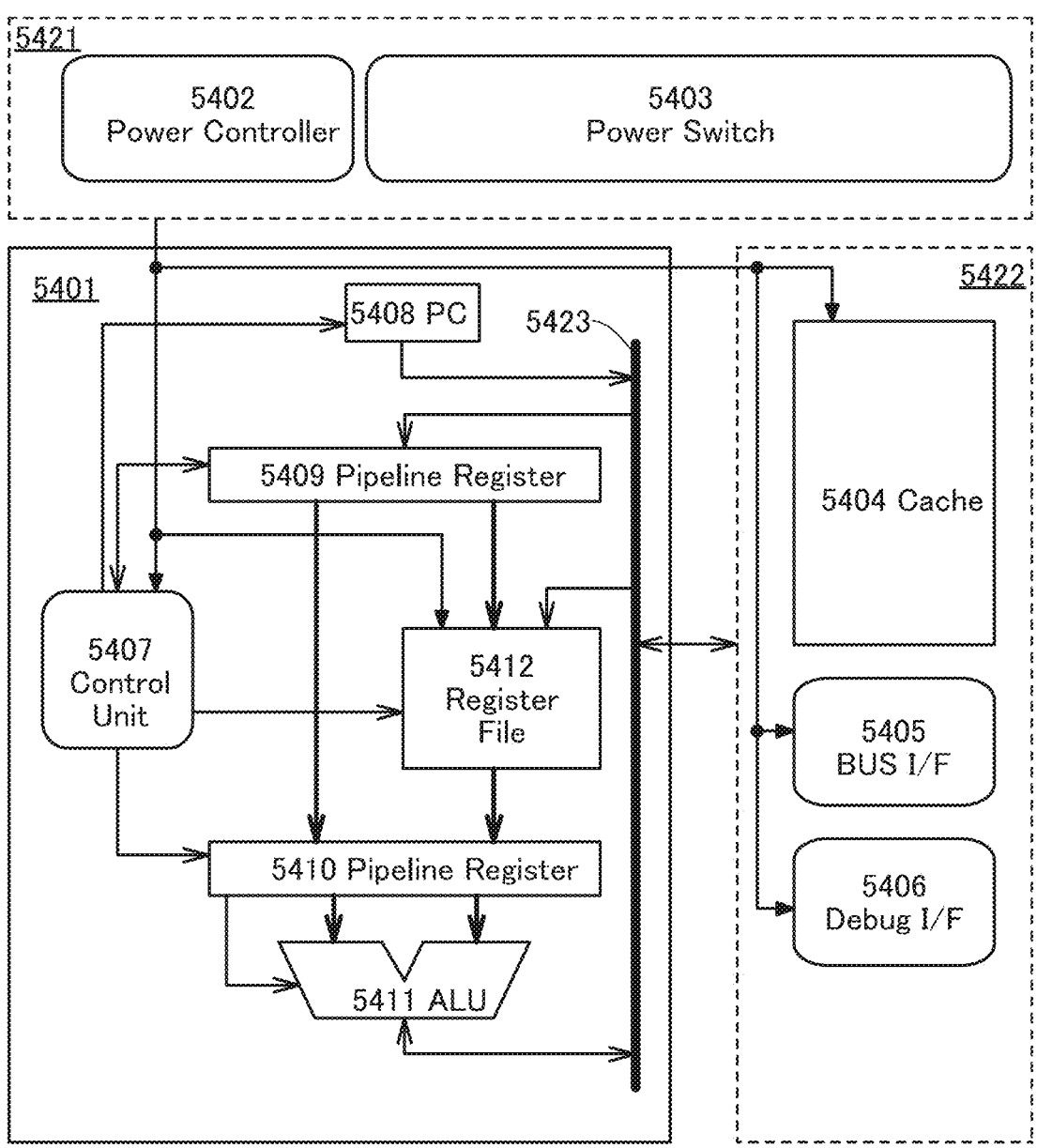
FIG. 41 A block diagram illustrating a semiconductor device of one embodiment of the present invention.

A semiconductor device 5400 illustrated in FIG. 41 includes a CPU core 5401, a power management unit 5421, and a peripheral circuit 5422. The power management unit 5421 includes a power controller 5402 and a power switch 5403. The peripheral circuit 5422 includes a cache 5404 including a cache memory, a bus interface (BUS I/F) 5405, and a debug interface (Debug I/F) 5406. The CPU core 5401 includes a data bus 5423, a control unit 5407, a PC (program counter) 5408, a pipeline register 5409, a pipeline register 5410, an ALU (arithmetic logic unit) 5411, and a register file 5412. Data is transmitted between the CPU core 5401 and the peripheral circuit 5422 such as the cache 5404 via the data bus 5423.

The semiconductor device (cell) can be used for many logic circuits typified by the power controller 5402 and the control unit 5407, particularly for all logic circuits that can be constituted using standard cells. Accordingly, the semiconductor device 5400 can be small. The semiconductor device 5400 can have reduced power consumption. The semiconductor device 5400 can have a higher operating speed. The semiconductor device 5400 can have a smaller power supply voltage variation.

When p-channel Si transistors and the transistor described in the above embodiment which includes a metal oxide (preferably an oxide containing In, Ga, and Zn) in a channel formation region are used in the semiconductor device (cell) and the semiconductor device (cell) is used in the semiconductor device 5400, the semiconductor device 5400 can be small. The semiconductor device 5400 can have reduced power consumption. The semiconductor device 5400 can have a higher operating speed. Particularly when the Si transistors are only p-channel ones, the manufacturing cost can be reduced.

The control unit 5407 has functions of totally controlling operations of the PC 5408, the pipeline register 5409, the pipeline register 5410, the ALU 5411, the register file 5412, the cache 5404, the bus interface 5405, the debug interface 5406, and the power controller 5402 to decode and execute instructions contained in a program such as input applications.

The ALU 5411 has a function of performing a variety of arithmetic operations such as four arithmetic operations and logic operations.

The cache 5404 has a function of temporarily storing frequently-used data. The PC 5408 is a register which has a function of storing an address of an instruction to be executed next. Note that although not illustrated in FIG. 41, the cache 5404 is provided with a cache controller for controlling the operation of the cache memory.

The pipeline register 5409 has a function of temporarily storing instruction data.

The register file 5412 includes a plurality of registers including a general-purpose register and can store data that is read from the main memory, data obtained as a result of arithmetic operations in the ALU 5411, or the like.

The pipeline register 5410 is a register which has a function of temporarily storing data used for arithmetic operations in the ALU 5411, data obtained as a result of arithmetic operations in the ALU 5411, or the like.

The bus interface 5405 functions as a path for data between the semiconductor device 5400 and various devices outside the semiconductor device 5400. The debug interface 5406 functions as a path for a signal for inputting an instruction to control debugging to the semiconductor device 5400.

The power switch 5403 has a function of controlling supply of a power source voltage to various circuits included in the semiconductor device 5400 other than the power controller 5402. The above various circuits belong to several different power domains, and the power switch 5403 controls whether the power supply voltage is supplied to the various circuits in the same power domain. In addition, the power controller 5402 has a function of controlling the operation of the power switch 5403.

The semiconductor device 5400 having the above structure is capable of performing power gating. A description will be given of an example of the power gating operation sequence.

First, by the CPU core 5401, timing for stopping the supply of the power supply voltage is set in a register of the power controller 5402. Then, an instruction to start power gating is sent from the CPU core 5401 to the power controller 5402. Then, various registers and the cache 5404 included in the semiconductor device 5400 start data saving. Then, the power switch 5403 stops the supply of the power supply voltage to the various circuits included in the semiconductor device 5400 other than the power controller 5402. Then, an interrupt signal is input to the power controller 5402, whereby the supply of the power supply voltage to the various circuits included in the semiconductor device 5400 is started. Note that a counter may be provided in the power controller 5402 to determine the timing of starting the supply of the power supply voltage regardless of the input of an interrupt signal. Next, the various registers and the cache 5404 start data recovery. Then, the instruction is resumed in the control unit 5407.

Such power gating can be performed in the whole processor or one or a plurality of logic circuits forming the processor. Furthermore, power supply can be stopped even for a short time. Consequently, power consumption can be reduced at a fine spatial or temporal granularity.

In performing power gating, information retained by the CPU core 5401 or the peripheral circuit 5422 is preferably saved in a short time. By doing so, the power can be turned on or off in a short time, and an effect of saving power becomes significant.

In order that the information retained by the CPU core 5401 or the peripheral circuit 5422 be saved in a short time, the data is preferably saved in a flip-flop circuit itself (referred to as a flip-flop circuit capable of backup operation). Furthermore, the data is preferably saved in an SRAM cell itself (referred to as an SRAM cell capable of backup operation). The flip-flop circuit and SRAM cell which are capable of backup operation preferably include transistors including a metal oxide (preferably an oxide containing In, Ga, and Zn) in a channel formation region. Consequently, the transistors have a low off-state current; thus, the flip-flop circuit and SRAM cell which are capable of backup operation can retain information for a long time without power supply. When the transistors have a high switching speed, the flip-flop circuit and SRAM cell which are capable of backup operation can save and restore data in a short time in some cases.

Figure 42:
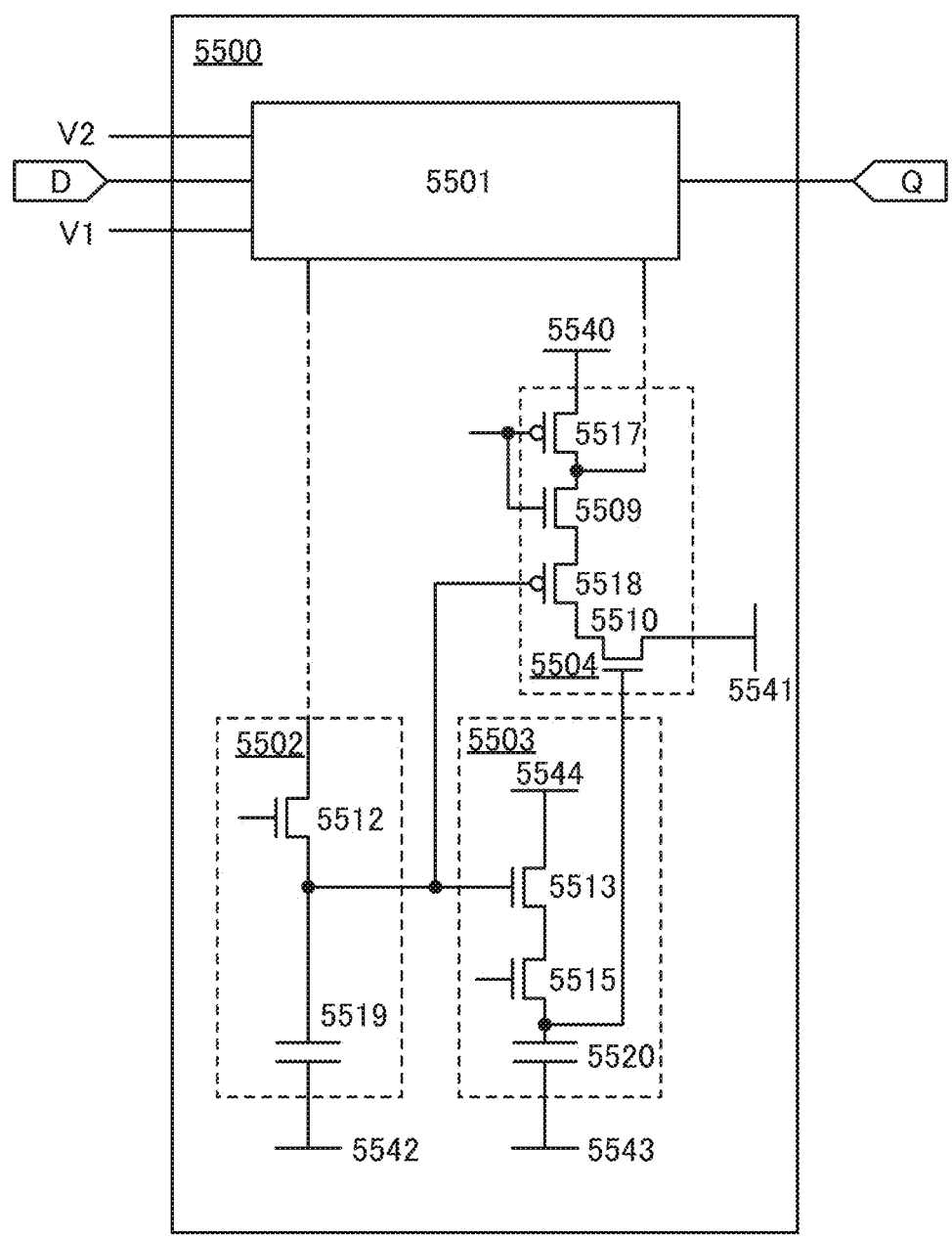
FIG. 42 A circuit diagram illustrating a semiconductor device of one embodiment of the present invention.

An example of the flip-flop circuit capable of backup operation is described using FIG. 42.

A semiconductor device 5500 illustrated in FIG. 42 is an example of the flip-flop circuit capable of backup operation. The semiconductor device 5500 includes a first memory circuit 5501, a second memory circuit 5502, a third memory circuit 5503, and a read circuit 5504. As a power supply voltage, a potential difference between a potential V1 and a potential V2 is supplied to the semiconductor device 5500. One of the potential V1 and the potential V2 is at a high level, and the other is at a low level. An example of the structure of the semiconductor device 5500 when the potential V1 is at a low level and the potential V2 is at a high level will be described below.

The first memory circuit 5501 has a function of retaining data when a signal D including the data is input in a period during which the power supply voltage is supplied to the semiconductor device 5500. Furthermore, the first memory circuit 5501 outputs a signal Q including the retained data in the period during which the power supply voltage is supplied to the semiconductor device 5500. On the other hand, the first memory circuit 5501 cannot retain data in a period during which the power supply voltage is not supplied to the semiconductor device 5500. That is, the first memory circuit 5501 can be referred to as a volatile memory circuit.

The second memory circuit 5502 has a function of reading the data retained in the first memory circuit 5501 to store (or save) it. The third memory circuit 5503 has a function of reading the data retained in the second memory circuit 5502 to store (or save) it. The read circuit 5504 has a function of reading the data retained in the second memory circuit 5502 or the third memory circuit 5503 to store (or restore) it in the first memory circuit 5501.

In particular, the third memory circuit 5503 has a function of reading the data retained in the second memory circuit 5502 to store (or save) it even in the period during which the power supply voltage is not supplied to the semiconductor device 5500.

As shown in FIG. 42, the second memory circuit 5502 includes a transistor 5512 and a capacitor 5519. The third memory circuit 5503 includes a transistor 5513, a transistor 5515, and a capacitor 5520. The read circuit 5504 includes a transistor 5510, a transistor 5518, a transistor 5509, and a transistor 5517.

The transistor 5512 has a function of charging and discharging the capacitor 5519 in accordance with data retained in the first memory circuit 5501. The transistor 5512 is preferably capable of charging and discharging the capacitor 5519 at a high speed in accordance with data retained in the first memory circuit 5501. Specifically, the transistor 5512 preferably contains crystalline silicon (preferably polycrystalline silicon, further preferably single crystal silicon) in a channel formation region.

The conduction state or the non-conduction state of the transistor 5513 is determined in accordance with the charge retained in the capacitor 5519. The transistor 5515 has a function of charging and discharging the capacitor 5520 in accordance with the potential of a wiring 5544 when the transistor 5513 is in a conduction state. It is preferable that the off-state current of the transistor 5515 be extremely low. Specifically, the transistor 5515 preferably contains a metal oxide (preferably an oxide containing In, Ga, and Zn) in a channel formation region.

Specific connection relationships between the elements are described. One of a source and a drain of the transistor 5512 is connected to the first memory circuit 5501. The other of the source and the drain of the transistor 5512 is connected to one electrode of the capacitor 5519, a gate of the transistor 5513, and a gate of the transistor 5518. The other electrode of the capacitor 5519 is connected to a wiring 5542. One of a source and a drain of the transistor 5513 is connected to the wiring 5544. The other of the source and the drain of the transistor 5513 is connected to one of a source and a drain of the transistor 5515. The other of the source and the drain of the transistor 5515 is connected to one electrode of the capacitor 5520 and a gate of the transistor 5510. The other electrode of the capacitor 5520 is connected to a wiring 5543. One of a source and a drain of the transistor 5510 is connected to a wiring 5541. The other of the source and the drain of the transistor 5510 is connected to one of a source and a drain of the transistor 5518. The other of the source and the drain of the transistor 5518 is connected to one of a source and a drain of the transistor 5509. The other of the source and the drain of the transistor 5509 is connected to one of a source and a drain of the transistor 5517 and the first memory circuit 5501. The other of the source and the drain of the transistor 5517 is connected to a wiring 5540. Furthermore, although a gate of the transistor 5509 is connected to a gate of the transistor 5517 in FIG. 42, the gate of the transistor 5509 is not necessarily connected to the gate of the transistor 5517.

The transistor described in the above embodiment as an example can be used as the transistor 5515. Because of the low off-state current of the transistor 5515, the semiconductor device 5500 can retain information for a long time without power supply. The favorable switching characteristics of the transistor 5515 allow the semiconductor device 5500 to perform high-speed backup and recovery.

The structure described in this embodiment can be used in appropriate combination with the structure described in the other embodiments.

Embodiment 7

In this embodiment, one mode of a semiconductor device of one embodiment of the present invention will be described with reference to FIG. 43 and FIG. 44.
<Semiconductor Wafer and Chip>

Figure 43A:
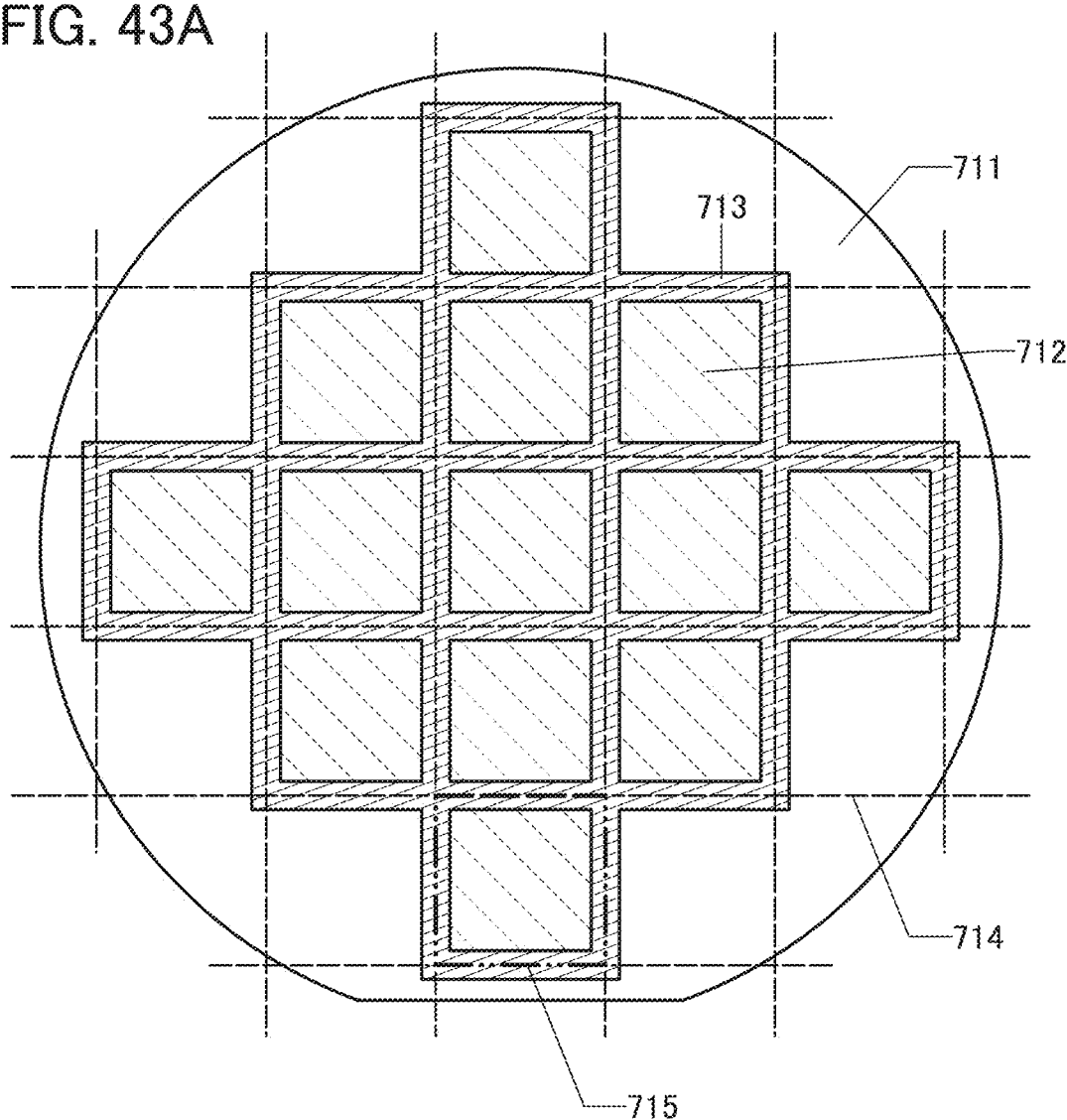
FIG. 43 Top views of a semiconductor wafer of one embodiment of the present invention.

FIG. 43(A) illustrates a top view of a substrate 711 before dicing treatment is performed. As the substrate 711, a semiconductor substrate (also referred to as a "semiconductor wafer") can be used, for example. A plurality of circuit regions 712 are provided over the substrate 711. A semiconductor device or the like of one embodiment of the present invention can be provided in the circuit region 712.

Figure 43B:
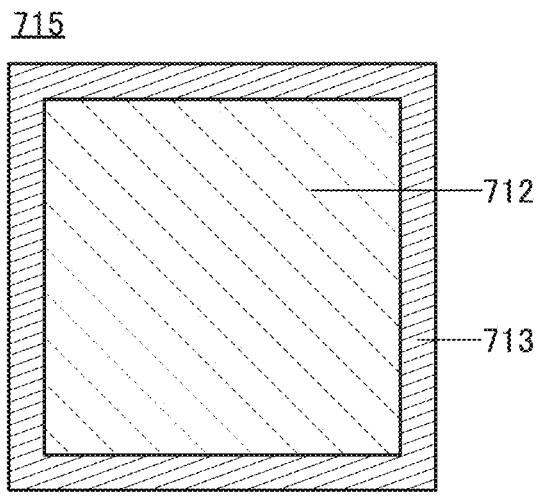

The plurality of circuit regions 712 are each surrounded by a separation region 713. Separation lines (also referred to as "dicing lines") 714 are set at a position overlapping with the separation regions 713. The substrate 711 is cut along the separation lines 714, whereby chips 715 including the circuit regions 712 can be cut out. FIG. 43(B) illustrates an enlarged view of the chip 715.

A conductive layer, a semiconductor layer, or the like may be provided in the separation region 713. A conductive layer, a semiconductor layer, or the like provided in the separation region 713 relieves ESD (Electro-Static Discharge) that might be caused in a dicing step, preventing a decrease in the yield due to the dicing step. A dicing step is generally performed while pure water whose specific resistance is decreased by dissolution of a carbonic acid gas or the like is supplied to a cut portion, in order to cool down a substrate, remove swarf, and prevent electrification, for example. Providing a conductive layer, a semiconductor layer, or the like in the separation region 713 allows a reduction in the usage of the pure water. Therefore, the cost of manufacturing semiconductor devices can be reduced. Thus, the productivity of semiconductor devices can be improved.

<Electronic Component>

Figure 44A:
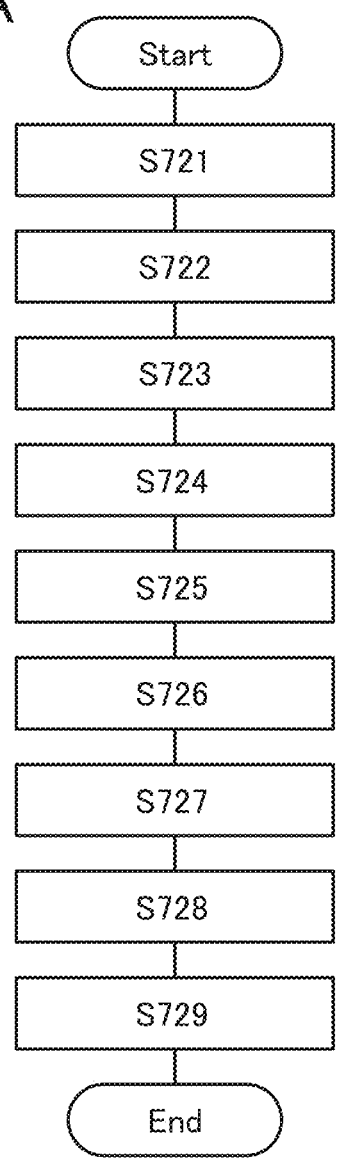
FIG. 44 A flowchart describing a manufacturing process example of an electronic component and a schematic perspective view.

An example of an electronic component using the chip 715 will be described with reference to FIG. 44(A) and FIG. 44(B). Note that the electronic component is also referred to as a semiconductor package or an IC package. The electronic component has a plurality of standards, names, and the like depending on a terminal extraction direction, a terminal shape, and the like.

The electronic component is completed when the semiconductor device described in the above embodiment is combined with components other than the semiconductor device in an assembly process (post-process).

The post-process will be described with reference to a flow chart in FIG. 44(A). After the semiconductor device of one embodiment of the present invention and the like are formed over the substrate 711 in a pre-process, a "back surface grinding step" for grinding a back surface (a surface where the semiconductor device and the like are not formed) of the substrate 711 is performed (Step S721). When the substrate 711 is thinned by grinding, the size of the electronic component can be reduced.

Next, a "dicing step" for dividing the substrate 711 into a plurality of chips 715 is performed (Step S722). Then, a "die bonding step" for individually bonding the divided chips 715 to a lead frame is performed (Step S723). To bond the chip 715 and a lead frame in the die bonding step, a method such as resin bonding or tape-automated bonding is selected as appropriate depending on products. Note that the chip 715 may be bonded to an interposer substrate instead of the lead frame.

Next, a "wire bonding step" for electrically connecting a lead of the lead frame and an electrode on the chip 715 through a metal wire is performed (Step S724). As the metal wire, a silver wire, a gold wire, or the like can be used. Ball bonding or wedge bonding can be used as the wire bonding, for example.

The wire-bonded chip 715 is subjected to a "sealing step (molding step)" for sealing the chip with an epoxy resin or the like (Step S725). Through the sealing step, the inside of the electronic component is filled with a resin, so that a wire for connecting the chip 715 to the lead can be protected from external mechanical force, and deterioration of electrical characteristics (decrease in reliability) due to moisture, dust, or the like can be reduced.

Subsequently, a "lead plating step" for plating the lead of the lead frame is performed (Step S726). This plating process prevents corrosion of the lead and enables more reliable soldering at the time of mounting the chip on a printed circuit board in a later step. Then, a "formation step" for cutting and processing the lead is performed (Step S727).

Next, a "marking step" for performing printing (marking) on a surface of the package is performed (Step S728). After a "testing step" (Step S729) for checking the quality of an external shape, the presence of malfunction, and the like, the electronic component is completed.

Figure 44B:
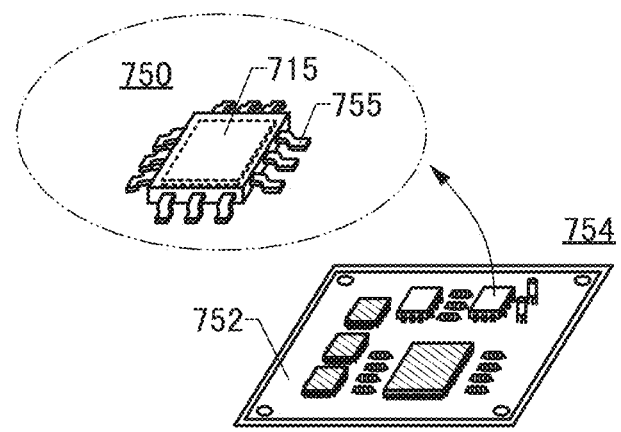

FIG. 44(B) illustrates a perspective schematic view of a completed electronic component. FIG. 44(B) illustrates a perspective schematic view of a QFP (Quad Flat Package) as an example of the electronic component. An electronic component 750 illustrated in FIG. 44(B) includes a lead 755 and the chip 715. The electronic component 750 may include a plurality of chips 715.

The electronic component 750 illustrated in FIG. 44(B) is mounted on a printed circuit board 752, for example. A plurality of electronic components 750 are combined and electrically connected to each other over the printed circuit board 752; thus, a substrate on which the electronic components are mounted (a circuit board 754) is completed. The completed circuit board 754 is used for an electronic device or the like.

This embodiment can be implemented in appropriate combination with the structure described in the other embodiments.

Embodiment 8

<Electronic Device>

A semiconductor device of one embodiment of the present invention can be used for a variety of electronic devices. FIG. 45 illustrates specific examples of the electronic devices using the semiconductor device of one embodiment of the present invention.

Figure 45A:
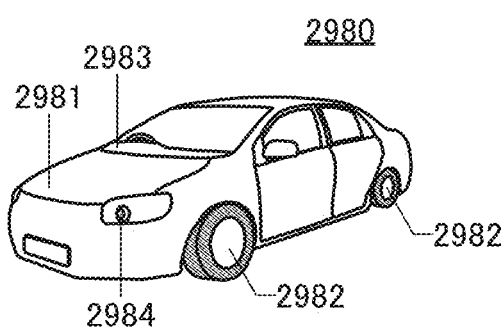
FIG. 45 Views illustrating electronic devices of embodiments of the present invention.

FIG. 45(A) is an external view illustrating an example of a car. A car 2980 includes a car body 2981, wheels 2982, a dashboard 2983, lights 2984, and the like. The car 2980 also includes an antenna, a battery, and the like.

Figure 45B:
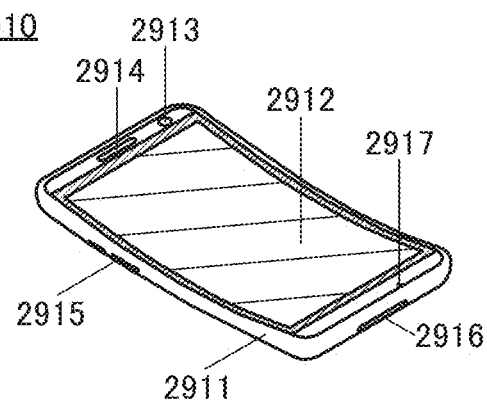

An information terminal 2910 illustrated in FIG. 45(B) includes a housing 2911, a display portion 2912, a microphone 2917, a speaker portion 2914, a camera 2913, an external connection portion 2916, an operation switch 2915, and the like. A display panel and a touch screen that use flexible substrates are provided in the display portion 2912. The information terminal 2910 also includes an antenna, a battery, and the like inside the housing 2911. The information terminal 2910 can be used as, for example, a smartphone, a mobile phone, a tablet information terminal, a tablet personal computer, or an e-book reader.

Figure 45C:
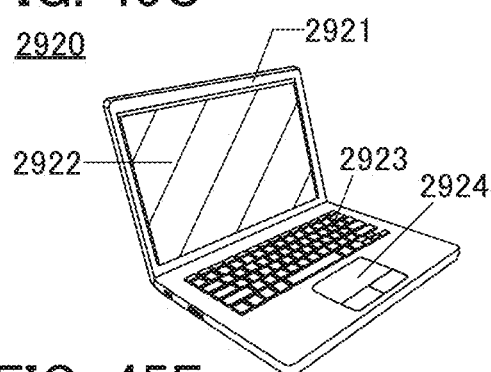

A notebook personal computer 2920 illustrated in FIG. 45(C) includes a housing 2921, a display portion 2922, a keyboard 2923, a pointing device 2924, and the like. The notebook personal computer 2920 also includes an antenna, a battery, and the like inside the housing 2921.

Figure 45D:
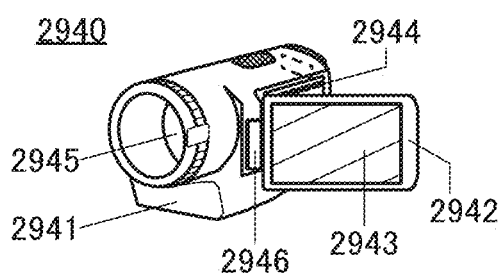

A video camera 2940 illustrated in FIG. 45(D) includes a housing 2941, a housing 2942, a display portion 2943, operation switches 2944, a lens 2945, a joint 2946, and the like. The operation switches 2944 and the lens 2945 are provided for the housing 2941, and the display portion 2943 is provided for the housing 2942. The video camera 2940 also includes an antenna, a battery, and the like inside the housing 2941. The housing 2941 and the housing 2942 are connected to each other with the joint 2946, and the angle between the housing 2941 and the housing 2942 can be changed with the joint 2946. The orientation of an image displayed on the display portion 2943 may be changed and display and non-display of an image can be switched depending on the angle between the housing 2941 and the housing 2942.

Figure 45E:
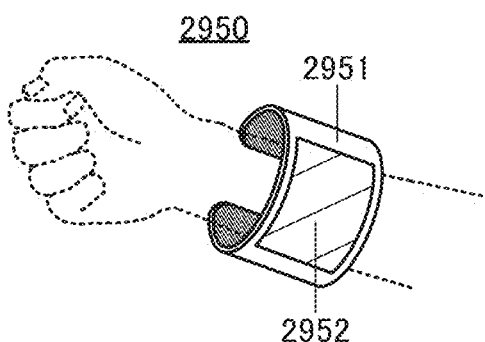

FIG. 45(E) illustrates an example of a bangle-type information terminal. An information terminal 2950 includes a housing 2951, a display portion 2952, and the like. The information terminal 2950 also includes an antenna, a battery, and the like inside the housing 2951. The display portion 2952 is supported by the housing 2951 having a curved surface. A display panel using a flexible substrate is provided in the display portion 2952, whereby the user-friendly information terminal 2950 that is flexible and lightweight can be provided.

Figure 45F:
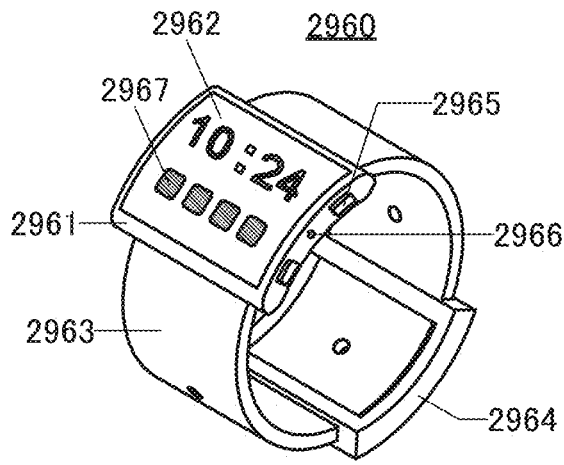

FIG. 45(F) illustrates an example of a watch-type information terminal. An information terminal 2960 includes a housing 2961, a display portion 2962, a band 2963, a buckle 2964, an operation switch 2965, an input/output terminal 2966, and the like. The information terminal 2960 also includes an antenna, a battery, and the like inside the housing 2961. The information terminal 2960 is capable of executing a variety of applications such as mobile phone calls, e-mailing, viewing and editing texts, music reproduction, Internet communication, and a computer game.

A display surface of the display portion 2962 is curved, and images can be displayed on the curved display surface. In addition, the display portion 2962 includes a touch sensor, and operation can be performed by touching the screen with a finger, a stylus, or the like. For example, by touching an icon 2967 displayed on the display portion 2962, an application can be started. With the operation switch 2965, a variety of functions such as time setting, power on/off operation, on/off operation of wireless communication, setting and cancellation of a silent mode, and setting and cancellation of a power saving mode can be performed. For example, the functions of the operation switch 2965 can be set by setting the operation system incorporated in the information terminal 2960.

The information terminal 2960 can execute near field communication conformable to a communication standard. For example, mutual communication with a headset capable of wireless communication enables hands-free calling. Moreover, the information terminal 2960 includes the input/output terminal 2966, and data can be directly transmitted to and received from another information terminal via a connector. In addition, charging can be performed via the input/output terminal 2966. Note that the charging operation may be performed by wireless power feeding without using the input/output terminal 2966.

For example, a memory device using the semiconductor device of one embodiment of the present invention can hold control data, a control program, or the like of the above electronic device for a long time. With the use of the semiconductor device of one embodiment of the present invention, a highly reliable electronic device can be achieved.

This embodiment can be implemented in appropriate combination with the structure described in the other embodiments.

EXAMPLE

In this example, a semiconductor device including the transistor 200 illustrated in FIG. 1 was fabricated and a cross section thereof was observed. A method for manufacturing the semiconductor device which has been subjected to the cross-sectional observation will be described below.

A silicon oxynitride film was used as the insulator 224. As an oxide to be the oxide 230a in the oxide 230 over the insulator 224, an In—Ga—Zn oxide was deposited by a sputtering method using a target with In:Ga:Zn=1:3:4 [atomic ratio]. Next, as an oxide to be the oxide 230b, an In—Ga—Zn oxide was deposited over the first oxide by a sputtering method using a target with In:Ga:Zn=4:2:4.1 [atomic ratio]. Note that the first oxide and the second oxide were successively deposited.

Next, a tungsten film to be the conductor 251 was deposited over the second oxide.

Then, the oxide 230 and the conductor 251 were processed by a lithography method to form an island including the oxide 230 and the conductor 251.

Next, a silicon oxynitride film was deposited as an insulator to be the insulator 226. Next, CMP treatment was performed to planarize the top surface of the insulator to be the insulator 226.

Next, an opening reaching the oxide 230b was formed in the conductor 251 and the insulator to be the insulator 226, whereby the conductor 251a and the conductor 251b were formed.

Next, as an oxide to be the oxide 230c, an In—Ga—Zn oxide was deposited by a sputtering method using a target with In:Ga:Zn=1:3:2 [atomic ratio].

Next, a silicon oxynitride film to be the insulator 250 was deposited.

Next, over the silicon oxynitride film to be the insulator 250, as a conductive film to be the conductor 260, a titanium nitride film was deposited and then a tungsten film was deposited.

Next, the oxide film to be the oxide 230c, the insulating film to be the insulator 250, and the conductive film to be the conductor 260 were polished by CMP treatment until the insulator 226 was exposed; thus, the oxide 230c, the insulator 250, and the conductor 260 were formed in the opening.

Next, the top surface of the insulator 226 was etched (half-etched back) by approximately 40 nm, so that the level of the top surface of the insulator 226 becomes lower than the level of the top surface of the conductor 260; thus, a step was formed. The etching treatment was performed by a dry etching method using a mixed gas of Ar, $CHF_3$, and $CF_4$. By the etching treatment, part of the top surfaces of the oxide 230c and the insulator 250 was also removed.

Next, the insulator 227 was deposited, the insulator 228 and the insulator 229 were deposited over the insulator 227 and over the insulator 228, respectively. A silicon oxynitride film, an aluminum oxide film, and a silicon oxynitride film were deposited as the insulator 227, as the insulator 228, and as the insulator 229, respectively.

Next, a tungsten film was deposited over the insulator 229; a silicon nitride film was deposited over the tungsten film; the tungsten film and the silicon nitride film were processed by a lithography method; and the insulator 229, the insulator 228, the insulator 227, and the insulator 226 were subjected to etching treatment using a stacked-layer film of the tungsten film and the silicon nitride film as an etching mask, so that an opening reaching the top surface of the conductor 251a and an opening reaching the top surface of the conductor 251b were formed. A dry etching method was used as the etching treatment.

In this example, the insulator 229, the insulator 227, and the insulator 226 were etched using a mixed gas of Ar, $O_2$, and $C_4F_6$, and the insulator 228 was etched using a mixed gas of Ar, $H_2$, and $C_4F_8$.

Next, a conductor to be the conductor 252 (the conductor 252*a* and the conductor 252*b*) was deposited on inner walls of the openings and over the insulator 229. As the conductor 252, a titanium nitride film was deposited and then a tungsten film was deposited.

Next, CMP treatment was performed on the top surface of the conductor to be the conductor 252 until the top surface of the insulator 229 was exposed, whereby the conductor 252*a* and the conductor 252*b* were formed in the openings.

Through the above process, a sample of the semiconductor device was fabricated.

Next, the cross section of the fabricated sample was observed. The cross-sectional observation was performed with a scanning transmission electron microscope (STEM) HD2300 manufactured by Hitachi High-Technologies Corporation.

Figure 46:
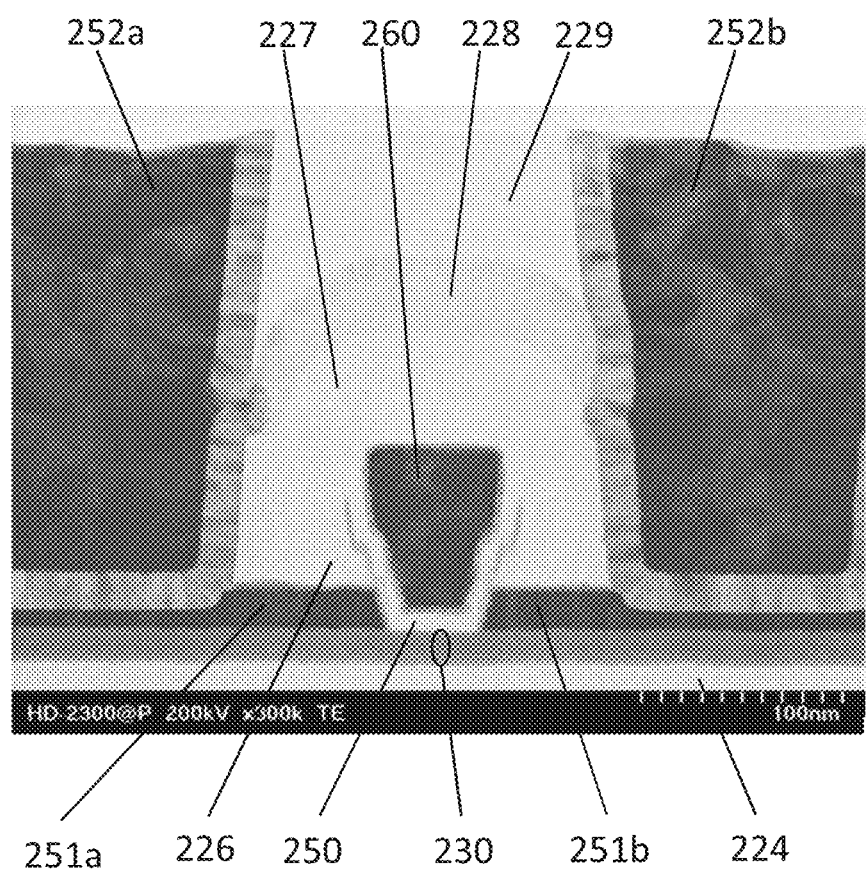
FIG. 46 A cross-sectional STEM image of a semiconductor device of Example.

FIG. 46 is a cross-sectional photograph of the sample. As shown in FIG. 46, in the structure of the semiconductor device of one embodiment of the present invention, the conductor 252*a* and the conductor 252*b* can be distanced from the conductor 260 functioning as the first gate electrode even when the space between the conductor 252*a* and the conductor 252*b* is narrowed; thus, it is confirmed that the semiconductor device can be miniaturized.

At least part of this example can be implemented in combination with the other embodiment described in this specification as appropriate.

REFERENCE NUMERALS

100 capacitor
110 conductor
112 conductor
120 conductor
130 insulator
150 insulator
200 transistor
200*a* transistor
200*b* transistor
203 conductor
203*a* conductor
203*b* conductor
205 conductor
205*a* conductor
205*b* conductor
210 insulator
212 insulator
214 insulator
216 insulator
218 conductor
220 insulator
222 insulator
224 insulator
226 insulator
226A insulator
227 insulator
228 insulator
229 insulator
230 oxide
230*a* oxide
230*b* oxide
230*c* oxide
230*c*2 oxide
230A oxide
230B oxide
230C oxide
231 opening
232*a* opening
232*b* opening
233_1 region
233_2 region
233_3 region
234 region
235 region
241_1 opening
241_2 opening
241_3 opening
242*a* opening
242*b* opening
243_1 region
243_2 region
243_3 region
244 region
245 region
246 conductor
248 conductor
250 insulator
250_2 insulator
250A insulator
251 conductor
251*a* conductor
251*b* conductor
251*c* conductor
251A conductor
251B conductor
252 conductor
252*a* conductor
252*a*_2 conductor
252*b* conductor
252*b*_2 conductor
252*c* conductor
260 conductor
260_2 conductor
260A conductor
300 transistor
311 substrate
313 semiconductor region
314*a* low-resistance region
314*b* low-resistance region
315 insulator
316 conductor
320 insulator
322 insulator
324 insulator
326 insulator
328 conductor
330 conductor
350 insulator
352 insulator
354 insulator
356 conductor
360 insulator
362 insulator
364 insulator
366 conductor
370 insulator
372 insulator
374 insulator
376 conductor
380 insulator 382 insulator
384 insulator
386 conductor
711 substrate
712 circuit region
713 separation region
714 separation line
715 chip
750 electronic component
752 printed circuit board
754 circuit board
755 lead
1400 DOSRAM
1405 controller
1410 row circuit
1411 decoder
1412 word line driver circuit
1413 column selector
1414 sense amplifier driver circuit
1415 column circuit
1416 global sense amplifier array
1417 input/output circuit
1420 MC-SA array
1422 memory cell array
1423 sense amplifier array
1425 local memory cell array
1426 local sense amplifier array
1444 switch array
1445 memory cell
1446 sense amplifier
1447 global sense amplifier
1600 NOSRAM
1610 memory cell array
1611 memory cell
1612 memory cell
1613 memory cell
1614 memory cell
1640 controller
1650 row driver
1651 row decoder
1652 word line driver
1660 column driver
1661 column decoder
1662 driver
1663 DAC
1670 output driver
1671 selector
1672 ADC
1673 output buffer
2910 information terminal
2911 housing
2912 display portion
2913 camera
2914 speaker portion
2915 operation switch
2916 external connection portion
2917 microphone
2920 notebook personal computer
2921 housing
2922 display portion
2923 keyboard
2924 pointing device
2940 video camera
2941 housing
2942 housing
2943 display portion
2944 operation switch
2945 lens
2946 joint
2950 information terminal
2951 housing
2952 display portion
2960 information terminal
2961 housing
2962 display portion
2963 band
2964 buckle
2965 operation switch
2966 input/output terminal
2967 icon
2980 car
2981 car body
2982 wheel
2983 dashboard
2984 light
3001 wiring
3002 wiring
3003 wiring
3004 wiring
3005 wiring
3006 wiring
3110 OS-FPGA
3111 controller
3112 word driver
3113 data driver
3115 programmable area
3117 IOB
3119 core
3120 LAB
3121 PLE
3123 LUT block
3124 register block
3125 selector
3126 CM
3127 power switch
3128 CM
3130 SAB
3131 SB
3133 PRS
3135 CM
3137 memory circuit
3137B memory circuit
3140 OS-FF
3141 FF
3142 shadow register
3143 memory circuit
3143B memory circuit
3188 inverter circuit
3189 inverter circuit
5400 semiconductor device
5401 CPU core
5402 power controller
5403 power switch
5404 cache
5405 bus interface
5406 debug interface
5407 control unit
5408 PC
5409 pipeline register
5410 pipeline register
5411 ALU
5412 register file
5421 power management unit
5422 peripheral circuit 5423 data bus
5500 semiconductor device
5501 memory circuit
5502 memory circuit
5503 memory circuit
5504 read circuit
5509 transistor
5510 transistor
5512 transistor
5513 transistor
5515 transistor
5517 transistor
5518 transistor
5519 capacitor
5520 capacitor
5540 wiring
5541 wiring
5542 wiring
5543 wiring
5544 wiring

The invention claimed is:

1. A semiconductor device comprising:
a first insulator;
an oxide over the first insulator;
a second insulator, a first conductor, and a second conductor over the oxide;
a third conductor over the second insulator;
a fourth conductor over the first conductor;
a fifth conductor over the second conductor;
a third insulator over the first insulator, the first conductor, and the second conductor;
a fourth insulator over the second insulator, the third insulator, and the third conductor; and
a fifth insulator over the fourth insulator,
wherein the first conductor and the second conductor are provided to face each other with the second insulator therebetween,
wherein the second insulator is provided along an inner wall of an opening provided in the third insulator, facing side surfaces of the first conductor and the second conductor, and a top surface of the oxide,
wherein a level of a top surface of the third conductor is higher than levels of top surfaces of the second insulator and the third insulator,
wherein the fourth insulator is provided along the top surface of the second insulator, the top surface of the third insulator, the top surface of the third conductor, and a side surface of the third conductor, and
wherein the fourth conductor and the fifth conductor are provided to penetrate the third insulator, the fourth insulator, and the fifth insulator and to face each other with the third conductor therebetween.

2. The semiconductor device according to claim 1,
wherein the fourth insulator comprises a first region formed along the side surface of the third conductor, a second region formed along the top surface of the third conductor, and a third region other than the first region and the second region, and
wherein a thickness of the first region with reference to a formation surface of the third region is twice or more a thickness of the third region.

3. The semiconductor device according to claim 2, wherein the fourth conductor and the fifth conductor are provided to overlap with at least part of the first region and to penetrate the third region.

4. The semiconductor device according to claim 1, wherein a distance between the third conductor and a region of the fourth conductor in contact with the first conductor, which face each other, is substantially the same as a distance between the third conductor and a region of the fifth conductor in contact with the second conductor, which face each other.

5. The semiconductor device according to claim 1, wherein the second insulator is provided along the inner wall of the opening provided in the third insulator, the facing side surfaces of the first conductor and the second conductor, and the top surface of the oxide with a second oxide therebetween.

6. The semiconductor device according to claim 1, wherein the fourth insulator is provided along the top surface of the second insulator, the top surface of the third insulator, the top surface of the third conductor, and the side surface of the third conductor with a sixth insulator therebetween.

7. The semiconductor device according to claim 1, wherein the first oxide and a second oxide each comprise a metal oxide.

8. The semiconductor device according to claim 2, wherein the fourth conductor and the fifth conductor are provided to overlap with at least part of the first region and to penetrate the third region.

9. The semiconductor device according to claim 2, wherein a distance between the third conductor and a region of the fourth conductor in contact with the first conductor, which face each other, is substantially the same as a distance between the third conductor and a region of the fifth conductor in contact with the second conductor, which face each other.

10. The semiconductor device according to claim 2, wherein the first oxide and a second oxide each comprise a metal oxide.

* * * * *